United States Patent
Keigler

(10) Patent No.: US 9,257,319 B2
(45) Date of Patent: Feb. 9, 2016

(54) PARALLEL SINGLE SUBSTRATE PROCESSING SYSTEM WITH ALIGNMENT FEATURES ON A PROCESS SECTION FRAME

(75) Inventor: Arthur Keigler, Wellesley, MA (US)

(73) Assignee: TEL NEXX, INC., Billerica, MA (US)

( * ) Notice: Subject to any disclaimer, the term of this patent is extended or adjusted under 35 U.S.C. 154(b) by 769 days.

(21) Appl. No.: 13/488,297

(22) Filed: Jun. 4, 2012

(65) Prior Publication Data

US 2012/0308344 A1    Dec. 6, 2012

Related U.S. Application Data

(60) Provisional application No. 61/493,183, filed on Jun. 3, 2011, provisional application No. 61/589,697, filed on Jan. 23, 2012, provisional application No. 61/590,199, filed on Jan. 24, 2012.

(51) Int. Cl.
*H01L 21/677* (2006.01)
*H01L 21/67* (2006.01)
(Continued)

(52) U.S. Cl.
CPC .... *H01L 21/67757* (2013.01); *H01L 21/67028* (2013.01); *H01L 21/67034* (2013.01);
(Continued)

(58) Field of Classification Search
CPC ............... H01L 21/67781; H01L 21/67775; H01L 21/67757; H01L 21/67023
USPC ............................................. 414/222.04, 938
See application file for complete search history.

(56) References Cited

U.S. PATENT DOCUMENTS 3,949,891 A    4/1976 Butler et al.
4,002,141 A    1/1977 Shrader
(Continued)

FOREIGN PATENT DOCUMENTS

FR    2626261    7/1989
JP    62033437    7/1987
(Continued)

OTHER PUBLICATIONS

Office Action mailed Nov. 2, 2014 in corresponding Chinese Patent Application No. 201280027194.3 (with an English translation) (11 pages).

(Continued)

*Primary Examiner* — Gerald McClain
(74) *Attorney, Agent, or Firm* — Rothwell, Figg, Ernst & Manbeck, P.C.

(57) ABSTRACT

A system for fluid processing substrate surfaces arrayed in a fluid having a process section with a frame having a plurality of process elements to process the substrate surfaces without contacting the substrate surfaces and a substrate holder assembly having a number of substrate holders and configured for transporting substrates as a unit. The substrate holder assembly and each of the substrate holders are configured for removable coupling to the process section frame, each substrate holder configured to hold at least one of the substrates. The process section frame has alignment features disposed so that, on coupling of the substrate holder assembly with the process section frame, the alignment features interface with each substrate holder of the substrate holder assembly and locate each substrate holder in repeatable alignment, at corresponding coupling of each substrate holder and the process section frame, with respect to a predetermined feature of the process section.

20 Claims, 113 Drawing Sheets

(51) Int. Cl.
*H01L 21/68* (2006.01)
*H01L 21/687* (2006.01)

(52) U.S. Cl.
CPC .... *H01L21/67051* (2013.01); *H01L 21/67057* (2013.01); *H01L 21/6776* (2013.01); *H01L 21/67173* (2013.01); *H01L 21/67781* (2013.01); *H01L 21/68* (2013.01); *H01L 21/68707* (2013.01)

(56) References Cited

U.S. PATENT DOCUMENTS

| | | | |
|---|---|---|---|
| 4,138,755 A | 2/1979 | Hashimoto et al. | |
| 4,184,448 A | 1/1980 | Aichert et al. | |
| 4,202,071 A | 5/1980 | Scharpf | |
| 4,208,760 A | 6/1980 | Dexter et al. | |
| 4,243,472 A | 1/1981 | O'Neill | |
| 4,311,427 A | 1/1982 | Coad et al. | |
| 4,410,209 A | 10/1983 | Trapani | |
| 4,485,759 A | 12/1984 | Brandolf | |
| 4,500,407 A | 2/1985 | Boys et al. | |
| 4,568,234 A * | 2/1986 | Lee et al. | 414/938 |
| 4,840,530 A * | 6/1989 | Nguyen | 414/938 |
| 4,858,980 A | 8/1989 | Dreisig et al. | |
| 4,875,824 A | 10/1989 | Moe et al. | |
| 4,915,564 A | 4/1990 | Eror et al. | |
| 4,944,650 A | 7/1990 | Matsumoto | |
| 4,981,408 A | 1/1991 | Hughes et al. | |
| 5,092,011 A | 3/1992 | Gommori et al. | |
| 5,125,784 A | 6/1992 | Asano | |
| 5,153,841 A | 10/1992 | Goff et al. | |
| 5,282,923 A | 2/1994 | Cannizzaro, Jr. | |
| 5,295,777 A | 3/1994 | Hodos | |
| 5,374,325 A | 12/1994 | Cannizzaro, Jr. | |
| 5,442,416 A | 8/1995 | Tateyama et al. | |
| 5,484,252 A | 1/1996 | Mutoh | |
| 5,516,732 A | 5/1996 | Flegal | |
| 5,565,034 A | 10/1996 | Nanbu et al. | |
| 5,612,068 A | 3/1997 | Kempf et al. | |
| 5,660,642 A | 8/1997 | Britten | |
| 5,692,869 A | 12/1997 | Kumagai | |
| 5,807,439 A | 9/1998 | Akatsu et al. | |
| 5,883,762 A | 3/1999 | Calhoun et al. | |
| 5,884,640 A | 3/1999 | Fishkin et al. | |
| 5,902,402 A | 5/1999 | Durst et al. | |
| 6,012,472 A | 1/2000 | Leenaars et al. | |
| 6,027,574 A | 2/2000 | Fishkin et al. | |
| 6,055,694 A | 5/2000 | Steere | |
| 6,092,971 A | 7/2000 | Balg et al. | |
| 6,155,773 A | 12/2000 | Ebbing et al. | |
| 6,156,580 A | 12/2000 | Wooten et al. | |
| 6,170,495 B1 | 1/2001 | Leenaars et al. | |
| 6,174,011 B1 | 1/2001 | Keigler | |
| 6,274,506 B1 | 8/2001 | Christenson et al. | |
| 6,280,294 B1 | 8/2001 | Miyamoto | |
| 6,283,701 B1 | 9/2001 | Sundar et al. | |
| 6,288,806 B1 | 9/2001 | Touma et al. | |
| 6,318,951 B1 | 11/2001 | Schmidt et al. | |
| 6,319,373 B2 | 11/2001 | Takeyama et al. | |
| 6,322,312 B1 | 11/2001 | Sundar | |
| 6,328,814 B1 | 12/2001 | Fishkin et al. | |
| 6,345,947 B1 | 2/2002 | Egashira | |
| 6,354,794 B2 * | 3/2002 | Sato et al. | 414/938 |
| 6,374,837 B2 | 4/2002 | Scranton et al. | |
| 6,390,767 B1 | 5/2002 | Alper et al. | |
| 6,395,101 B1 | 5/2002 | Scranton et al. | |
| 6,430,841 B1 | 8/2002 | Borkowski et al. | |
| 6,457,929 B2 * | 10/2002 | Sato et al. | 414/222.04 |
| 6,488,462 B1 | 12/2002 | Williams | |
| 6,488,775 B2 | 12/2002 | Shimizu et al. | |
| 6,513,848 B1 | 2/2003 | Shendon et al. | |
| 6,514,033 B2 | 2/2003 | Sundar | |
| 6,523,553 B1 | 2/2003 | Redeker et al. | |
| 6,530,388 B1 | 3/2003 | Zuck et al. | |
| 6,536,131 B2 * | 3/2003 | Davis | 414/222.04 |
| 6,543,982 B1 | 4/2003 | Nichols et al. | |
| 6,555,276 B2 | 4/2003 | Gordon et al. | |
| 6,569,241 B2 | 5/2003 | Gordon et al. | |
| 6,578,891 B1 | 6/2003 | Suzuki et al. | |
| 6,578,893 B2 | 6/2003 | Soucy et al. | |
| 6,592,324 B2 | 7/2003 | Downs et al. | |
| 6,612,801 B1 * | 9/2003 | Koguchi | 414/938 |
| 6,615,113 B2 | 9/2003 | Kretz et al. | |
| 6,618,889 B1 | 9/2003 | Terui et al. | |
| 6,622,334 B1 | 9/2003 | Ziemins et al. | |
| 6,631,935 B1 | 10/2003 | Casarotti et al. | |
| 6,637,444 B1 | 10/2003 | Zuck et al. | |
| 6,638,004 B2 | 10/2003 | Berger et al. | |
| 6,638,860 B2 | 10/2003 | Matsunaga et al. | |
| 6,641,465 B2 | 11/2003 | Miyamoto | |
| 6,652,656 B2 | 11/2003 | Kopacz et al. | |
| 6,665,583 B2 | 12/2003 | Kretz et al. | |
| 6,672,820 B1 | 1/2004 | Hanson et al. | |
| 6,688,662 B2 | 2/2004 | Casarotti et al. | |
| 6,691,430 B2 | 2/2004 | Saito et al. | |
| 6,736,148 B2 | 5/2004 | Davis et al. | |
| 6,746,544 B2 | 6/2004 | Fishkin et al. | |
| 6,755,603 B2 | 6/2004 | Yamahata | |
| 6,797,074 B2 | 9/2004 | Redeker et al. | |
| 6,852,007 B1 | 2/2005 | Gonzalez-Martin et al. | |
| 6,866,460 B2 * | 3/2005 | Davis et al. | 414/939 |
| 6,926,016 B1 | 8/2005 | Zuck et al. | |
| 6,927,165 B2 | 8/2005 | Matsunaga et al. | |
| 6,935,830 B2 | 8/2005 | Berger et al. | |
| 6,948,898 B2 | 9/2005 | Berger et al. | |
| 6,955,516 B2 | 10/2005 | Achkire et al. | |
| 6,964,276 B2 | 11/2005 | Shulman et al. | |
| 6,979,165 B2 | 12/2005 | Larson et al. | |
| 7,002,698 B2 | 2/2006 | Hanson et al. | |
| 7,022,211 B2 | 4/2006 | Yoshioka et al. | |
| 7,027,894 B2 | 4/2006 | Kretz et al. | |
| 7,033,126 B2 | 4/2006 | Van Den Berg | |
| 7,047,903 B2 | 5/2006 | Ito | |
| 7,050,739 B2 | 5/2006 | Nakazato et al. | |
| 7,052,229 B2 | 5/2006 | Berger et al. | |
| 7,070,481 B1 | 7/2006 | Miyamoto | |
| 7,100,954 B2 | 9/2006 | Klein et al. | |
| 7,104,579 B2 | 9/2006 | Casarotti et al. | |
| 7,119,884 B2 | 10/2006 | Ottens et al. | |
| 7,133,273 B2 | 11/2006 | Ferreres | |
| 7,141,274 B2 | 11/2006 | Wang et al. | |
| 7,144,056 B2 | 12/2006 | Casarotti et al. | |
| 7,166,183 B2 | 1/2007 | Nam et al. | |
| 7,211,461 B2 | 5/2007 | Sakata et | |
| 7,252,098 B2 | 8/2007 | Fishkin et al. | |
| 7,270,510 B2 | 9/2007 | Putzi | |
| 7,281,535 B2 | 10/2007 | Mihai et al. | |
| 7,328,712 B1 | 2/2008 | Zuck et al. | |
| 7,364,625 B2 | 4/2008 | Christenson et al. | |
| 7,374,393 B2 | 5/2008 | Rice et al. | |
| 7,427,330 B1 | 9/2008 | Zuck et al. | |
| 7,438,630 B2 | 10/2008 | Miyamoto | |
| 7,445,697 B2 | 11/2008 | Keigler et al. | |
| 7,494,401 B2 | 2/2009 | Miyamoto | |
| 7,513,062 B2 | 4/2009 | Achkire et al. | |
| 7,549,428 B2 | 6/2009 | Masuda et al. | |
| 7,582,166 B2 | 9/2009 | Lampe et al. | |
| 7,690,969 B2 | 4/2010 | Miyamoto | |
| 7,712,806 B2 | 5/2010 | Adachi | |
| 7,712,808 B2 | 5/2010 | Hofmeister et al. | |
| 7,718,011 B2 | 5/2010 | Fishkin et al. | |
| 7,722,747 B2 | 5/2010 | Keigler et al. | |
| 7,727,366 B2 | 6/2010 | Keigler et al. | |
| 7,743,728 B2 | 6/2010 | Ishikawa et al. | |
| 7,748,542 B2 | 7/2010 | Yudovsky et al. | |
| 7,777,203 B2 | 8/2010 | Relleen et al. | |
| 7,779,554 B2 | 8/2010 | Onishi et al. | |
| 7,789,443 B2 | 9/2010 | Gillespie et al. | |
| 7,798,764 B2 | 9/2010 | Rice et al. | |
| 7,841,035 B2 | 11/2010 | Shizawa et al. | |
| 7,875,144 B2 | 1/2011 | Kobayashi | |
| 7,879,180 B2 | 2/2011 | Takahashi | |
| 7,879,401 B2 | 2/2011 | Forrest et al. | |
| 7,896,648 B2 | 3/2011 | Nitadori et al. | |

(56) References Cited

U.S. PATENT DOCUMENTS

| | | |
|---|---|---|
| 7,918,488 B2 | 4/2011 | Shiraishi et al. |
| 7,951,724 B2 | 5/2011 | Fyten et al. |
| 7,963,735 B2 | 6/2011 | Jang et al. |
| 7,980,255 B2 | 7/2011 | Achkire et al. |
| 7,993,486 B2 | 8/2011 | Hauf et al. |
| 7,993,705 B2 | 8/2011 | Nodera et al. |
| 8,002,511 B2 | 8/2011 | Kamikawa et al. |
| 8,029,653 B2 | 10/2011 | Yamamoto et al. |
| 8,033,288 B2 | 10/2011 | Shiomi et al. |
| 8,066,466 B2 | 11/2011 | Rice et al. |
| 8,079,797 B2 | 12/2011 | Tanaka et al. |
| 8,152,981 B2 | 4/2012 | Wijekoon et al. |
| 2001/0017146 A1 | 8/2001 | Bergman |
| 2001/0048867 A1 | 12/2001 | Lebar et al. |
| 2002/0071756 A1 | 6/2002 | Gonzalez |
| 2002/0078892 A1 | 6/2002 | Takahashi |
| 2002/0102155 A1 | 8/2002 | Wu et al. |
| 2003/0091410 A1 | 5/2003 | Larson et al. |
| 2003/0164179 A1 | 9/2003 | Kamikawa et al. |
| 2004/0026694 A1 | 2/2004 | Blattner et al. |
| 2004/0063319 A1 | 4/2004 | Toshima et al. |
| 2004/0194817 A1 | 10/2004 | Pope et al. |
| 2004/0245094 A1 | 12/2004 | McHugh et al. |
| 2005/0167275 A1 | 8/2005 | Keigler et al. |
| 2005/0223588 A1 | 10/2005 | Hansen |
| 2005/0241684 A1 | 11/2005 | Achkire et al. |
| 2006/0035563 A1 | 2/2006 | Kalenian et al. |
| 2006/0174921 A1 | 8/2006 | Achkire et al. |
| 2006/0260653 A1 | 11/2006 | Fishkin et al. |
| 2009/0241996 A1 | 10/2009 | Achkire et al. |
| 2010/0006124 A1 | 1/2010 | Achkire et al. |
| 2011/0020096 A1 | 1/2011 | Mink |
| 2012/0305192 A1* | 12/2012 | Keigler et al. .... H01L 21/67028 156/345.54 |
| 2012/0305193 A1* | 12/2012 | Keigler et al. .... H01L 21/67028 156/345.54 |
| 2012/0306137 A1* | 12/2012 | Keigler et al. .... H01L 21/67028 269/55 |
| 2012/0308345 A1* | 12/2012 | Keigler et al. .... H01L 21/67028 414/222.07 |
| 2012/0308346 A1* | 12/2012 | Keigler et al. ........... 414/222.09 |

FOREIGN PATENT DOCUMENTS

| | | |
|---|---|---|
| JP | 62189732 | 8/1987 |
| JP | 1022359 | 4/1989 |
| JP | 1230245 | 9/1989 |
| JP | 4002126 | 1/1992 |
| JP | 6097262 | 11/1994 |
| JP | 11354604 | 12/1999 |
| JP | 2000049206 | 2/2000 |
| JP | 2001219391 | 8/2001 |
| JP | 2001274232 | 10/2001 |
| JP | 2002064075 | 2/2002 |
| JP | 2002110609 | 4/2002 |
| JP | 2002203884 | 7/2002 |
| JP | 2003257923 | 9/2003 |
| JP | 2005085896 | 3/2005 |
| JP | 2007039158 A * | 2/2007 |
| JP | 2008103663 A * | 5/2008 |
| JP | 04757924 | 8/2011 |
| WO | WO0003417 | 1/2000 |
| WO | WO2007099976 | 9/2007 |

OTHER PUBLICATIONS

International Search Report issued Aug. 22, 2012 in PCT/US12/40813 filed Jun. 4, 2012.

Written Opinion issued Aug. 22, 2012 in PCT/US12/40813 filed Jun. 4, 2012.

Office Action mailed Jul. 20, 2015 in corresponding Chinese Patent Application No. 201280027194.3 (with an English translation) (8 pages).

* cited by examiner

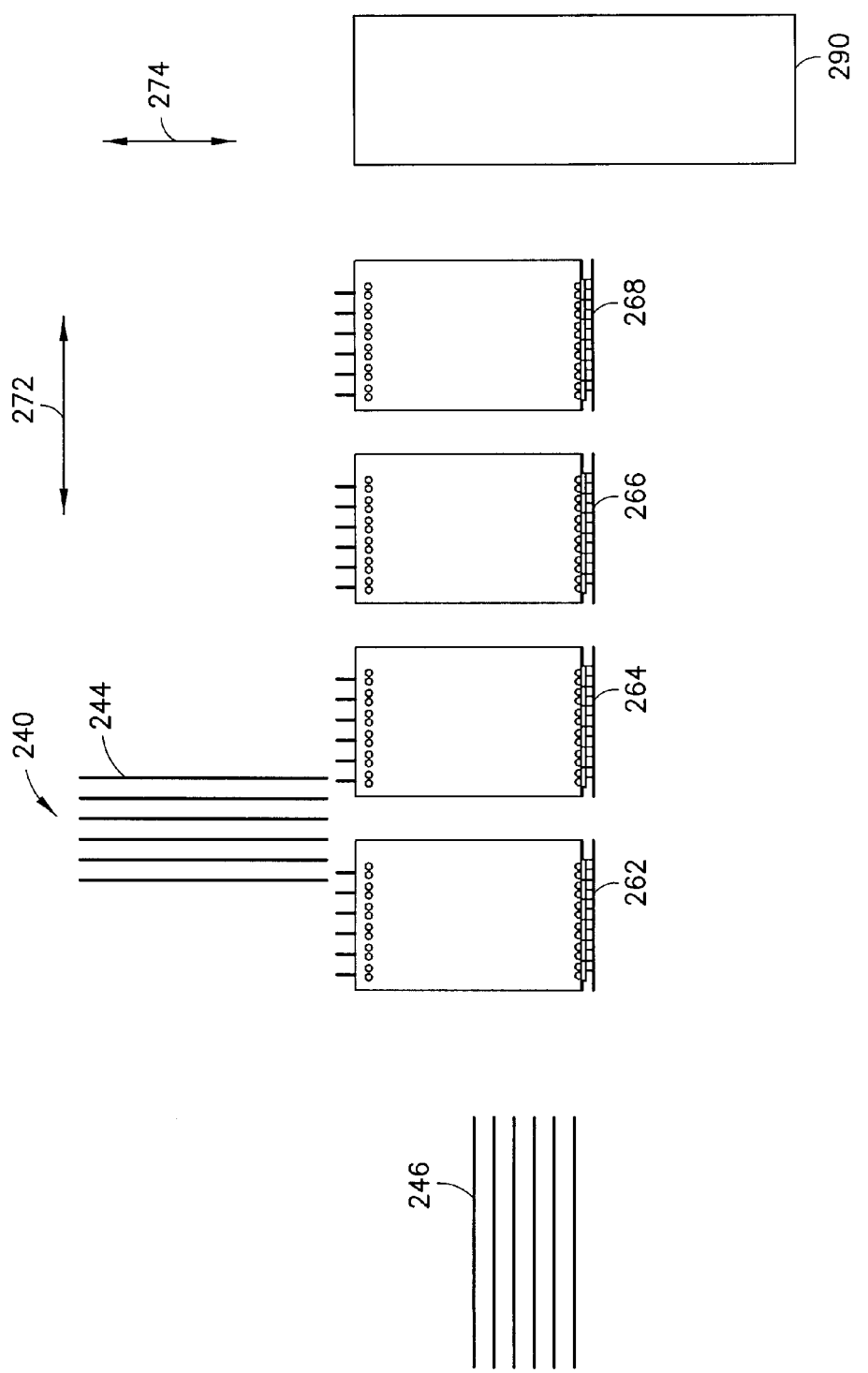

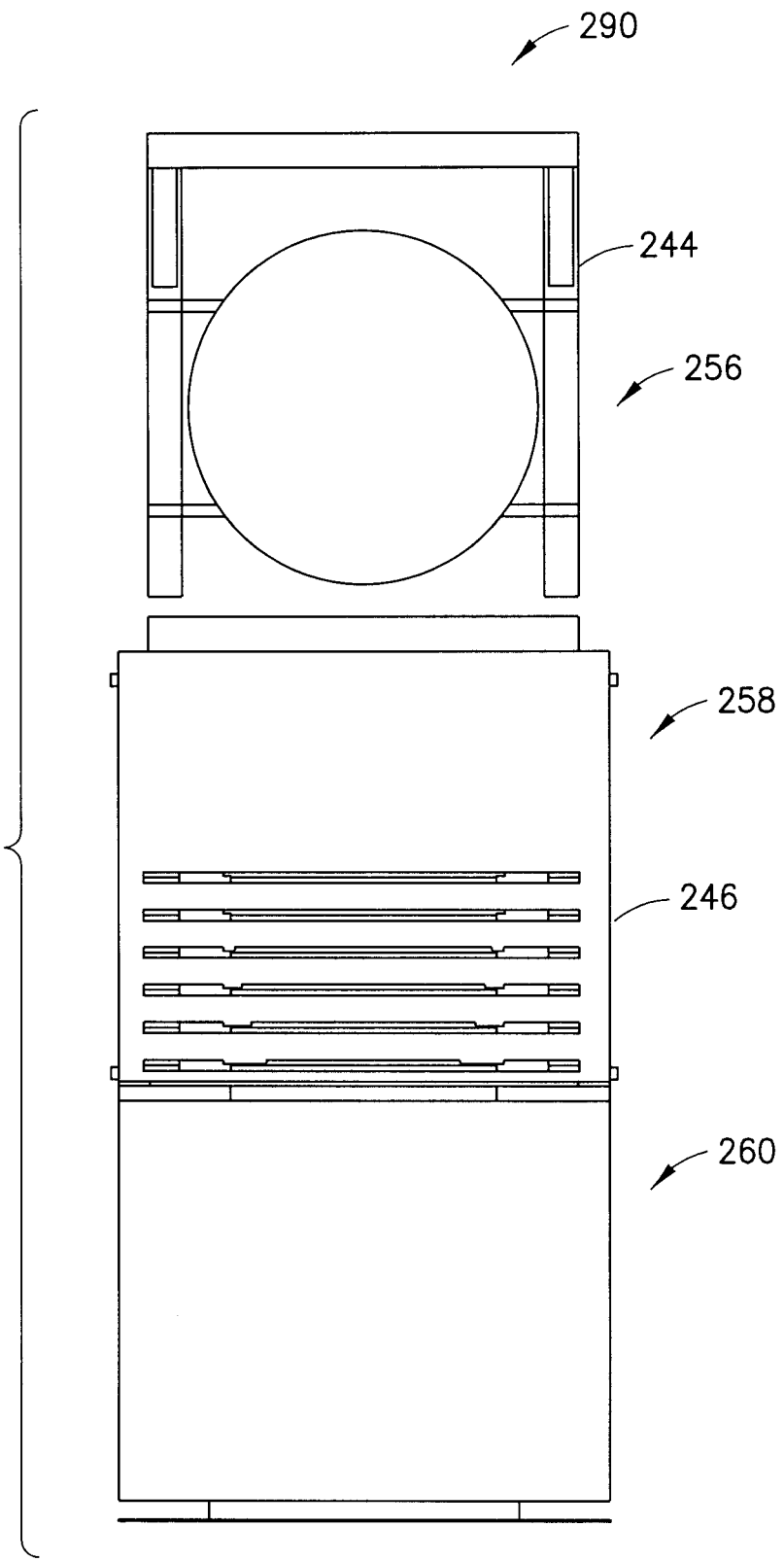

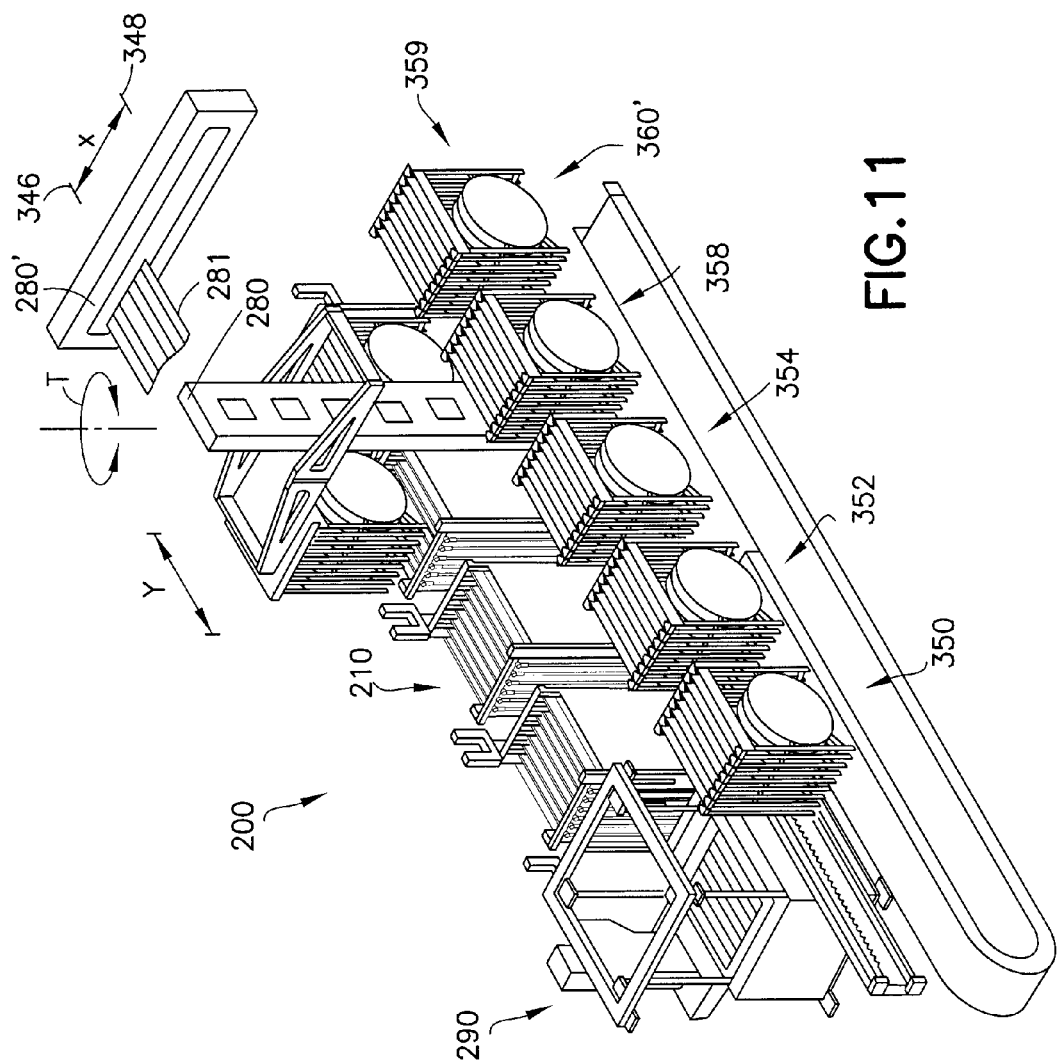

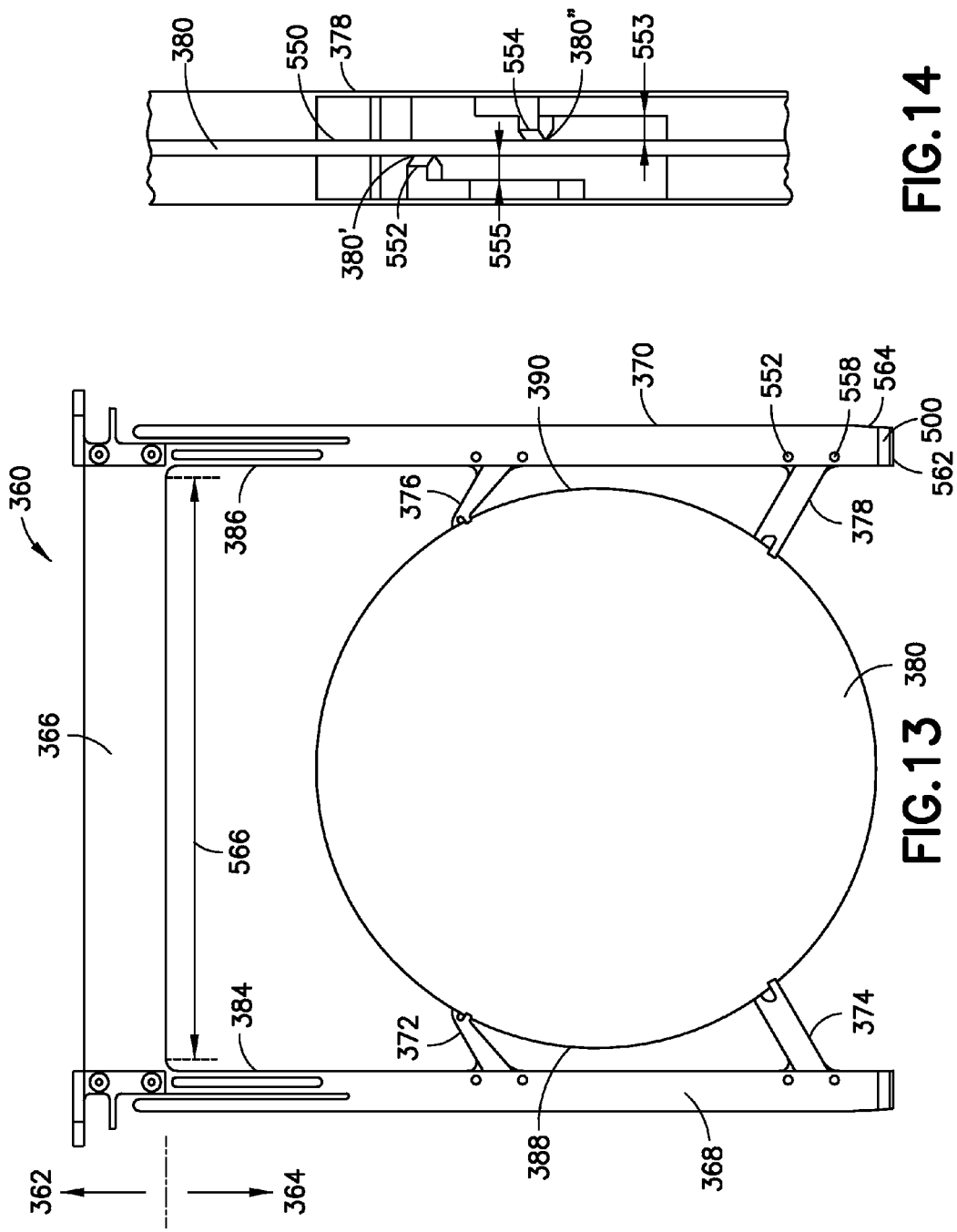

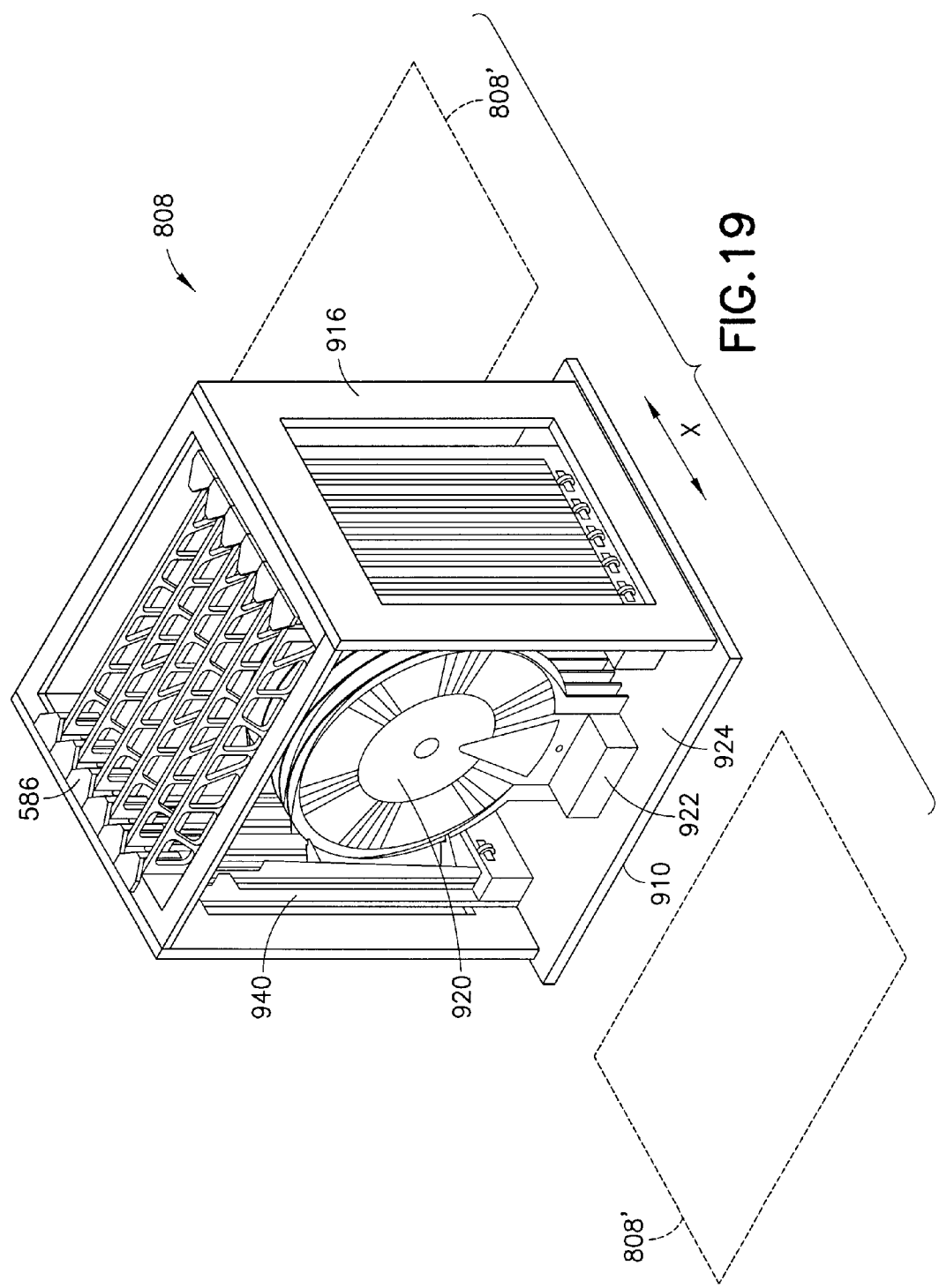

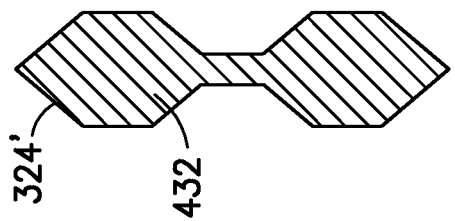
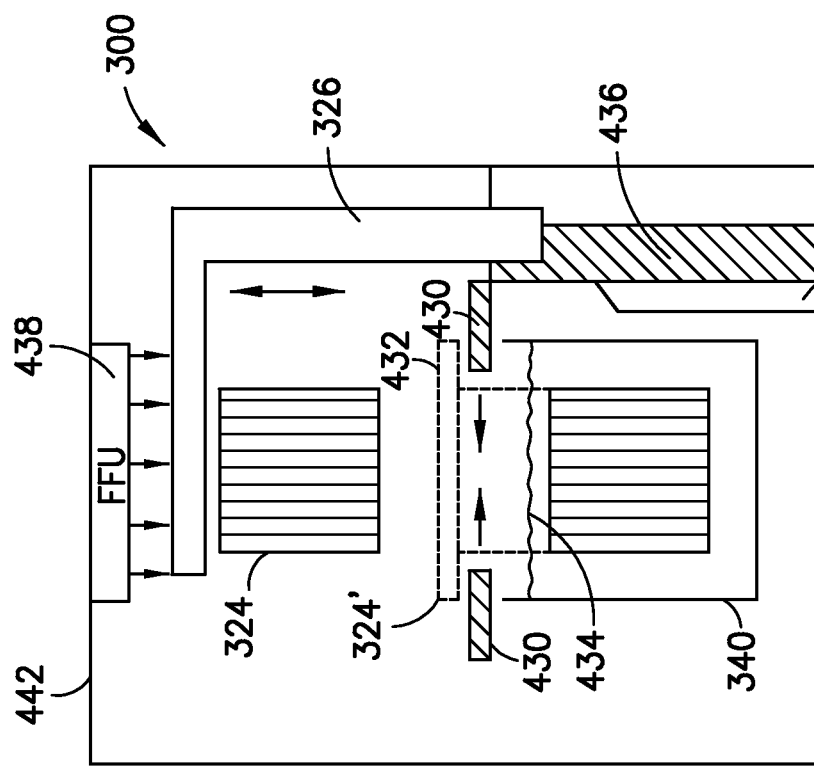

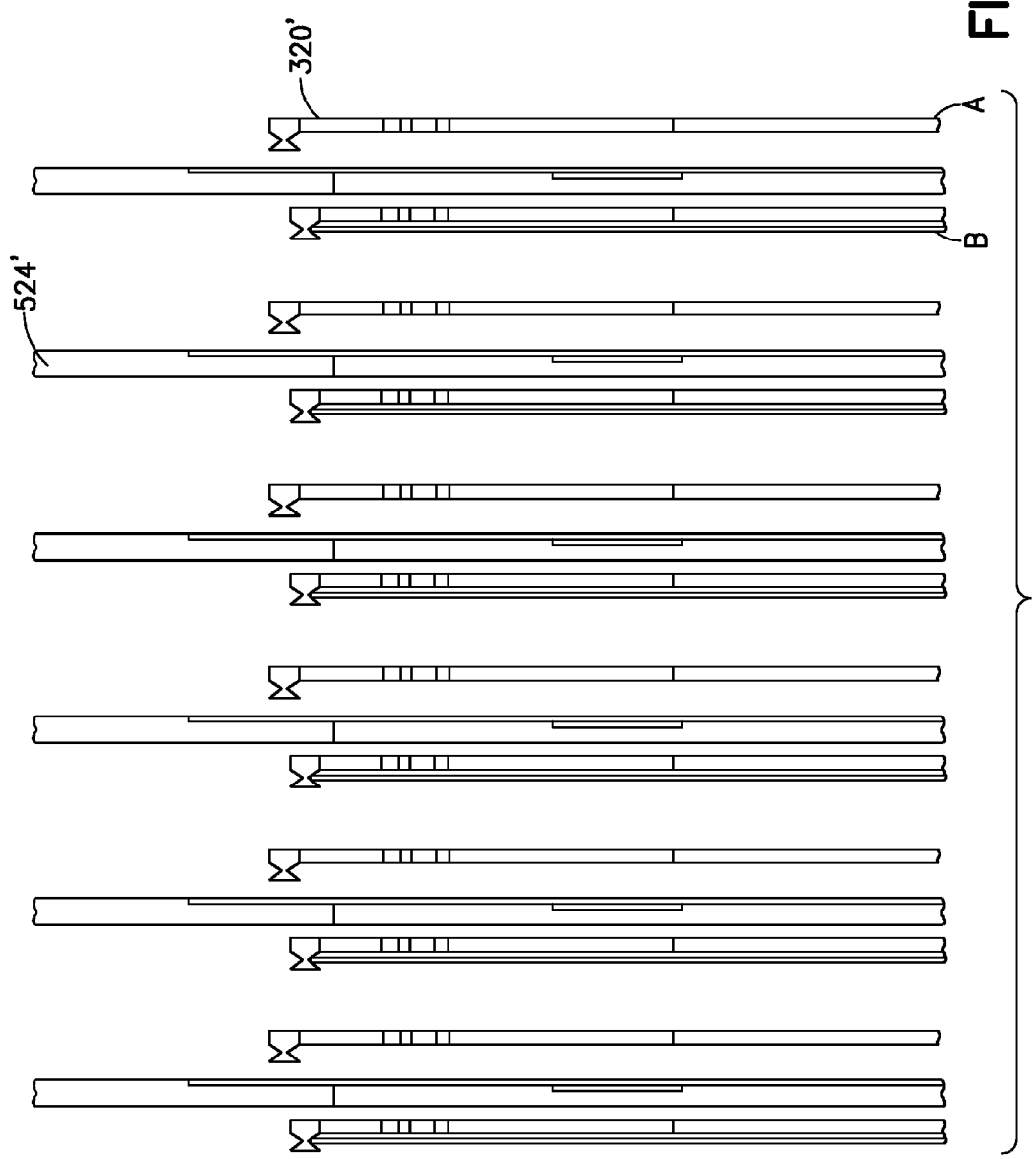

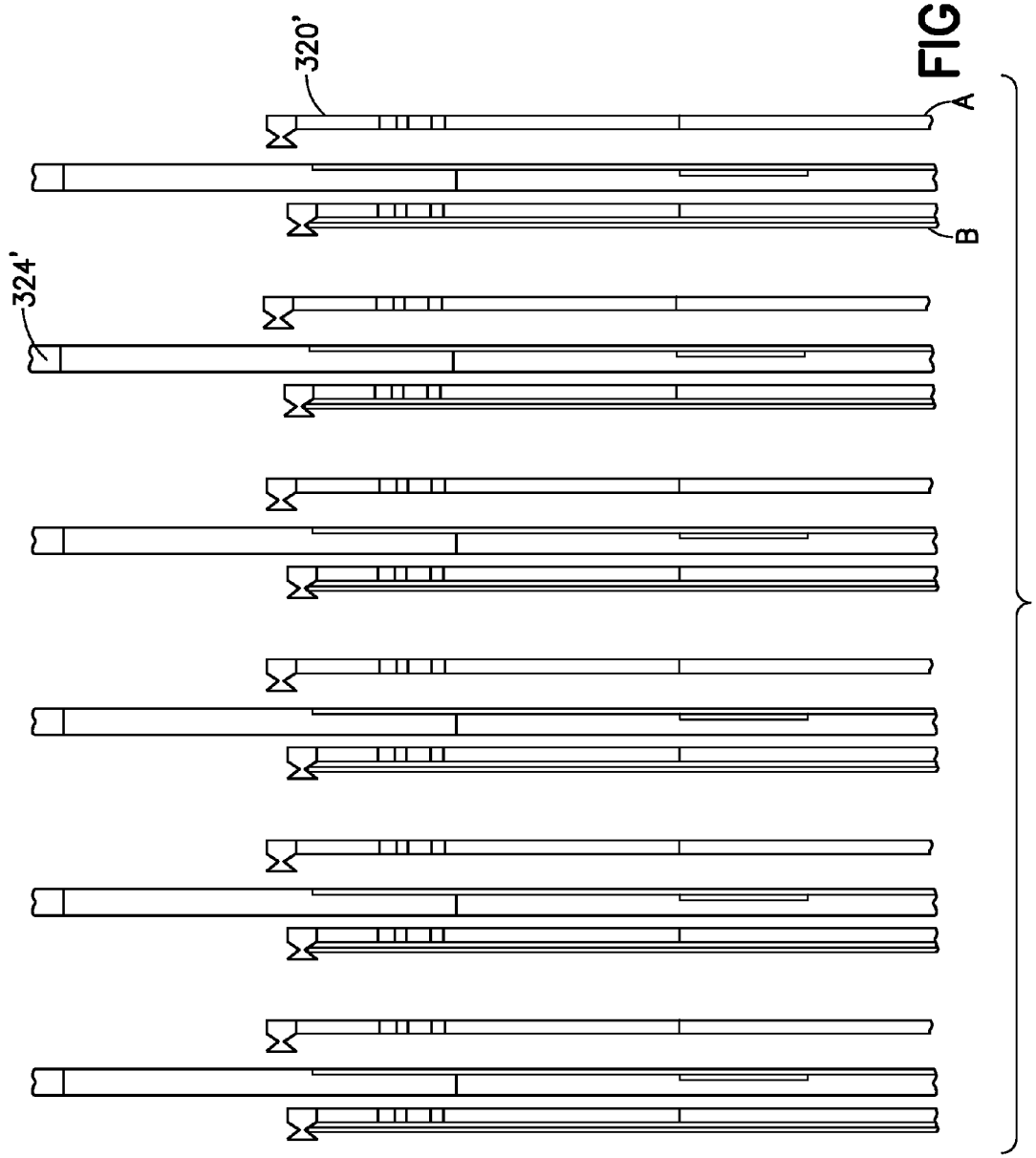

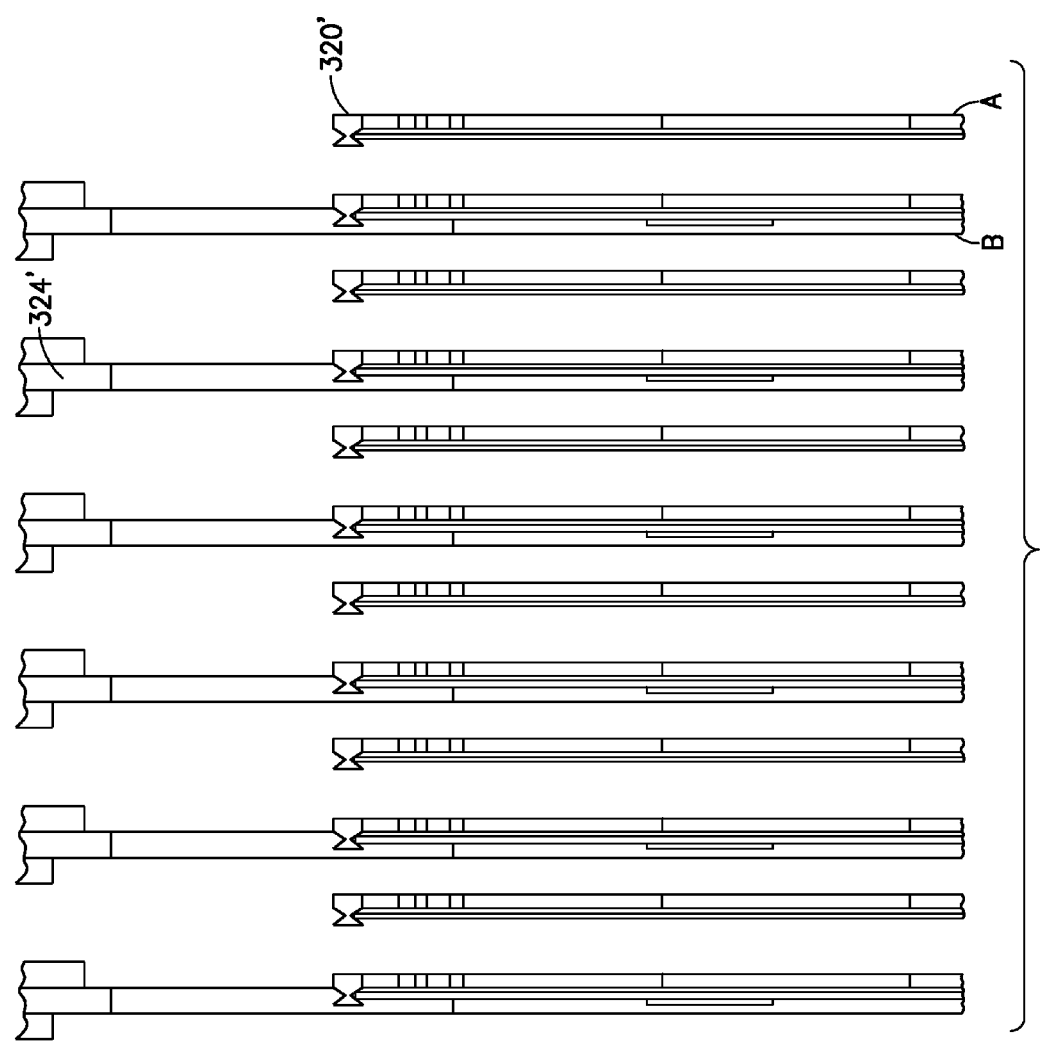

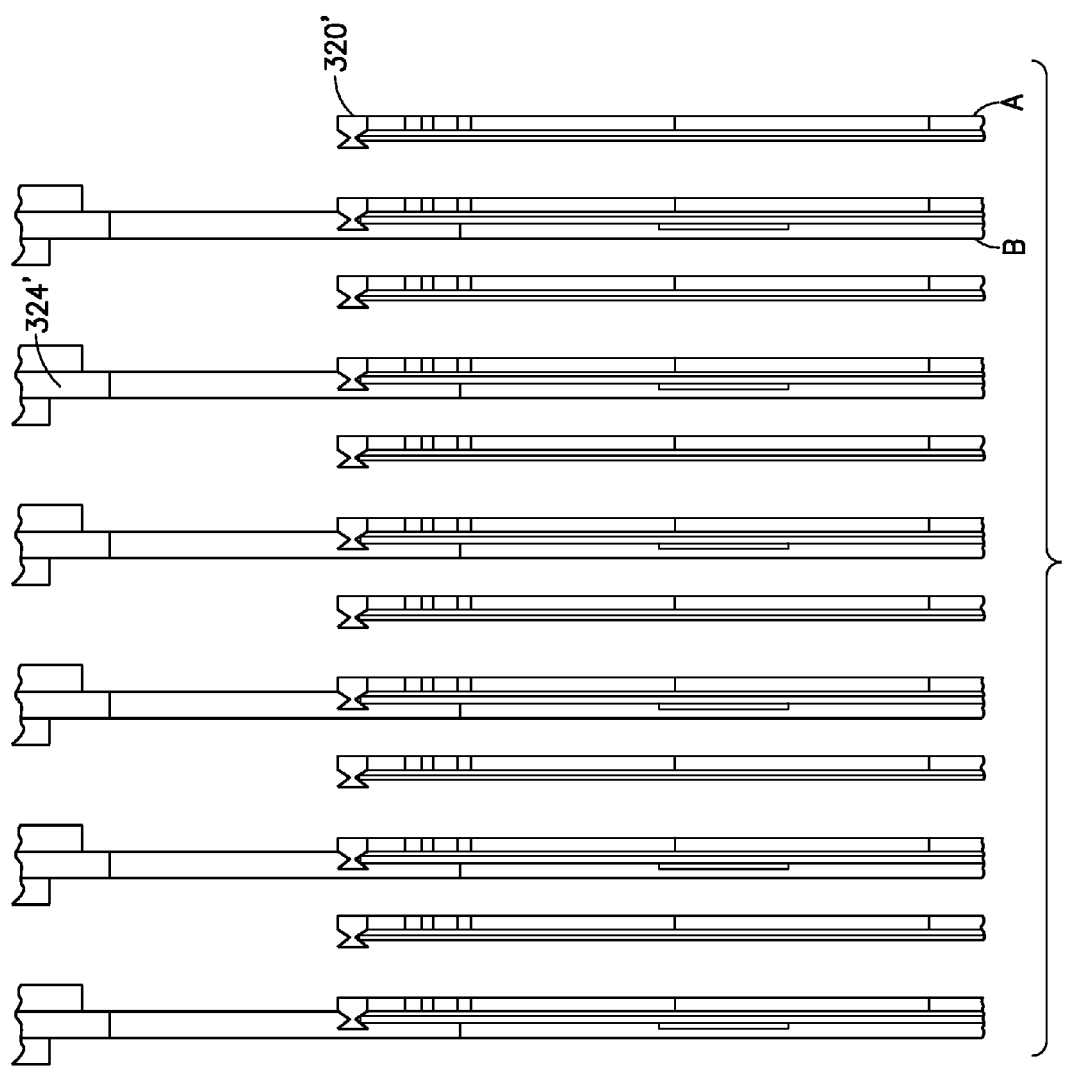

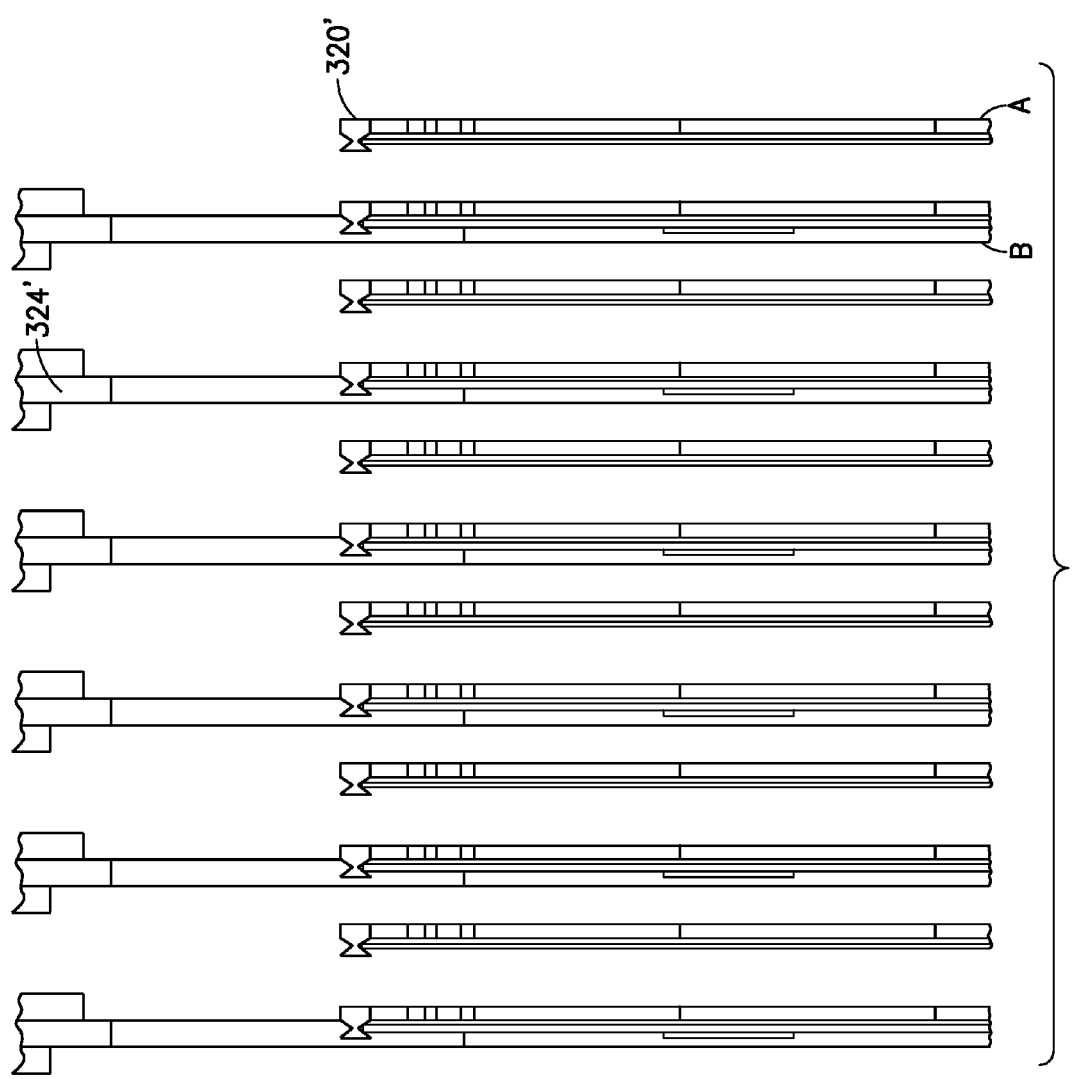

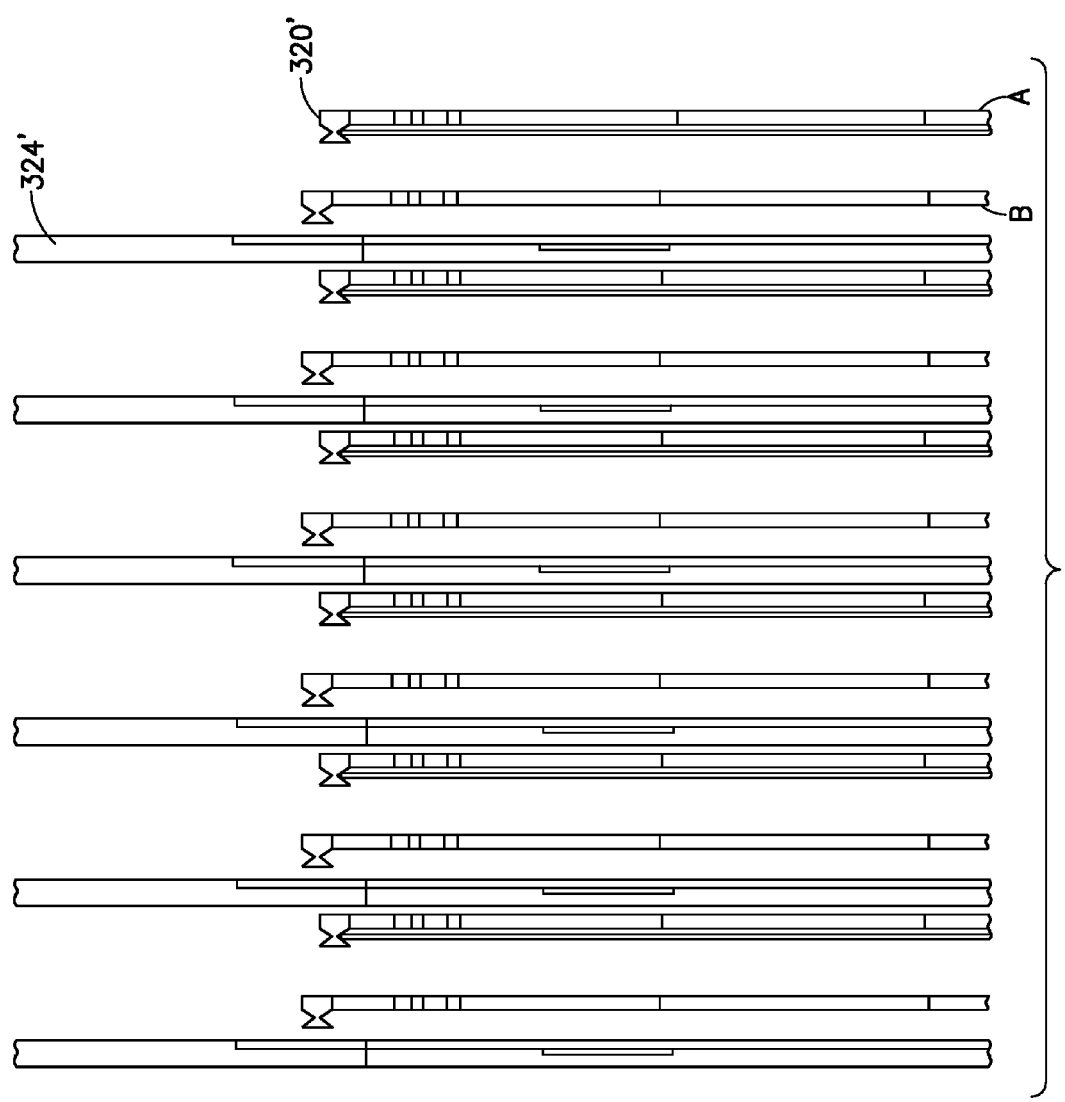

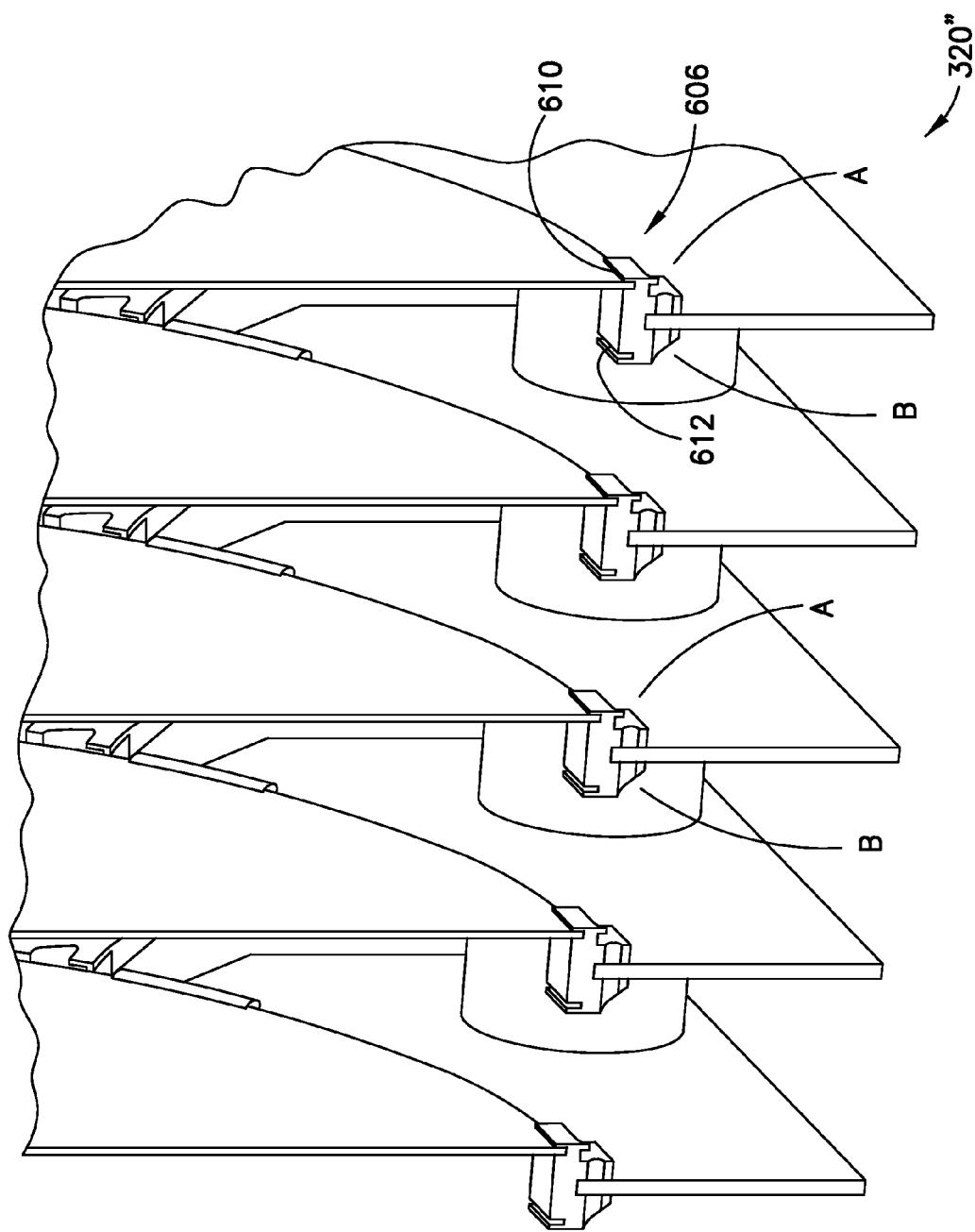

| # | MOTION & STATE | BLACK & WHITE VIEW |
|---|---|---|
| 02 | TRANSPORTER MOVES DOWNWARD TO CONTACT THE WH-ARRAY<br><br>WH-ARRAY: SUPPORTED BY PROCESS MODULE OR LOADER FEATURE<br><br>CLAMP: OPEN HORIZONTALLY AND OPEN VERTICALLY<br><br>TRANSPORT PLATE: COMES INTO CONTACT WITH WH-ARRAY TOP SURFACE | |

FIG.29B

| # | MOTION & STATE | BLACK & WHITE VIEW |
|---|---|---|
| 03 | WH-ARRAY: SUPPORTED BY PROCESS MODULE OR LOADER FEATURE<br><br>CLAMP: MOVES CLOSED HORIZONTALLY WHILE REMAINING OPEN VERTICALLY<br><br>TRANSPORT PLATE: IN CONTACT WITH WH-ARRAY TOP SURFACE | (946, 996, 818) |

FIG.29C

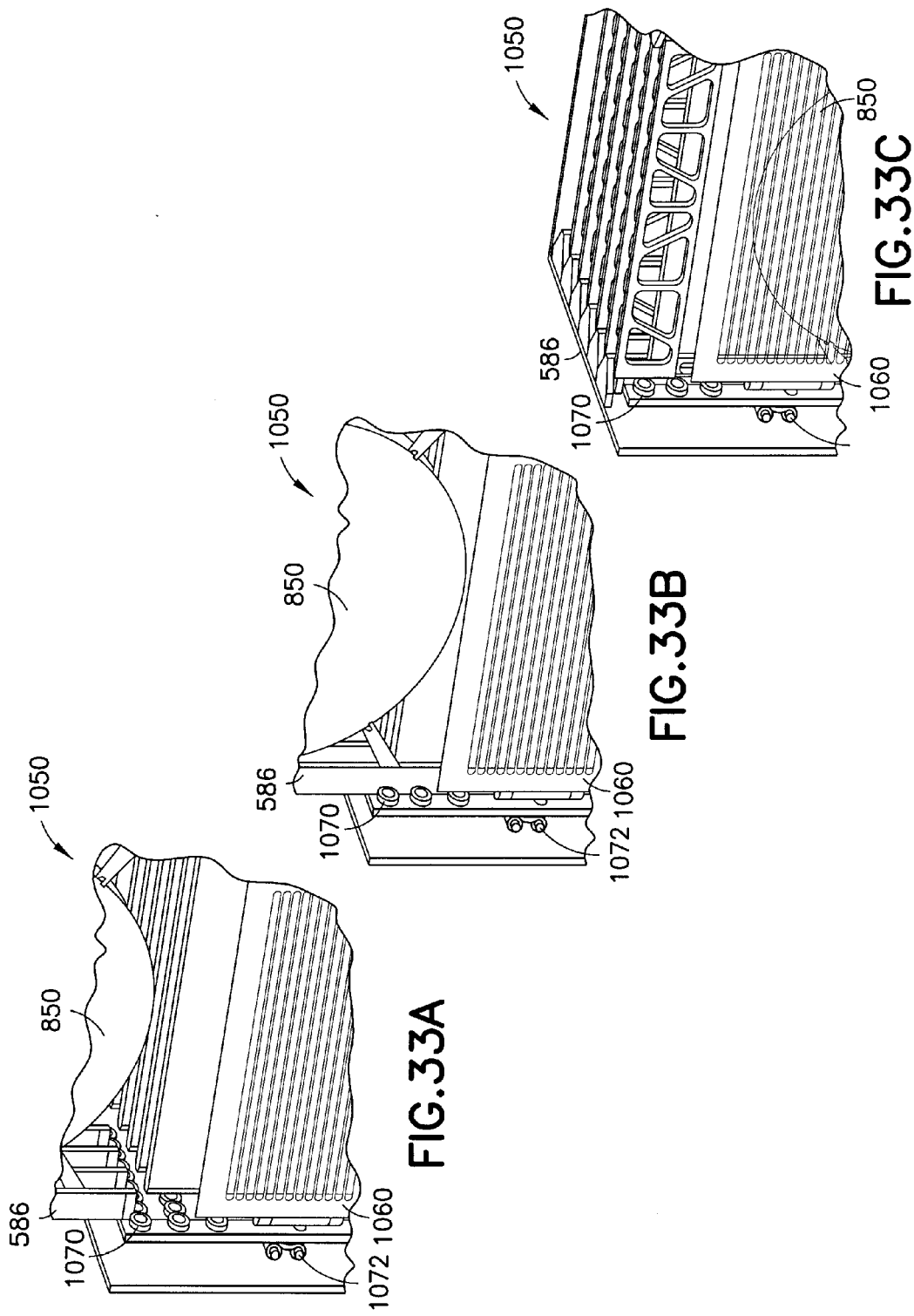

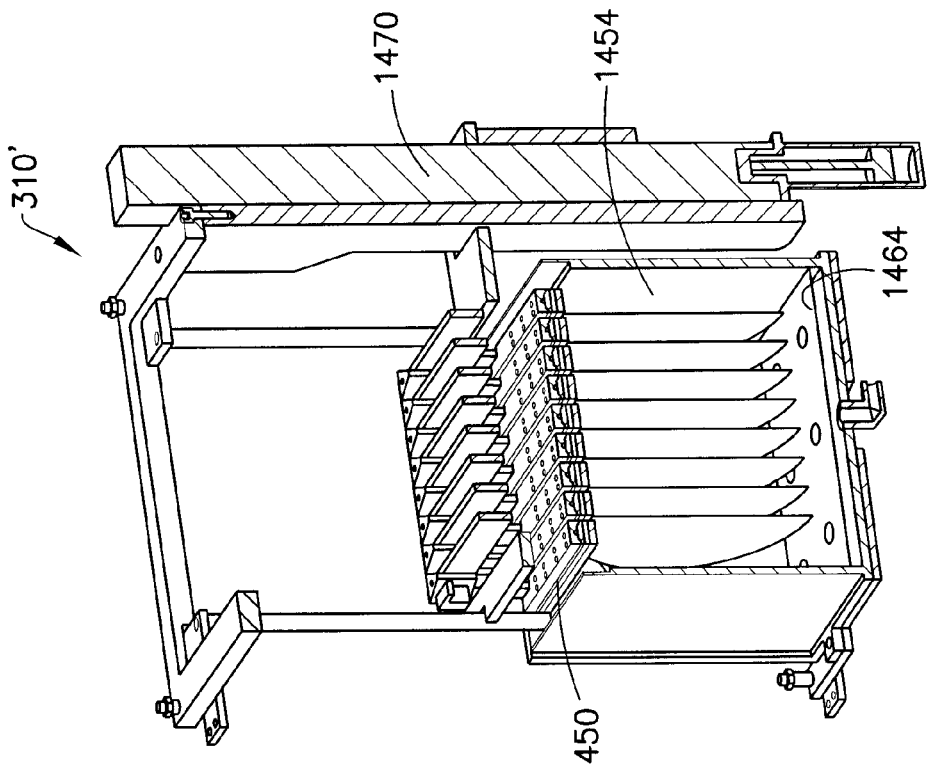
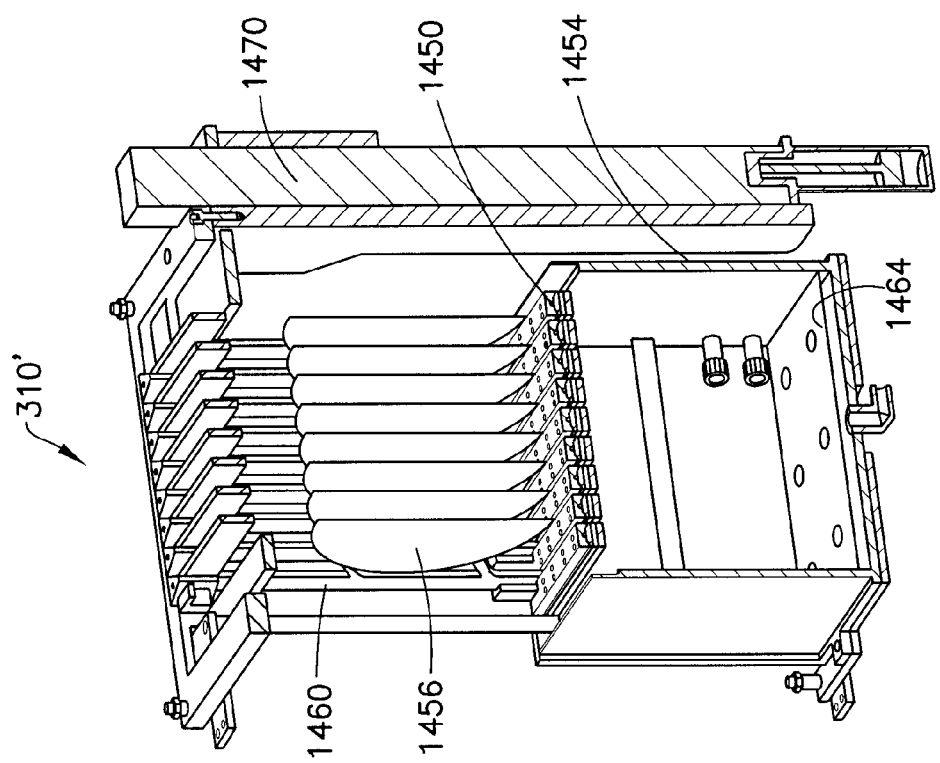

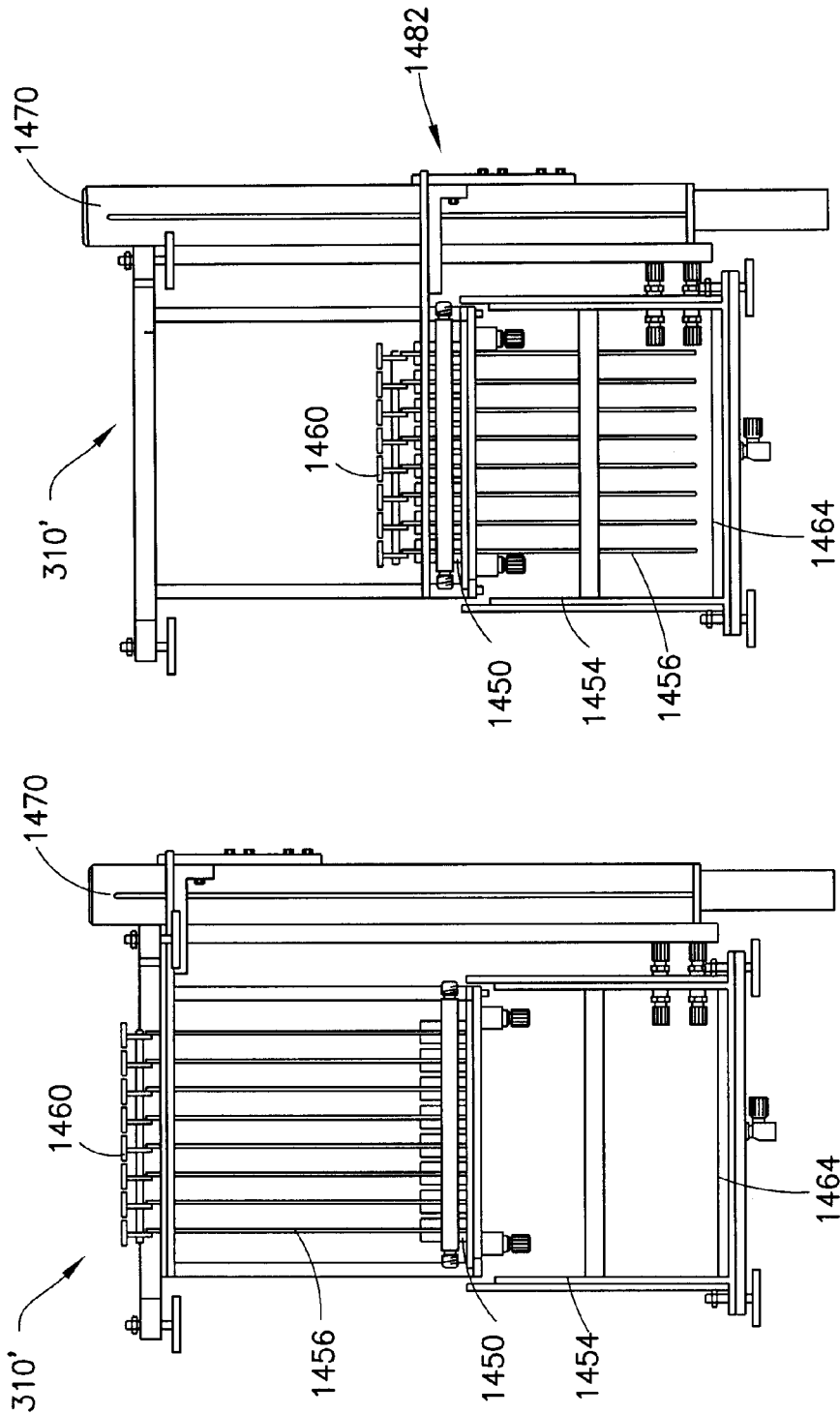

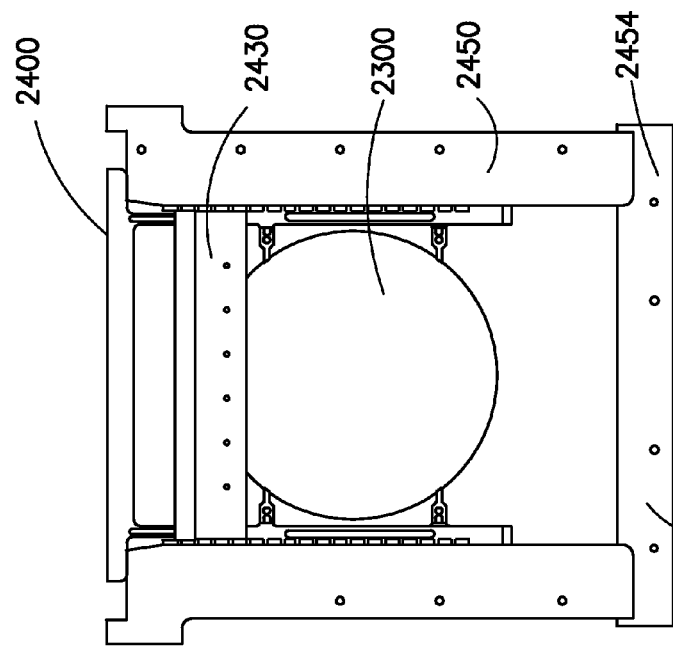
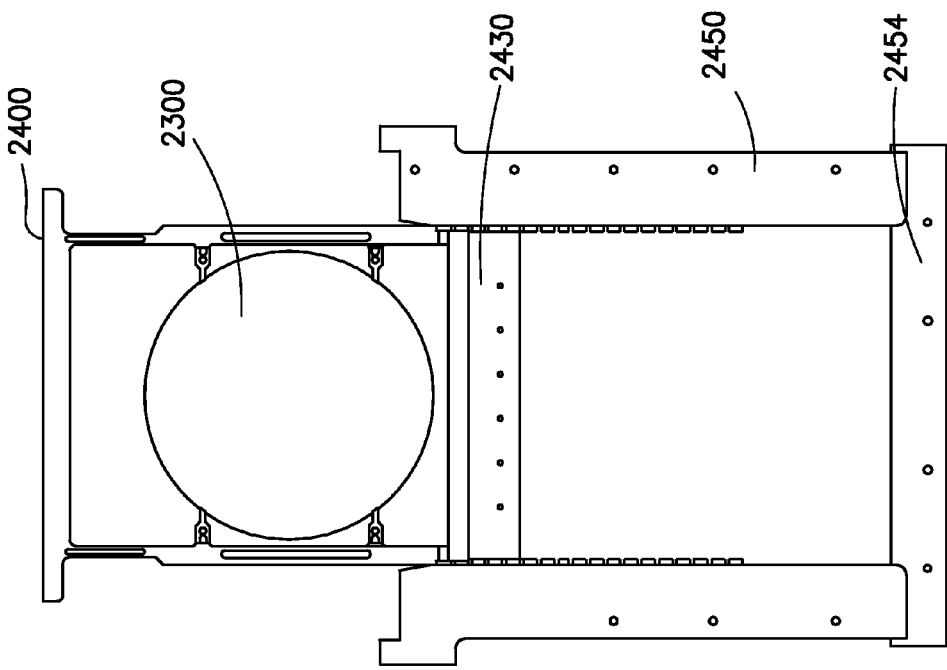
FIG. 62B
FIG. 62A

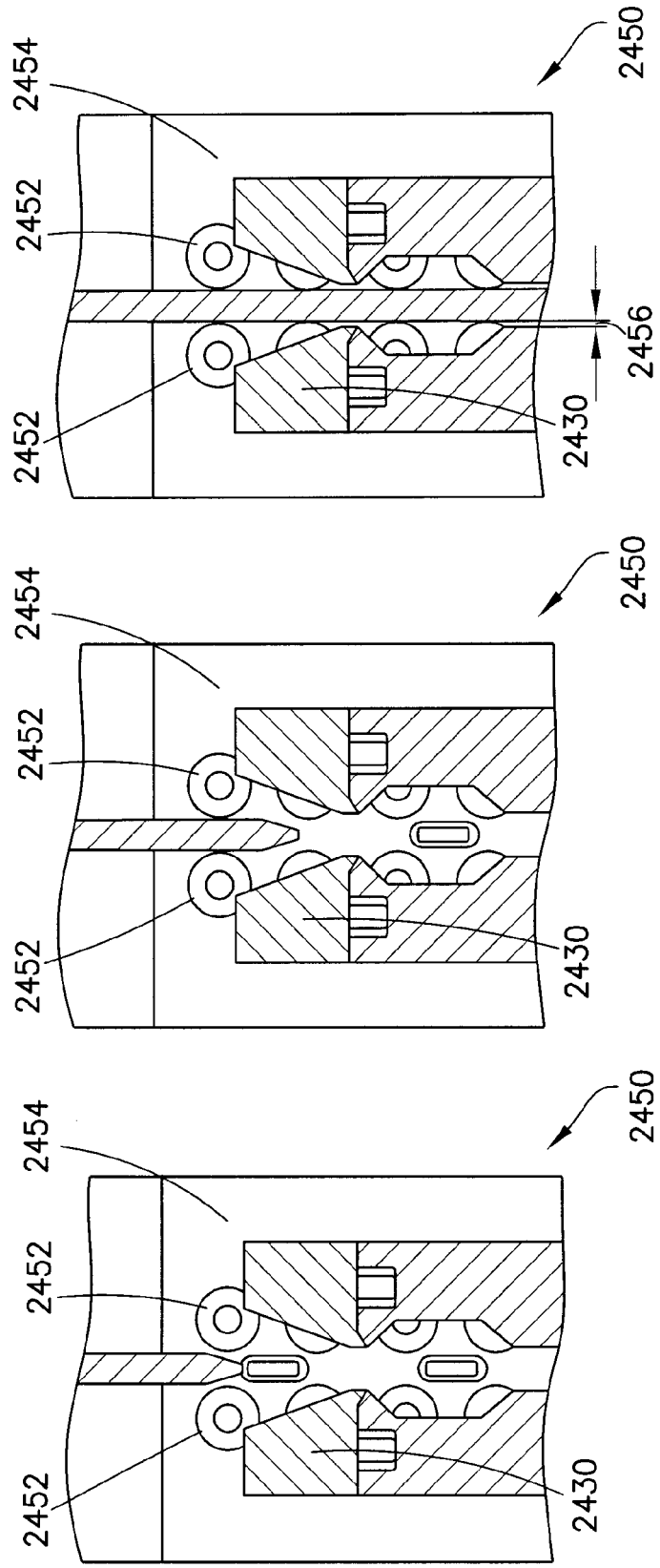

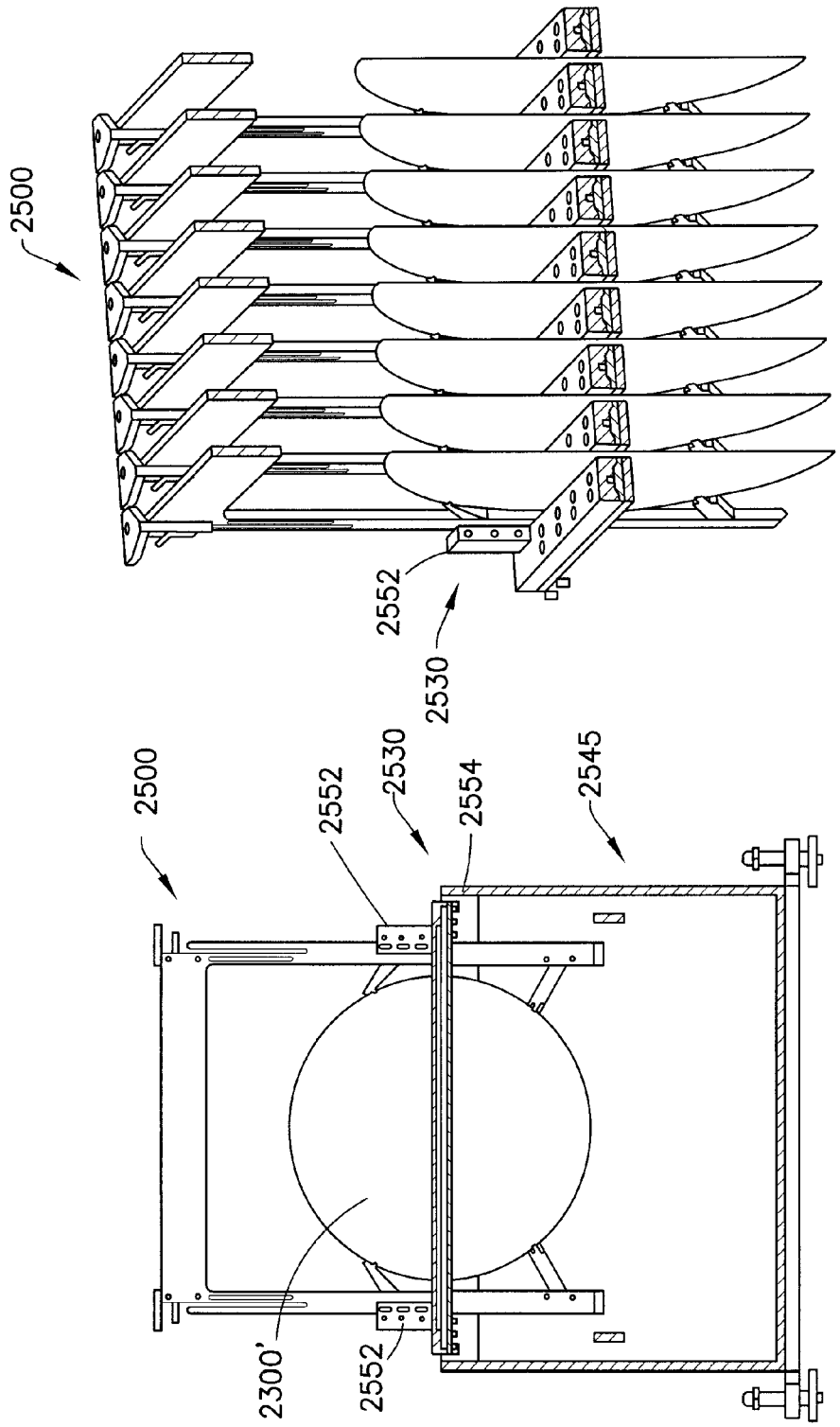

PARALLEL SINGLE SUBSTRATE PROCESSING SYSTEM WITH ALIGNMENT FEATURES ON A PROCESS SECTION FRAME

RELATED APPLICATIONS

This application claims the benefit of and priority from U.S. Provisional Patent Application Ser. No. 61/493,183 entitled "SUBSTRATE PROCESSING SYSTEM", filed on Jun. 3, 2011; U.S. Provisional Patent Application Ser. No. 61/589,697 entitled "PARALLEL SINGLE SUBSTRATE PROCESSING SYSTEM", filed on Jan. 23, 2012; and U.S. Provisional Patent Application Ser. No. 61/590,199 entitled "MARANGONI DRYER APPARATUS", filed on Jan. 24, 2012; all of which are incorporated by reference herein in their entirety. This application is related to U.S. patent application Ser. No. 13/488,343, filed Jun. 4, 2012 entitled "PARALLEL SINGLE SUBSTRATE PROCESSING SYSTEM"; U.S. patent application Ser. No. 13/488,407, filed Jun. 4, 2012 entitled "PARALLEL SINGLE SUBSTRATE PROCESSING SYSTEM HOLDER"; U.S. patent application Ser. No. 13/488,433, filed Jun. 4, 2012 entitled "PARALLEL SINGLE SUBSTRATE PROCESSING SYSTEM LOADER", now abandoned; U.S. patent application Ser. No. 13/488,090, filed Jun. 4, 2012 entitled "PARALLEL SINGLE SUBSTRATE PROCESSING SYSTEM"; U.S. patent application Ser. No. 13/488,416, filed Jun. 4, 2012 entitled "PARALLEL SINGLE SUBSTRATE PROCESSING AGITATION MODULE"; U.S. patent application Ser. No. 13/488,329, filed Jun. 4, 2012 entitled "PARALLEL SINGLE SUBSTRATE MARANGONI MODULE"; and U.S. patent application Ser. No. 13/488,354, filed Jun. 4, 2012 entitled "PARALLEL SINGLE SUBSTRATE PROCESSING FLUID JET MODULE".

BACKGROUND

1. Field

The exemplary embodiment generally relates to a substrate processing system and, more particularly, to vertical fluid parallel single wafer processing system.

2. Brief Description of Related Developments

Fluid processing, among other processes, is used as a manufacturing technique for the application or removal of films and materials to various structures and surfaces, such as semiconductor wafers and silicon work pieces or substrates. Fluid processing in a vertical orientation allows full immersion of the substrate being processed and manipulation of the fluid in close proximity to the surface of the wafer. A problem arises where transport and processing of substrates in a vertical orientation requires precise positioning with little risk of damage to the substrate during transport or processing. A further problem arises where transport and processing of substrates from a horizontal to a vertical orientation requires a high reliability and high speed transport system. Accordingly, there is a desire for new and improved methods and apparatus for transporting and processing substrates in a vertical orientation.

BRIEF DESCRIPTION OF THE DRAWINGS

The foregoing aspects and other features of the disclosed embodiments are explained in the following description, taken in connection with the accompanying drawings, wherein:

FIG. 9 shows a partial side view of an exemplary parallel single substrate processing system;

FIG. 10 shows a partial end view of an exemplary parallel single substrate processing system;

FIG. 11 shows a partial isometric view of an exemplary parallel single substrate processing system;

FIG. 13 shows a wafer holder;

FIG. 14 shows a wafer holderfinger

FIG. 19 shows an isometric view of a loader module;

FIG. 23A shows a front view of a loader module and a holder array on a transporter;

FIG. 23C shows a section view of a holder crossmember;

FIG. 24A shows a partial front view of a loader module and a holder array;

FIG. 24B shows a partial front view of a loader module and a holder array;

FIG. 24G shows a partial front view of a loader module and a holder array;

FIG. 24H shows a partial front view of a loader module and a holder array;
FIG. 24I shows a partial front view of a loader module and a holder array;
FIG. 24M shows a partial front view of a loader module and a holder array;
FIG. 27 shows a partial isometric view of a loader module;
FIG. 29B shows a transporter and array motion and state table;
FIG. 29C shows a transporter and array motion and state table;
FIG. 33A shows an isometric view of a shear plate agitation module;
FIG. 33B shows an isometric view of a shear plate agitation module;
FIG. 33C shows an isometric view of a shear plate agitation module;
FIG. 48A is an isometric view of a parallel single wafer processing module;
FIG. 48B is an isometric view of a parallel single wafer processing module;
FIG. 49A is a side view of a parallel single wafer processing module;
FIG. 49B is a side view of a parallel single wafer processing module.

FIG. 62A is a side view of a wafer holder and a process module in a first position;
FIG. 62B is a side view of a wafer holder and a process module in a second position;
FIG. 63A is a section view of a wafer holder and a process module;
FIG. 63B is a section view of a wafer holder and a process module;
FIG. 63C is a section view of a wafer holder and a process module;
FIG. 64 is a side view of an array of wafer holders and a process module;
FIG. 65A is a section view of an array of wafer holders and a process module.

DETAILED DESCRIPTION

Figure 1:
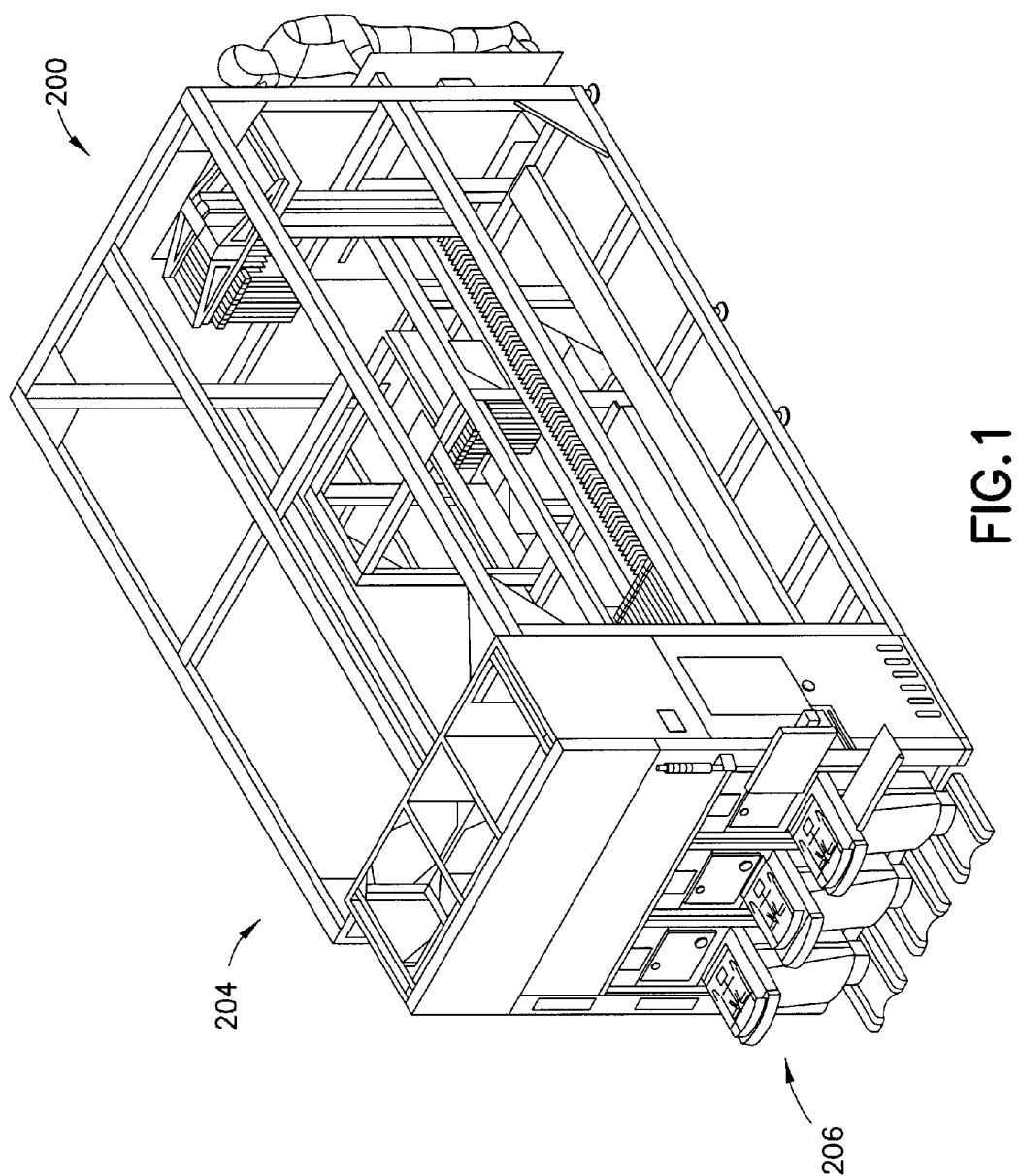
FIG. 1 shows an isometric view of an exemplary parallel single substrate processing system.

FIG. 1 illustrates a parallel single substrate processing system in accordance with an aspect of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

Figure 2:
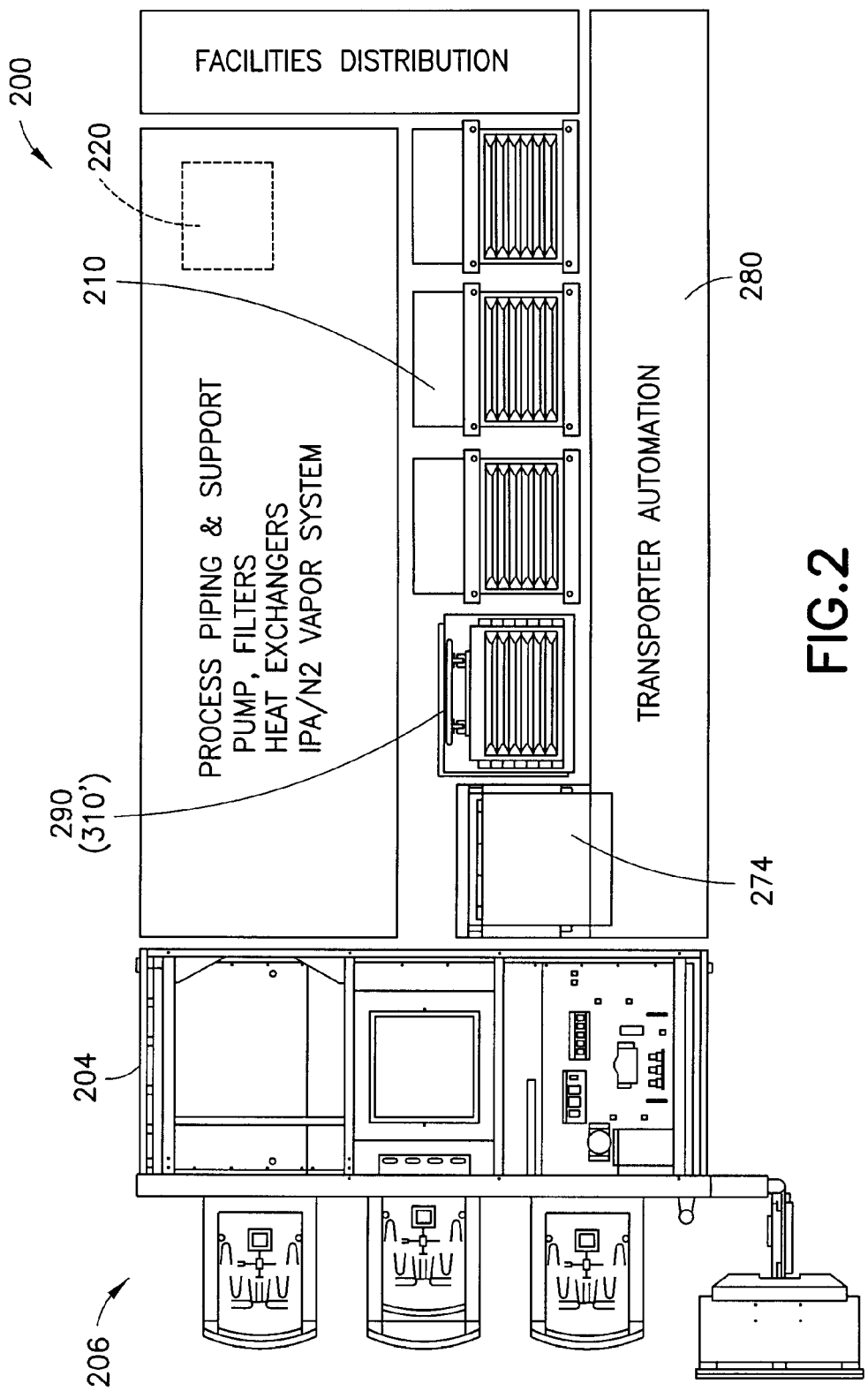
FIG. 2 shows a top view of an exemplary parallel single substrate processing system.
Figure 3:
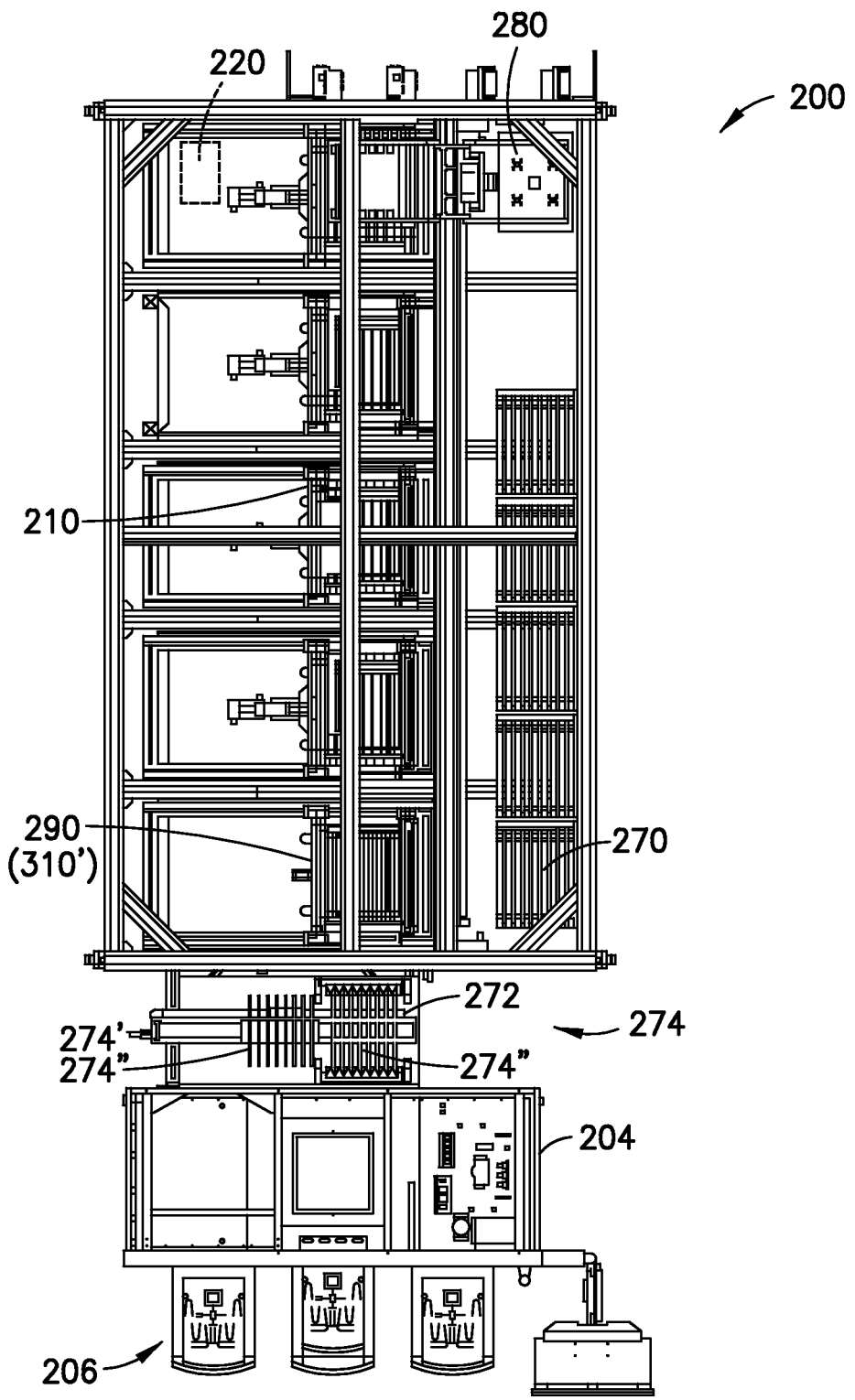
FIG. 3 shows a top view of an exemplary parallel single substrate processing system.
Figure 4:
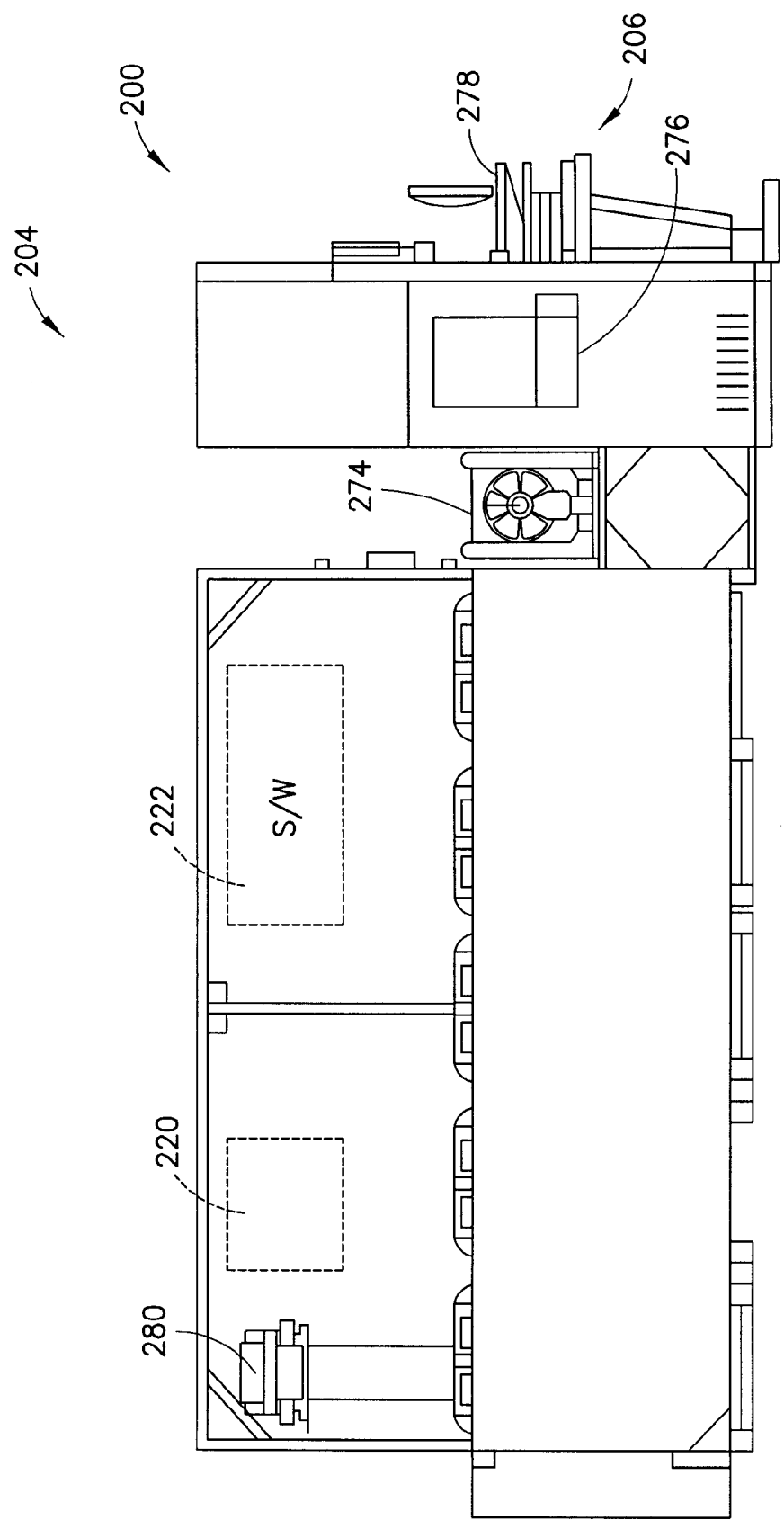
FIG. 4 shows a side view of an exemplary parallel single substrate processing system.

Referring now to FIG. 1, there is shown an isometric view of an exemplary parallel single substrate processing system 200. Referring also to FIG. 2, there is shown a top view of an exemplary parallel single substrate processing system 200. Referring also to FIG. 3, there is shown a top view of an exemplary parallel single substrate processing system 200. Referring also to FIG. 4, there is shown a side view of an exemplary parallel single substrate processing system 200. Substrate processing machine 200 may suitable for a manufacturing process using the present disclosed embodiment. The disclosed embodiment may be implemented in an electroplating, cleaning or etching system and may be used in combination with an electro deposition machine such as the Stratus from NEXX Systems in Billerica Mass. In alternate aspects of the disclosed embodiment, system 200 and modules 210 may be used in combination with any suitable substrate processing system. System 200 and modules 210 may incorporate features as disclosed in the International Application WO 2005/042804 A2 published under the Patent Cooperation Treaty and having publication date May 12, 2005 and as disclosed in U.S. Publication No. 2005/0167275 published Aug. 14, 2005 and entitled method and apparatus for fluid processing a work piece, both of which are hereby incorporated by reference herein in their entirety. System 200 is shown as an exemplary system. In alternate aspects of the disclosed embodiment, more or less modules may be provided having different configurations and locations. Machine 200 may have features as disclosed in U.S. Provisional Patent Application No. 61/493,183 filed on Jun. 3, 2011 and entitled Substrate Processing System which is hereby incorporated by reference herein in its entirety. Machine 200 may contain load ports 206 by which substrates previously processed, such as being patterned with photoresist or otherwise processed are inserted and withdrawn from the system. Loading station 204 may have a robotic arm 276 which transfers substrates 278 indirectly or directly into wafer loader module 274 where wafer loader module 274 may load wafer(s) to holders 270, 272. Loader module 274 may be a batch exchange loader having a shuttle with an input 274', loading/unloading 274" and output 274'" positions as will be described in greater detail below. In alternate aspects of the disclosed embodiment, loader module 274 may have features allowing for rotating holder 270 and gripping and ungripping one or more wafers either in parallel or selectively of holder 270. In alternate aspects of the disclosed embodiment, robotic arm 276 may transport a single wafer, a batch of wafers or a combination thereof. In alternate aspects of the disclosed embodiment, more than one loader module 274 may be provided to load holders 270, 272 in parallel or to load wafers onto different types of holders where holders 270, 272 may have different features or be used for different types of processes. In alternate aspects of the disclosed embodiment, loading station 204 may have a robotic arm 276 which transfers substrates 278 directly into substrate-holders 270, 272 which are then transferred by transport 280 to modules 210 and processed either in parallel, in succession or in combination parallel and succession. In one aspect of the disclosed embodiment, transporter 280 or a separate holder support may have features allowing for the direct handoff of wafers from robot 276 to holder 270 where transporter 280, for example, would have features allowing for rotating holder 270 and gripping and un-gripping one or more wafers either in parallel or selectively of holder 270. Although one transporter 280 is shown, more may be provided operating in parallel or otherwise. By way of example, substrate holders 270, 272 may feature a single wafer or a batch wafer flexure wafer holding mechanism as further described in the disclosed embodiment to follow. In alternate aspects of the disclosed embodiment, holders 270, 272 may be a combination of flexure wafer holding mechanism as further described and wafer holders as disclosed in the aforementioned publications with respect to the Stratus system from NEXX Systems in Billerica Mass. In alternate aspects of the disclosed embodiment, any suitable combination of holder(s) may be utilized within system 200. Process modules 210 may have features as further described in the disclosed embodiment to follow, for example, where modules 210 may be suitable for electroplating wafers, anodizing wafers, cleaning wafers, such as liquid stripping of photoresist, seed layer etching, general wafer cleaning or otherwise. In the disclosed embodiment, waferholders and the associated process apparatus utilize a flexure based wafer-holding mechanism to process wafers in a vertical orientation and thereby utilize various aspects of a vertical orientation for fluid processing to allow for full immersion of the wafer into a fluid bath and to facilitate agitating the fluid near the surface of the wafer, for example by SHEAR PLATE agitation close to the wafer surface either alone or in combination with various nozzle jets close to the wafer surface, either for spraying liquid or gas at the wafer surface or for drying via the Marangoni effect as wafers are vertically withdrawn from an immersed condition into an ambient atmosphere non-immersed condition or for drying via blowing a gas, such as clean dry nitrogen, through a linear nozzle or plurality of nozzles, toward the wafer surface. The disclosed embodiment encompass both single wafer vertical processing and batch wafer vertical processing or a combination of single and batch wafer vertical processing. For example, single wafer holders may be processed in a single wafer process and then subsequently ganged together for one or more batch process. Alternately, system 200 may have all single or all batch wafer processing. In alternate aspects of the disclosed embodiment, the flexure based wafer holders may be used in processing in any suitable orientation, vertical, horizontal or otherwise. In either single or batch wet processing tools, as will be described in greater detail, a provision is further disclosed for precision location of wafer surfaces relative to the fluid process elements where the fluid process elements may be one or more agitation paddle(s) or member(s) (e.g. SHEAR PLATE agitation members), linear fluid drains, linear nozzle air or N2 knives, Marangoni-dry linear nozzles and nozzle arrays for wafer holder arrays, scanning nozzle arrays or otherwise. Controller(s) 220 may be provided within each station or module to sequence the process and/or transport within the station or module. A system controller(s) 222 may be provided within the system 200 to sequence substrates between the stations or process modules and to coordinate system actions, such as, host communication, lot loading and unloading or otherwise those actions that are required to control the system 200. In alternate aspects of the disclosed embodiment, process modules 210 may include a combination of cleaning and electro deposition modules. In alternate aspects of the disclosed embodiment, more or less modules in more or less suitable combinations may be provided in any suitable combination. As such, all such variations, alternatives and modifications of system 200 configurations are embraced.

Figure 7:
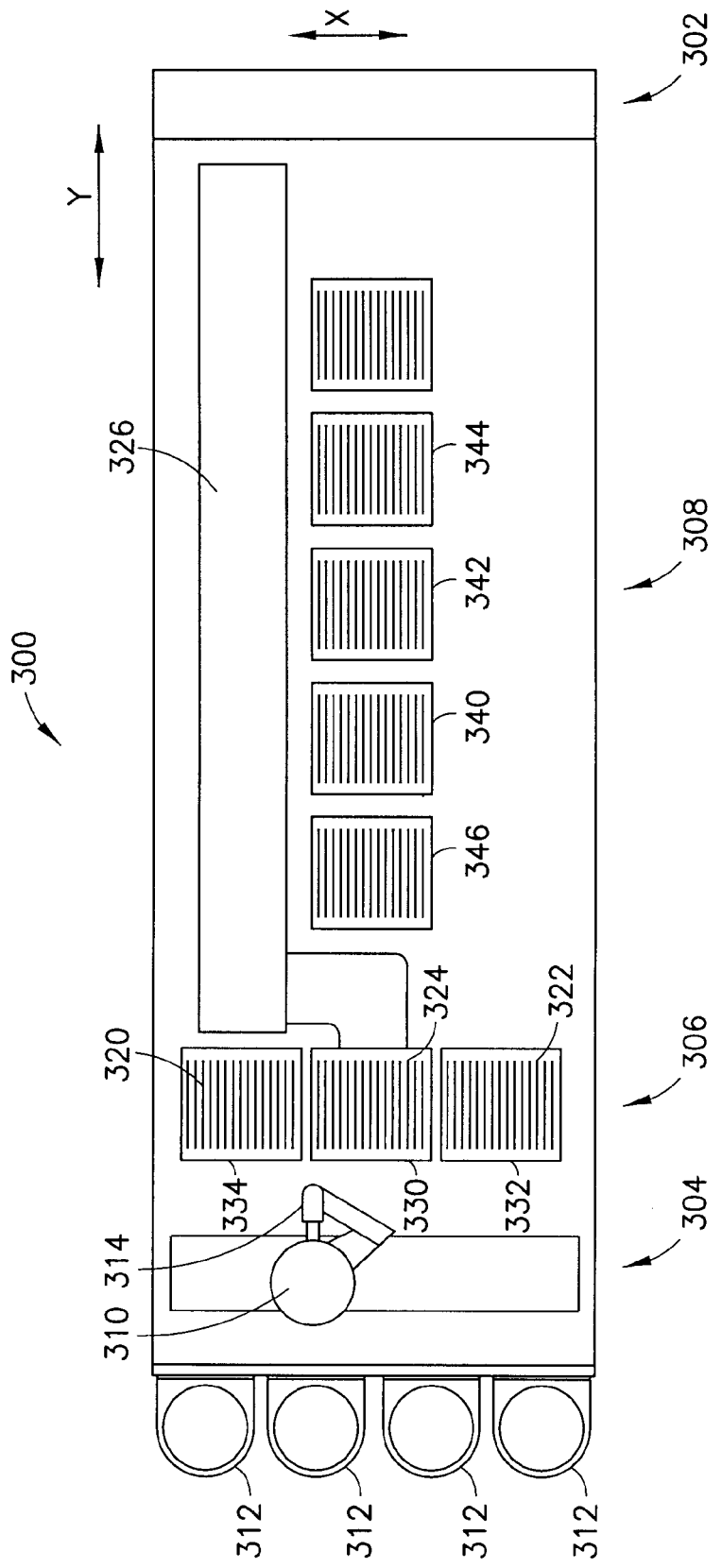
FIG. 7 shows a top view of an exemplary parallel single substrate processing system.
Figure 8:
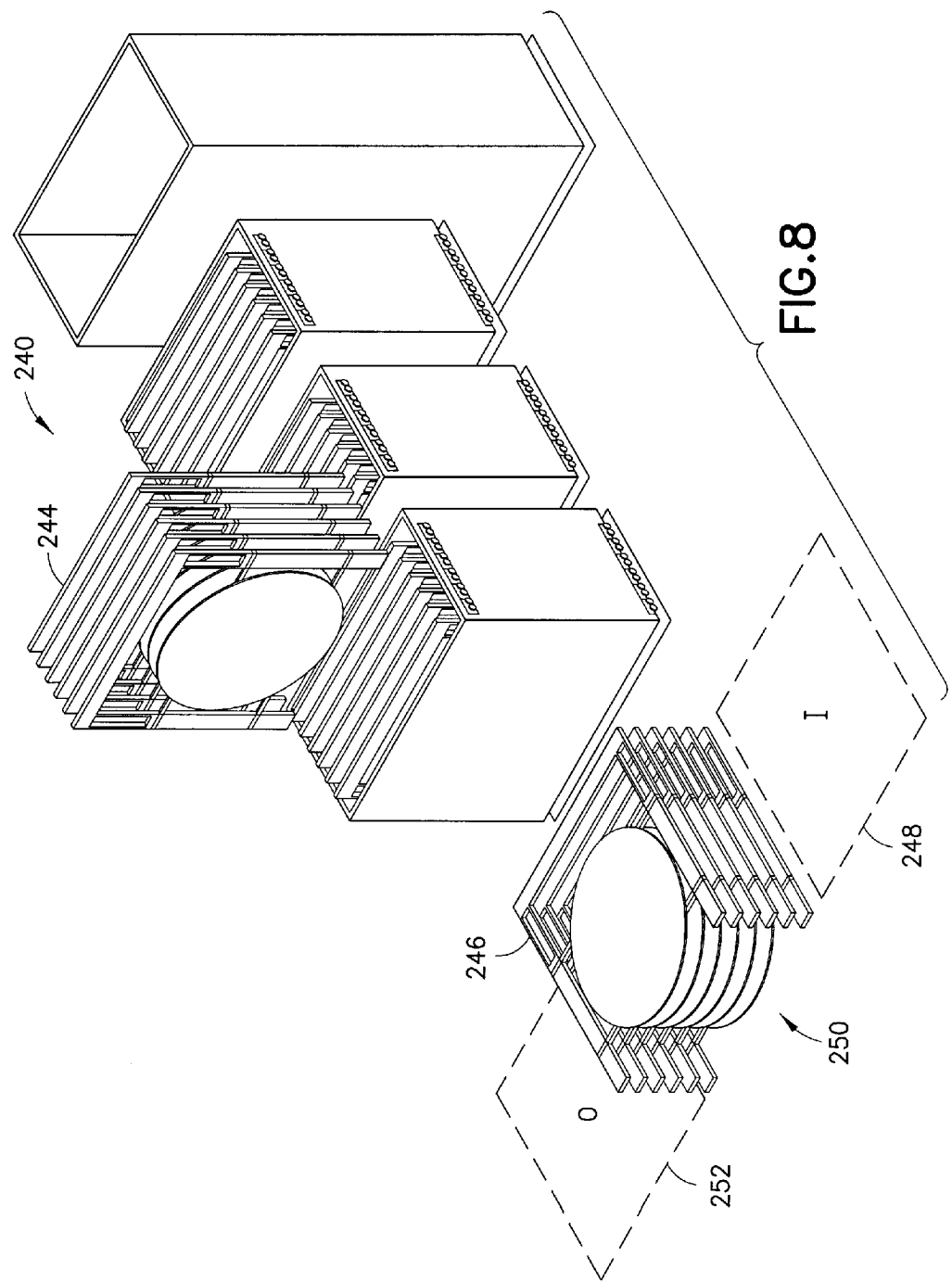
FIG. 8 shows a partial isometric view of an exemplary parallel single substrate processing system.

Referring now to FIG. 8, there is shown a batch wafer process system or parallel single substrate processing system 240. Referring also to FIG. 9, there is shown a side view of batch wafer process system or parallel single substrate processing system 240. Referring also to FIG. 10, there is shown an end view of batch wafer process system or parallel single substrate processing system 240. In the disclosed embodiment, there may be three levels in the tool: (1) transport 256, (2) process 258, and (3) Marangoni-dryer 260. In the embodiment shown, a transporter (not shown) may handle a multiplicity of wafer holders 244, 246 between process modules 262, 264, 266, 268, 270, for example along axes 272, 274. In the embodiment shown, six wafer holders are shown in each array 244, 246. In alternate aspects of the disclosed embodiment, any suitable number of wafer holder(s) may be used in each array, for example, 1, 13 or any suitable number. The virtual array 244 of wafer holders may be moved through the tool from process to process by the transporter. As will be described below in greater detail with respect to the embodiment shown in FIG. 7, a shuttle may be provided having a load/unload position 250, an input position and/or array 248 and an output position and/or array 252. By way of example, wafers to be processed may be loaded, for example, from a wafer carrier or FOUP into array 248, shuttled to load position 250 and transferred to holder 246 to be processed. By way of further example, wafers that have been processed may be transferred from holder 246 to output array 252 at unload position 250 and shuttled to output position 252 to be unloaded for post processing or to be transferred to a wafer carrier or FOUP or otherwise. In alternate aspects of the disclosed embodiment, a single shuttle array may be used to accept processed wafers from and supply unprocessed wafers to holder 246 as will be described. Although in the embodiment shown holder array 246 is shown horizontal, in alternate aspects of the disclosed embodiment, array 246 may be in a vertical orientation. In alternate aspects of the disclosed embodiment, array 246 may be shuttled from position 250 to position 252 or from position 248 to position 250 for transfer of wafers directly to or from a robot without the use of intermediate arrays. Further, in alternate aspects of the disclosed embodiment, separate load and unload stations may be provided, for example, in line with input and output stations 248, 252 or in line with the process modules. Further, in alternate aspects of the disclosed embodiment, for loading and unloading the wafer, holders may be inserted into a Load-Station which rotates the whole array 90 degrees to allow for horizontal wafer transfer. Here, load station 250 may be provided to drop the wafer holder 246 blades off into a cradle that can rotate 90 degrees to present the wafers horizontally and provide a simple cam driven actuation to pry open the flexures to allow for wafer transfer. In the disclosed embodiment, the transporter may carry an array of wafer holders without building the array into a "cassette" of any sort, and instead simply treating the wafer holder as a blade, which is formed into an array each time a multiplicity of them are picked up by the transporter. With respect to process modules 262-268, the height of the fluid line in the subsequent steps, for example, solvent rinse and DIW rinse, may be higher than the top of the wafer holder during the final rinse and dry steps. As will be described and shown in greater detail below, angled surfaces on the wafer holder may be provided to minimize fluid capture that would otherwise occur on horizontal surfaces, and allowing complete rinsing of the wafer holder. In the disclosed embodiment, system 240 may have a transporter with a wafer holder gripper that may pick-up and release an array of 6 wafer holders at time. In alternate aspects of the disclosed embodiment, the system may be configurable to handle array(s) of holders with more or less substrates or with different numbers of holders in different process modules. Further and as will be described in greater detail, Maranon-dryer module 290 and shear plate agitation fluid modules 626-268 may be provided that accept multiple wafer holders. In the disclosed embodiment, six single sided wafer holders may be spaced at about 1" to 1.5" pitch or otherwise to make up array 244. The individual wafer holders allow access to the rear surface of wafers, for example, for a Maranon-dry process and certainty of avoiding DFR particle re-deposition on the wafer backside. The system 240 potential applications may be embodied with either batch loading in a horizontal or vertical plane, single wafer loading in a horizontal or vertical plane or a combination of single and/or batch loading with any suitable combination of process and/or holder types. In the disclosed embodiment, an exemplary system layout is shown for batch or parallel single substrate processing, for example, for photoresist strip. Here, an example of an embodiment for the vertical wafer fluid processing tool is for batch removal of dry film photoresist. By way of example, modules 262-268, 290 may be one or more of a Batch SHEAR PLATE agitation pre-soak tank, Batch SHEAR PLATE agitation resist dissolution tank, Batch SHEAR PLATE agitation IPA clean tank and/or Batch Marangoni IPA dryer tank 290 or any other suitable combination of one or more process modules. As shown, there are 4 or 5 process stations where the final DI water rinse may be combined into the process station of the Marangoni dryer 290. In alternate aspects of the disclosed embodiment, more or less modules may be added to eliminate any bottlenecks in the processing where different steps may also have the same or different batch sizes used alone or in combination with other batch sizes. Accordingly, the disclosed embodiment is intended to embrace all such combinations.

Figure 5:
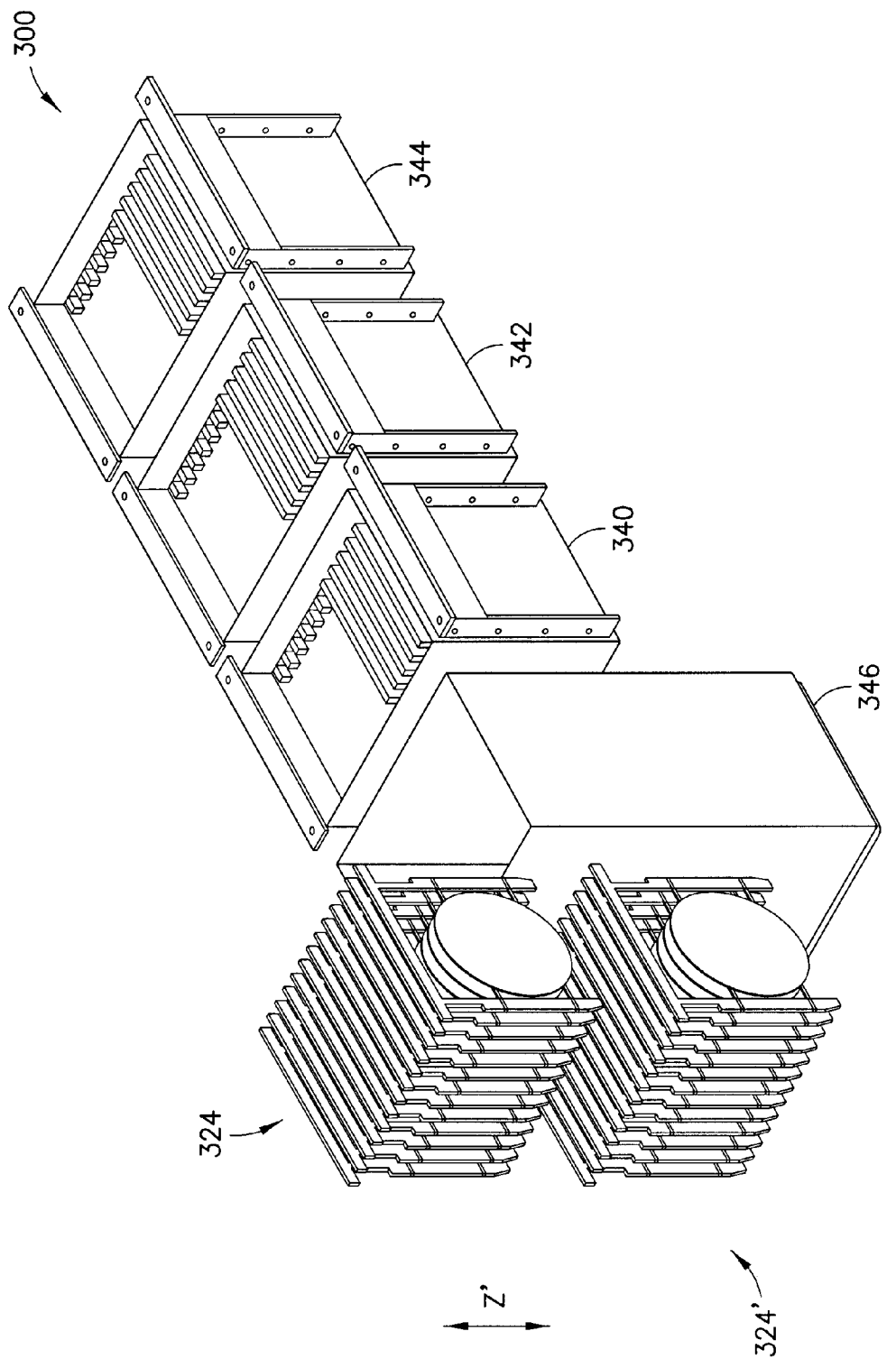
FIG. 5 shows a partial isometric view of an exemplary parallel single substrate processing system.
Figure 6:
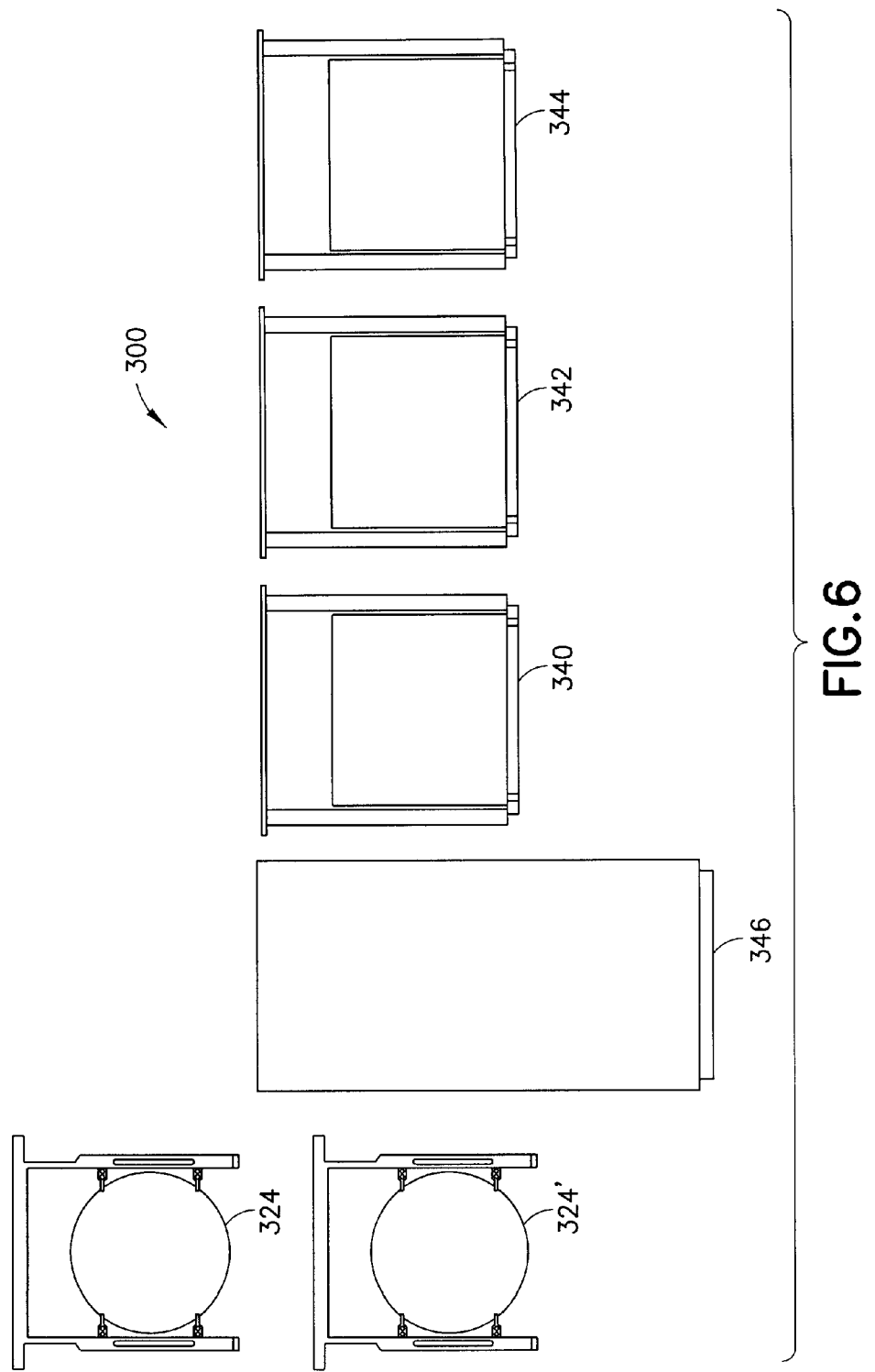
FIG. 6 shows a partial side view of an exemplary parallel single substrate processing system.

Referring now to FIG. 7, there is shown a top view of an exemplary parallel single wafer processing system 300. Referring also to FIG. 5, there is shown a partial isometric view of batch parallel single wafer process system 300. Referring also to FIG. 6, there is shown a partial side view of parallel single wafer process system 300. In the embodiment, system 300 has wafer transport portion 304, batch load and unload portion 306, process portion 308 and storage or power distribution portion 302. Here, a substrate transport system transports substrates between process modules 340, 342, 346, 344 and carriers 312. Here, and as will be described in greater detail, system 300 has an array of wafer holders, the array of wafer holders having individual holders that are moveable and independently positionable with respect to the other holders in the array of holders. Transporter 326 is adapted to transport the array of holders as a unit from process modules 340, 342 to a loader 324 where loader 324 is adapted to unload substrates from the array of holders and load new wafers to the array of holders in a fast swap operation. Substrate transport robot 314 transports the substrates between the loader 324 and the carriers 312. Wafers 310 may be transported from pod door openers 312 by robot 314 to or from input shuttle array 322 or output shuttle array 320. Robot 314 may have a single arm and end effector or two arms and/or two end effectors, for example, to simultaneously load input and remove output wafers. Loader and unloader 306 has a shuttle that may selectively position input shuttle array 322 from input position 332 to load position 330. Loader and unloader 306 has a shuttle that may selectively position output shuttle array 320 from output position 334 to unload position 330. As will be described in greater detail below, at load and/or unload position 330, transporter 326 may transport wafer holder array 324 to load and/or unload position 330 to load a batch of wafers to be processed from input shuttle array 322 to wafer holder array 324 or to unload a batch of wafers that have been processed from wafer holder array 324 to output shuttle array 320. One or more shuttle array(s) 320, 322 may be provided where shuttle array(s) 320, 322 may have the same number of holder positions as wafer holder array 324 or alternately may have more positions as will be described in greater detail below, for example, where shuttle array 320 is capable of simultaneously holding both an input and output batch of wafers for fast swap with wafer holder array 324. In alternate aspects of the disclosed embodiment, shuttle 306 may not be provided with shuttle array(s), for example, where wafer holder array 324 is transported by shuttle 306 to position 330, 332, 334 or otherwise where shuttle may have the capability to re-orient and/or actuate members of holder 324 and facilitate direct transport of wafers between robot 314 and wafer holder array 324. In alternate aspects of the disclosed embodiment, additional and/or separate load and unload positions may be provided and more or less input and/or output positions may be provided. For example, a single position or shuttle array may be used for input and output or separate load and unload positions may be provided. The shuttle may have a single shuttle axis or multiple axis, for example, to independently position one or more shuttle arrays. Batch arrays may be employed in the disclosed embodiment to enable faster transfer, for example, 250 wafer per hour mechanical throughput, for example, which may be used for front-end cleans, strip cleans or otherwise, and to provide improved tool layout and access. In the embodiment shown, side mounted Transporter robot 326 is shown, for example with a main bearing and automation mounted low on the side of tool 300. System 300 utilizes vertical wafer transfer using Shuttle 320, 322, allowing for pre-load or post-unload of Shuttle 320, 322 by wafer-robot 314 where robot 314 may have a supinating wrist so that transfer to shuttle array 320, 322 may be accomplished in vertical orientation. Here, a 13 wafer batch of wafer holders 324 may be exchanged, for example, in 30 seconds between Transporter 326 and shuttle 320, 322, decoupling the front-end wafer robot 314 from transporter 326 actuation. Further and as will be described in greater detail, a cantilevered structure for tank automation is shown for shear plate modules 340, 342 and 344 and Marangoni module 346. System 300 is shown having a wide tool structure, encompassing a 4 FOUP front-end 304 and allows for both the Vertical-Transfer-Loader 330 and the Side-Robot 326. The wafer plane is shown parallel to the Y axis of movement through the tool. Heated covers may be provided close over the wafer section, and under the handle section of the wafer holder after wafer holder arrays are inserted into process tanks, thereby avoiding condensation of hot stripper or other chemistry on the wafer holder cross-beam. As will be described, batch Marangoni dry 346 may have 13 meniscus interfaces being balanced simultaneously. In the embodiment shown, a 13 element wafer holder batch having a direction of travel (Y-direction) parallel to wafer surface is shown. In alternate aspects of the disclosed embodiment, any suitable number of wafers or elements or orientation of travel may be provided. In FIG. 5 and FIG. 6, two wafer holder batches are shown, one in the process position 324' in the Loader 330, and one in the Transport position 324 where 326 transports the wafer holder array between the two positions as well as in the y axis direction. Marangoni dryer module 346 is shown taller and may have an integrated lift. The load-station 330 into which the wafer holder array batch 324 is deposited by transporter 326 is such that the wafer holder batch 324 is held in fixed position by loader 330 where transporter 326 may release wafer holder array 324 and move away to other activity. Z motion of about 20" or otherwise may be required by transporter 326. In alternate aspects of the disclosed embodiment, transporter 326 may further have an x axis or one or more suitable rotation axis to selectively position wafer holder array 324 in any suitable orientation, for example, where more or less loading stations or process or post process modules may be provided in different locations or otherwise. Actuation may be provided on load-station 330 that pushes open the legs of wafer holder 324 to release the Wafers. An X-motion Shuttle may be provided that has positions for Input-Wafers 322 and Output-Wafers 320, for example, three positions for each wafer in the wafer holder batch. In alternate aspects of the disclosed embodiment, any suitable number of selectable locations may be provided on one or more independent shuttles on the same or different axes of motion. By way of example, for a 1.5" pitch in the wafer holder batch 324 this indicates a selectable pitch, for example, a 0.5" pitch on the Shuttle, such that the Shuttle moves +−X by about 0.5" as will be described. Actuation of Top-Finger and Bottom-Cradle on shuttle array 322, 320 may be provided on the Shuttle such that these wafer contact elements may be moved radially outward, for example, by 2-3 mm from the on-center wafer edge, thereby allowing the Shuttle to move in X direction (i.e. perpendicular to the wafer surface) without contacting the Wafers held on-center by the wafer holders in wafer holder batch 324. By way of example, for a 13 position shuttle wafer holder batch 320, 322, this amounts to 2×2×13=52 actuators, most likely solenoids, that can either move in pairs to exchange a wafer with the robot 314 end effector, or all 52 simultaneously to engage with the loader 330 wafer holder batch assembly 324. Here, minimal motion is required of the shuttle, for example, only about +−0.5" for a 1.5" pitch wafer holder batch. Further, on-center transfer with the end effector avoids the risk of "dropping" the wafer from the wafer holder into the shuttle-cradle; instead the wafer is gripped simultaneously by both the end effector and the shuttle before either one lets go. Here, a "drop" of 2-3 mm may be provided. In the event a single shuttle is provided, robot 314 would be idled when the Batch transfer is being done. In contrast, when using two Shuttles as seen in FIG. 8, robot 314 may continue load/unload with the alternate Shuttle. Here, by way of example, the gain provided by the second shuttle may be greater for a smaller batch wafer holder array size.

Figure 12A:
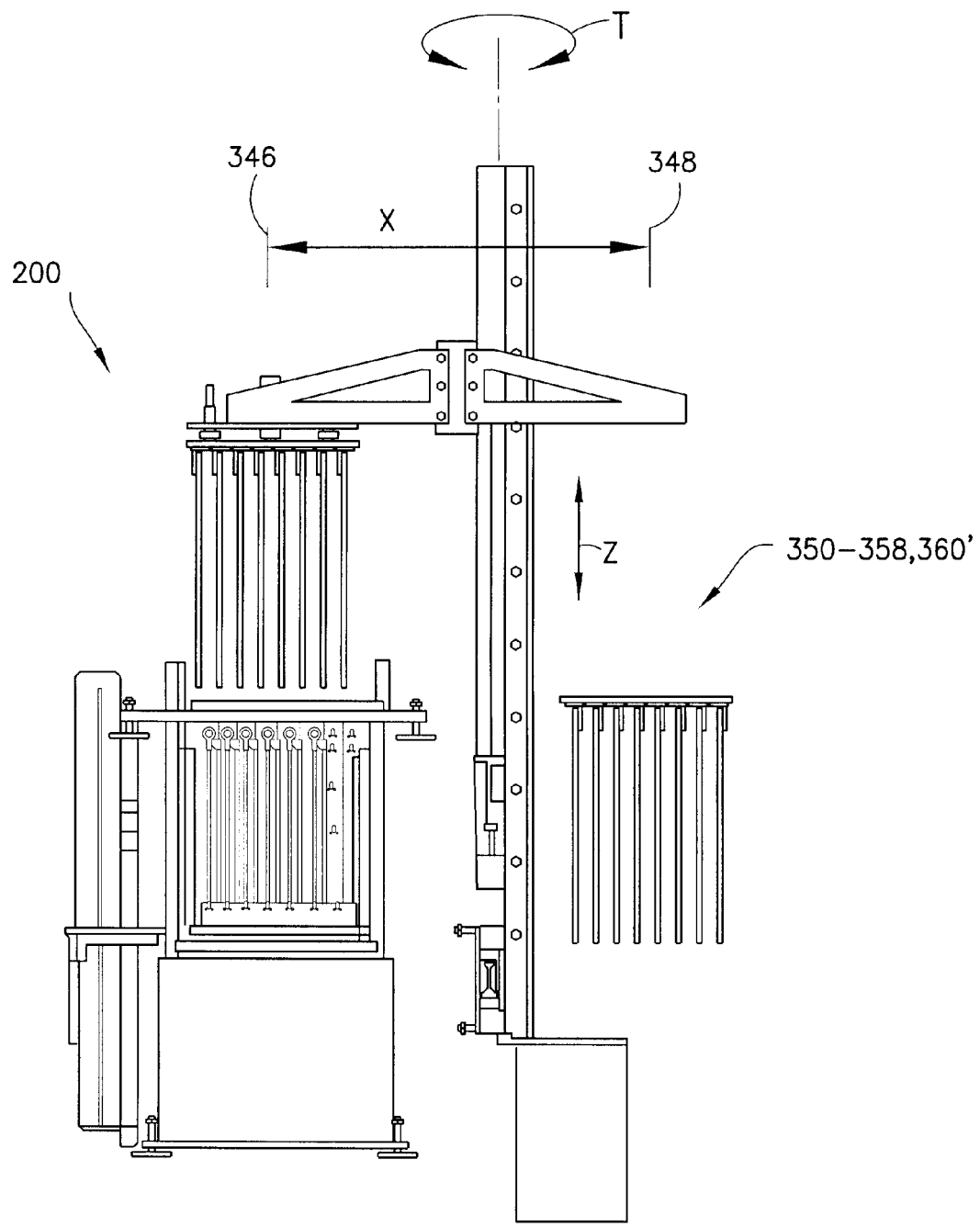
FIG. 12A shows a partial front view of an exemplary parallel single substrate processing system.
Figure 12B:
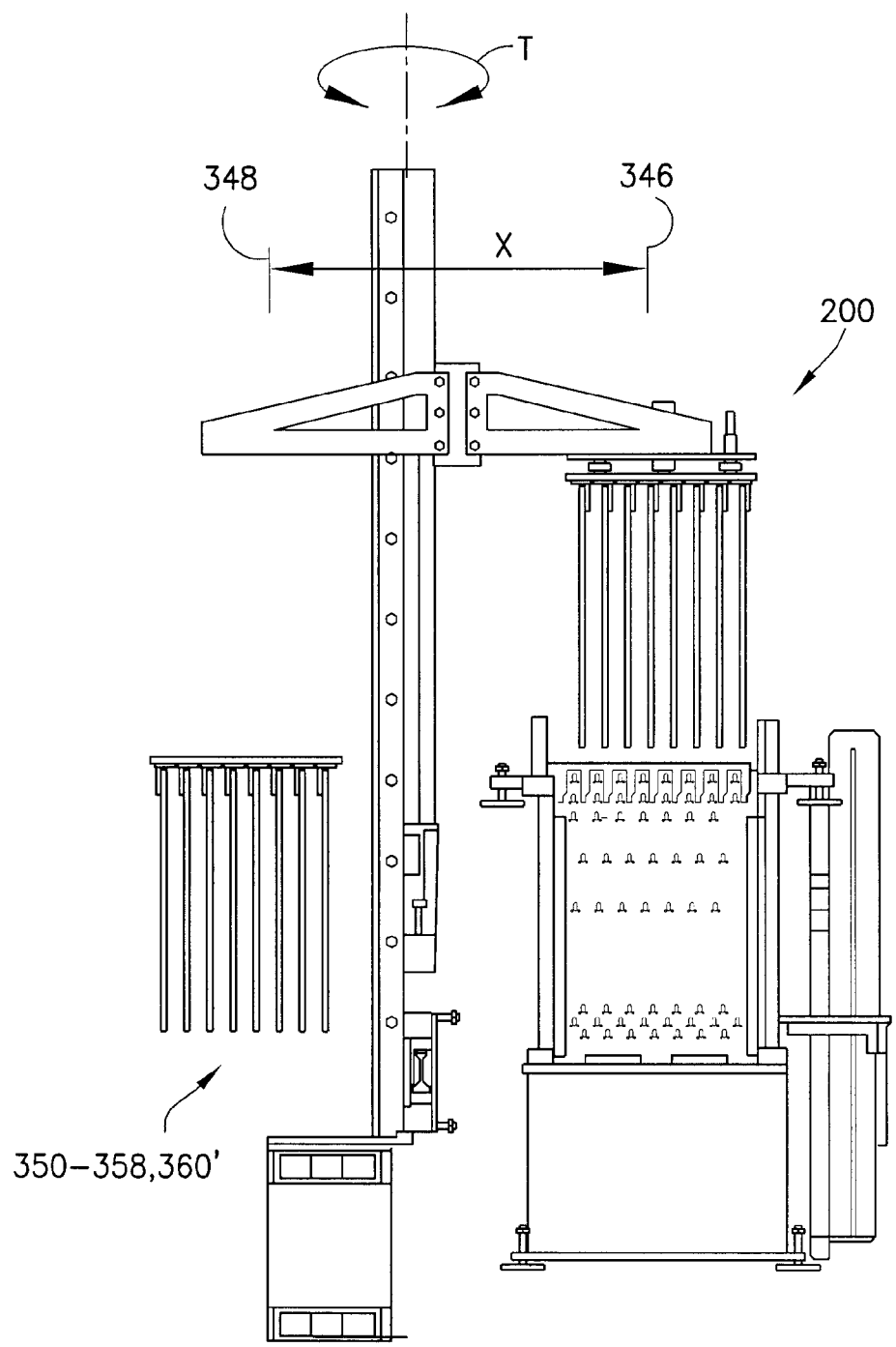
FIG. 12B shows a partial rear view of an exemplary parallel single substrate processing system.
Figure 12C:
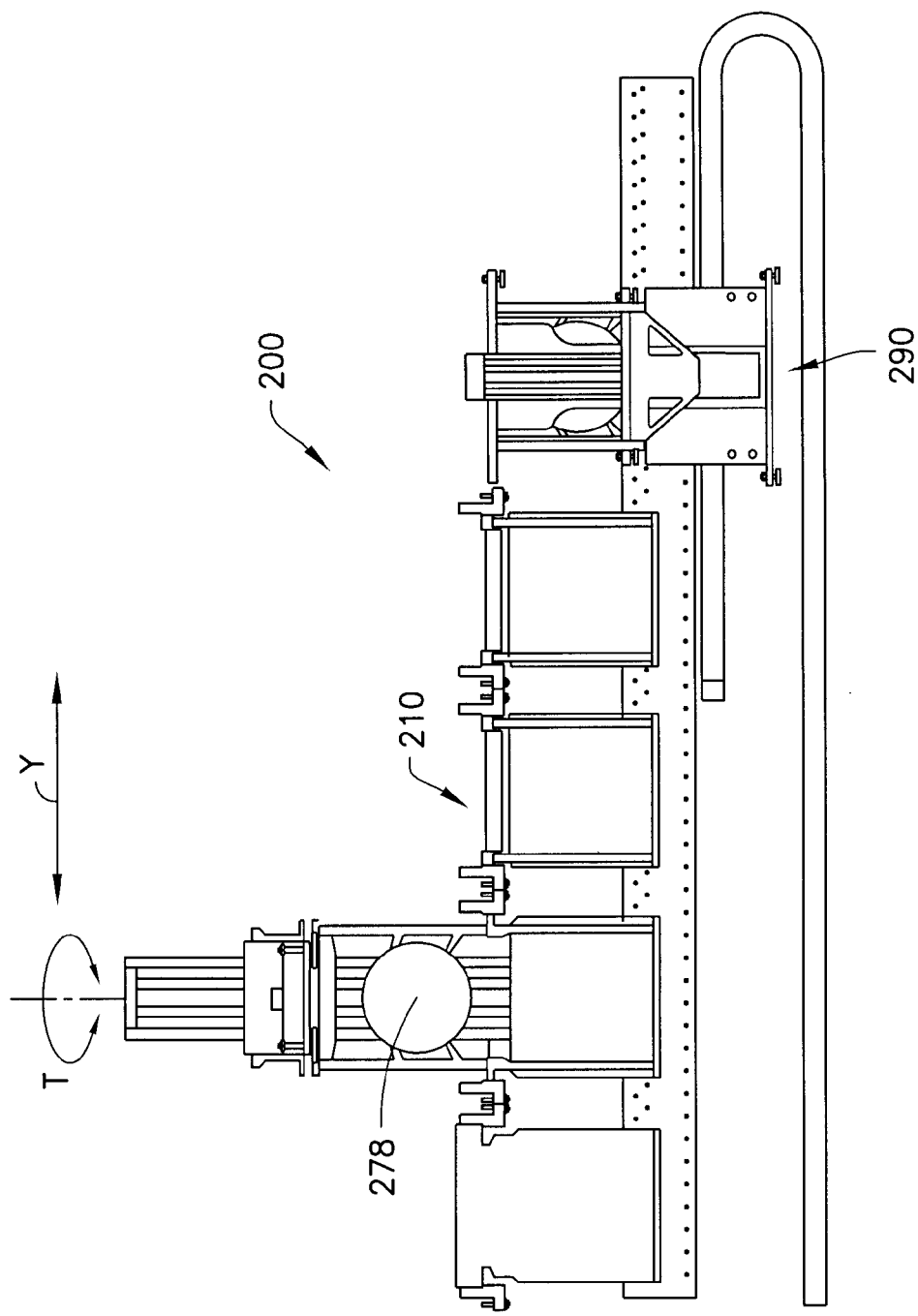
FIG. 12C shows a partial side view of an exemplary parallel single substrate processing system.
Figure 12D:
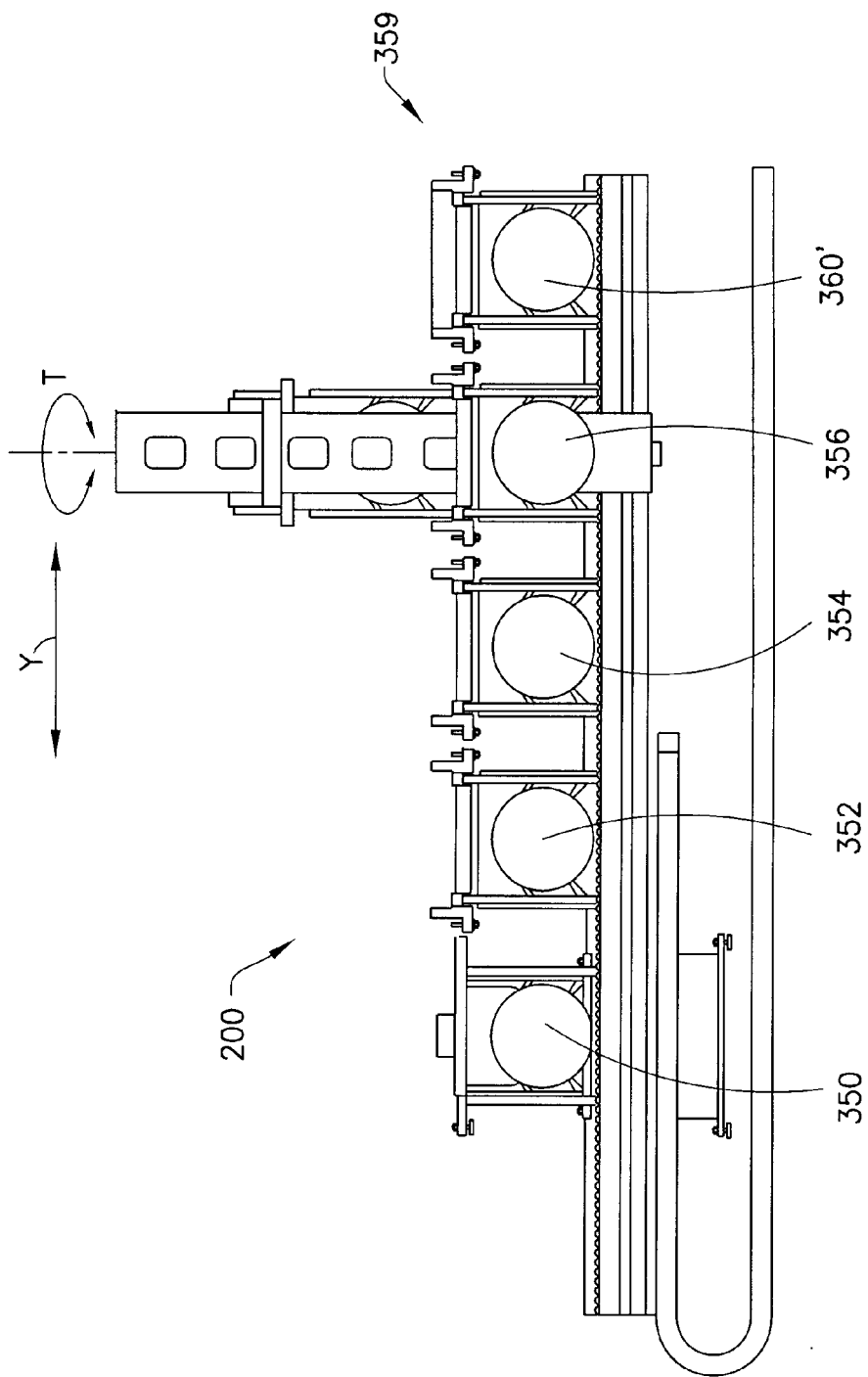
FIG. 12D shows a partial side view of an exemplary parallel single substrate processing system.

Referring now to FIG. 11, there is shown a partial isometric view of exemplary parallel single substrate processing system 200. Referring also to FIG. 12A, there is shown a partial front view of exemplary parallel single substrate processing system 200. Referring also to FIG. 12B, there is shown a partial rear view of exemplary parallel single substrate processing system 200. Referring also to FIG. 12C, there is shown a partial side view of exemplary parallel single substrate processing system 200. Referring also to FIG. 12D, there is shown a partial side view of exemplary parallel single substrate processing system 200. In the disclosed embodiment, system 200 may have processing side 346 and a buffering side. Here, for example, processing side 346 is shown having process modules 210 and Maranon dryer module 290 while buffering side 348 is shown having buffering stations 350, 352, 354, 358, 360'. In alternate aspects of the disclosed embodiment, sides 346, 348 may include all process modules or any suitable combination of process modules, buffer modules or otherwise and may be configurable to have any combination of process modules, buffer modules or otherwise. Here, transporter 280 may be configurable to move one or more arrays of holders 359 to any suitable location on side 346 or 348 and may be configured with an X axis or rotation T axis or any suitable axis to move arrays of holders 359 from side 346 to side 348 or any suitable process location, buffer location or otherwise. Alternately, transporter 280 may interface with shuttle 280' that shuttles array supporting structure 281 from side 346 to side 348. Here, transporter 280 may have a holder array supporting structure that may transport an array of holders 359 on either side 346 and/or side 348 where either side of the transporters holder array supporting structure may pick or place an array of holders 359 from or to array supporting structure 281 and where shuttle 280' shuttles array supporting structure 281 from side 346 to side 348.

In accordance with another aspect of the disclosed embodiment, system 200 for processing surfaces of a plurality of substrates is provided. System 200 has a process module 210 having a process module frame and having a plurality of process elements to process the substrate surfaces without contacting the substrate surfaces. A plurality of substrate holder assemblies 586, each having a number of substrate holders, each of which is removably coupled to the process module frame, each substrate holder in the substrate holder assembly 586 configured to hold a substrate. The process module frame 210 has alignment features aligning each of the substrate holders in the substrate holder assembly in repeatable alignment with respect to each of the process elements in the plurality of process elements with each of the process elements in the plurality of process elements being located between the substrates. A loader module 274, 400 (See FIG. 22A) configured to unload a plurality of processed substrates from each of the substrate holder assemblies and load a plurality of unprocessed substrates to each of the substrate holder assemblies. A transporter 280 is configured to transport each of the substrate holder assemblies 586 to and from the process module 210 and the loader module 274. The system further has a second process module 290, wherein the transporter is configured to transport each of the substrate holder assemblies to and from the process module 210, the second process module 290 and the loader module 274. The system further has a substrate transport front end 204 configured to transport the unprocessed substrates from substrate carriers to the loader module 274 and further configured to transport processed substrates from the loader module to the substrate carriers. The surfaces of the substrates are in a substantially vertical orientation. The plurality of process elements may be an array of agitation members that agitate a fluid proximate the substrate surfaces without contacting the substrate surfaces. The substrate holder assembly may be removable from the process module frame as a unit. Each substrate holder in the substrate holder assembly 586 may be removable from the process module frame independent of the other holders in the substrate holder assembly. Each substrate holder in the substrate holder assembly 586 may be independently moveable and positionable relative to the other substrate holders in the substrate holder assembly. Each of the substrate holders in the substrate holder assembly 586 is in repeatable alignment with respect to each of the process elements in the plurality of process elements with each of the process elements in the plurality of process elements being located between the substrates. System 200 is shown for fluid processing one or more substrate surfaces arrayed in a fluid. Each of the substrate holders in the substrate holder assembly 586 is in repeatable alignment with respect to a corresponding process element in the plurality of process elements and independent of the other process elements in the plurality of process elements with each of the process elements in the plurality of process elements being located between the substrates. The substrate surfaces are maintained in parallel alignment and in a vertical orientation.

In accordance with another aspect of the disclosed embodiment, a system 200 for fluid processing one or more substrate surfaces arrayed in a fluid is provided. System 200 has a process module or section 210 with a frame having a plurality of process elements to process the substrate surfaces without contacting the substrate surfaces. Substrate holder assembly 586 has a holder frame 946 and a number of substrate holders, each of which is coupled to the holder frame 946 and is configured for holding a substrate so that each substrate holder of the holder assembly holds a different substrate in the substrate holder assembly for transport as a unit with the substrate holder assembly to and from the process section 210. The substrate holder assembly 586 and each substrate holder thereof are removably coupled to the process section frame 210. At least one of the substrate holders of the substrate holder assembly 586 is movable relative to the holder frame and positionable in repeatable alignment with respect to a predetermined feature of the process section 210 and independent of positioning of the holder frame with respect to the process section. The holder frame may be an end effector coupled to a transporter where the transporter is configured to move the substrate holder assembly 586 to and from the process section 210, and where the transporter 280 is configured to move a different substrate holder assembly with the holder frame to and from the process section 210. Each of the number of substrate holders may be removably coupled to the holder frame. Each of the substrate holders in the substrate holder assembly 586 is independently moveable and positionable relative to the process elements. Each of the substrate holders in the substrate holder assembly 586 is in repeatable alignment with respect to the predetermined feature of the process section independent of the other substrate holders in the substrate holder assembly. Each of the process elements in the plurality of process elements are located between the substrates. Each of the substrate holders in the substrate holder assembly 586 is in repeatable alignment with respect to a corresponding process element in the plurality of process elements and independent of the other process elements in the plurality of process elements with each of the process elements in the plurality of process elements being located between the substrates. A different substrate is held by each substrate holder of the substrate holder assembly for transport therewith as a unit to and from the process module 210. The substrate holder assembly and each substrate holder of the substrate holder assembly are removably coupled to the process module frame and, when coupled to the process module frame, each substrate holder is independently moveable and positionable relative to the other substrate holders of the substrate holder assembly 586. Each of the substrate holders in the substrate holder assembly is in repeatable alignment with respect to the predetermined feature of the process module independent of the other substrate holders in the substrate holder assembly.

In accordance with one aspect of the disclosed embodiment, system 200 for fluid processing one or more substrate surfaces arrayed in a fluid is provided. System 200 has a process section or module 210 with a frame and having plurality of process elements to process or fluid process the substrate surfaces without contacting the substrate surfaces. As will be described, the plurality of process elements may be agitation members, drying members, fluid jet members or any suitable processing elements. Substrate holder assembly 586 (FIG. 17) having a number of substrate holders is configured for transporting one or more substrates as a unit between process section 210 and another location. Here, the substrate holder assembly 586 has a number of substrate holders and is configured for batch transport of substrates as a unit. The substrate holder assembly and each of the substrate holders are configured for removable coupling to the process section frame. Each substrate holder in the substrate holder assembly 586 is configured to hold a substrate or at least one of the substrates. The process section frame 210 has alignment features disposed so that, on coupling of the substrate holder assembly 586 with the process section frame, the alignment features interface with each substrate holder of the substrate holder assembly 586 and locate each substrate holder in repeatable alignment, at corresponding coupling of each substrate holder and the process section frame, with respect to a predetermined feature of the process section 210. The predetermined features may be located between the substrates with the substrates in a vertical orientation. The predetermined features may be each of the process elements with each of the process elements in the plurality of process elements being located between the substrates. The alignment feature may be vertical guides aligning each of the substrate holders in the substrate holder assembly in repeatable alignment with respect to a corresponding process element in the plurality of process elements where each of the substrate holders in the substrate holder assembly has integral positioning features that cooperate with mating features of each of the vertical guides. The holder assembly 586 may be the number of substrate holders coupled to a frame 946 (See FIG. 28A), where the frame may be an end effector coupled to a transporter and where the transporter is configured to move the substrate holder assembly to and from the process module 210, and where the transporter is configured to move a different substrate holder assembly with the holder frame to and from the process module 210. Each of the substrate holders in the substrate holder assembly 586 may be independently moveable and positionable relative to the other substrate holders in the substrate holder assembly. Each of the substrate holders in the substrate holder assembly 586 may be in repeatable alignment with respect to the predetermined feature of the process section independent of the other substrate holders in the substrate holder assembly 586. Each of the substrate holders in the substrate holder assembly 586 may be in repeatable alignment with respect to a corresponding process element in the plurality of process elements and independent of the other process elements in the plurality of process elements. The module frame has insertion guides and each substrate holder has mating guides depending from each substrate holder and corresponding to the insertion guides, the insertion guides and mating guides being configured so that, on coupling of the substrate holder and the module frame, the insertion guides receive the corresponding mating guides of each substrate holder aligning each substrate holder of the substrate holder assembly in repeatable alignment with respect to a corresponding process element in the plurality of process elements. The insertion guides may be vertical guides aligning each of the substrate holders in the substrate holder assembly in repeatable alignment with respect to the corresponding process element in the plurality of process elements. The holder assembly 586 may be the number of substrate holders coupled to a frame 946, where the frame comprises an end effector coupled to a transporter and wherein the transporter is configured to move the substrate holder assembly to and from the process apparatus, and where the transporter 280 is configured to move a different substrate holder assembly with the holder frame to and from the process apparatus. Each of the substrate holders in the substrate holder assembly 586 may be in repeatable alignment with respect to the corresponding process element in the plurality of process elements independent of the other substrate holders in the substrate holder assembly 586.

Figure 15A:
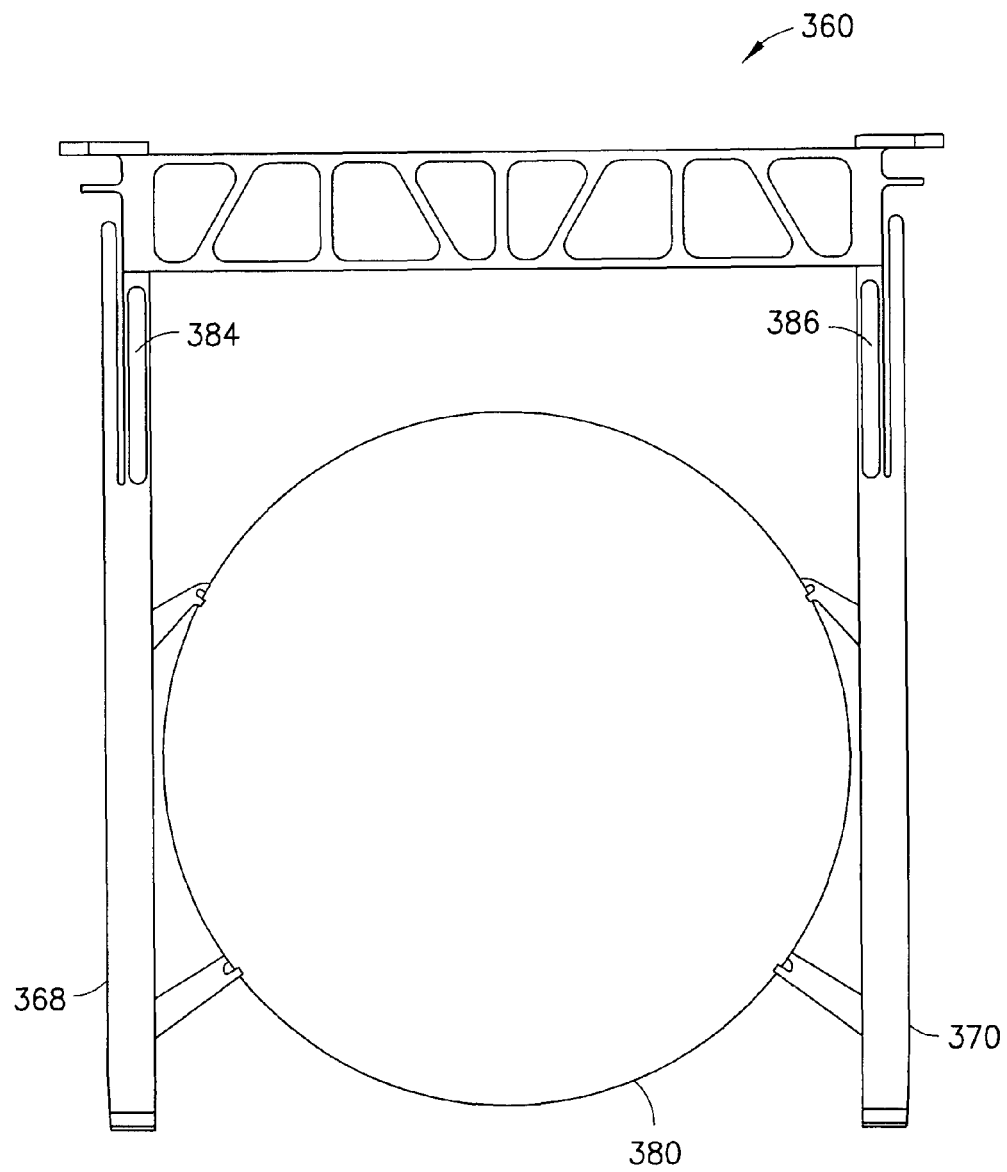
FIG. 15A shows a wafer holder.
Figure 15B:
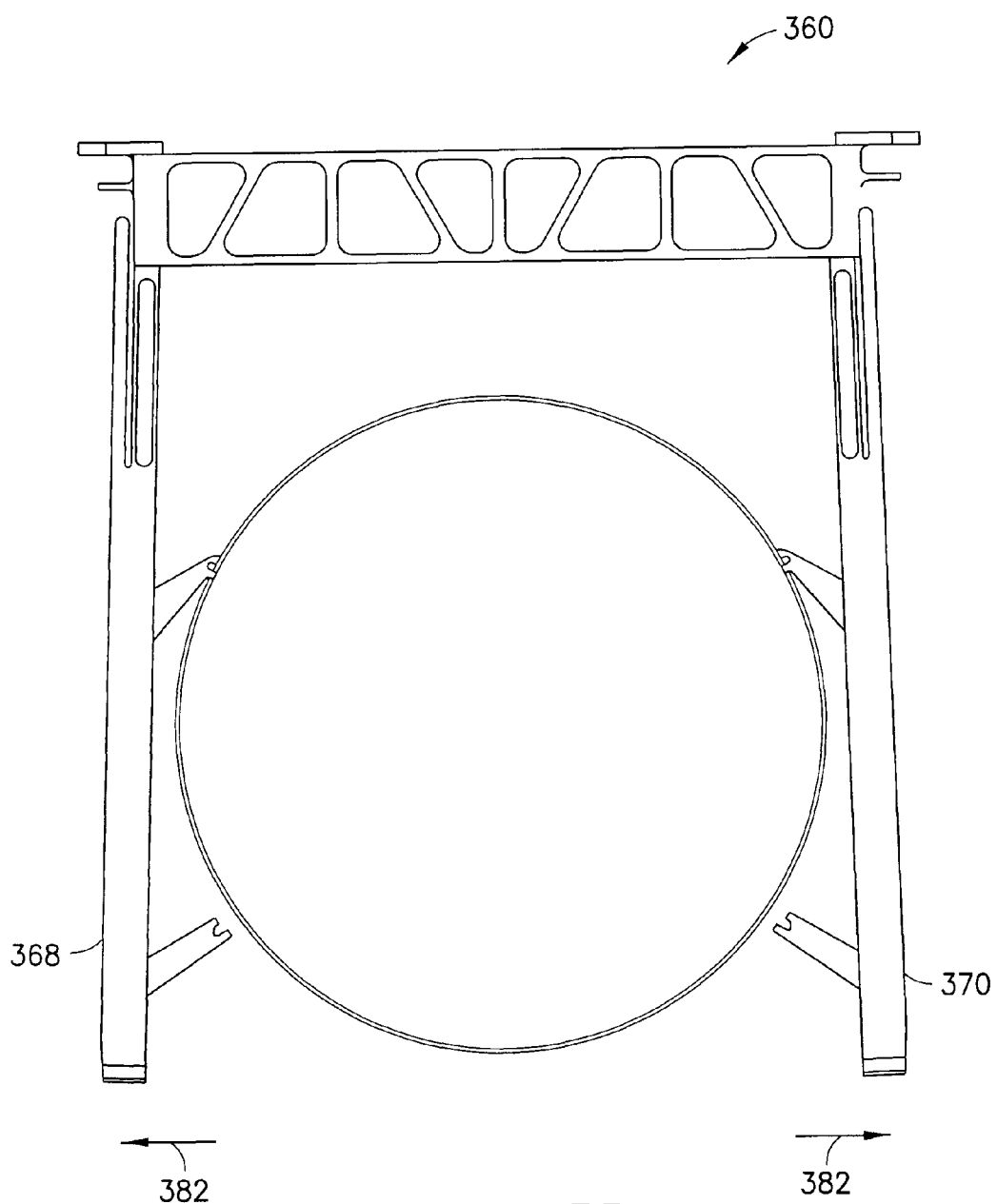
FIG. 15B shows a wafer holder.
Figure 15C:
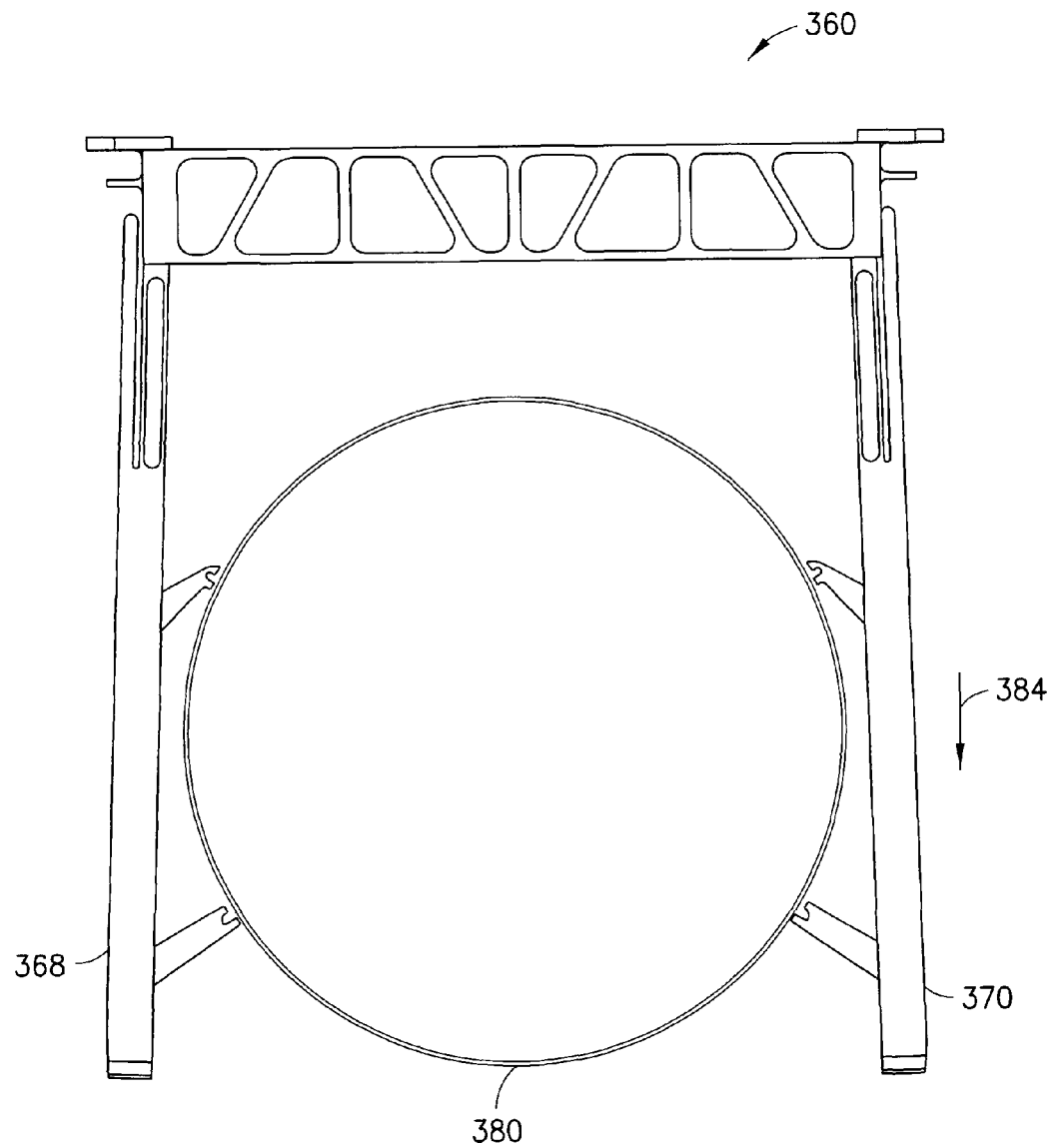
FIG. 15C shows a wafer holder.
Figure 15D:
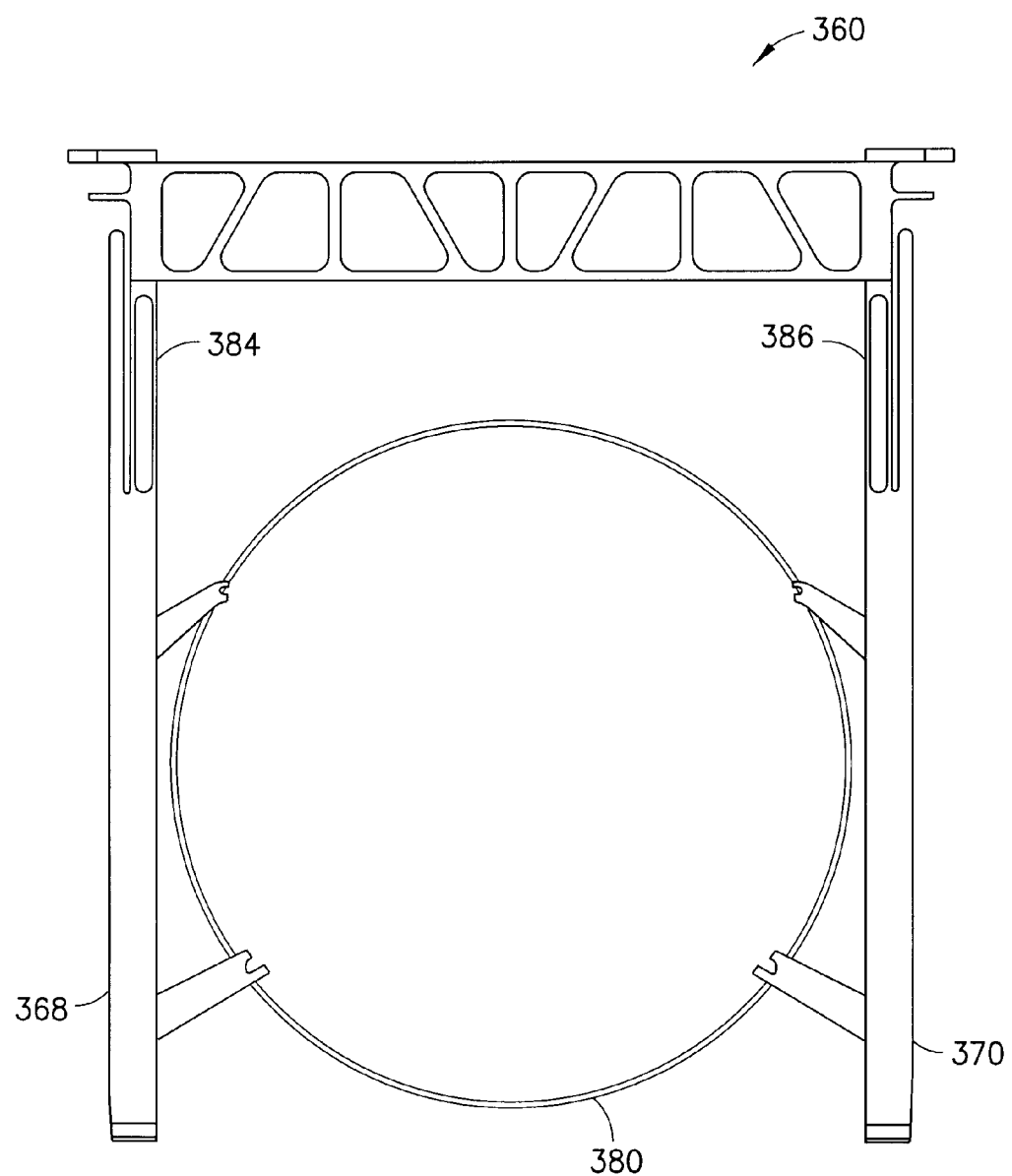
FIG. 15D shows a wafer holder.
Figure 16B:
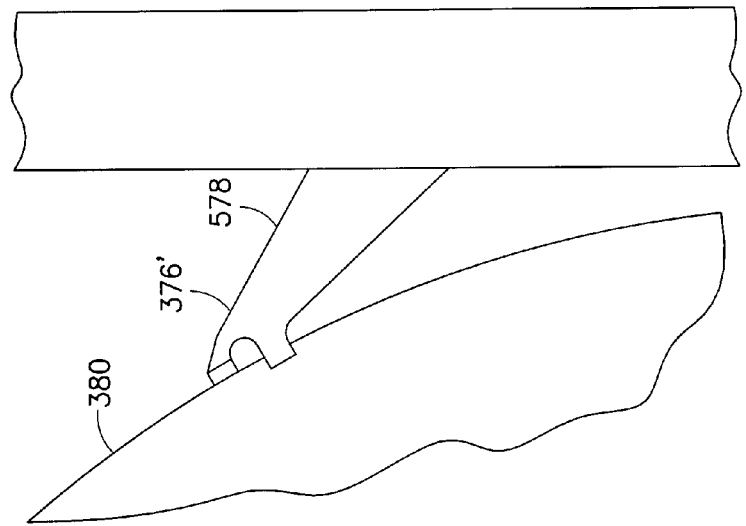
FIG. 16B shows a portion of a wafer holder.
Figure 16A:
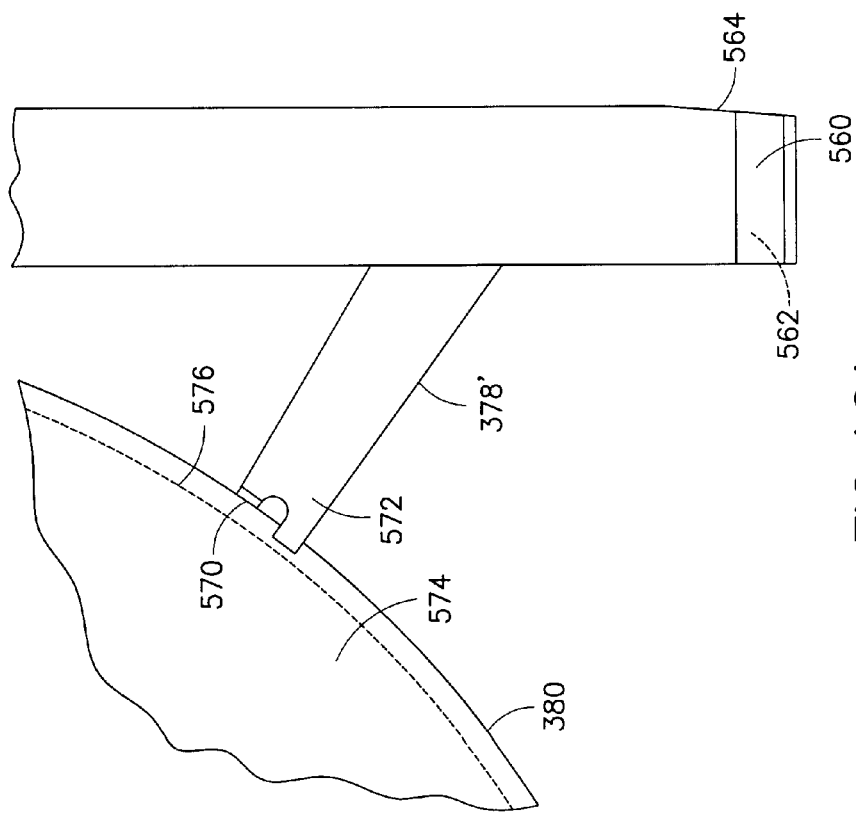
FIG. 16A shows a portion of a wafer holder.

Referring now to FIG. 13, there is shown a single wafer holder 360. Holder 360 is shown having handle section 362 and wafer section 364. Handle section 362 has crossbar 366 that couples left and right flexures 368, 370 of wafer section 364. Left fingers 372 and 374 are shown coupled to left flexure 368. Right fingers 376, 378 are shown coupled to right flexure 370. Referring also to FIG. 15A, wafer 380 is shown on center with flexures 368, 370 closed and retaining wafer 380 captured with fingers 372, 374, 376, 378. Referring also to FIG. 15B, there is shown wafer holder 360 with wafer 380 still on center and with flexures 368, 370 opened 382, for example 0.070" or otherwise. Referring also to FIG. 15C, there is shown wafer holder 360 with wafer 380 moved down, for example, 0.180" or otherwise and with flexures 368, 370 opened 382, for example 0.070" or otherwise. Here, flexures 368, 370 are shown opened 382 with wafer 380 moved down 384 relative to wafer holder 360, for example, in order to allow translation perpendicular to the Wafer surface with adequate clearance of the wafer holder top finger contacts 372, 376. In alternate aspects of the disclosed embodiment, the wafer need not move down to clear the contacts. Here, the support of the wafer holder array may be able to move in both Z and X relative to the support of the Wafers (X being perpendicular to wafer surface here). The top to bottom asymmetric open position of the flexure wafer holder with regard to load/unload is overcome relatively easily in the loader and gains the simplicity and rigidity of the wafer holder array in the remainder of the system. Referring also to FIG. 15D, wafer 380 is shown on center with flexures 368, 370 but offset perpendicular to the view such that the fingers do not capture wafer 380. Here, flexures 368, 370 are in a relaxed state and closed inside the edges of wafer 380 with wafer 380 not captured with fingers 372, 374, 376, 378. The flexure frame may be made from stainless steel SS316, PEEK or any suitable material. Here, flexure based motion may be used to load and grip wafers as an assembly for showing wafer position relative to the wafer holder in its deflected state. FIG. 15A image shows the beam in a wafer holding state whereas FIG. 15B shows 0.070" exemplary deflection of the 2.5" long or otherwise flexure, which may be sufficient to clear the capture rim for the upper contact block and causes the wafer to fall out of the lower contact block. This type of actuation may require either (1) the load station to provides support to the wafer prior to opening the flexure/contact-block assembly or (2) the lower contact blocks to have a more extensive surface on the rear side of wafer to support it when the flexure is deflected open. Flexure wafer holding mechanism or wafer holder 360 holds and retains substrate 380 during vertical fluid processing of a surface of the substrate where holder 360 has a frame with a support member 355 and with first leg 368 and second leg 370 coupled to frame 366 and depending from the support member with first compliant flexure 384 and second compliant flexure 386 respectively. Here, first and second compliant flexures are configured so that at least one of the legs is movable relative to the other. First leg 368 is shown having first contact fingers or members 372, 374 that are shown engaging a first edge 388 of substrate 380. Second leg 370 is shown having second contact fingers or members 376, 378 adapted to engage second edge 390 of substrate 552 so that substrate 380 is supported by the legs. In alternate aspects of the disclosed embodiment, more or less contact fingers may be provided, for example a single contact finger on one leg and multiple contact fingers on the opposing leg. Upon deflection of the first and second compliant flexures, the first and second legs are moveable in substantially opposite directions disengaging the first and second contact fingers from the first and second edges of substrate 380. Here, upon deflection of the first and second compliant flexures, the relative movement between first and second legs effect engagement and disengagement of the first and second contact members from the first and second edges of the substrate. In the embodiment, the flexure wafer holding mechanism touches the wafer 380 at several points on the perimeter of wafer 380 such that the holding force may be fail-safe, simple and compact. Here, fail-safe may refer to transporting of 360 throughout an automated system with little risk of dropping or damaging wafer or substrate 380. Here, simple may refer to simplicity of the substrate engagement mechanism as well as the capability to enable ganging a plurality of wafer holders into a batch, for example a six or otherwise wafer holder batch, to provide higher throughput of wafers through the process tool. Here, compact may refer to enabling the various fluid processing mechanisms to approach very close to the wafer surface without being obstructed by the wafer holding mechanism, for example to enable a SHEAR PLATE agitation mechanism to work at a distance of 0.5 mm from the wafer surface or alternately any other suitable mechanism, distance or otherwise. Substrate holder 550 may be used in conjunction with any suitable fluid processing mechanisms, for example, and may include a fluid nozzle array, a nitrogen air knife and a Maranon drying nozzle assembly or otherwise. In the disclosed embodiment, flexure wafer holder 360 may be used to provide precision location and movement of the wafer relative to these fluid or gas processing elements while taking advantage of vertical orientation to provide advantageous fluid flow. Thus the designation for the wafer holder as a Precision Aligned Carrier (PAC) wafer holder. In the embodiment, the contact fingers may be asymmetric so that fluid process elements may be positioned nearer the front surface of wafer 380 than the back side, for example within 0.5 mm or otherwise of the front surface of the wafer. In the embodiment shown, wafer holder legs 368, 370 may provide some separation distance from the handle 368 or crossbar so that the wafer 380 may be immersed into a fluid bath without wetting the handle. Legs 368, 370 may be opened and closed to allow for insertion and removal of wafers as covered in more detail below. A loading actuation mechanism (not shown) separates legs 368, 370 for example by pushing against the inner surface of the lower part of each leg to spread the legs away from the wafer holder centerline such that the flexures 384, 386 connecting the leg to the handle are deflected sufficiently to allow the wafer 380 to be moved out of the contact finger surfaces. When the wafer holder legs are in a closed position as shown in FIG. 15A, the four contact fingers 372, 374, 376, 378 define a circle that is approximately the same diameter as the wafer and this circle may be considered as defining the nominal centerpoint datum of the wafer holder to which the wafer center is aligned when it is captured by wafer holder 360. When the wafer holder legs are deflected, the four contact fingers define a second circle that may be several millimeters or otherwise larger than the diameter of the wafer and for which the center of this second circle may be displaced several millimeters away from datum center due to the deflection of the flexure leg combination; if the wafer is translated such that its center aligns with the second circle center the wafer 380 may be lifted out of the contact fingers and removed from the wafer holder 360. In alternate aspects of the disclosed embodiment, the flexure design of the wafer holder may be such that the first and second circle centerlines may be substantially the same such that wafer extraction does not employ relative translation between wafer and holder during insertion or extraction from holder 360. One aspect of the disclosed embodiment is the detailed shape of the wafer capture surfaces on the contact fingers and the manner in which the motion of the wafer during load and unload enables the holding mechanism to be very secure and yet have minimal contact to the wafer surface and cause minimal dripping or other unwanted fluid processing artifacts, as described in more detail below. In the embodiment shown either a load station may be used to provide support to the wafer prior to opening the flexure/contact-block assembly or alternately the lower contact blocks 374, 378 may be provided with a more extensive surface than shown in FIG. 14, for example, on the rear side of wafer 380 to support the surface when the flexure is deflected open. As seen in FIG. 15C, by offsetting the wafer 380, for example, by 0.180" inches vertically, approximately centering it in the opening of the contact blocks (when the flexures are deflected by 0.070" or otherwise) the wafer now has, for example, 0.11" clearance to the capture sections, and still is above the rear support surface. This motion in a load station may be as follows: 1. Insert WH-Array 360 vertically using Transporter 280. 2. Rotate cradle to 10 degrees off vertical so that wafer is biased by gravity against rear surfaces of the Contact-Blocks. 3. Apply 10 Nts of force to bend the flexure legs of the WH (i.e open them part way) which will cause the wafer to slide downward in Z by 0.18", while being stopped by the lower Contact-Blocks, and tilting backward against the rear of the upper Contact-Blocks. 4. Move a Load-Station vertical lift element upward by 0.2" to support wafer in Z direction (this is only a pair of bars parallel to wafer axis to contact on the wafer edge, while not obscuring the end effector insertion) at this point the wafer is weakly constrained in Z at the top so some over-travel will be tolerated. 5. Apply 20 Nts of force to bend flexure legs to open position, this may provide 2.5 mm clearance for wafer to each of the Contact-Block front capture rims, so that wafer 360 has adequate clearance to be lifted out along its axis. 6. Rotate cradle to horizontal; wafers are weakly constrained from moving upward in Z direction by the sloped surfaces of the Contact-Blocks. 7. Use a simple end effector for get and put motions to pick-up the finished wafer and replace with a new wafer. As will be described, in alternate aspects of the disclosed embodiment, the Load Station could include an interleaved set of pallets, with 3 points of contact at the wafer perimeter, which lift after the WH-Array is vertically inserted and rotated to horizontal such that wafer drops onto the contact points when flexures are opened; when flexures close the angled backside surface of Contact Blocks lift the wafer into the grip surfaces of the wafer holder 550. In FIG. 14, there is shown a view of lower contact block 378 having an edge wafer support surface 550 that contacts an outer peripheral edge 390 of substrate 380. Lower contact block 378 further has a first supporting portion 552 that contacts a first surface 380' at an outer peripheral edge on the surface of substrate 380. Lower contact block 378 further has a second supporting portion 554 that contacts a second surface 380" opposing the first surface at an outer peripheral edge on the surface of substrate 380. Wafer contact feature 378 is shown designed to not trap fluids when raised out of one of the process modules, for example, a Marangoni or shear plate agitation module, where any liquid trapped between the wafer and the contact can redeposit onto the wafer after drying, causing water spots. Here, the two sides of the wafer may be spaced 553, 555 more than a capillary length (2 mm) so that gravitational force exceeds the surface contact force, and the fluid drips back into the bath rather than staying with the raised PAC. PAC wafer contacts, for example contact fingers 372, 374, 376, 378 may be composed of a material hard enough not to wear away upon contact with the sharp edge bevel, but soft enough to not wear away the Si wafer, thereby preventing particle generation. One exemplary material is PEEK or any suitable alternate. In this manner, each finger 372, 374, 376, 378 in combination retain substrate 380. In alternate aspects of the disclosed embodiment, the fingers may have features such as angled portion(s) with respect to the surface(s) of wafer 380, for example, so that when supporting the wafer in an open position, only the outer bottom or back edge of the wafer contacts the surface, and so that wafers may be supported in a horizontal orientation by holder 360 when holder 360 is open. In alternate aspects of the disclosed embodiment, tapered surface(s) may be provided and angled with respect to surface(s) of wafer 380 and may contact an outer edge of the wafer, for example, in the clamping and capture of a warped wafer or otherwise. The length and size of portions 552, 554 may be minimized to minimize interaction with fluid processing of the front side of wafer 380. In alternate aspects of the disclosed embodiment, a radius nose may further be provided to prevent wafer hang up or otherwise. Alternately any suitable contact block geometry may be applied alone or in any suitable combination. As seen in FIG. 13, contact block or finger 378 may be a removable contact block. Here, two 3 mm or other suitable pins may position the Contact-Block and redundant M2.5 mm flat-head screws 556, 558 or other suitable fasteners may hold block 378 in place. The frame of flexure 370 may be cut from 316-Stainless Steel and annealed and Blanchard ground flat and parallel prior to water jet cutting and milling of the attachment surfaces. Alternately, any suitable material or fabrication technique may be used. The legs 368, 370 of flexure based holder 360 may be sufficiently wide, for example, to provide lead-in and wheel rolling surfaces sufficiently far from the wafer or process chemistry. The mass of assembly 360 may be 2.3 lbs. or otherwise and may be minimized with a center of gravity near the top of wafer 380. Here, tapered surfaces 560, 562, 564 may be provided and are shown on the lower end of holder 368, 370 legs (front, rear, side), for example, to facilitate the alignment of wafer holder 360 to guide features in fluid process modules as will be described and shown in greater detail below. In the disclosed embodiment, holder 360 provides structure for aligning wafers to process fluid elements. To enable parallel single wafer processing, a wafer-Holder may accomplish several functions: Fail safe holding of wafers precisely with respect to reference surfaces in process modules; Enablement of wafer loading and unloading; Enablement of the transport of an array of wafer holders in parallel with sufficient high precision locating in multiple process modules; and vertical processing with minimal drips. Simultaneous dual wafer size, for example, 300 mm and 200 mm may be provided by positioning the 200 mm wafer at the bottom of the wafer holder (i.e. so that the bottom edges of 200 mm and 300 mm are tangent) so that the loader mechanism for 200 mm doesn't interfere with that of 300 mm the motion distance for opening the wafer holder, which may be different for 300 and 200 mm sizes. Similarly, outside dimensions of the 300 mm and 200 mm holders may be identical so the same shear plate or other process nests may be used for both 200 and 300. In the embodiment shown, a soft pad contact may be provided with additional features, for example, a third edge grip or to increase the capture interference to contain flexible or fragile wafers or substrates. In the embodiment shown in FIG. 14, holder 360 employs separate radial and axial wafer contact surfaces into distinct elements rather than using a combined "V-groove" type of feature providing alignment as discussed in greater detail below and supporting future capabilities such as a wafer edge clean or otherwise. As will be described, a perfluroelastomer pad may be used for wafer radial contact, avoiding high point contact force and associated particle generation from abrasion; here safe handling of silicon/glass bonded wafers or other fragile substrates may be provided. Here, the elastomer pad may be molded onto the contact fingers. Thin, approximately 2-3 mm or other suitable sized finger elements 372, 374, 376, 378 with attachment features outside of a 310 mm or other suitably wide travel zone 566 needed for the Marangoni nozzles or other process elements may be provided, thereby allowing for closer uniform approach of the linear Marangoni or other nozzles. Axial restraint features may be machined directly into these parts in order to avoid a junction which may initiate drips. Holder 360 may be constructed from multiple pieces pinned, and/or heat shrunk fitted together or other suitable manufacturing technique may be provided. In the embodiment shown, different geometry is provided for the top 372, 376 and bottom 374, 378 fingers so that drips are pulled downward by gravity away from the wafer 380. In the embodiment shown, side flexure legs 368, 370 may be separate elements from a top cross bar 368. Referring also to FIG. 16A, there is shown finger 378'. Finger 378' has elastomer pad 570 that supports the radial loads where stainless steel has a slot 572 which restrains the wafer position axially (i.e. in/out of the page). Wafer 380 is shown with resist 574 with 2 mm edge exclusion 576. Here, finger 378' is shown as a lower or bottom finger staying within the edge exclusion zone. Referring also to FIG. 16B, there is shown finger 376'. Top contact finger 376' is shown having different geometry 578 which allows fluid drips to flow downward away from wafer 380. A minimal finger cross-sectional contact area at the wafer minimizes the volume of fluid held by surface tension forces. In the embodiment shown, there is clearance in wafer thickness direction in the SS or PEEK finger elements where this clearance may be tight enough to avoid the wafer motion during processing, for example, due to interaction with ShearPlate agitation member induced fluid motion. Lead-in may be provided in portions of the contact fingers, for example, reduced to about ½ mm which can be tolerated by using the exchange Loader mechanism where the wafer may be positioned precisely by the loader gripper such that clearances may not need to be replicated into wafer holder 360, thereby allowing for closer proximity of the process elements, for example shear plate and Maranon process elements or otherwise.

Figure 17:
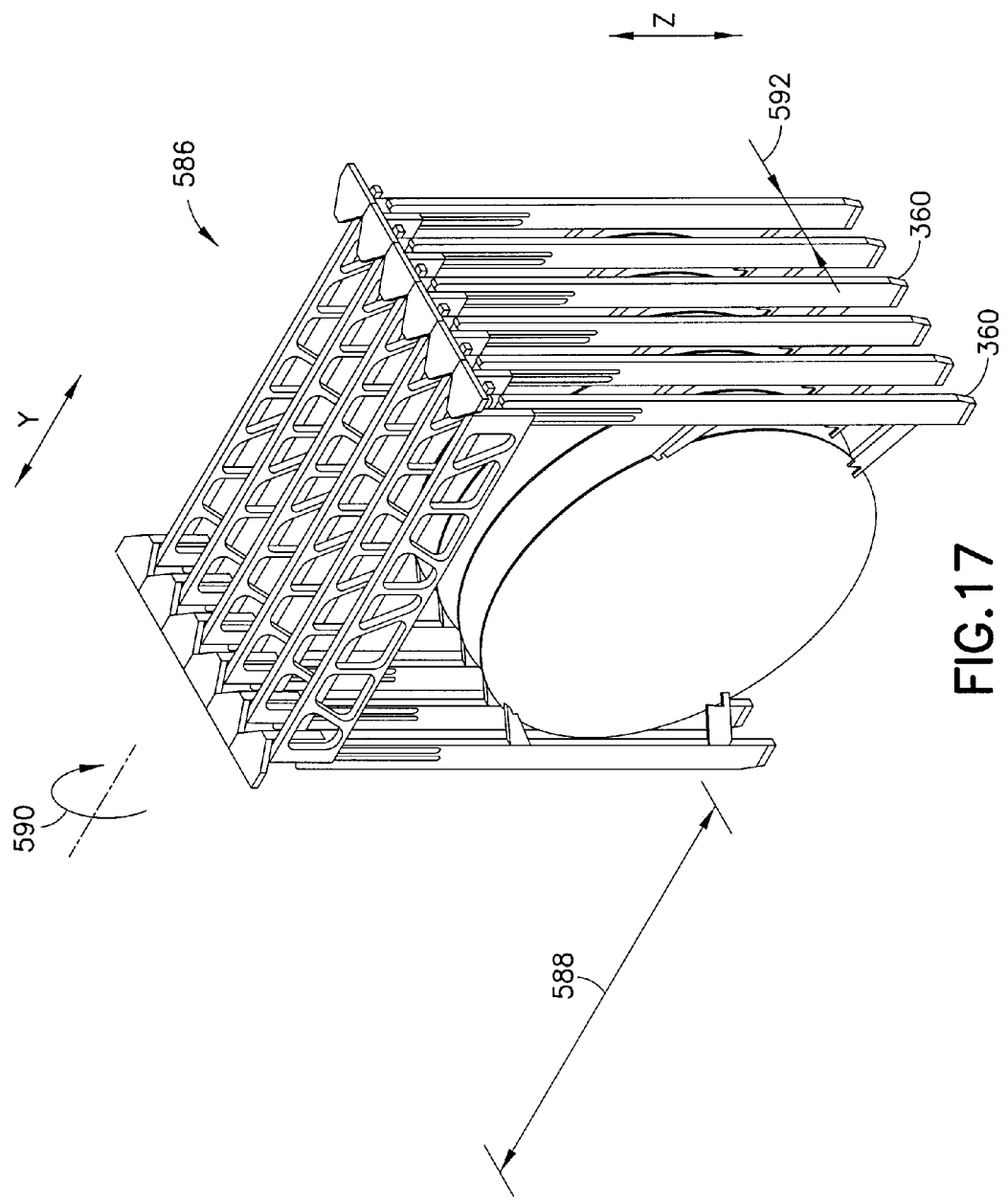
FIG. 17 shows an array of wafer holders.
Figure 18B:
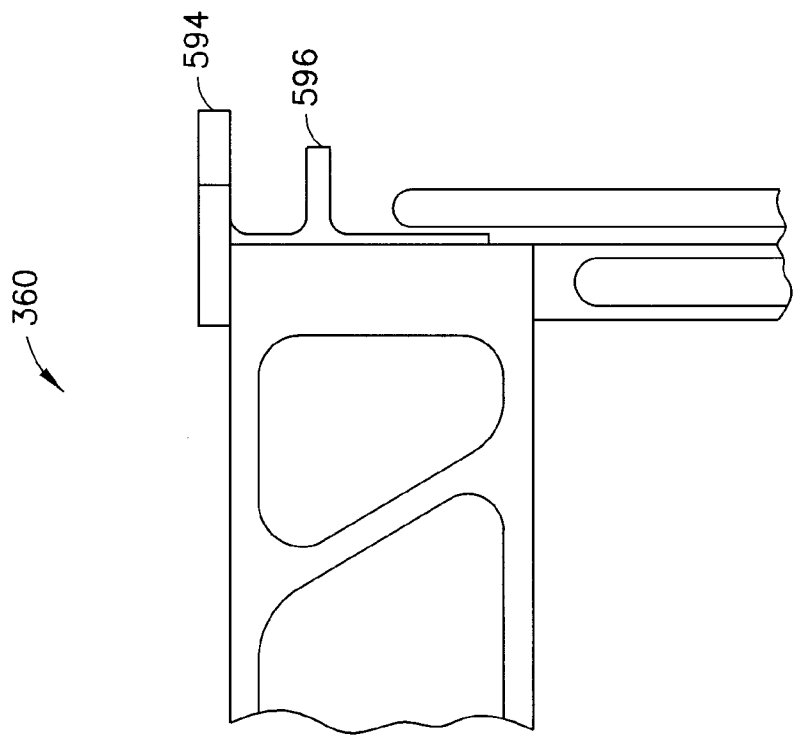
FIG. 18B shows a portion of a wafer holder.
Figure 18A:
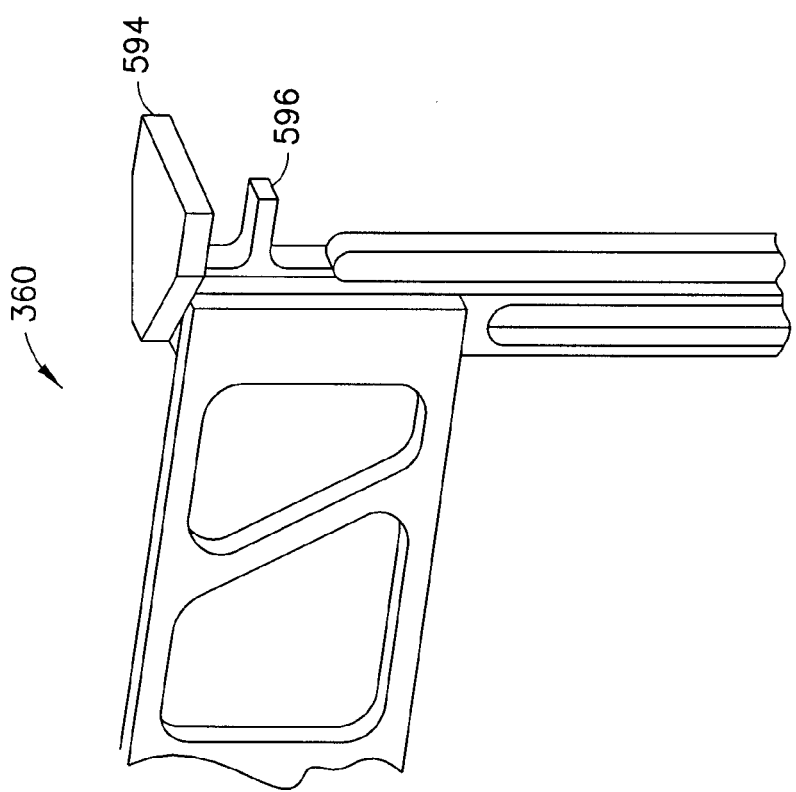
FIG. 18A shows a portion of a wafer holder.

Referring now to FIG. 17, there is s shown an array of wafer holders 586. Referring also to FIG. 18A, there is shown a partial view of wafer holder 360. Referring also to FIG. 18B, there is shown a partial view of wafer holder 360. Individual wafer-holders 360 are not attached to each other to form a "batch" 586, instead they are temporarily formed into a "batch" by the actuation of the transporter which lifts, transports, and deposits a "virtual array" 586 of wafer holders 586 from one process station to the next in the tool. A number of features on wafer holder 360 enable appropriate transport as a virtual array 586 and precision alignment of individual wafers to process elements within modules. Here, the transporter lifts and supports the array 586 in Z. During transport, accelerations are in Y (parallel to Wafer surface) so resulting primary torque due to offset of center of gravity from the lift surfaces is well stabilized, for example, by the 15" or other suitable width 588 of the wafer holder 360. During transport, particularly lift and descend, torques 590 need to be stabilized and there is little leverage to do so since wafer holder array pitch 592 is 1.5" or otherwise. As such, a feature 594 may be provided on each holder 360 that uses most of this 1.5" length. A Lower region lead-in near to SP (shear plate) agitation member or LINEW (Marangoni) surfaces may be provided, for example, by extending lower edge of legs 368, 370. An upper region lead-out, or stabilization may be provided, for example, that keeps the wafer holder aligned in the Marangoni LINEW array lifter element. Top-Block 594 is shown having a broad plate that allows for both pick-up by Transporter, and is used to stabilize the wafer holders during transport where the pick-up mechanism may clamp the wafer holder up into a fixed plate. Clamping can be tight during linear accelerations and looser during descent and ascent from process modules, thereby avoiding over constraint and allowing the wafer holder 360 to find its precise place in the given processing module or transport module. A second feature on the Top-Block 594 may be a horizontal stub 596 that supports the wafer holder weight in the process module, this limits the down position so that the higher plate feature 594 is accessible to the Transporter for pick-up and put-down. The top surface of this stub 595 may be used in SP-Modules to clamp the wafer holder 360 downward to resist shear plate agitation member drag forces caused by agitation.

In accordance with another aspect of the disclosed embodiment, substrate holder 360 is adapted to hold and retain a substrate 380 during vertical fluid processing of a surface of the substrate. Wafer holder 360 has a frame 366 and a first leg 368 coupled to the frame by a first compliant flexure, the first leg having a first contact member configured to engage a first edge of the substrate. Second leg 370 is coupled to the frame by a second compliant flexure, the second leg having a second contact member configured to engage a second edge of the substrate. Upon deflection of the first and second compliant flexures, the first and second legs 368, 370 are moveable in substantially opposite directions disengaging the first and second contact fingers from the first and second edges of the substrate respectively. The first contact member may be first and second contact fingers engaging different portions of the first edge of the substrate. The first contact member may comprise first 550, second 552 and third 554 contact points, the first contact point engaging the first edge of the substrate, the second contact point engaging the surface of the substrate, the third contact point engaging another surface of the substrate on an opposite side of the substrate. The first and second legs 568, 570 are moveable in the same plane. The first and second legs may further be first and second integral positioning features configured to cooperate with a mating locating feature. The first and second legs may further be first and second leading tapered edges 560 configured to engage with a mating locating feature. The first compliant flexure may be first and second flexure elements, the first flexure element substantially parallel to the second flexure element. A handling feature 594 may be coupled to the frame, the handling feature having a holder transporter interface surface substantially perpendicular to the first and second legs.

Figure 20:
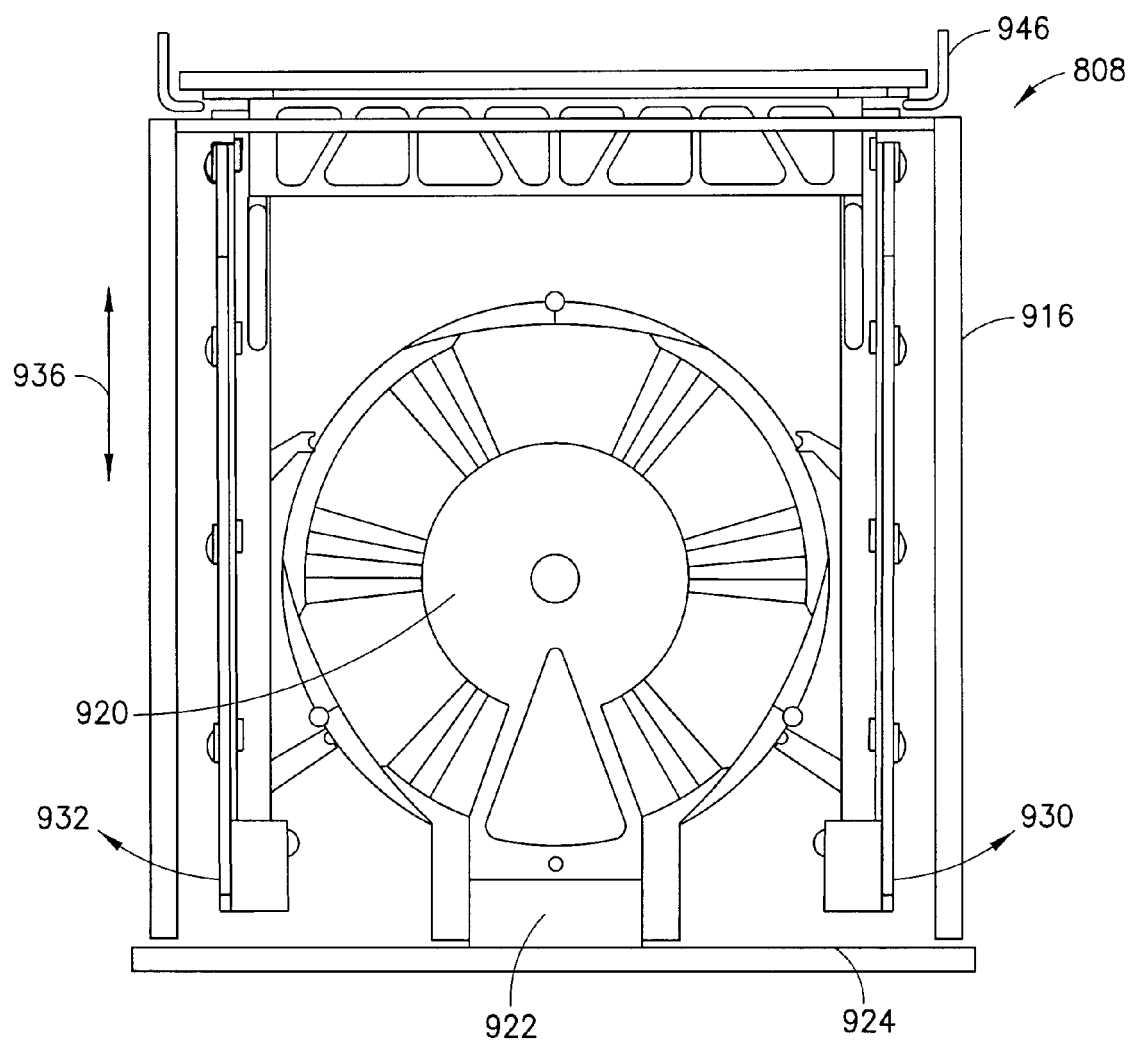
FIG. 20 shows an end view of a loader module.
Figure 21:
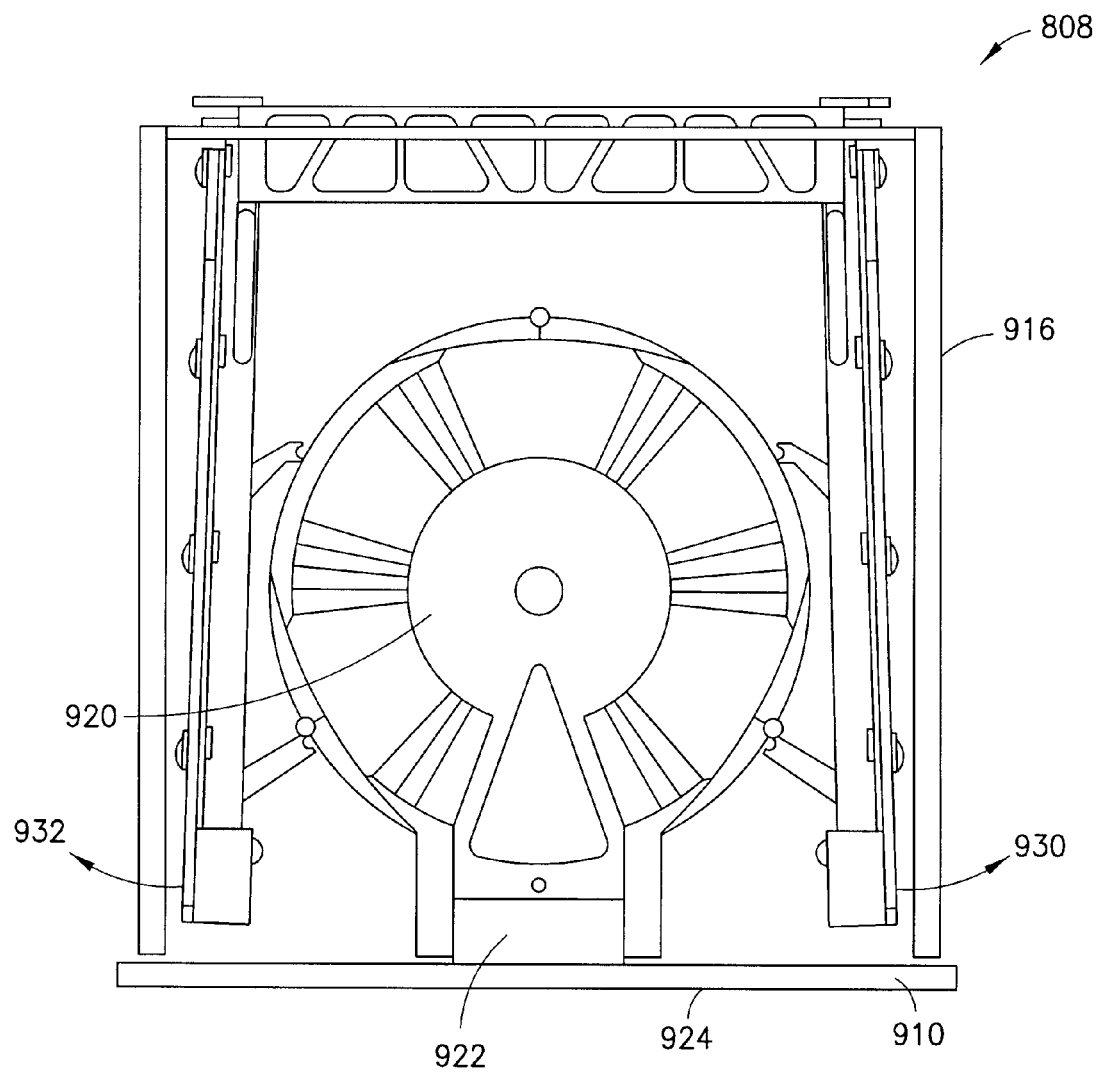
FIG. 21 shows an end view of a loader module.
Figure 22A:
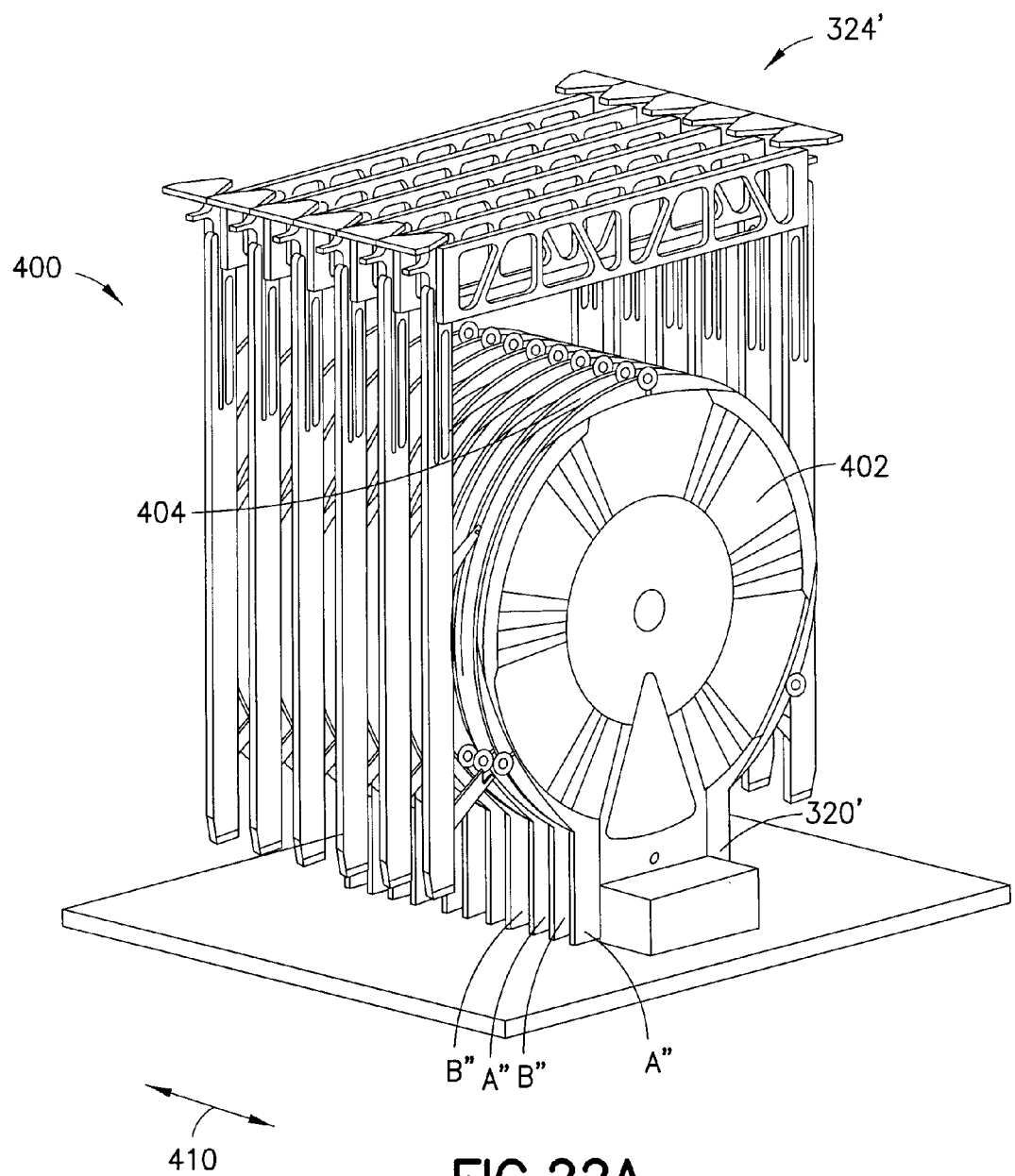
FIG. 22A shows an isometric view of a loader module and a holder array.
Figure 22B:
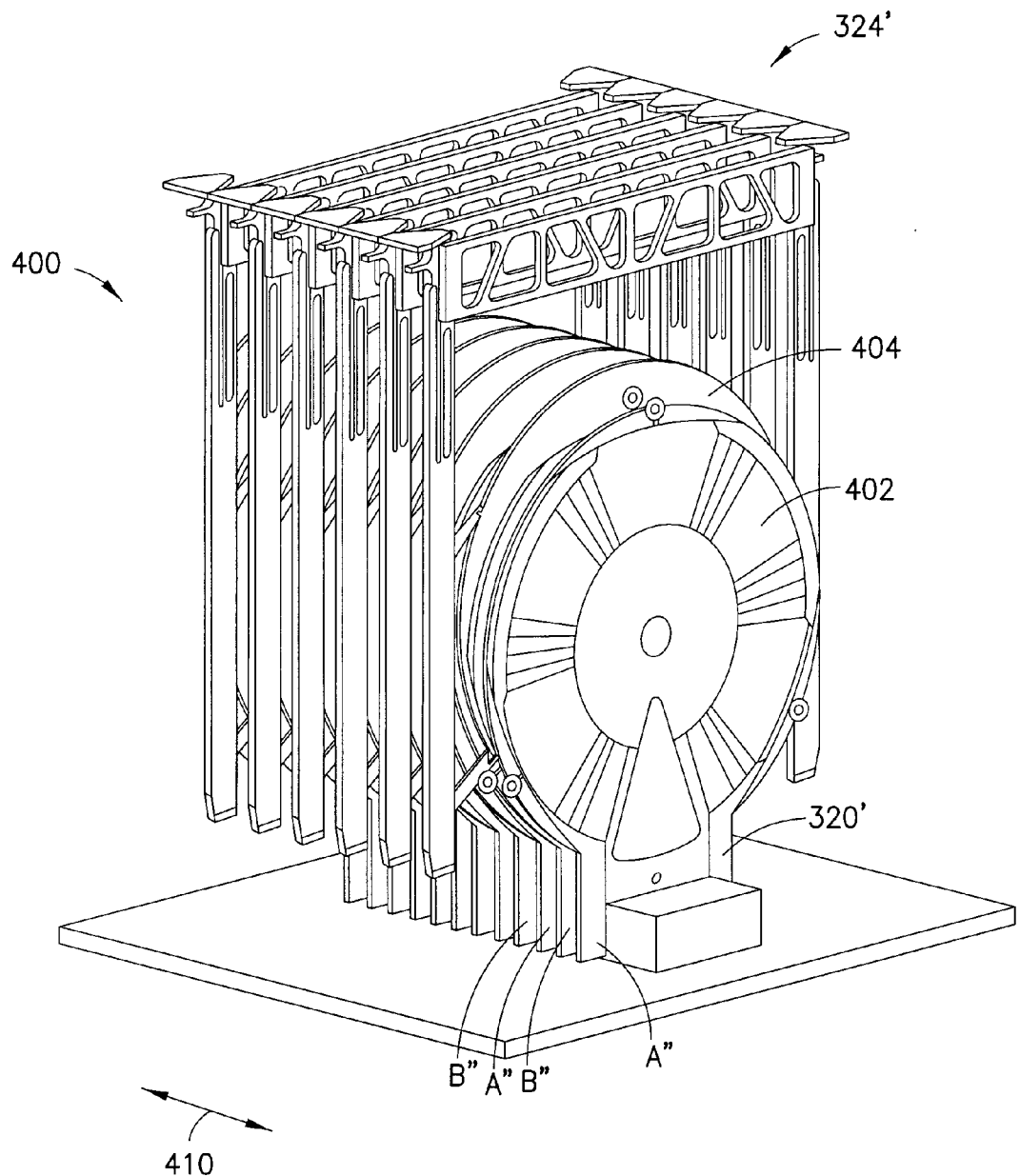
FIG. 22B shows an isometric view of a loader module and a holder array.

Referring now to FIG. 19, there is shown an isometric view of loader module 808. Referring also to FIG. 20, there is shown a side view of loader module 808. Referring also to FIG. 21, there is shown a side view of loader module 808. In the disclosed embodiment, loader 808 has shuttle 910 where shuttle stage 910 may have roughly a 1" travel in X direction for a single Shuttle 808 whereas adding a second Shuttle 808', for example, for higher throughput, so that one shuttle may be load/unloaded while the other is doing an array transfer; this would require both Shuttles to have about 20" travel for a 6 wafer array 818. Here, loader 808 receives wafer holder-Array 586 into framework 916 which has the requisite motion to open the wafer holder flexure 818, where this "wishbone" motion may be about 0.070" symmetric about wafer holder (WH) 818 center and Shuttle 910 center line (i.e. a total of 0.14" motion.) In the embodiment shown, elements of "Array Exchange Loader" 808 are shown for a 6 wafer array 586 size. In alternate aspects of the disclosed embodiment, any suitable number may be provided. Loader 808 has shuttle 910 having an array of Compliant wafer Gripper (CWG) elements 920, one for each input and output position, mounted on a linear bearing 922 mounted to the base plate 924. Wafer holder dock 916 receives the WH-Array 586 and makes a pivot motion 930, 932 of several degrees to open the WH's for exchange, and makes a vertical translation 936 of 4 to 6 mm to center the WH open finger position on the CWG-Gripper. Here, wafers are extracted and inserted in a supinated (i.e. vertical) orientation through slots in the sidewalls of the wafer holder dock 916. Transporter gripper plate 946 is also shown. In FIG. 20, WH-Array 586 is shown supported by the Loader and Transporter elements in an open position as would be the case immediately after drop-off or before pick-up of the WH-Array 586. In FIG. 21, the WH's 586 are shown opened and positioned so that the Shuttle/CWG-Gripper assembly 910/920 can move perpendicular to the wafer surfaces for transfer between CWG-Gripper and WH elements, as shown in more detail in the table of FIGS. 24A-M and FIGS. 25A-E. Side elements of the WH-Dock 916 may pivot to make this motion, and the WH-Dock may be lifted by 4-6 mm to move the WH-Array fingers in the open position onto center with the Wafers in the CWG-Grippers 920 on the Shuttle 910. Here, a more detailed sequence of moves within the loader is given in the table of FIGS. 24A-M and FIGS. 25A-E. Referring also to FIGS. 22B and 22A, a quick parallel exchange is shown with completed processed wafers being inserted into the Loader-Shuttle and outgoing un-processed wafers being removed by the WH-Array. Here, the Shuttle-array positions are two for CWG-Grippers and one empty for WH's. These positions split up the array pitch of approximately 1.5", they are referred to as "A" for the outgoing or processed wafers, "B" for the incoming or un-processed wafers, and "C" are not populated with CWG-Gripper elements, these are positions into which WH-Array elements are inserted. During the exchange process the Shuttle moves approximately plus or minus 0.75" inch horizontally. The WH-Array is moved vertically by the Transporter by approximately 20" to enter and exit the WH-Dock which surrounds the Wafer-Gripper arrays.

Referring now to FIG. 22A, there is shown a batch exchange loader 400 transferring 6 processed wafers 402 from holder array 324' to shuttle array 320'. Referring also to FIG. 22B, there is shown a batch exchange loader 400 transferring 6 un-processed wafers 404 from shuttle array 320' to holder array 324' after transferring 6 processed wafers 402 from holder array 324' to shuttle array 320'. Here, loader 400 may have features as described with respect to loader 808 and array 324' may have features as described with respect to array 586. Here loader 400 may transfer substrates as will be described in a "fast swap" manner between shuttle array 320' and holder array 324'. In the embodiment shown, loader 400 has shuttle array 320', shuttle axis 410, a cradle or support for capturing wafer holder array 324', an actuator for expanding the flexures of holder array 324' and actuators for expanding the wafer clamping features of shuttle array 320'. In each case, loader 400 may selectively grip one or more wafers with either wafer holder array 324' or shuttle array 320', for example, as will be described with respect to a unload and load sequence below. Loader 400 may receive wafer holder array 324' into a framework which has the requisite motion to open the wafer holder flexure, for example, a "wishbone" motion of about 0.070" or otherwise symmetric about the wafer holder center and Shuttle center line (i.e a total of 0.14" motion.). Here, FIG. 22A and FIG. 22B show isometric views of the main elements of "Batch Exchange Loader" for a 6 wafer batch size where FIG. 22A shows completed processed wafers 402 being inserted into the Loader-Shuttle 400 and FIG. 22B shows outgoing un-processed wafers being removed by wafer holder array 324'. Wafers 402 indicate outgoing processed, or stripped, wafers and wafers 404 indicate incoming wafers, for example, with photo-resist that will be stripped in the process section of the tool. Shuttle-array 320' has 6 positions "A" that are used for the outgoing or processed wafers 402. Shuttle-array 320' further has 6 positions "B", interleaved with the 6 positions "A", that are used for the outgoing or processed wafers 404. In alternate aspects of the disclosed embodiment, "A" may be used for incoming or unprocessed wafers. In alternate aspects of the disclosed embodiment, more or less positions may be provided. Here, loader 400 is provided adapted to unload wafers and load wafers to an array of wafer holders 324'. In the embodiment shown, loader 400 has first and second exchange holder arrays 320' "B" and 320' "A", each having exchange holders alternating and interleaved with respect to each other. Here, first exchange holder array 320' "B" has load or incoming wafers and the array of wafer holders 324' has unload or outgoing wafers. The unload wafers are moved as a group from the array of holders 324' to the second exchange holder array 320' "A" and the load wafers are moved as a group from the first exchange holder array 320' "B" to the array of holders 324' as will be described. In the embodiment shown, a six element Wafer-Holder-Array (WH-Array) 324', also known as a Precision Aligned Carrier (PAC) Array may be suspended from a Transporter (not shown) and two arrays of Wafer-Grippers "A" and "B" of shuttle array 320', one for input and one for output wafers, is carried on a Shuttle mechanism 410 (not shown) below. During the exchange process the Wafer-Gripper/Shuttle 320', 410 moves approximately one inch or otherwise horizontally while the WH-Array may be moved vertically by the transporter or otherwise by approximately 20" or otherwise to enter and exit the envelope occupied by the Wafer-Gripper arrays. The Wafer-Grippers may hold the wafers in a relatively precise position, for example the wafer may be positioned within an envelope of approximately +−0.4 mm from an ideal center position. Additionally, each Wafer-Gripper may hold the wafer with some compliance so that during the exchange step where the wafer is contacted by both the wafer holder and a Wafer-Gripper of shuttle 320', there is not any considerable force applied to the wafer due to small inherent misalignments between the two sets of contact surfaces. Such grippers are designated Compliant Wafer Grippers (CWG). Shuttle 320' may be provided with 12 wafer-gripper mechanisms 420, for example, as described in U.S. Pat. No. 6,174,011 which is hereby incorporated by reference in its entirety. In alternate aspects of the disclosed embodiment, any suitable wafer gripper mechanism may be used. The gripper mechanism also may be actuated from one end, for example, as shown here the lower end of the Wafer-Gripper which is mounted in the Shuttle (not shown) where a single actuation provides accurate motion of grip features due to deflection of a flexure system of the wafer-gripper. As will be described with respect to FIGS. 24-25, a batch exchange procedure occurs after the Shuttle 320' "B" positions have been loaded by the front-end wafer robot (which simultaneously would remove any finished wafers from the Shuttle 320' "A" positions) and the wafer holder array 324' has been processed through the tool wet processing and drying section. Here, wafers are transferred to and from the Loader by a commercially available wafer-robot in the front end of the tool with an edge grip end-effector and supination capability, which is the capability to rotate the wafer from horizontal orientation in the incoming cassette or FOUP to a vertical orientation suitable for insertion into the Wafer-Gripper/Shuttle 320'. For high speed systems a commercially available wafer-robot with two such end-effectors would be used. In alternate aspects of the disclosed embodiment, simultaneous dual wafer size, for example, 300 mm and 200 mm or otherwise capability may be handled by positioning the 200 mm wafer at the bottom of the wafer holder (i.e. the bottom edge where 200 mm and 300 mm wafers are tangent) so that the Loader mechanism for 200 mm doesn't interfere with that of 300 mm. The motion distance for opening the wafer holder may be different for the 300 and 200 mm sizes. Here, outside dimensions may be substantially similar or identical so the same shear plate nests, Maranon dryer components or other process or post process components may be used for both 200 and 300 mm sizes.

Figure 23B:
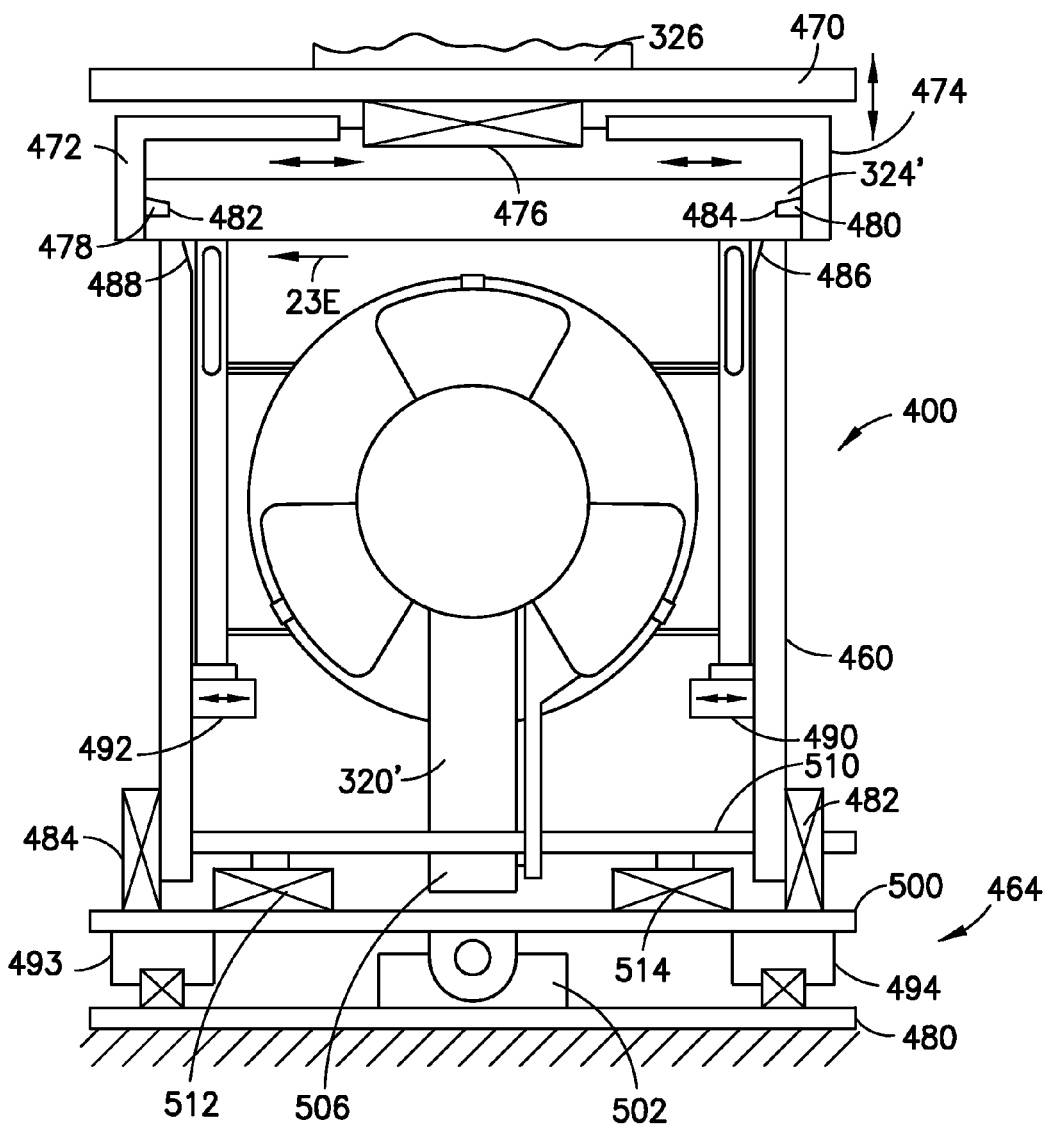
FIG. 23B shows a side view of a loader module and a holder array and a transporter.

Referring now to FIG. 23A, there is shown a cross section of a process tool 300 through a process area 308. In the embodiment shown, transporter 326 transports PAC wafer holder array 324 to and from exemplary process module 340. Process module 340 may have moveable heated covers 430 (shown open) that close above the fluid level 434 of process module 340 and below the crossbar(s) 432 of wafer holder array shown as 324' in a fluid processing position where heated covers 430 are provided to prevent condensation, for example, on the wafer holder array or otherwise. Filter fan unit 438 may be provided within enclosure 442 of system 300 to maintain a clean mini environment where, for example, transporter region 436 may be provided to house moving components of transporter 327 and exhausting air there from through exhaust plenum 440. Referring now to FIG. 23B, there is shown a cross section of an exemplary batch exchange loader 400. Loader 400 may have shuttle array 320', wafer holder array support 460 and shuttle 464. In the embodiment shown, shuttle array 320' is capable of holding both processed and unprocessed wafers as described above. In alternate aspects of the disclosed embodiment, shuttle array 320' may be only capable of holding either processed or unprocessed wafers. Alternately, shuttle array 320' may not be provided, for example, where wafer holder array 324' is capable of being shuttled, for example, to an input or output location and wafers transferred directly by the wafer handling robot to and from wafer holder array 324' directly without the use of an intermediate shuttle array. In the embodiment shown, shuttle 464 is shown as a single shuttle. In alternate aspects of the disclosed embodiment, a second or more shuttle(s) may be provided on the same or different axis of motion, either coupled or independently and selectably positionable and operable and capable of handling an additional shuttle array, an additional wafer holder array or otherwise. Further, in alternate aspects of the disclosed embodiment, shuttle 464 may be provided with the capability to selectably re-orient shuttle array 320', wafer holder array 324' or otherwise to any suitable orientation, for example, from vertical to horizontal or otherwise. Transporter 326 may transport wafer holder array 324' to and from loader 400 where loader 400 may be provided with features to load and unload wafers to and from wafer holder array 324' in conjunction with transporter 326, for example, where transporter 326 is used for vertical motion and holding wafer holder array 324' stationary relative to the shuttle or shuttle array during transfer. In alternate aspects of the disclosed embodiment, loader 400 may operate and be capable of transferring wafers to and from wafer holder array 324' independent of transporter 326, for example, where transporter 326 may be transporting other PAC wafer holder array(s) from process to process or otherwise in parallel with operation of loader 400 loading and/or unloading substrates to or from substrate holder array 324'. Transporter 326 may have gripper portion 470 having first and second grippers 472, 474 actuated by actuator 476 where actuator 476 may selectively grip or release a wafer transport array. Gripper portions 472, 474 may have any suitable gripping features 478, 480 that engage mating features 482, 484 in wafer holder array 324'. Gripper portions 472, 474 and gripping features 478, 480 may be rigid or compliant as required and may have lead in features, pin and socket features or any suitable feature to positively locate gripper 470 relative to a wafer holder array. Support 460 may be provided, for example, where transporter is not required during a wafer batch exchange where support 460 may be grounded to frame 480 or moving shuttle 464. One or two axis actuators 482, 484 may be provided to move support 460 vertically, horizontally or otherwise to support a batch transfer of wafers, for example independent of or in conjunction with transporter 326 where actuators 482, 484 may be grounded to frame 480 or moving shuttle 464. Lead in features 486, 488 may be provided in support 460 to facilitate guidance of wafer holder array 324' during insertion or otherwise. Clamps (not shown) may be provided to positively couple wafer holder array 324' to support 460. Actuators 490, 492 may be provided to selectively release or grip wafers with wafer holder array 324' where actuators 490, 492 may be grounded to support 460, frame 480 or otherwise. Shuttle 464 may be grounded to frame 480 having slides 494, 498, shuttle support table 500 and drive 502 where drive 502 may be a lead screw drive or any suitable linear drive that may selectable position table 500 with respect to ground 480. Shuttle array 320' may be supported directly by shuttle table 500 and may have actuator(s) 406 that selectively grip or ungrip one or more wafers (may be individually or as a group) with respect to shuttle array 320'. In alternate aspects of the disclosed embodiment, shuttle array 320' may be supported by intermediate support 510 that may be moveable relative to shuttle table 500, for example, with actuators 512, 514 that may be one or two axis actuators, for example vertical and/or horizontal to facilitate batch transfer of wafers. In alternate aspects of the disclosed embodiment, any suitable combination of supports, actuators or otherwise may be used to facilitate batch transfer of wafers. Referring now to FIG. 23C, there is shown a cross section of a PAC wafer holder 324' cross bar 432. In the embodiment shown, cavities may be provided to reduce weight and smoothed drip minimizing surfaces may be provided to minimize potential for dripping, Further, coatings may be provided to eliminate or reduce condensation to prevent carrying condensate from one process to another. Potential drip surfaces further may be offset, for example, offset from the wafer surface or otherwise.

In accordance with another aspect of the disclosed embodiment, a substrate unload and load apparatus 400 adapted to unload a plurality of processed substrates from a plurality of arrayed substrate holders and load a plurality of unprocessed substrates to the plurality of arrayed substrate holders is provided. The substrate unload and load apparatus 400 has a frame and a plurality of processed substrate supports "A" coupled to the frame and configured to support the plurality of processed substrates. A plurality of unprocessed substrate supports "B" are coupled to the frame and configured to support the plurality of un processed substrates. Each of the plurality of unprocessed substrate supports are alternating and interleaved with respect to each of the plurality of processed substrate supports. A holder release 490, 492 is coupled to the frame and configured to engage the plurality of arrayed substrate holders. The holder release has a first state where the plurality of arrayed substrate holders releases the plurality of processed substrates from the plurality of arrayed substrate holders. The holder release has a second state where the plurality of arrayed substrate holders captures the plurality of un processed substrates with the plurality of arrayed substrate holders. The plurality of processed substrates are unloaded from the plurality of arrayed substrate holders to the plurality of processed substrate supports in the first state. The plurality of unprocessed substrates are loaded from the plurality of unprocessed substrate supports to the plurality of arrayed substrate holders in the second state. The plurality of processed substrates are unloaded from the plurality of arrayed substrate holders while in a vertical orientation. The plurality of unprocessed substrates are loaded to the plurality of arrayed substrate holders while in a vertical orientation. The plurality of processed substrate supports and the plurality of unprocessed substrate supports are coupled to the frame with an indexer, where the indexer simultaneously moves the plurality of processed substrate supports and the plurality of unprocessed substrate supports from a first position where the plurality of processed substrates are unloaded from the plurality of arrayed substrate holders to a second position where the plurality of unprocessed substrates are loaded to the plurality of arrayed substrate holders. The holder release disengages substrate edge support members of the plurality of arrayed substrate holders from edges of the plurality of processed substrates when in the first state. The holder release engages the substrate edge support members to edges of the plurality of unprocessed substrates when in the second state. Each of the plurality of unprocessed substrates supported by the plurality of unprocessed substrate supports are alternating and interleaved with respect to each of the plurality of processed substrates supported by the plurality of processed substrate supports. Each of the plurality of unprocessed substrates supported by the plurality of unprocessed substrate supports are axially aligned with respect to each of the plurality of processed substrates supported by the plurality of processed substrate supports. Edges of the plurality of unprocessed substrates are supported by the plurality of unprocessed substrate supports, where edges of the plurality of processed substrates are supported by the plurality of processed substrate supports. The plurality of processed substrates are simultaneously unloaded as a processed substrate group from the plurality of arrayed substrate holders to the plurality of processed substrate supports in the first state. The plurality of unprocessed substrates are simultaneously loaded as a unprocessed substrate group from the plurality of unprocessed substrate supports to the plurality of arrayed substrate holders in the second state. A plurality of holder supports are coupled to the frame and configured to support and align each holder of the plurality of arrayed substrate holders independent of the other holders in the plurality of arrayed substrate holders.

Figure 24C:
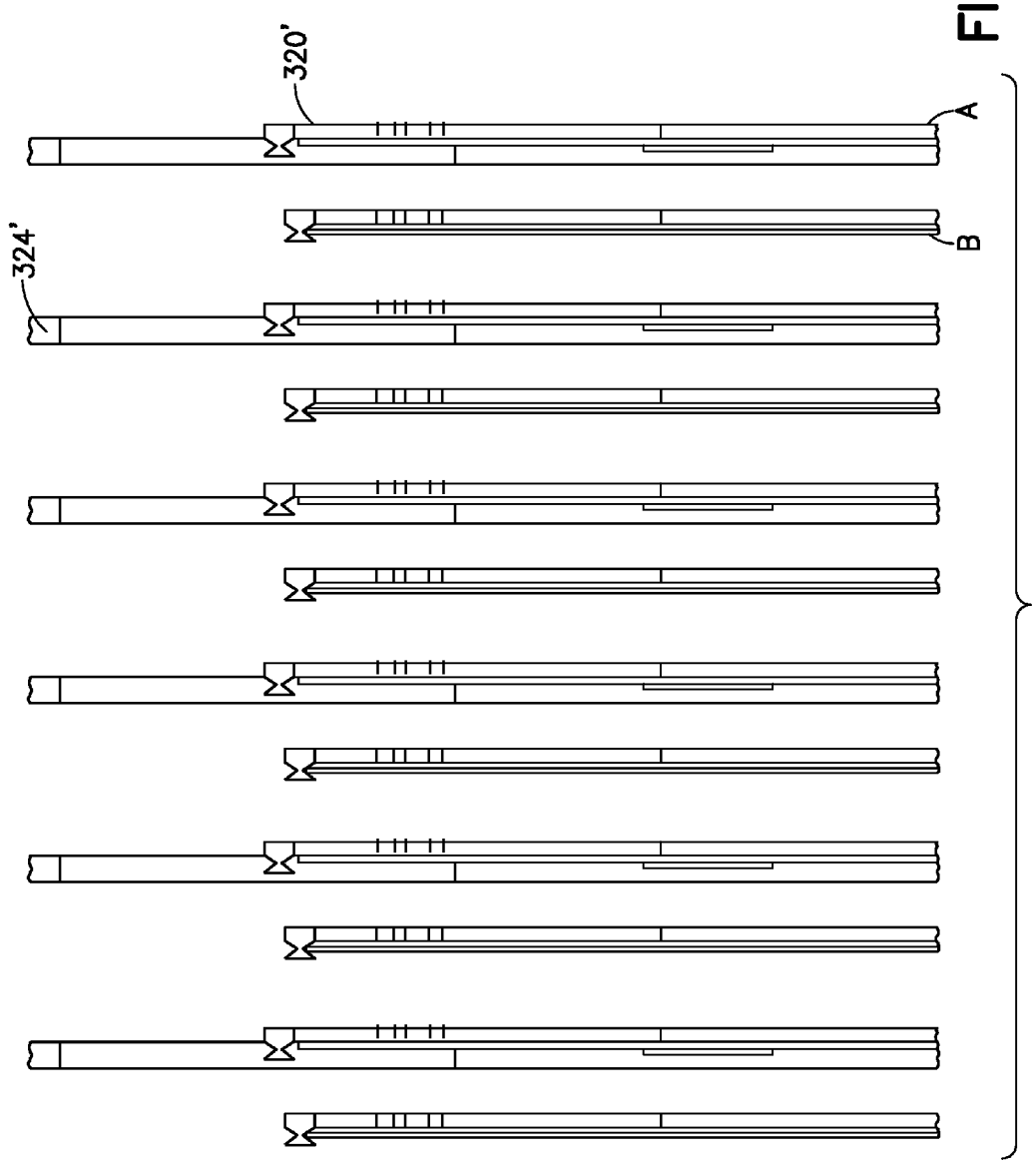
FIG. 24C shows a partial front view of a loader module and a holder array.
Figure 24D:
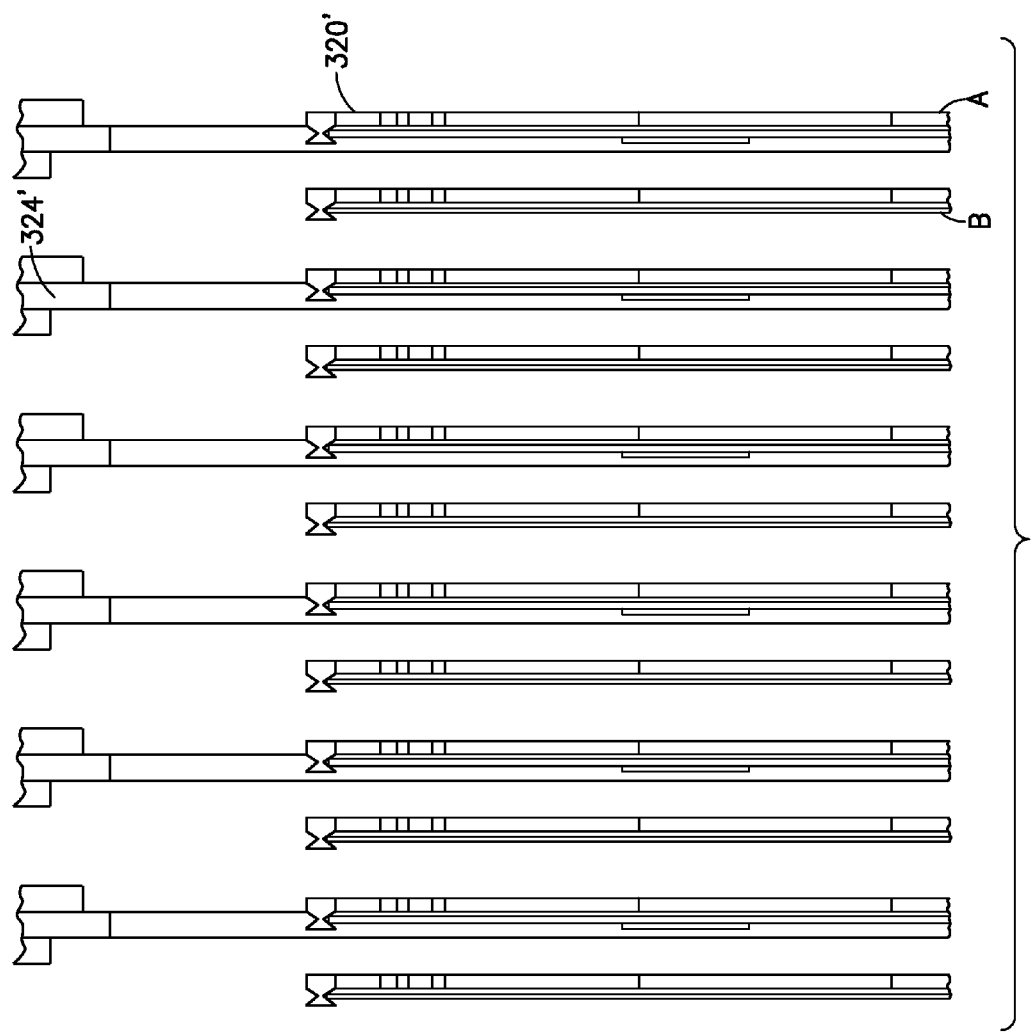
FIG. 24D shows a partial front view of a loader module and a holder array.
Figure 24E:
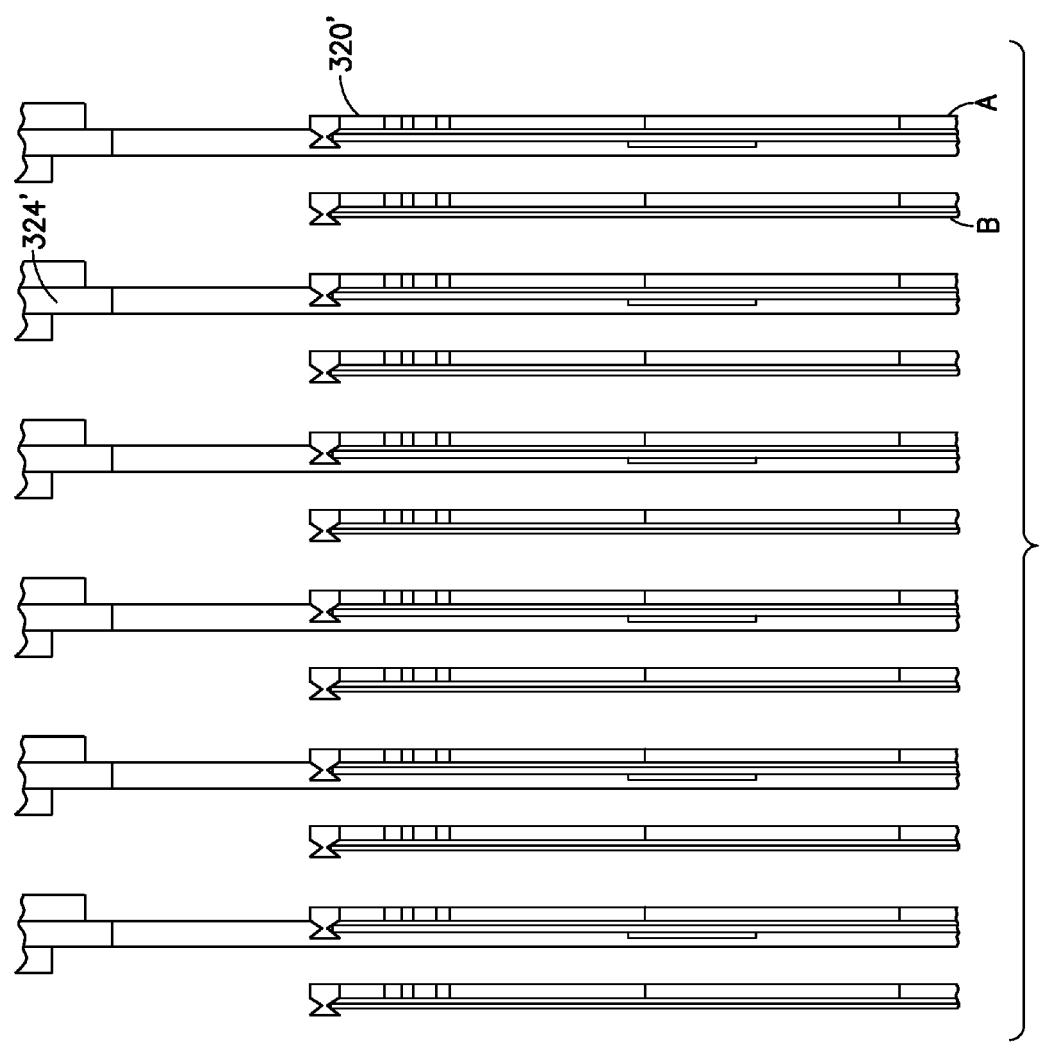
FIG. 24E shows a partial front view of a loader module and a holder array.
Figure 24F:
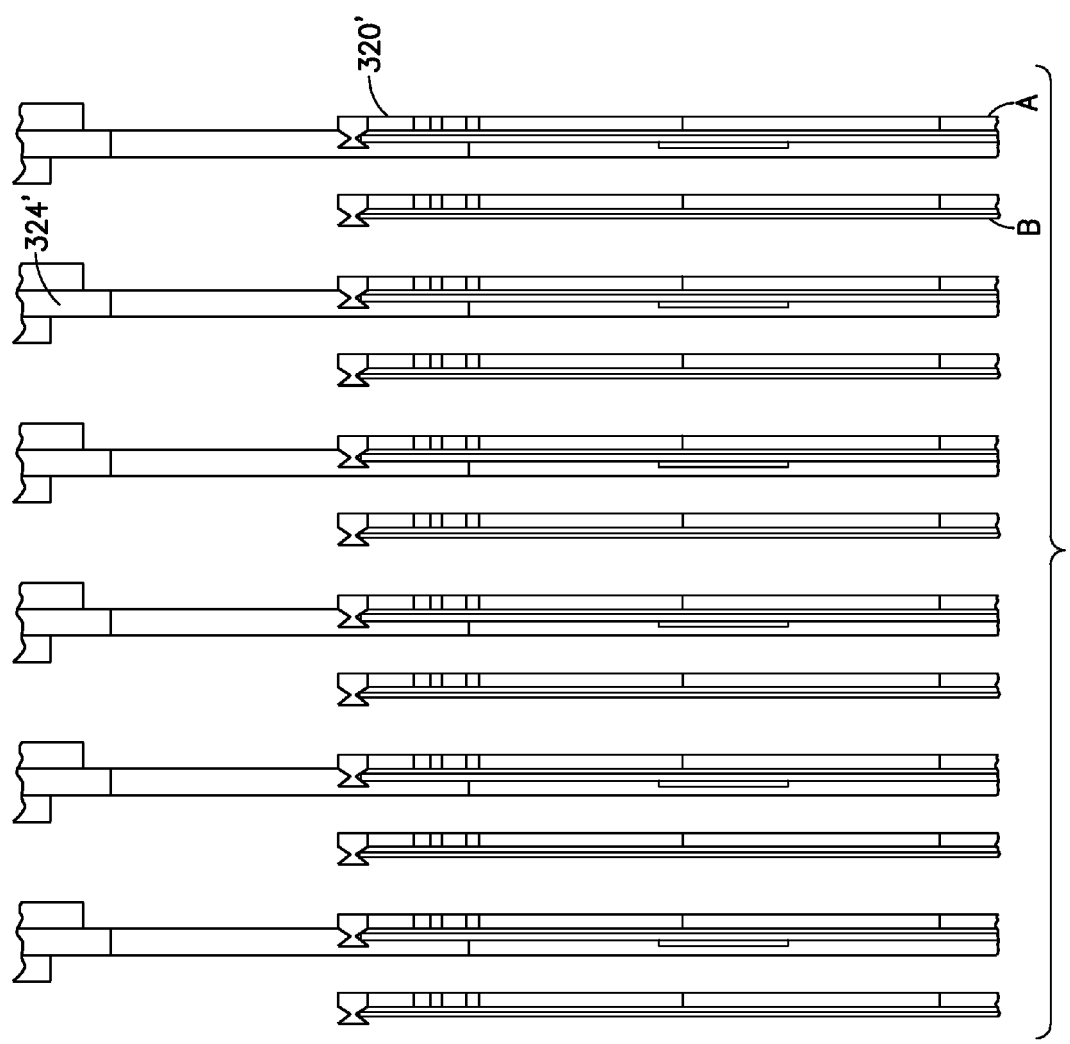
FIG. 24F shows a partial front view of a loader module and a holder array.
Figure 24J:
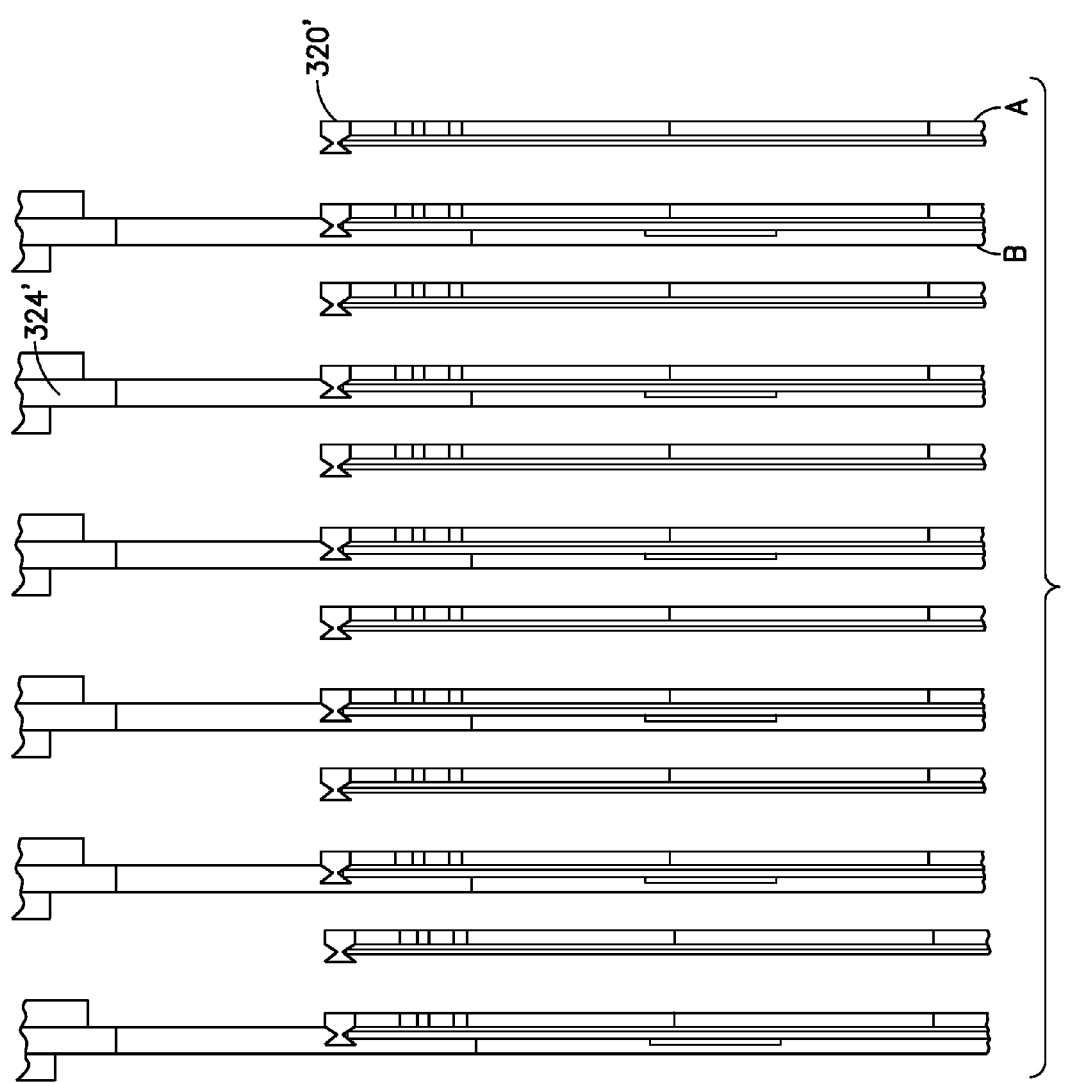
FIG. 24J shows a partial front view of a loader module and a holder array.
Figure 24K:
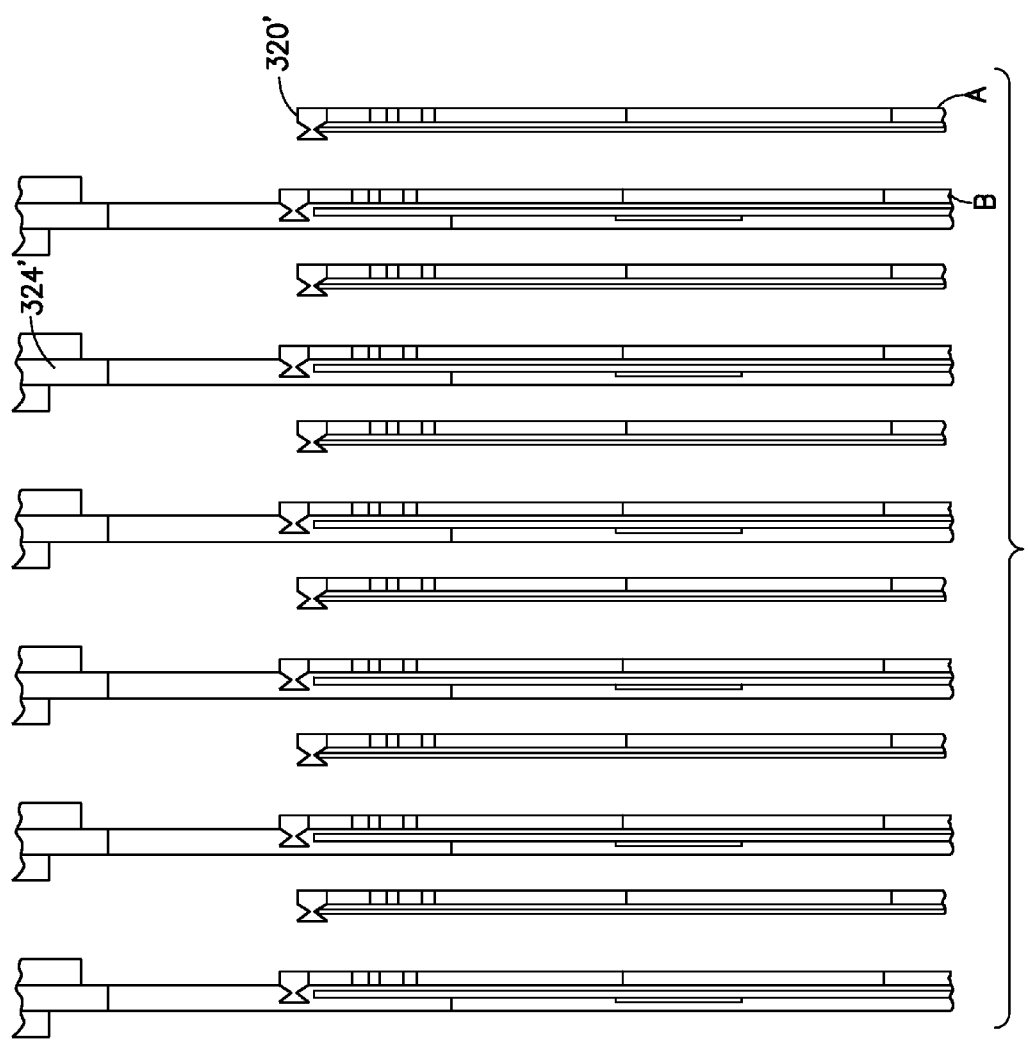
FIG. 24K shows a partial front view of a loader module and a holder array.
Figure 24L:
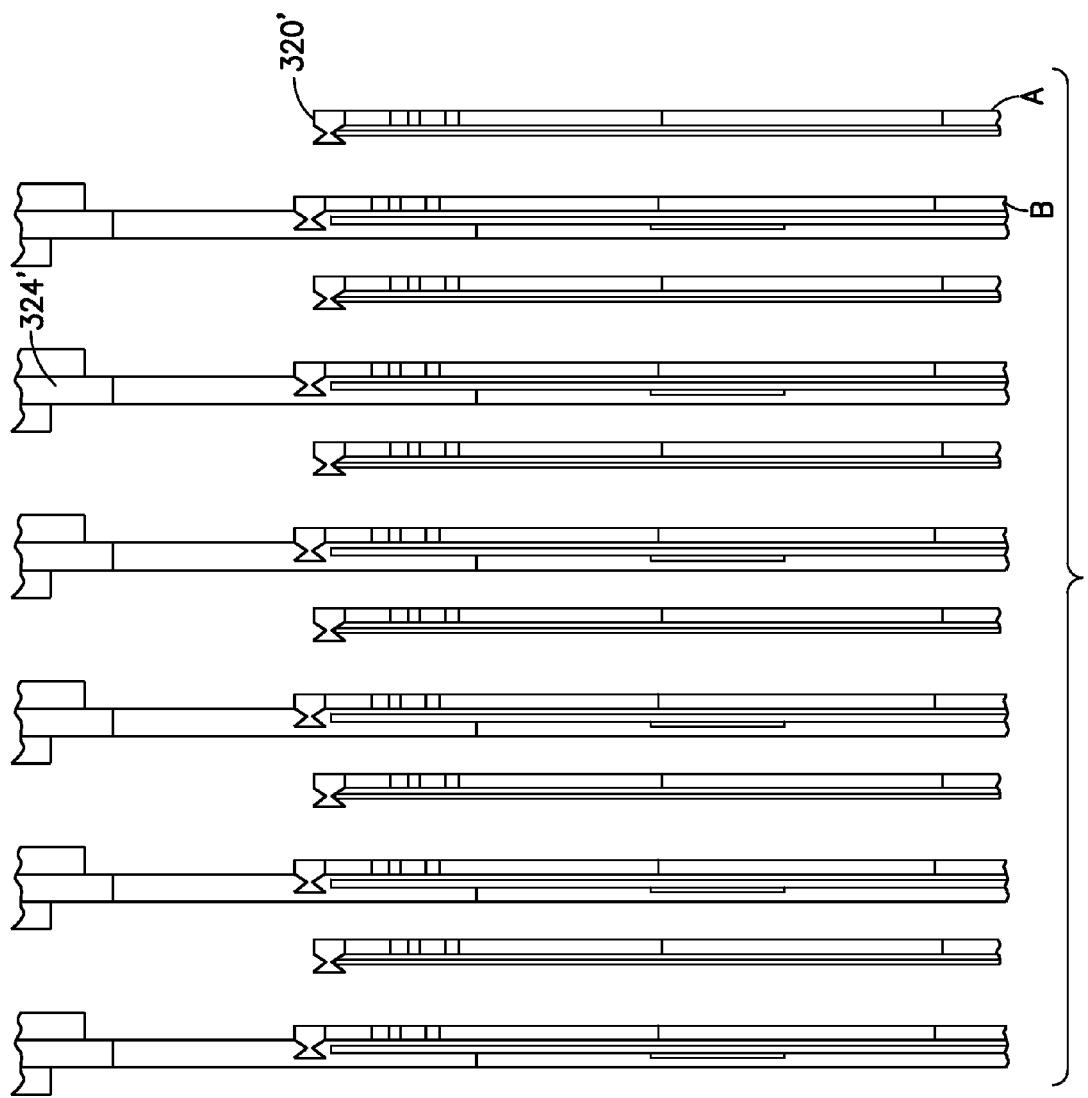
FIG. 24L shows a partial front view of a loader module and a holder array.
Figure 25A:
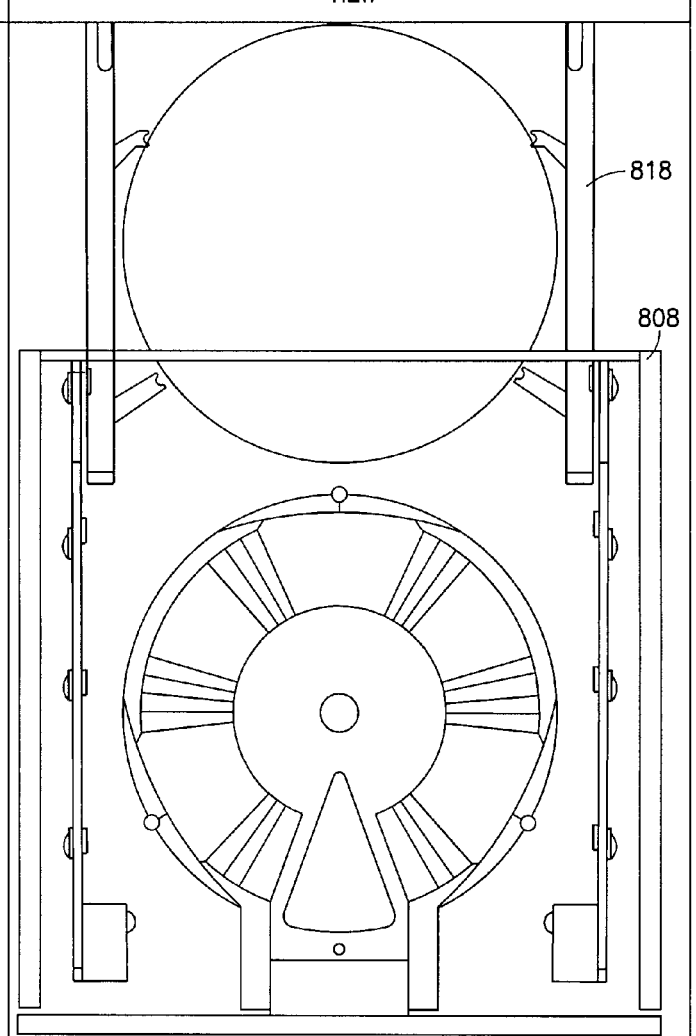
FIG. 25A shows a table of loader motions.
Figure 25B:
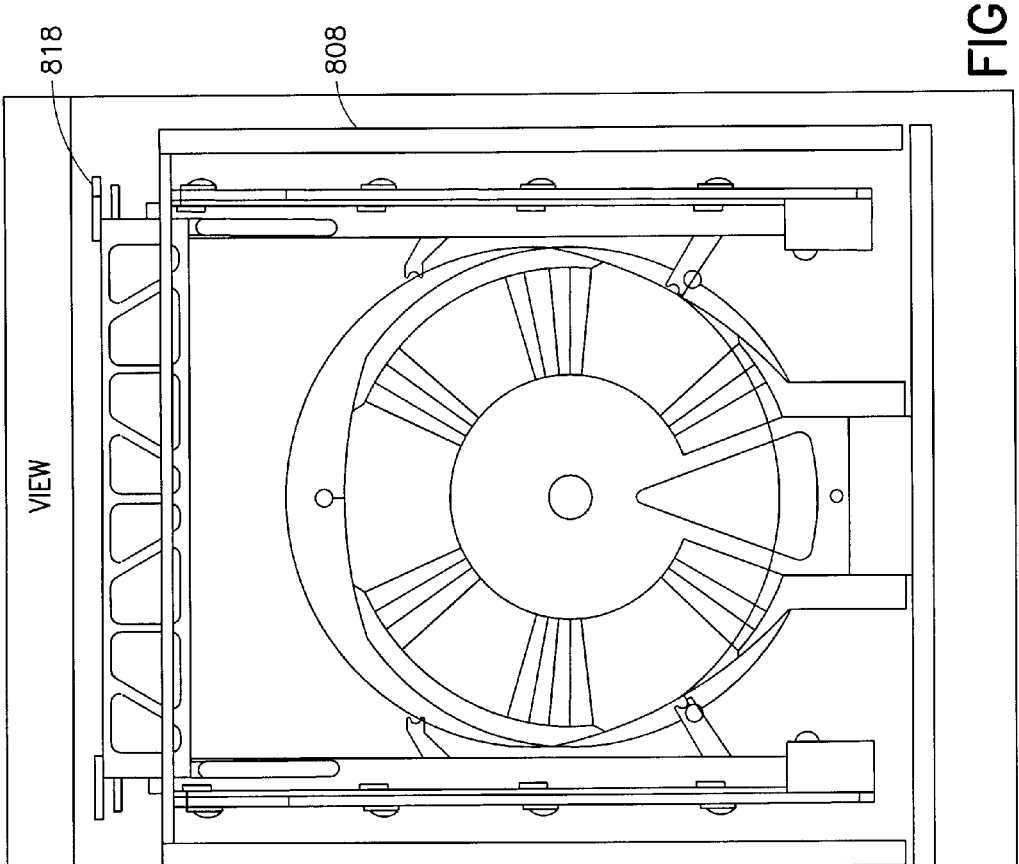
FIG. 25B shows a table of loader motions.
Figure 25C:
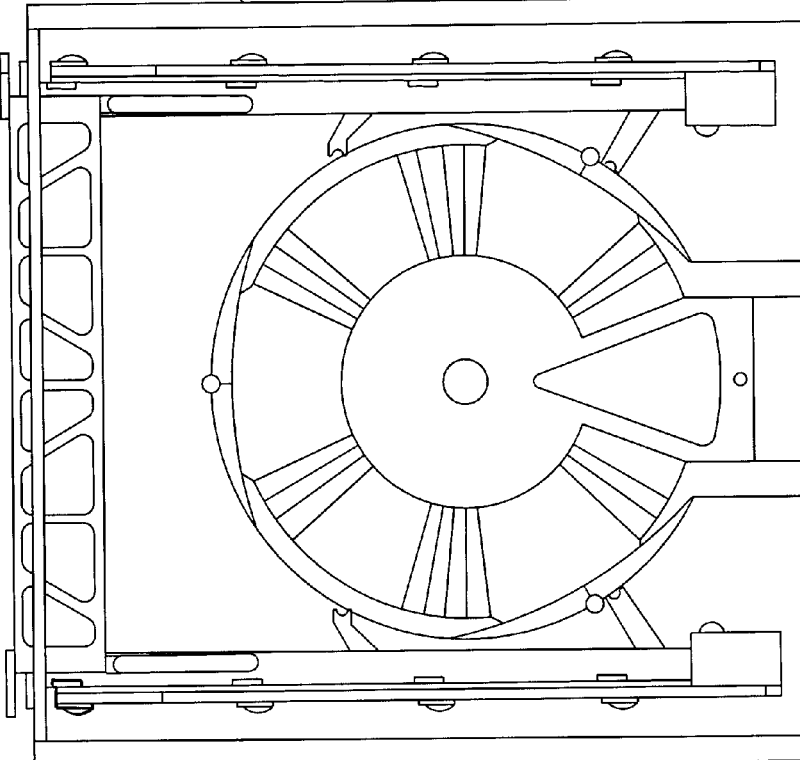
FIG. 25C shows a table of loader motions.
Figure 25D:
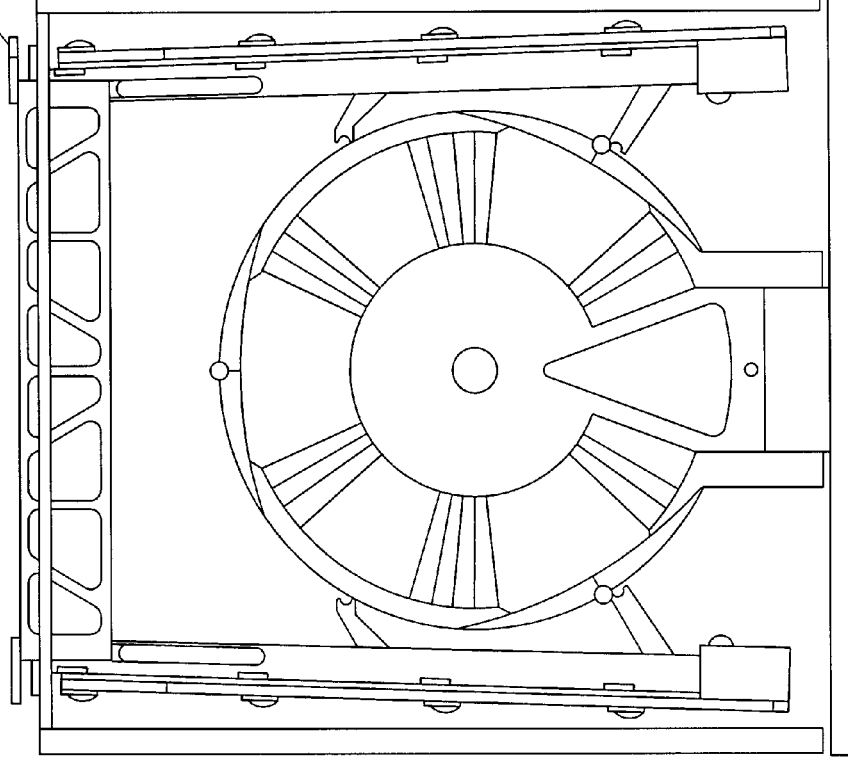
FIG. 25D shows a table of loader motions.
Figure 25E:
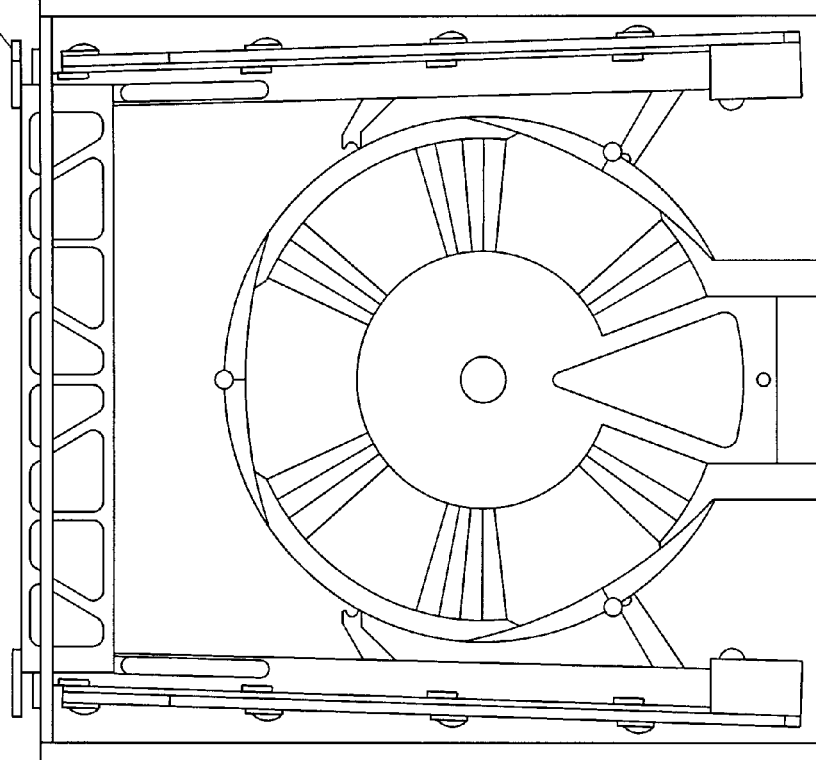
FIG. 25E shows a table of loader motions.

Referring now to FIGS. 24A-24M, there is shown an exemplary load sequence. Referring now to FIG. 24A, there is shown a side view of holder array 324' and shuttle array 320'. Here, the motion and state includes vertical motion downward by PAC WH-Array 324' into the Shuttle 320' and shown for example, 1 inch above the Z aligned position. Here, the WH-Array 324' is shown full with outgoing wafers and contact surfaces closed. Here, Shuttle-A positions are shown empty with contact surfaces in open position and Shuttle-B positions are shown full with incoming wafers with contact surfaces in closed position. Referring also to FIG. 24B, there is shown a side view of holder array 324' and shuttle array 320'. Here, the motion and state includes vertical motion downward by WH-Array 324' into the Shuttle 320' and shown in Z aligned position. Here, the PAC WH-Array 324' is shown full with outgoing wafers and contact surfaces closed. Here, shuttle-A positions are shown empty with contact surfaces in open position and Shuttle-B positions are shown full with incoming wafers with contact surfaces in closed position. Referring also to FIG. 24C, there is shown a side view of holder array 324' and shuttle array 320'. Here, the motion and state includes horizontal motion by Shuttle 320' to align "A" positions with WH-Array 324' wafers. Here, WH-Array 324' is shown full with outgoing wafers and contact surfaces closed. Here, Shuttle-A positions are shown full with contact surfaces in open position and Shuttle-B positions are shown full with incoming wafers with contact surfaces in closed position. Referring also to FIG. 24D, there is shown a side view of holder array 324' and shuttle array 320'. Here, the motion and state includes Shuttle "A" position flexures closed on the outgoing wafers. Here, WH-Array 324' is shown full with outgoing wafers and contact surfaces closed. Here, Shuttle-A positions are shown full with contact surfaces in closed position and Shuttle-B positions are shown full with incoming wafers with contact surfaces in closed position. Referring also to FIG. 24E, there is shown a side view of holder array 324' and shuttle array 320'. Here, the motion and state includes WH-Array 324' flexures open to release the outgoing wafers. Here, WH-Array 324' is shown full with outgoing wafers and contact surfaces opened. Here, Shuttle-A positions are shown full with contact surfaces in closed position and Shuttle-B positions are shown full with incoming wafers with contact surfaces in closed position. Referring also to FIG. 24F, there is shown a side view of holder array 324' and shuttle array 320'. Here, the motion and state includes where WH-array 324' moves up, for example, 0.180" to allow shuttle 320' to move outgoing wafers past its contact surfaces. Here, WH-Array 324' is shown empty with contact surfaces opened. Here, Shuttle-A positions are shown full with outgoing wafers with contact surfaces in closed position and Shuttle-B positions are shown full with incoming wafers with contact surfaces in closed position. Referring also to FIG. 24G, there is shown a side view of holder array 324' and shuttle array 320'. Here, the motion and state includes where Shuttle 320' moves horizontally to align incoming wafers with WH-Array 324' contact surfaces. Here, WH-Array 324' is shown empty and up with contact surfaces opened. Here, Shuttle-A positions are shown full with outgoing wafers with contact surfaces in closed position and Shuttle-B positions are shown full with incoming wafers with contact surfaces in closed position. Referring also to FIG. 24H, there is shown a side view of holder array 324' and shuttle array 320'. Here, the motion and state includes where WH-Array 324' moves downward, for example, by 0.180" to align with Shuttle 320'. Here, WH-Array 324' is shown empty and down with contact surfaces opened. Here, Shuttle-A is shown full with outgoing wafers with contact surfaces in closed position and Shuttle-B is shown full with incoming wafers with contact surfaces in closed position. Referring also to FIG. 24I,J, there is shown a side view of holder array 324' and shuttle array 320'. Here, the motion and state includes where WH-Array 324' flexures close to capture incoming wafers. Here, WH-Array 324' is shown full and down with contact surfaces closed. Here, Shuttle-A positions are shown full with outgoing wafers with contact surfaces in closed position and Shuttle-B positions are shown full with incoming wafers with contact surfaces in closed position. Referring also to FIG. 24K, there is shown a side view of holder array 324' and shuttle array 320'. Here, the motion and state includes where Shuttle-B positions contact surfaces open to release incoming wafers. Here, WH-Array 324' is shown full and down with contact surfaces closed. Here, Shuttle-A positions are shown full with outgoing wafers with contact surfaces in closed position and Shuttle-B positions are shown full with incoming wafers with contact surfaces in open position. Referring also to FIG. 24L, there is shown a side view of holder array 324' and shuttle array 320'. Here, the motion and state includes where Shuttle 320' moves horizontally to allow clearance for WH-Array 324' to be extracted. Here, WH-Array 324' is shown full with incoming wafers and down with contact surfaces closed. Here, Shuttle-A positions are shown full with outgoing wafers with contact surfaces in closed position and Shuttle-B positions are shown empty with contact surfaces in open position. Referring also to FIG. 24M, there is shown a side view of holder array 324' and shuttle array 320'. Here, the motion and state includes where WH-Array 324' moves vertically out of the Loader and proceeds to process the incoming wafers. Here, WH-Array 324' is shown full with incoming wafers and moving upward with contact surfaces closed. Here, Shuttle-A positions are shown full with outgoing wafers with contact surfaces in closed position and Shuttle-B positions are shown empty with contact surfaces in open position. In alternate aspects of the disclosed embodiment, the loader may move shuttle array 320' vertically to engage and disengage wafer holder array 324' instead of, for example, the transporter or otherwise moving wafer holder array 324' vertically. Further, in alternate aspects of the disclosed embodiment, up and down movements of wafer holder array 324 may not be required.

Referring now to FIGS. 25A-25E there is shown a table with the primary vertical and pivot motions made by the Loader WH-Dock 808 and the WH-Array 818 (586) during a load/unload operation at the wafer level. The table shown in FIGS. 25A-25E may be used in conjunction with the sequence shown in FIGS. 24A-24M as an exemplary sequence of Shuttle moves used to unload reload a WH-Array.

Figure 26:
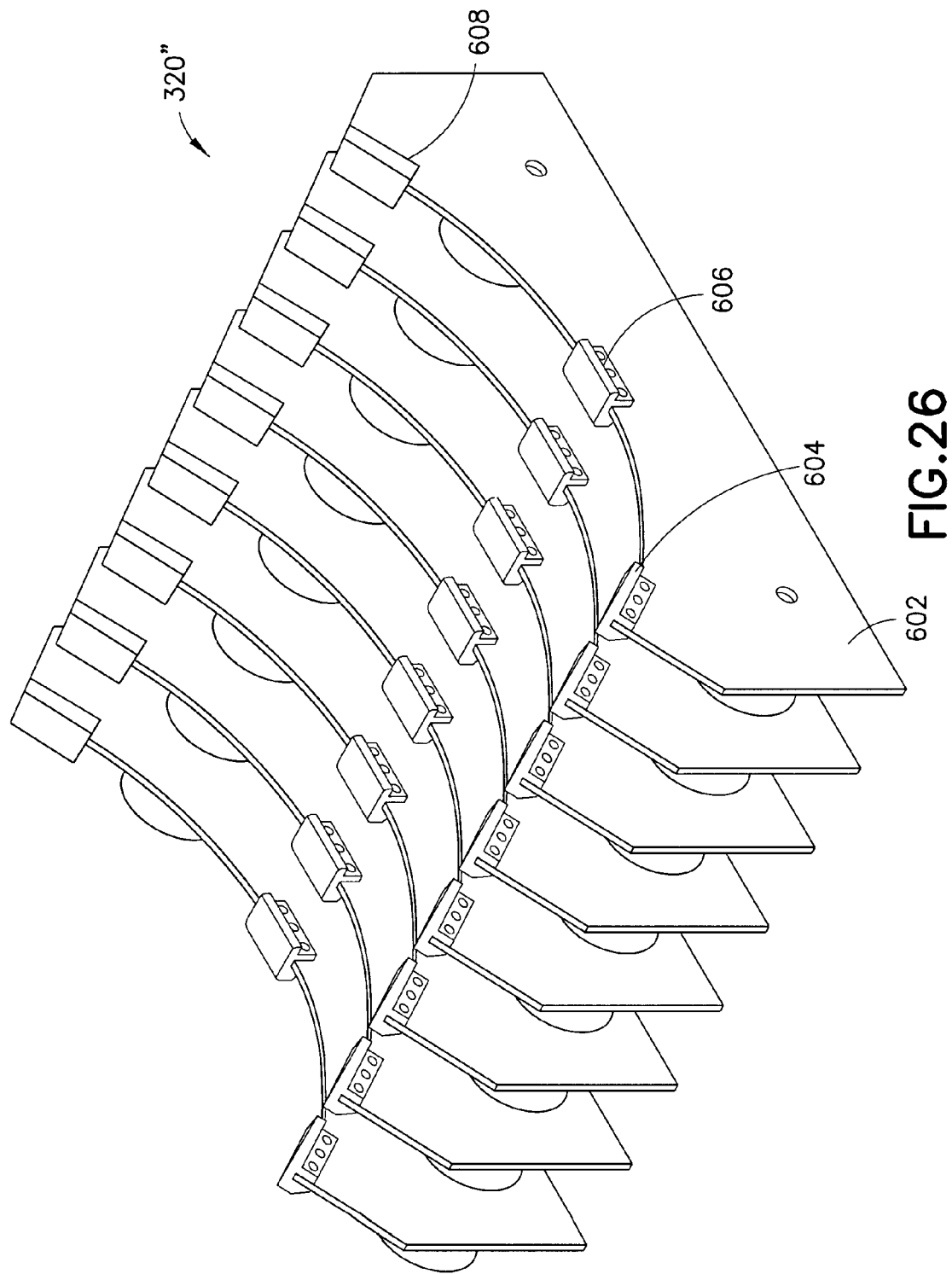
FIG. 26 shows a partial isometric view of a loader module.
Figure 30A:
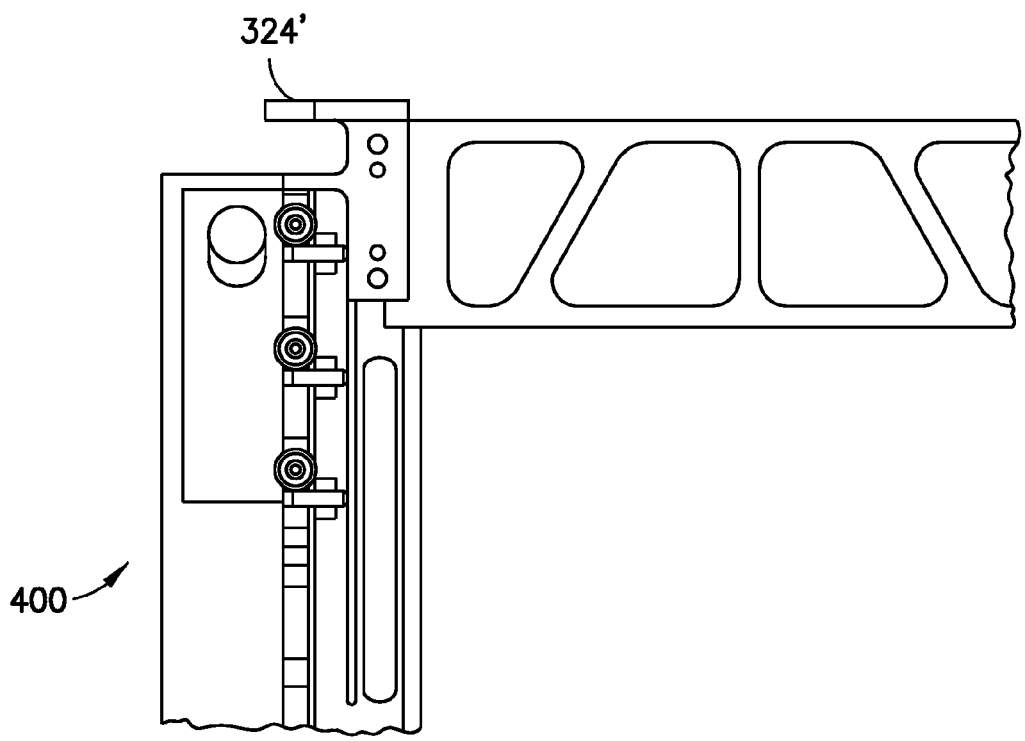
FIG. 30A shows a partial front view of a loader module and a holder array.
Figure 30B:
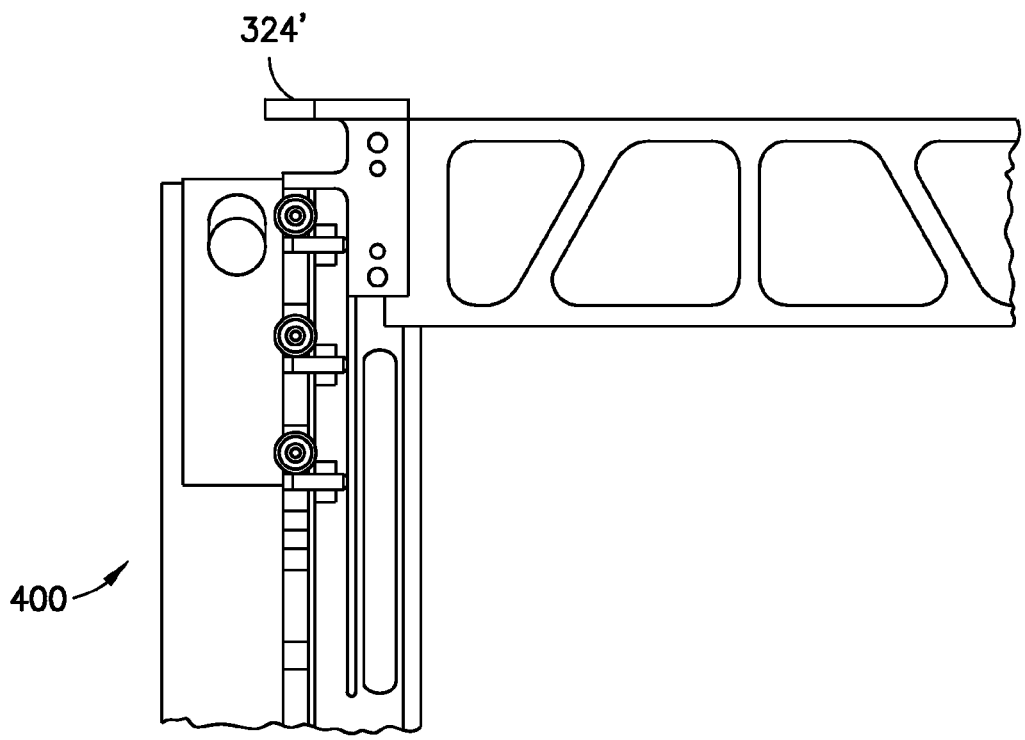
FIG. 30B shows a partial front view of a loader module and a holder array.

Referring now to FIG. 26, there is shown a partial isometric view of shuttle array 320" of a loader module showing an alternate aspect of the disclosed embodiment. Referring also to FIG. 27, there is shown a partial isometric view of shuttle array 320". In the embodiment shown, array 320" has an array of supports 602, each having three wafer supports 604, 606, 608. Each of the wafer supports has two grooves 610, 612 corresponding to A and B positions of shuttle array as previously described. Wafer supports 604, 606, 608 cooperate to support outgoing 612 and incoming (not shown) wafers in a vertical orientation as previously described with respect to shuttle 320' or otherwise as previously described. Referring also to FIG. 30A, there is shown a partial front view of a loader module 400 and a holder array 324'. Referring also to FIG. 30B, there is shown a partial front view of a loader module 400 and a holder array 324'. FIG. 30A shows PAC 324' in the insert/removal position, whereas FIG. 30B shows PAC 324' opened where the opened PAC has been lifted by 1.5 mm relative to loader module 400. This small secondary motion may be required to compensate for the difference in position between upper and lower wafer contact surfaces, and the horizontal and vertical coupling of their positions during flexure loading.

Figure 28A:
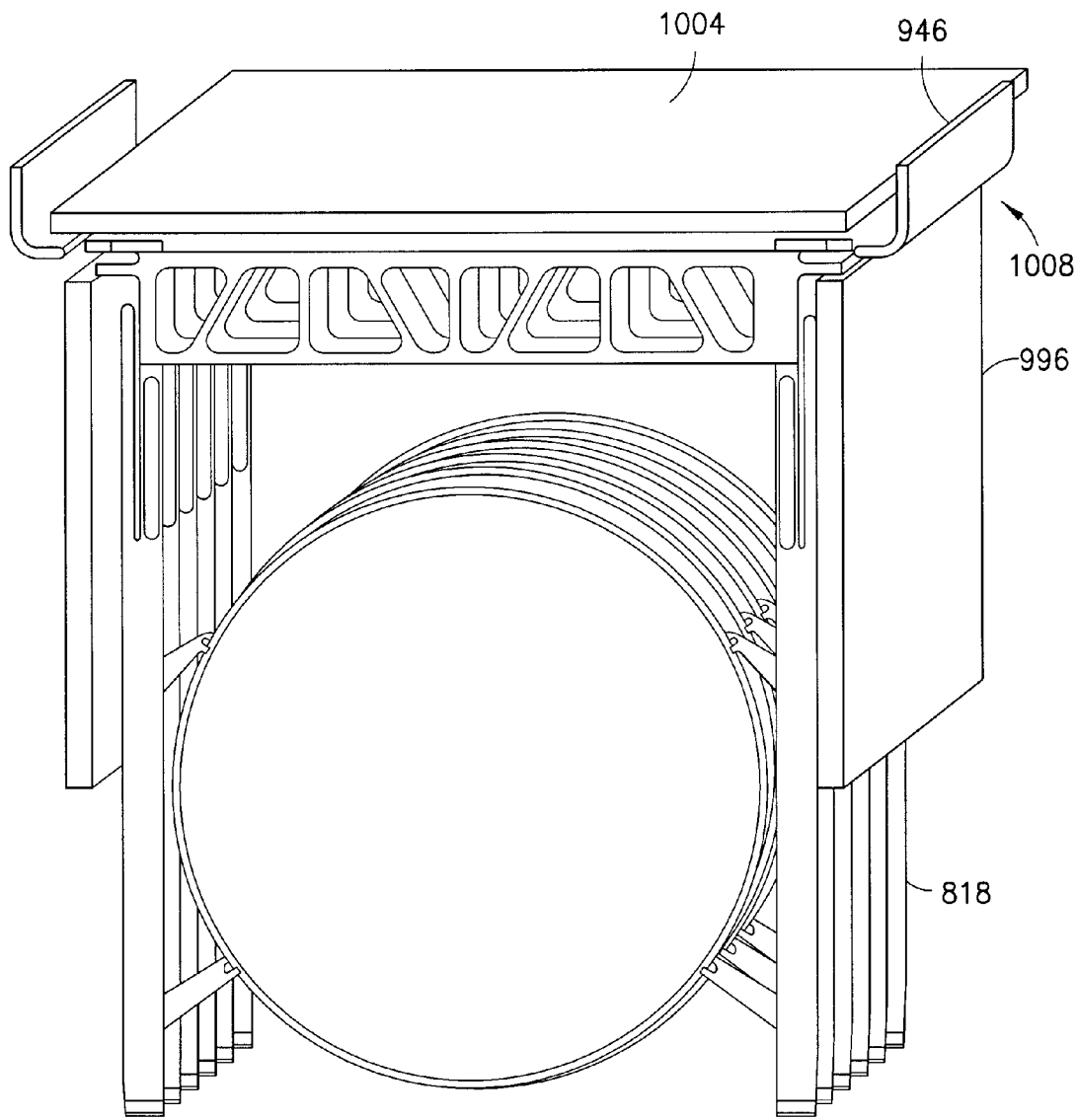
FIG. 28A shows an isometric view of a holder array.
Figure 28B:
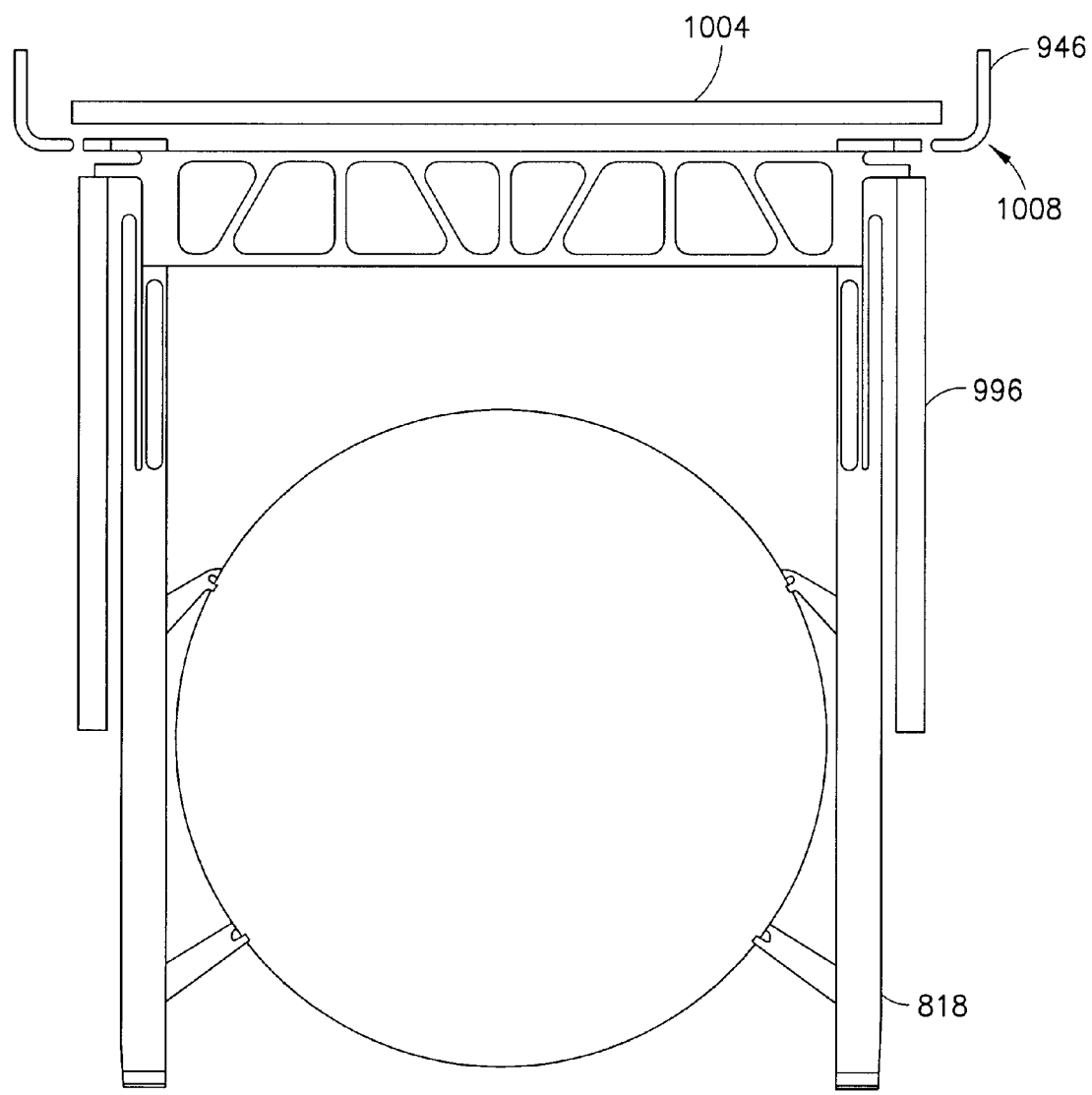
FIG. 28B shows a side view of a holder array.
Figure 28C:
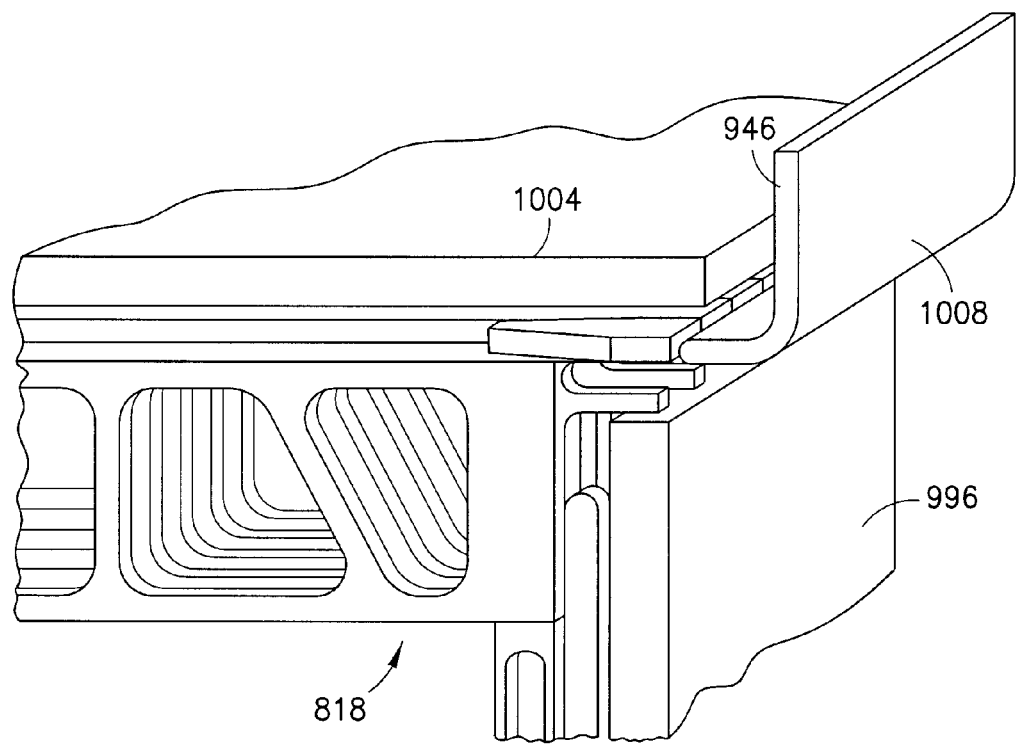
FIG. 28C shows a partial isometric view of a holder array.
Figure 28D:
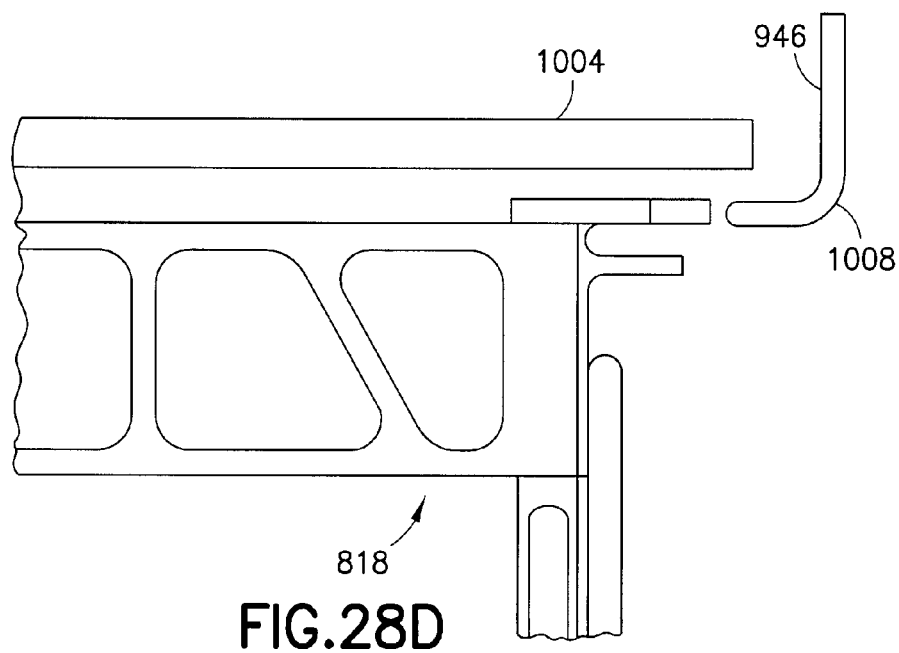
FIG. 28D shows a partial sideview of a holder array.
Figure 29A:
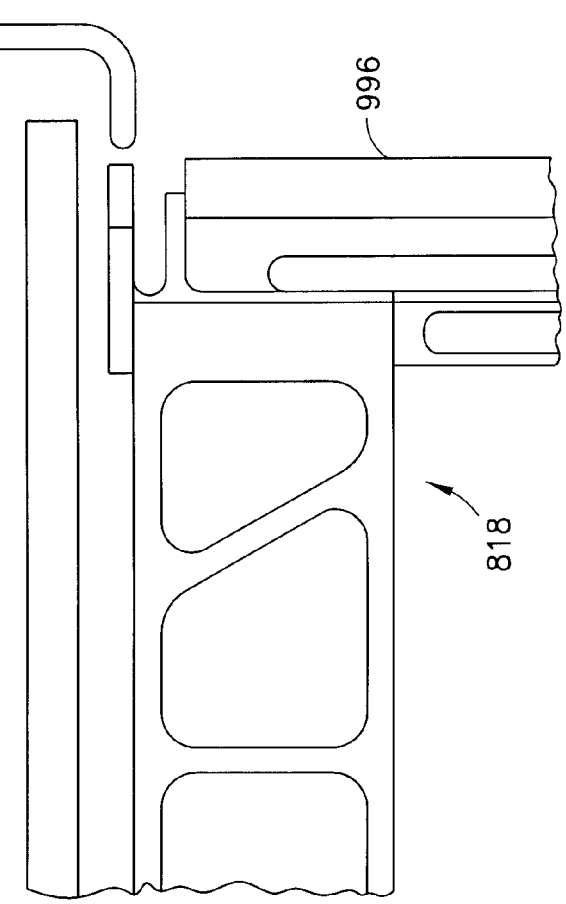
FIG. 29A shows a transporter and array motion and state table.
Figure 29D:
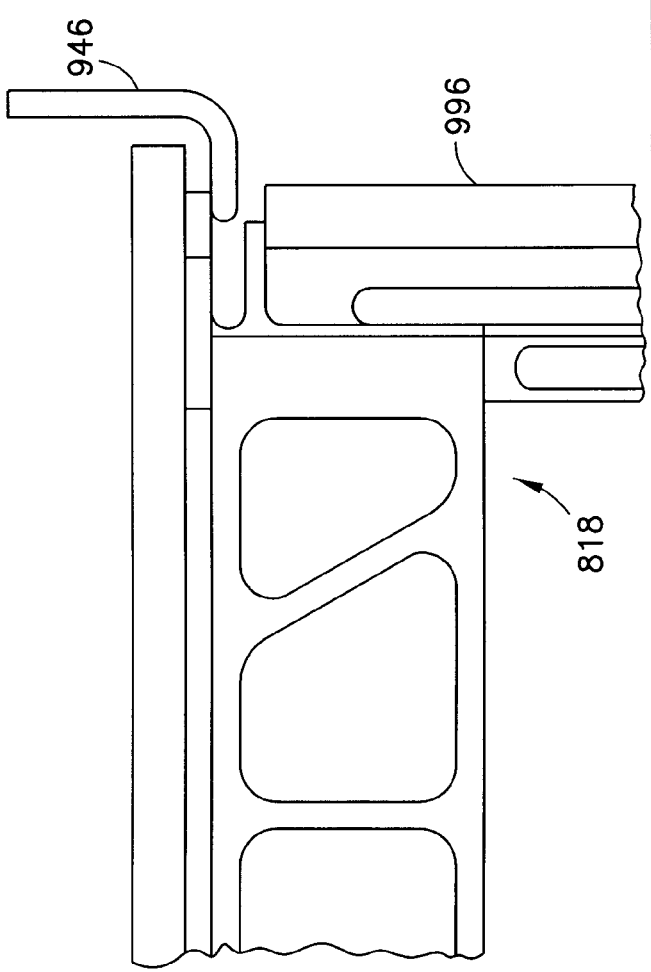
FIG. 29D shows a transporter and array motion and state table.
Figure 29E:
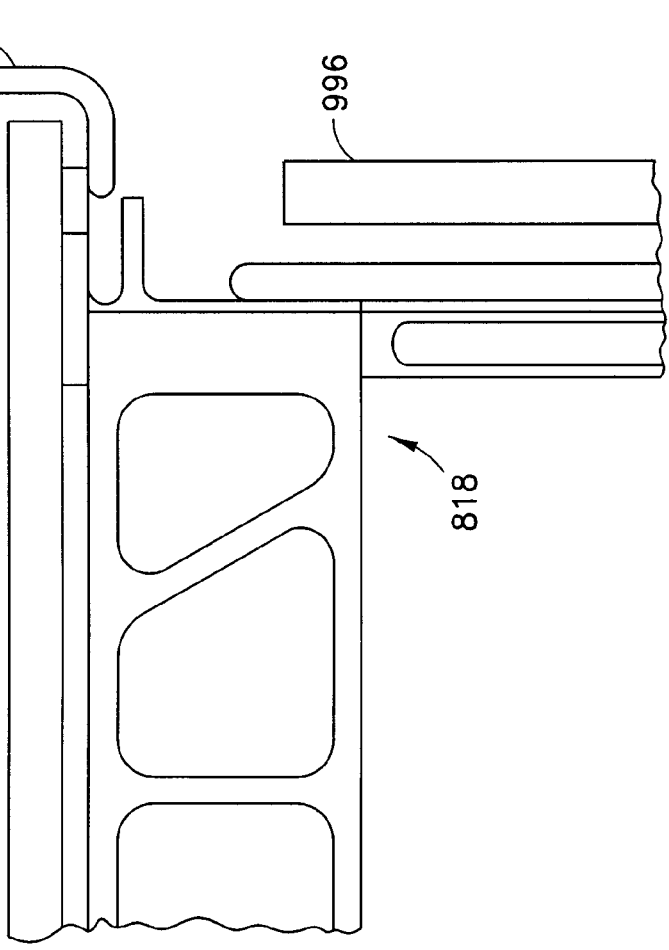
FIG. 29E shows a transporter and array motion and state table.
Figure 29F:
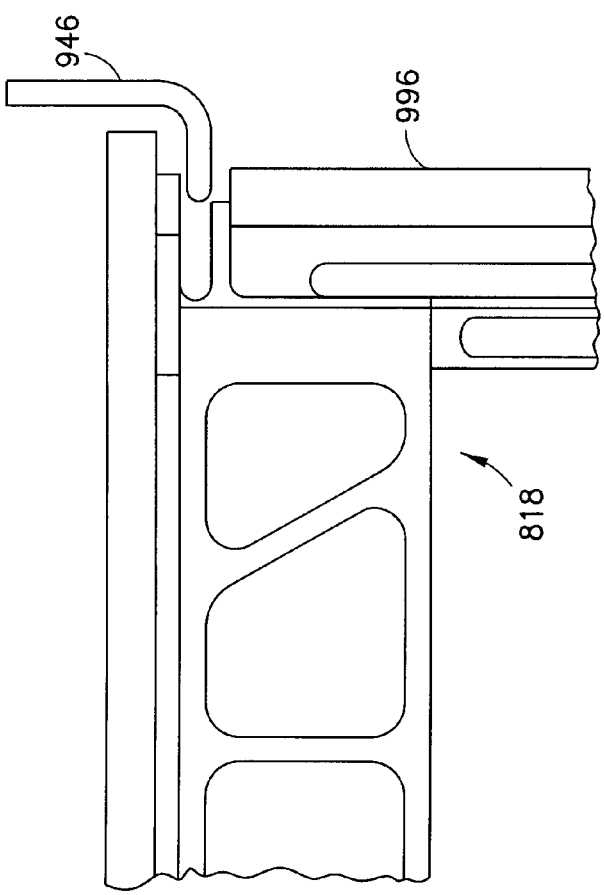
FIG. 29F shows a transporter and array motion and state table.
Figure 29G:
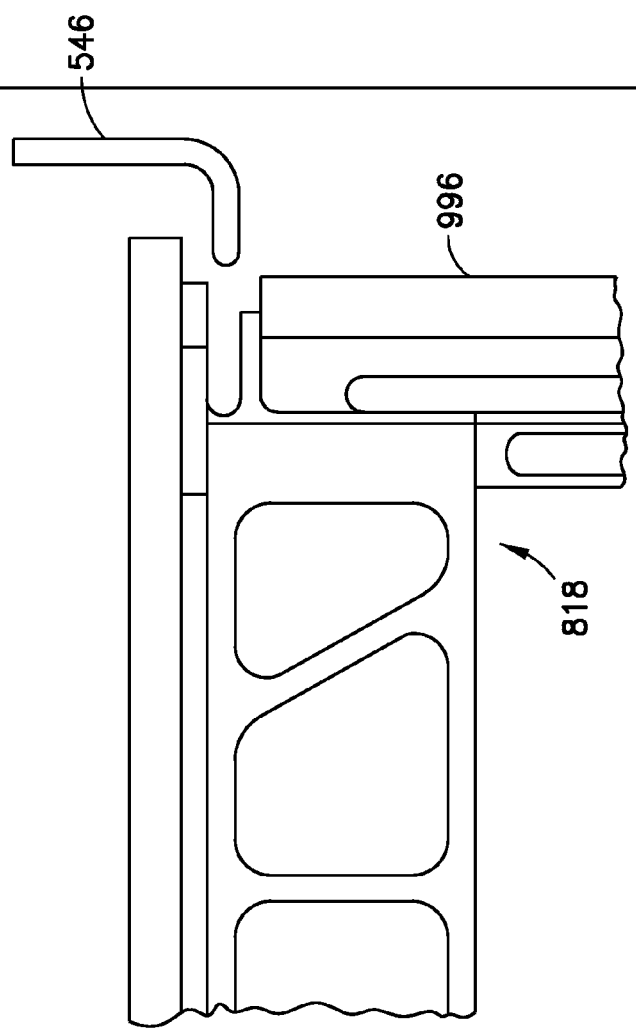
FIG. 29G shows a transporter and array motion and state table.
Figure 29H:
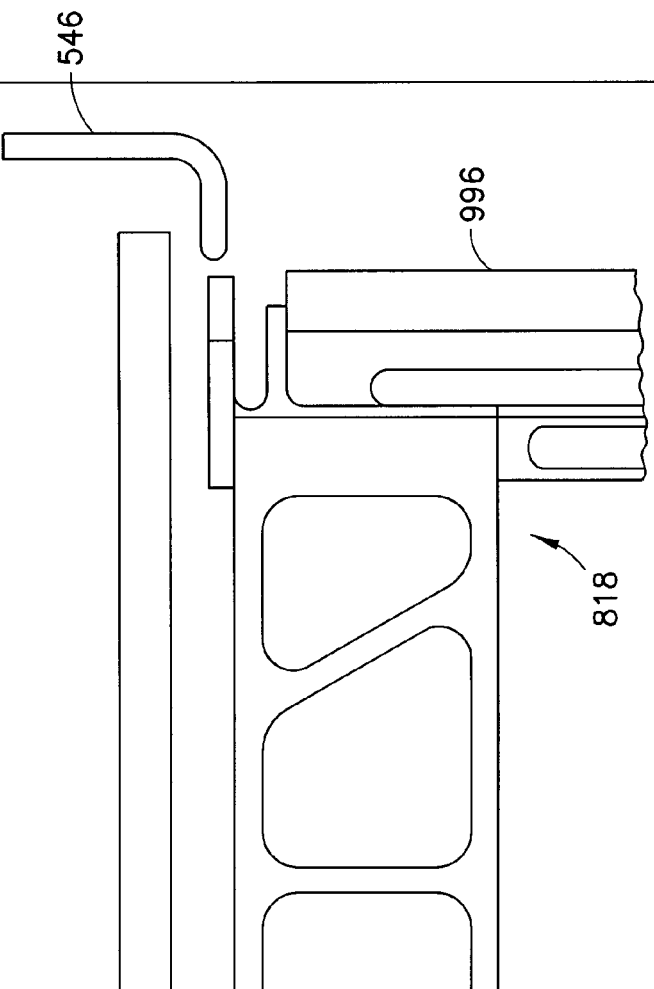
FIG. 29H shows a transporter and array motion and state table.

Referring now to FIG. 28A, there is shown a isometric view of a holder array. Referring also to FIG. 28B, there is shown a side view of a holder array. Referring also to FIG. 28C, there is shown a partial isometric view of a holder array. Referring also to FIG. 28D, there is shown a partial side view of a holder array. FIGS. 28A-D show holder 818, transporter gripper 946 and process module support 996. Exemplary features of the interaction between a Transporter 946 and the WH's 950 are shown in FIGS. 28A-28D, and listed in more detail in the table shown in FIGS. 29A-29H. Here, transporter pick-up mechanism 946 may include two main parts that contact the wafer holders 950; top-plate 1004 fixed to the automation stage of the transporter and pair of Clamps 1008 which move relative to the Top-Plate in both vertical and horizontal directions. Each process station may include a structure 996 to support WH's 950 and align them to the critical elements within that module, a generalized support structure 996 is shown as a pair of plates into which the WH-Array 586 is deposited or from which it is picked up. Here, individual WH's 950 form a "virtual array" 586 or WH-Array 586, which when carried by the Transporter 946 and the WH's 950 may never actually be attached to each other by a fixed means, enabling each wafer to be aligned singly with process elements, for example, Marangoni, shear plate, N2 Air Knife and other or similar components in close proximity to each wafer surface, as will be described in greater detail.

Referring now to FIGS. 29A-H, there is shown a transporter and array motion and state table showing a sequence of movements for transporter pick up and drop off of wafer holder array 818, for example, at a process module or otherwise. Here, the table shows an exemplary sequence of primary elements of an exchange between Transporter and a process position, or station, which may be a Loader, Shear-Plate module, Marangoni-module, Air-knife module, Fluid-Jet module, or other type process module. Here, WH elements 950 are transported from station to station as a "virtual array" 818 in the Transporter and WH elements become individually precision aligned by the respective station when the Transporter deposits them into position. In alternate aspects of the disclosed embodiment, more or less steps may be provided in any suitable combination.

Figure 31:
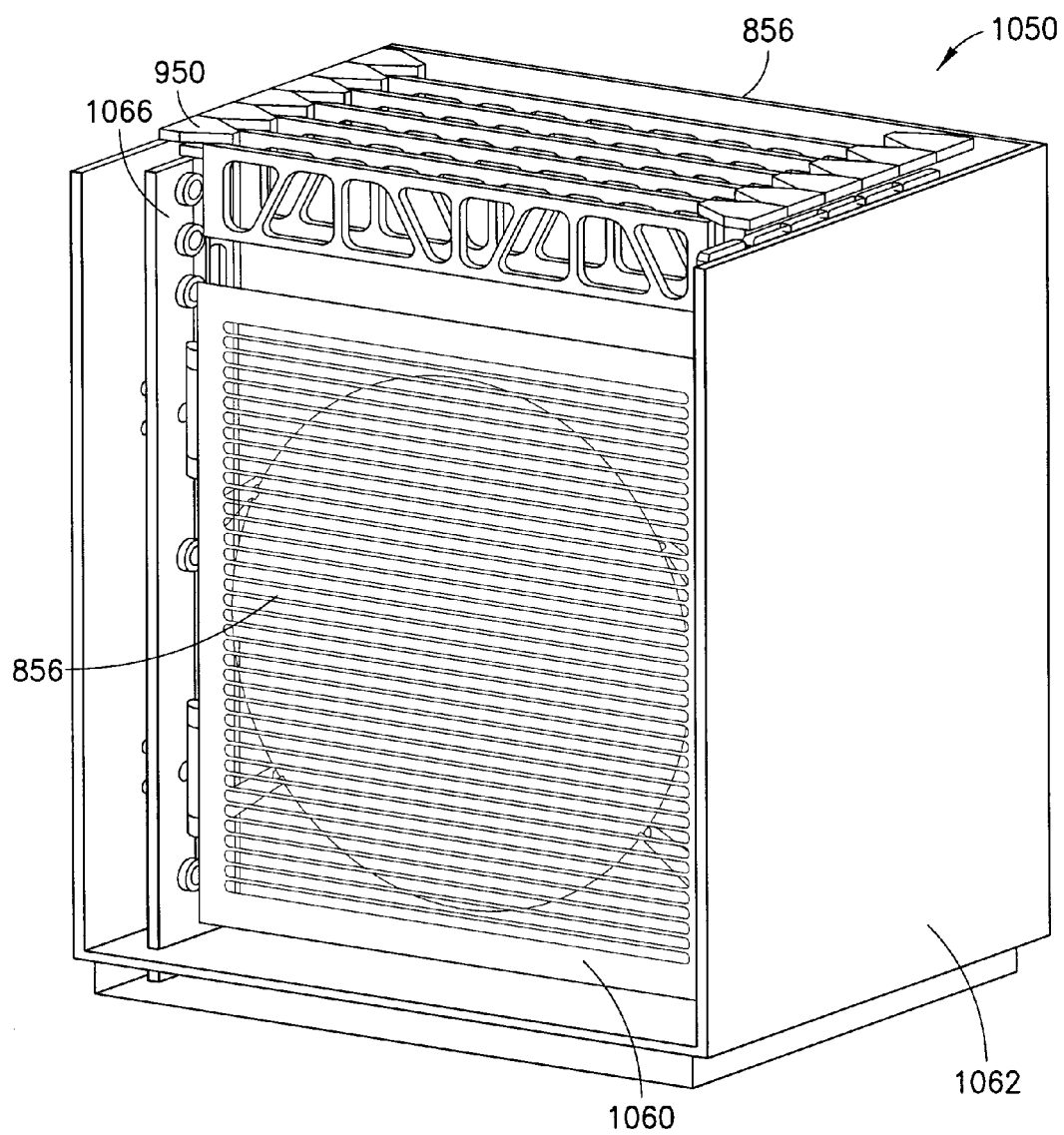
FIG. 31 shows an isometric view of a shear plate agitation module.
Figure 32A:
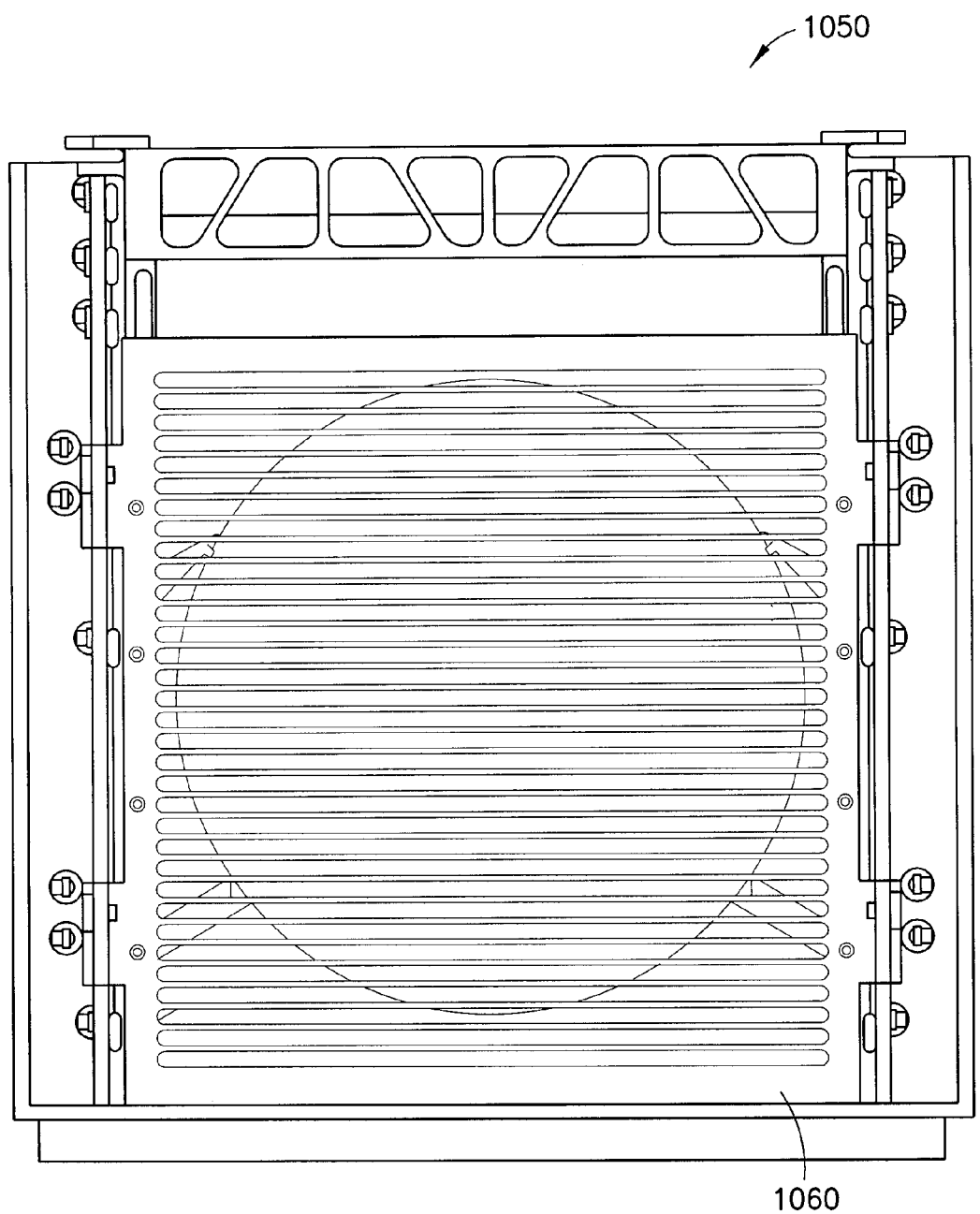
FIG. 32A shows a side view of a shear plate agitation module.
Figure 32B:
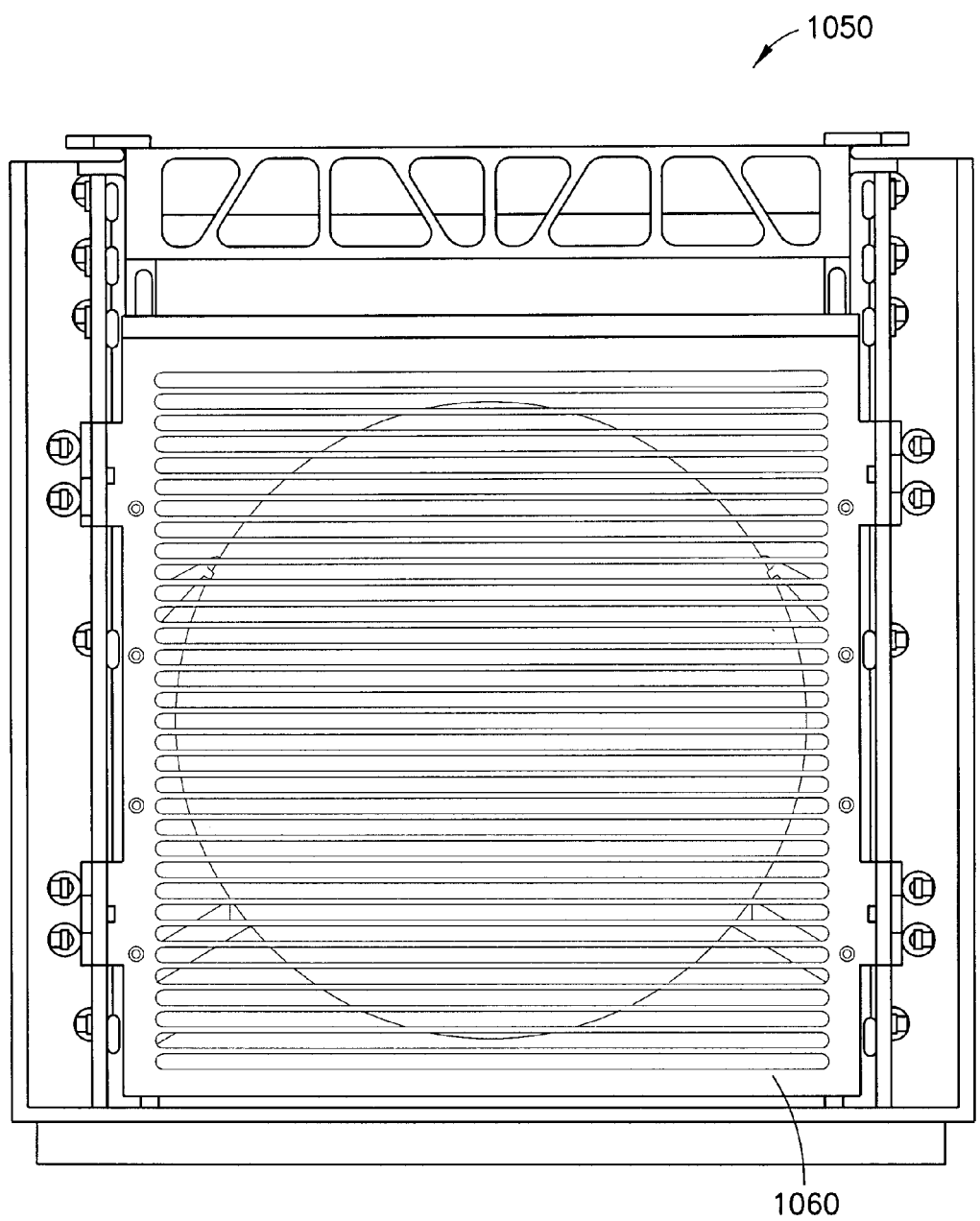
FIG. 32B shows a side view of a shear plate agitation module.
Figure 32C:
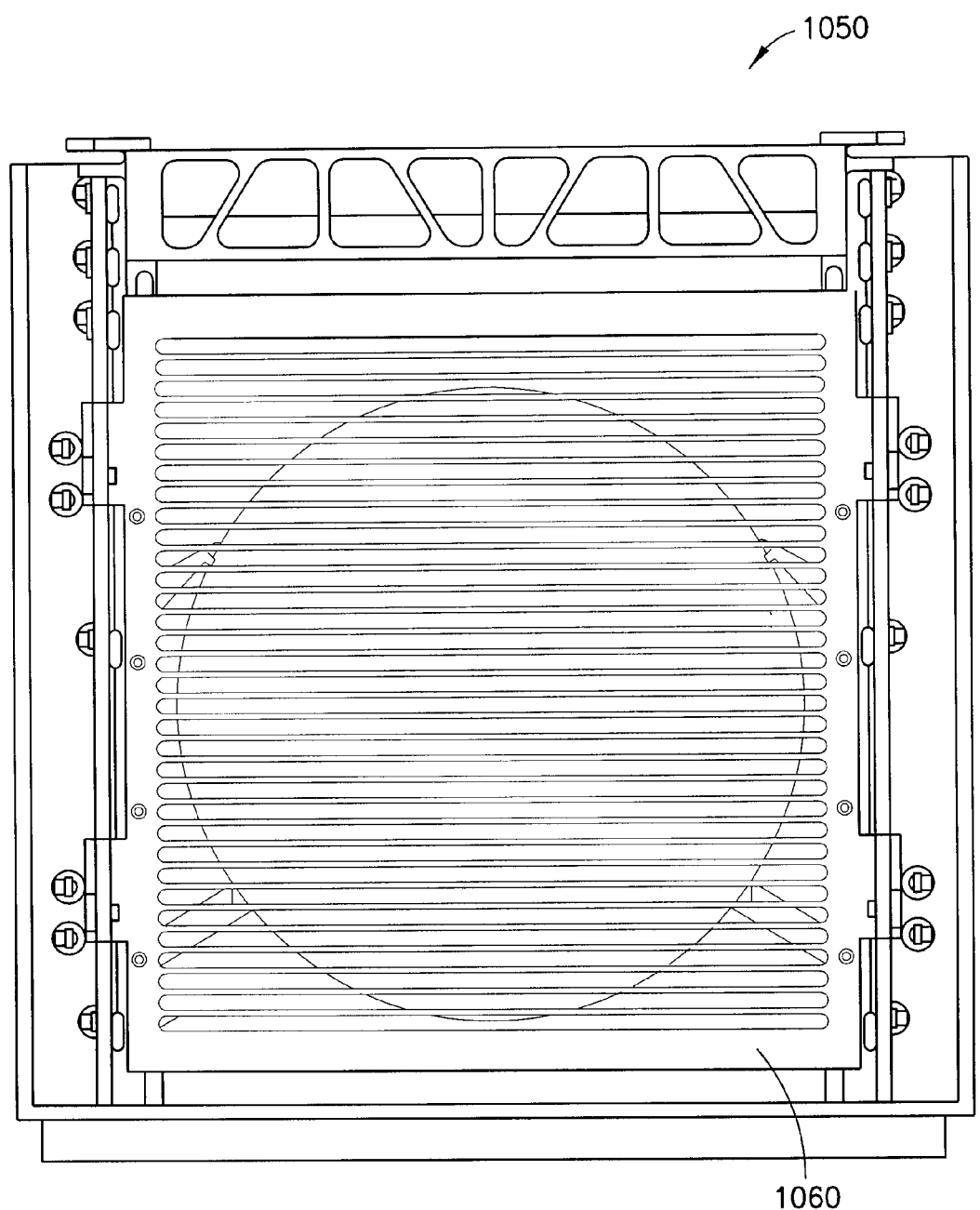
FIG. 32C shows a side view of a shear plate agitation module.
Figure 34:
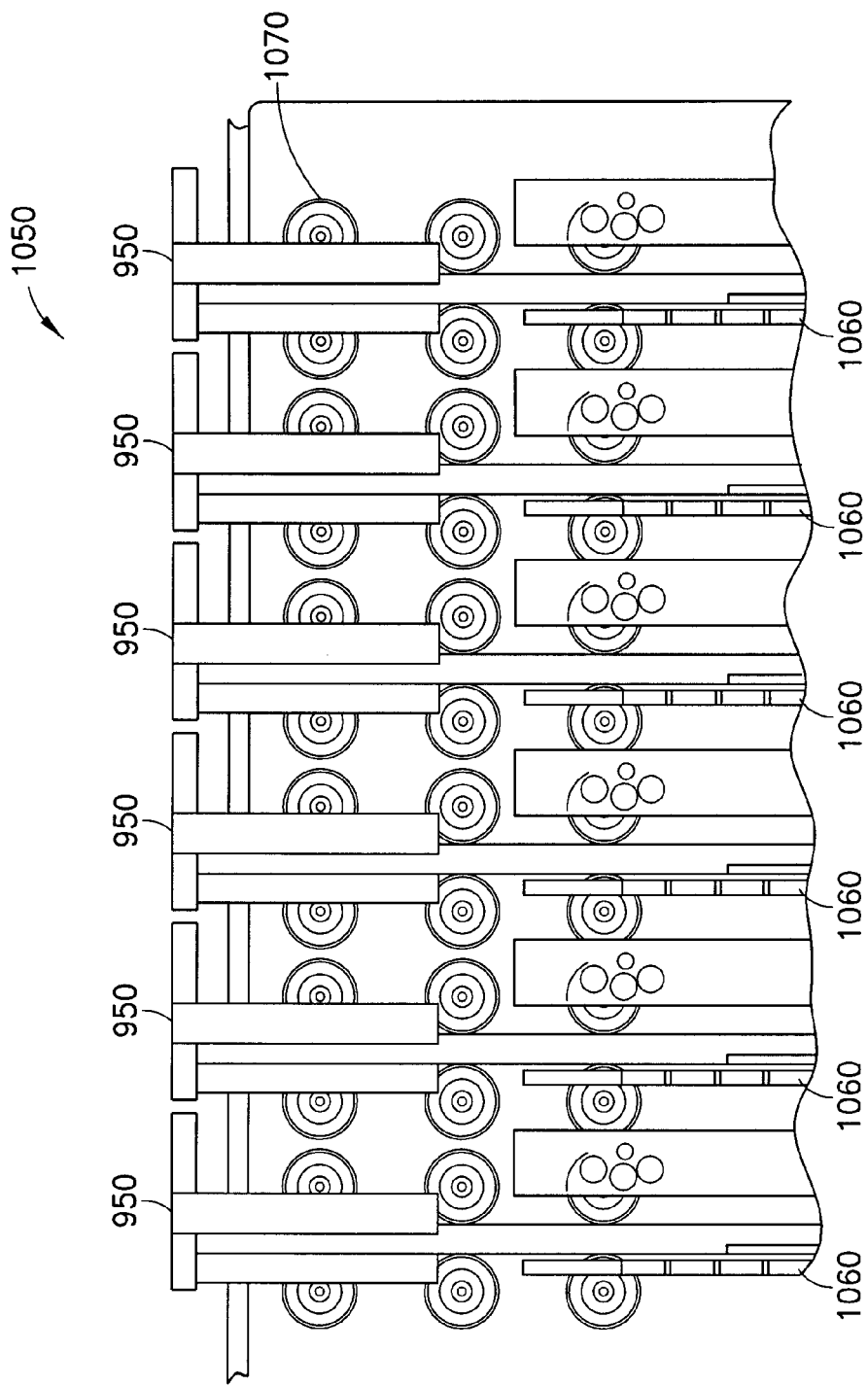
FIG. 34 shows an end view of a shear plate agitation module.

Referring now to FIG. 31, there is shown an isometric view of a shear plate agitation module 1050 suitable for use with system 800. Module 1050 provides close and repeatable alignment between the individual SP-blades 1060 and the wafer 856 surface and non-repeating oscillation full-width of about +−mm (total 40 mm) using SP-blade spacing of 10 mm (i.e. a primary oscillation full-width of 20 mm, together with a slower-frequency "walking" oscillation full-width of 20 mm). Two exemplary types of alignment between Shear-Plate (SP) and Wafer, or Wafer-Holder (WH) may possibly including SP to module-frame and WH to module-frame or WH directly to SP, and SP to module-frame. The former has an advantage of less tolerance stack-up and tighter alignment between Wafer surface and SP agitation surfaces, while the latter has the advantage of not using WH surfaces for moving alignment, thereby removing some fabrication constraints on surface finish of the WH alignment features. A problem with hot fluid processing including stripping is condensation on horizontal surfaces above the fluid and avoiding contamination from this condensate. A movable cover, with slots, may be used to contain this vapor within the SP module 1050 and may use the same motion to clamp the WH's in place vertically to resist the oscillating vertical forces imparted by the Shear-Plates to the Wafer surfaces. Aligning Wafer Holders to the module frame structure rather than to the Shear Plates does not require the oscillatory guide wheels of the SP to ride against WH surface. In the embodiment shown, tank 1062 holds the processing fluid, for example photoresist stripper, IPA, or DIW in which the ShearPlate assembly is immersed and into which the WH-Array 586 is inserted and removed. An internal frame 1066 supports the WH-Array 586 and includes precisely positioned guide wheels. A series of guide wheel sets align the ShearPlates relative to the frame and a series of guide wheel sets align WH's relative to the frame. A suitable linear motor and bearing assembly (not shown) may drive the Shear-Plates 1060 up and down to agitate the fluid immediately in front of the wafer surfaces. A rotary motor and eccentric cam system may also be used, as will be described in more detail. A suitable automation mechanism may move the WH's 586 vertically into the process module for processing and removes them vertically when processing is complete. Referring now to FIG. 32A-C, there are shown front views of shear plate module 1050. Here, FIG. 32A show a front view with ShearPlate in a down position; FIG. 32B in a center position and FIG. 32C in an up position for a typical overall stroke of 40 mm, which is suitable for a ShearPlate motion profile that has a primary stroke of +−10 mm and a secondary profile of +−10 mm. In alternate aspects of the disclosed embodiment, other suitable profiles or strokes may be provided. In the embodiment shown, for each ShearPlate 1060, four sets of guide wheels may constrain its position horizontally parallel to its surface and perpendicular to its surface while allowing motion in direction vertically parallel to its surface. Similarly, ten wheel sets, five on each side, similarly constrain each of the WH's 950 in horizontal and perpendicular directions while allowing motion vertically to insert and remove group of WH's 586. Precision alignment between the WH and ShearPlate guide wheel sets may be fabricated into the frame element such that all points on the wafer are positioned to within plus or minus between 0.5 and 1.0 mm, or alternately 0.3 mm or otherwise, from the Shear-Plate surface. The WH alignment may include more wheel sets (10 versus 4) in order to provide lead-in distance to fully align each WH 950 and each wafer 856 before the wafer is near the ShearPlate, thereby avoiding collision between the wafer and the ShearPlate. Referring also to FIGS. 33A-C, there is shown wafer holder array 586 insertion into shear plate module 1050. Guide wheels for the WH's 950 are on the inside 1070 of the frame to the right in FIGS. 33A-C and guide wheels for the ShearPlates 1050 are on the outside 1072 of each frame element, to the left in FIGS. 33A-C. At each guide point a pair of wheels aligns the WH in the direction perpendicular to the wafer surface and a single wheel limits the WH position in the direction parallel to the wafer surface; a pair of wheel sets at opposing parallel guide points fully constrains the WH in both perpendicular and parallel directions while allowing for vertical freedom of motion for WH insertion and removal. Similarly, at each of 4 guide points for the ShearPlate a pair of guide wheels constrains the Shear-Plate in direction perpendicular to its surface, a pair constrains the ShearPlate in the direction parallel to its surface, and the pair of opposing wheel sets fully constrain the Shear-Plate in direction parallel to its surface. Referring also to FIG. 34, there is shown an end section view of module 1050.

Figure 35:
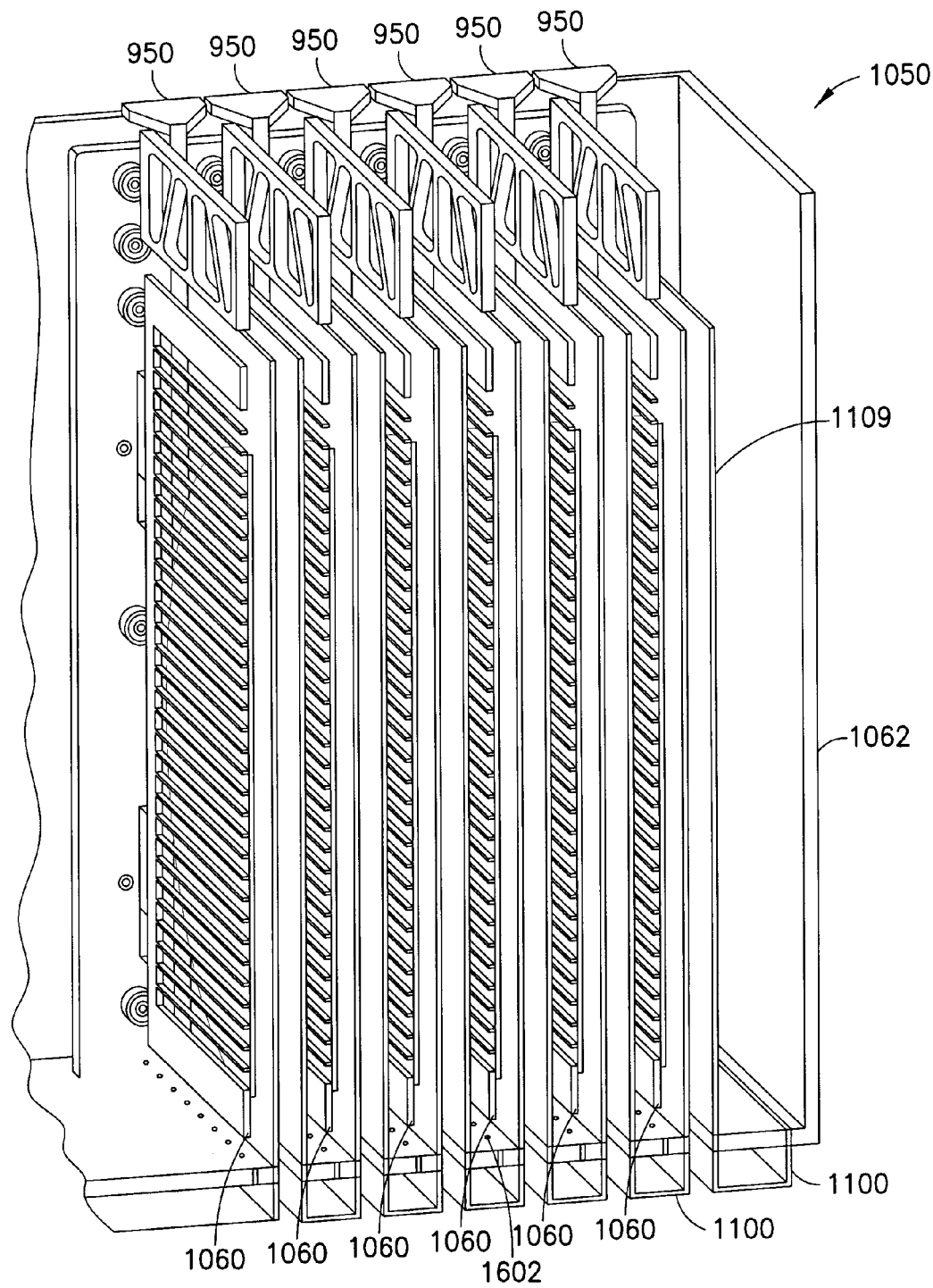
FIG. 35 shows an isometric view of a shear plate agitation module.

Referring also to FIG. 35, there is shown an isometric section view of module 1050. One aspect of immersion fluid processing is ensuring uniform macro-scale fluid flow to each wafer where fresh solution is injected into the bottom of the process tank and overflows a weir 1080 near the top of the process tank 1062 where the weir sets the solution level in the tank. FIG. 34 shows a detailed cross section near the top of the wafers where an individual fluid overflow weir 1080 carries spent fluid away from the region of each individual wafer. FIG. 35 shows a cross section through full height of the tank 1062, fluid input manifold and holes are shown at the bottom of the vessel for each SP 1060. In alternate embodiments fresh fluid may be injected at the top of the module near each wafer surface and pumped from the bottom of the tank, eliminating the need for a weir. Shear plates 1060 may be driven by one or more linear motors or may be cantilever mounted to a bearing, for example, on the process plumbing side of the tool and driven by a linear drive motor, ball screw or otherwise. FIG. 35 shows the bottom of the structure where the weirs pass through the baseplate 724, and may be welded in from the bottom of the baseplate, prior to welding on the input manifold 1100 which couples to the individual wafer holder by an array of size 0.06" or so holes 1102 along the Y direction under each wafer holder. The weir-box structure shown may be attached to the tool-framework and aligns the wafer holders to the Transporter, where this structure therefore may take the linear-motion inertial loads from the shear plate agitation and may be a ¼" stainless steel box or otherwise. Using gravity for chemistry return means this sits in a fluid reservoir. The weir height may be determined by being above the shear plate to avoid splashing and fluid height may be fairly close to the weir to minimize oxidation on the inside of weir passages. Insertion of Wafer holders with minimal cross-sectional area may not displace nearly as much fluid compared with a plating cell using a 1" thick solid body wafer holder, so fluid change between load and unload may be minimal. A chinois type of fine mesh stainless steel strainer could be placed in the weirs to catch resist particles, taking advantage of the significant height of the weir. As shown the weir opening may be only 0.5" or otherwise, where the opening may be tight for a chinois, alternately a unit may have solid steel sides with a strainer mesh welded in place as flat plates. In the embodiment shown, a separate fluid input is provided in the bottom section of the tank and a fluid weir and drain is provided in the top section of the tank with an individual input and output for each wafer. The combination of wafer specific inputs and drains remove material dissolved from each wafer in a repeatable manner. In an alternate embodiment, only a single input manifold may be provided across the bottom of the whole tank and a single overflow weir drain at one or two top edges of the tank may be provided. In the embodiment shown, individual overflow weirs 1104 are positioned between each of the wafer holders to better ensure wafer-to-wafer repeatability of fluid flow. The weir height may be determined by being above the SHEAR PLATE to avoid splashing and where the fluid height may be fairly close to the weir to minimize oxidation on the inside of the weir passages. Transducers may be provided, for example, level or pressure sensors or otherwise to provide an automatic signal for when to change and clean the chinois. In alternate aspects of the disclosed embodiment, the features of module 1050 may similarly be applied to process applications involving nozzle arrays, single or batch Marangoni drying, submersion and soaking or otherwise either alone or in combination.

Figures 36A, 36B:
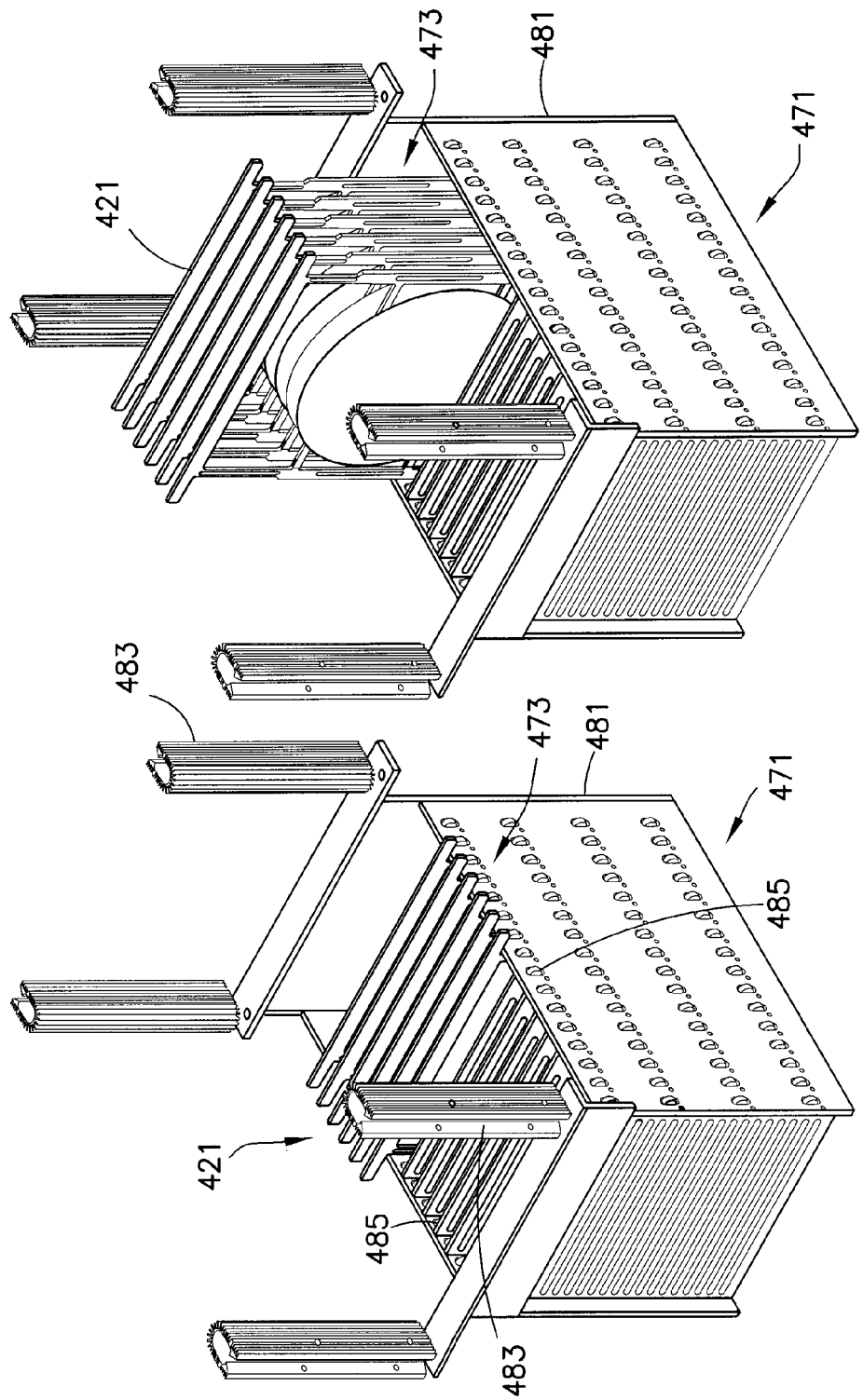
FIG. 36A shows an isometric view of a shear plate agitation module.
FIG. 36B shows an isometric view of a shear plate agitation module.

Referring now to FIG. 36A, there is shown a batch wafer holder 421 and a batch process module 471. Referring also to FIG. 36B, there is shown a batch wafer holder 421 and a batch process module 471. One embodiment of the Vertical Fluid Process 471 incorporates an apparatus for the removing unwanted photoresist residues. The process module may include a SHEAR PLATE assembly 473 which is moved relative to the fluid tank 481 by linear motors 483. As will be shown, the Wafer-Holders 421 are aligned to the SHEAR PLATES by wheels mounted on the SHEAR PLATE assembly 473. In this embodiment, only the frontside, or resist bearing side, of each wafer is agitated by a SHEAR PLATE, whereas positioned on the backside of each wafer is a fluid overflow drain compartment which guides the fluid past a screen to capture large resist particles and debris removed from the front side of the neighboring wafer. FIG. 36B shows a batch 421 of six wafer holders 421 positioned over a SHEAR PLATE process module 471 where FIG. 36A shows the batch 421 of six wafer holders inserted into the SHEAR PLATE process module 471 and positioned for processing. The process module 471 includes an outer tank 481 with input and drain manifolds, a SHEAR PLATE array 473 with guide wheels 485, and linear motors 483 positioned at the corners of the tank which drive the SHEAR PLATE array 473 in a selectively controlled vertical reciprocating pattern. One aspect of the disclosed embodiment is where the individual wafer holders are aligned to the SHEAR PLATE assembly 473 as covered in more detail.

Figure 37A:
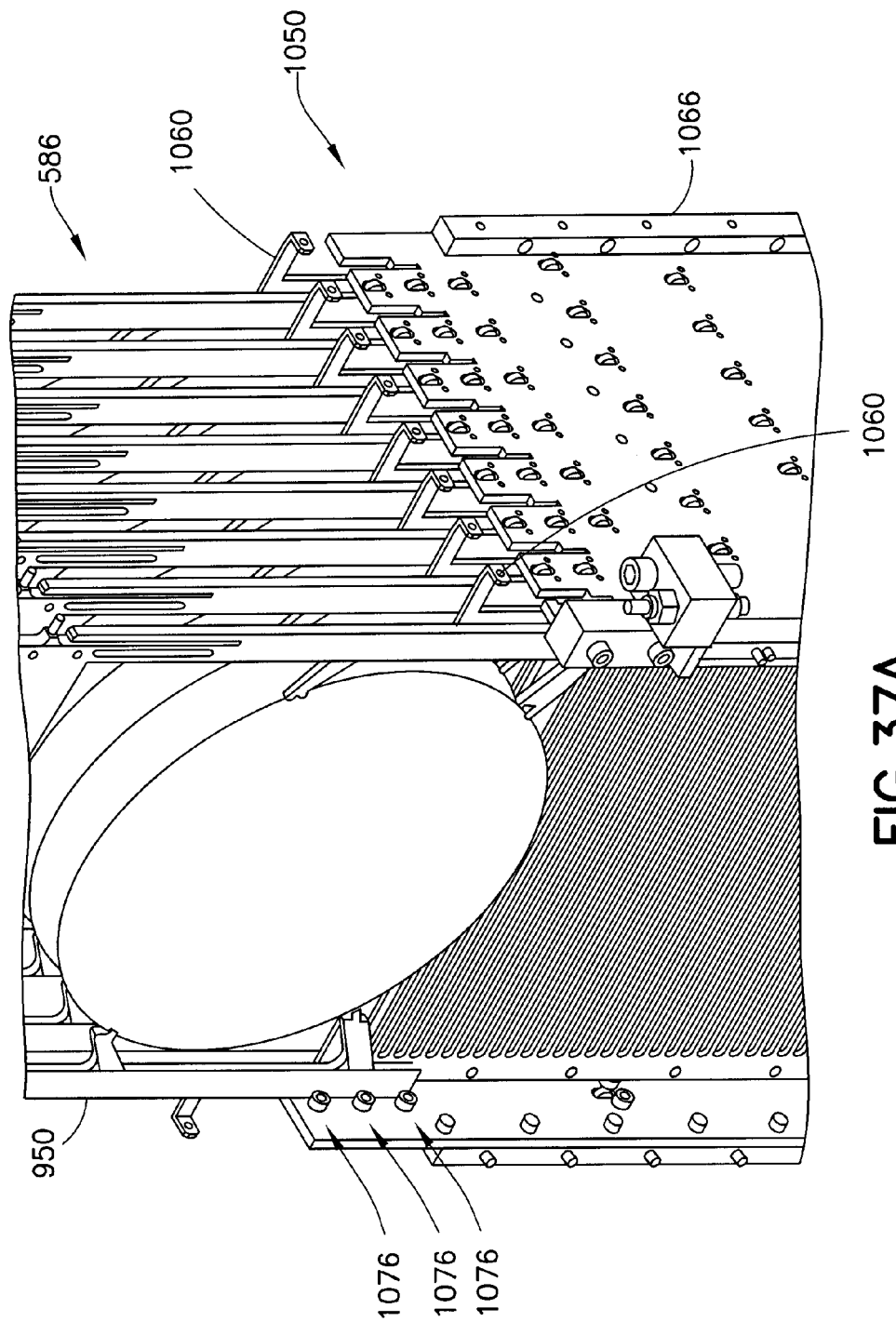
FIG. 37A shows an isometric view of a shear plate agitation module.
Figure 37B:
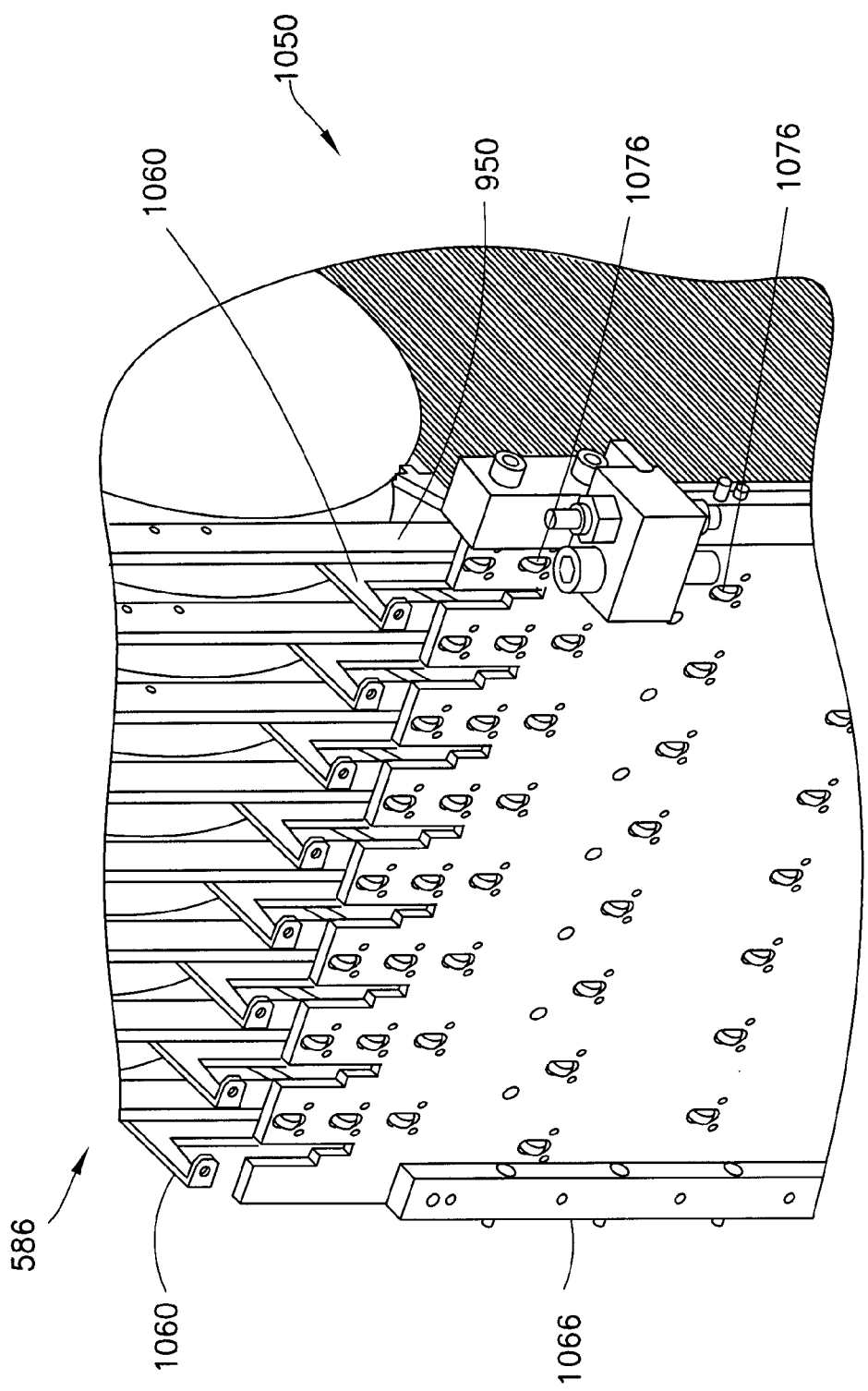
FIG. 37B shows an isometric view of a shear plate agitation module.
Figure 38A:
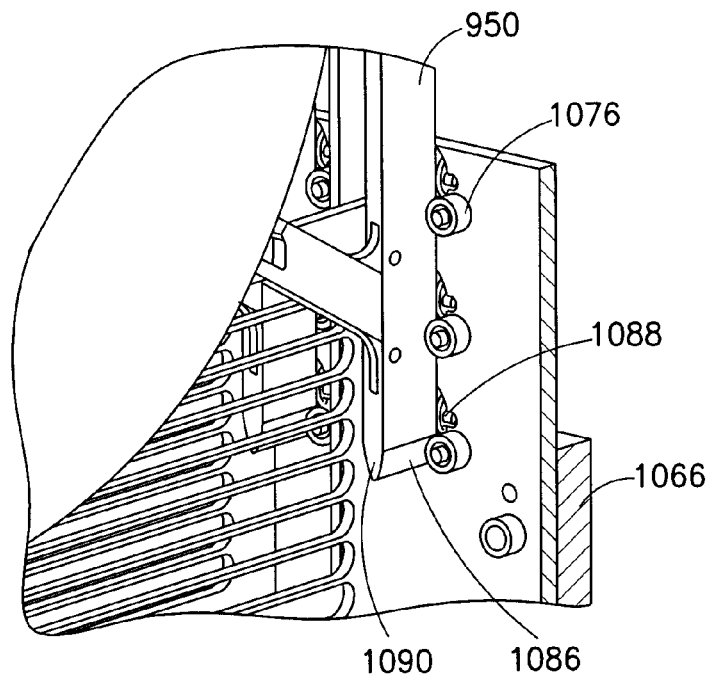
FIG. 38A shows an isometric view of a shear plate agitation module.
Figure 38B:
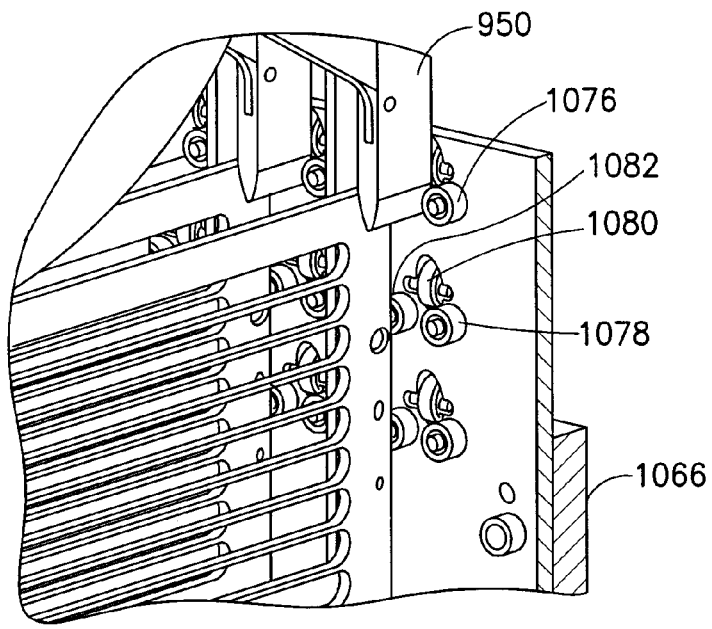
FIG. 38B shows an isometric view of a shear plate agitation module.
Figure 39A:
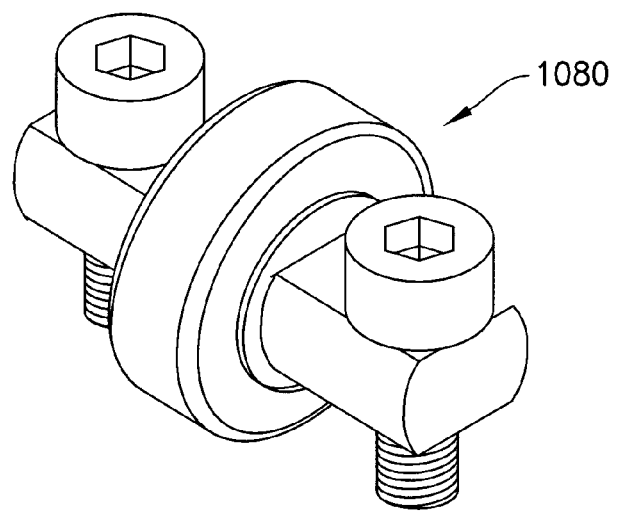
FIG. 39A shows an isometric view of a guide roller.
Figure 39B:
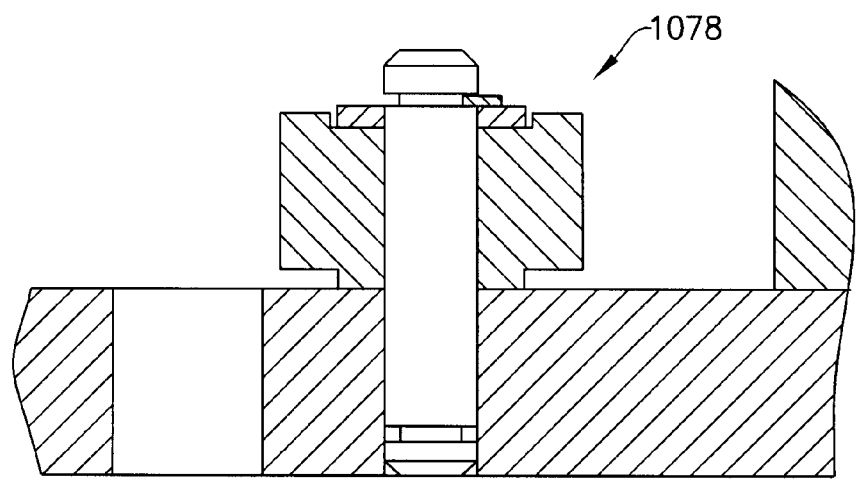
FIG. 39B shows a section view of a guide roller.
Figure 40B:
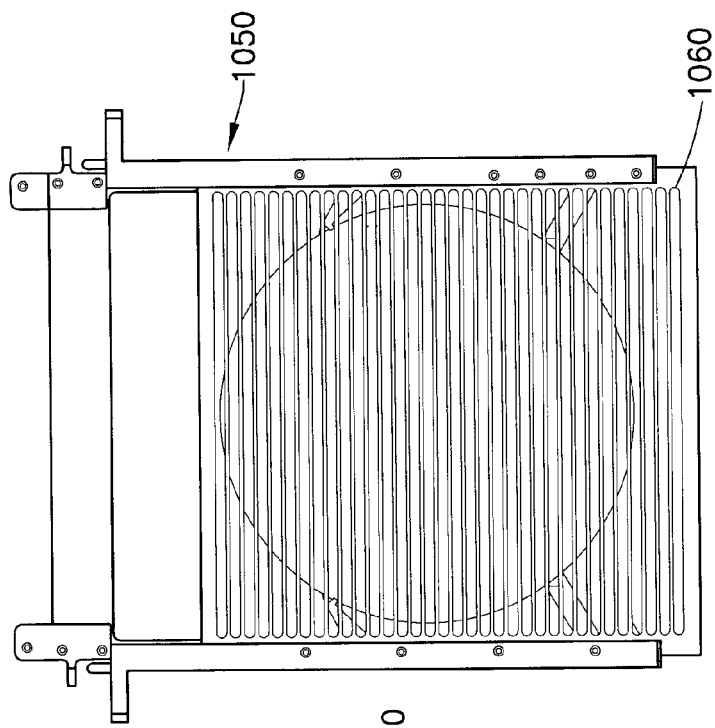
FIG. 40B shows a front view of a shear plate agitation module.
Figure 40A:
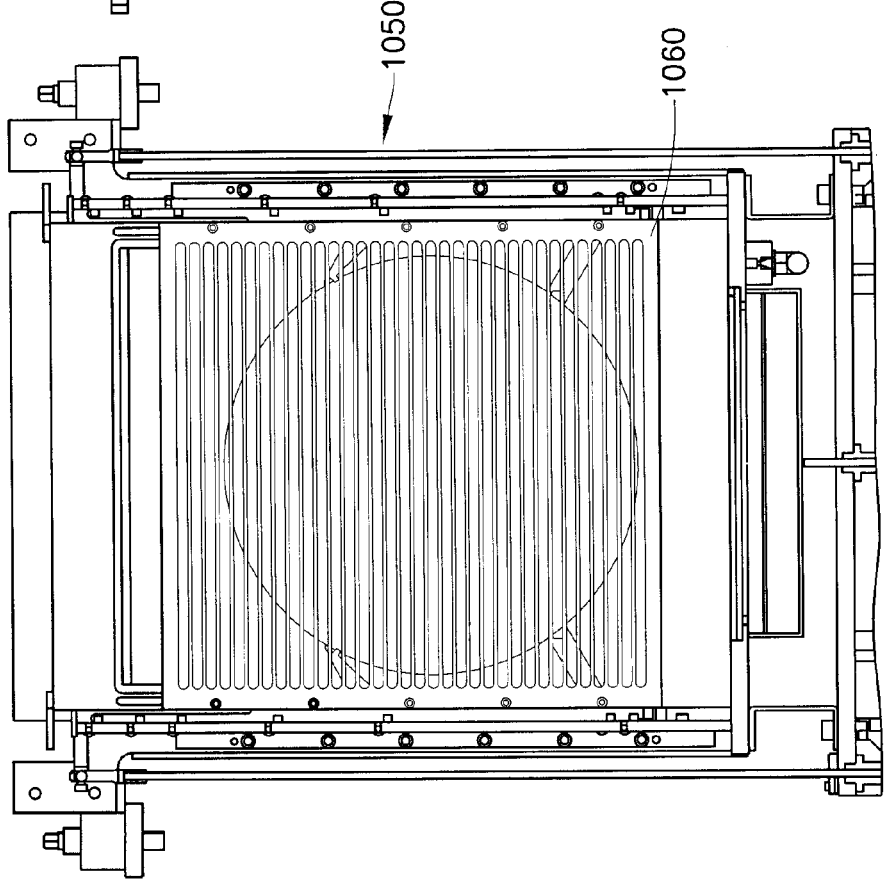
FIG. 40A shows a front view of a shear plate agitation module.
Figure 41:
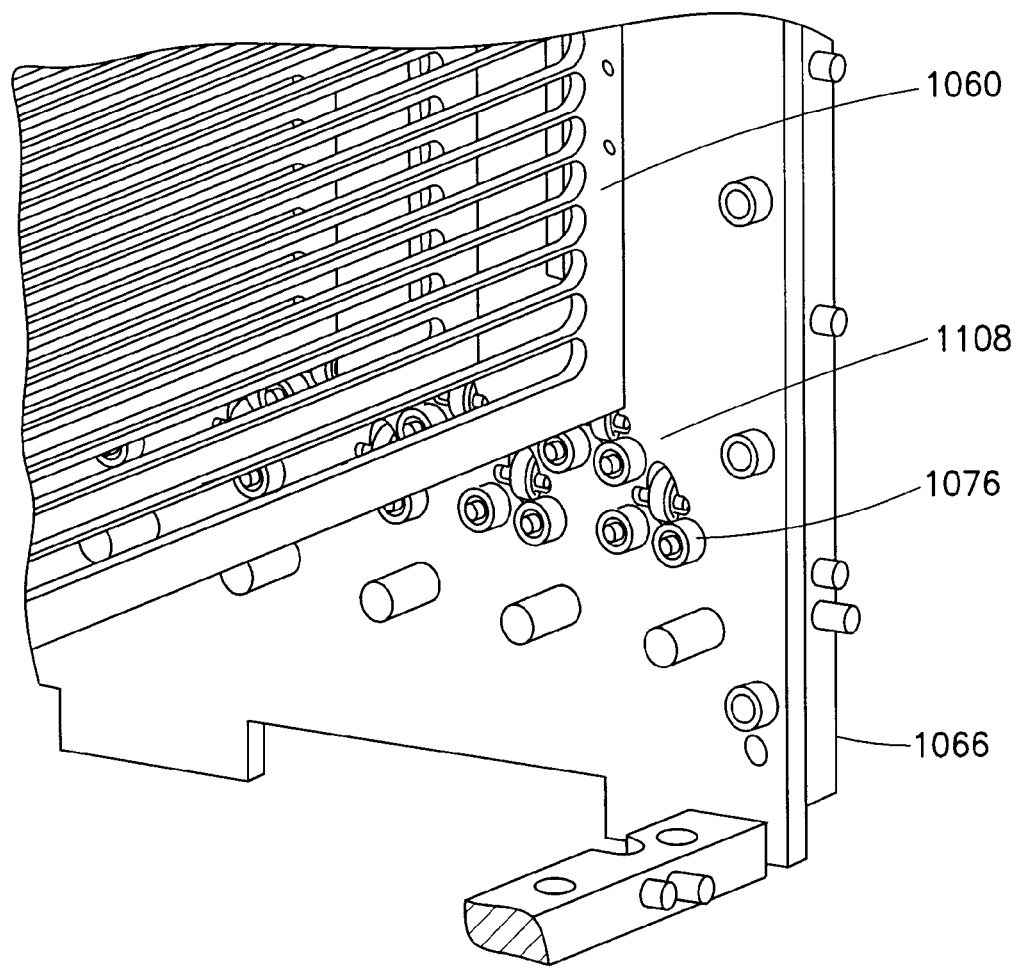
FIG. 41 shows an isometric view of a shear plate agitation module.

Referring now to FIG. 37A, there is shown a partial isometric view of shear plate agitation module 1050. Referring also to FIG. 37B, there is shown a partial isometric view of shear plate agitation module 1050. FIGS. 37A and 37B show wafer holder array 586 being inserted or extracted from the internal frame where each holder 950 separately engages three guide wheel sets 1076 where additional guide wheel sets 1076 are located below the upper three to positively locate each holder 950 in the array of holders 586 relative to each respective shear plate 1060 independent of the other holders in the holder array 586. As will be described in greater detail, each shear plate 1060 may be independently located on a separate set of guide wheels and independently moveable in the vertical direction with respect to the other shear plates. Referring also to FIG. 38A, there is shown a partial isometric view of shear plate agitation module 1050. Referring also to FIG. 38B, there is shown a partial isometric view of shear plate agitation module 1050. Each guide wheel set 1076 has three guide wheels 1078, 1080 and 1082 engaging a front side, outside and rear side of the leg of holder 950. Here, holder 950 has a bullet nose or lead in feature having a front side taper 1086, an outside taper 1088 and a rear side taper 1090 provided in the event there is misalignment during insertion of holder 950 into frame 1066. Referring also to FIG. 39A there is shown an isometric view of guide wheel assembly 1080. Referring also to FIG. 39B there is shown an isometric view of guide wheel assembly 1078. Referring now to FIG. 40A and FIG. 40B, there are shown front views of shear plate module 1050. Here, FIG. 40B show a front view with ShearPlate 1060 in a down position and FIG. 40A in an up position for a typical full-width stroke of 40 mm, which is suitable for a ShearPlate motion profile that has a primary stroke of +−10 mm and a secondary profile of +−10 mm. In alternate aspects of the disclosed embodiment, other suitable profiles or strokes may be provided. Referring also to FIG. 41, there is shown a partial isometric view of shear plate agitation module 1050. FIG. 41 shows guide wheel set 1108 that may have features similar to guide wheels sets 1076. Here, guide wheel set 1108 may be provided to guide shear plate agitation member 1060. Multiple guide wheel sets 1108 may be provided, for example, above guide wheel set 1108 and on opposing sides of frame 1066 to positively locate shear plate agitation member 1060 with respect to the corresponding holder 950. Here, each holder is independently moveable and located with respect to the other holders in holder array 586 where each holder is positively and individually located with respect to each agitation member 950 within frame 1066.

Figure 42A:
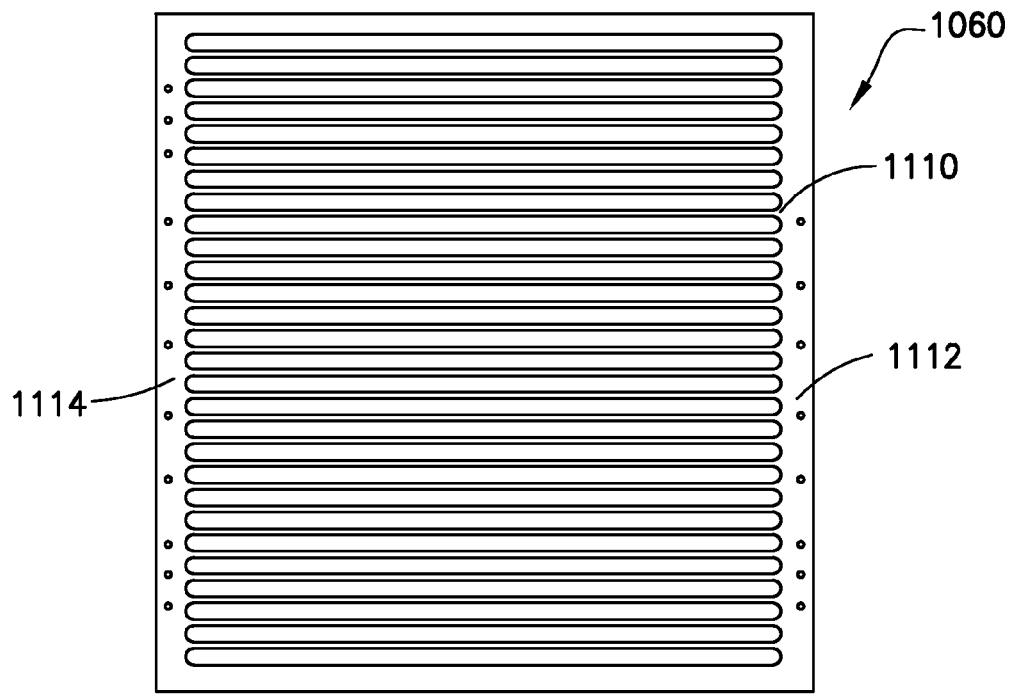
FIG. 42A shows an isometric view of a shear plate agitation member.
Figure 42B:
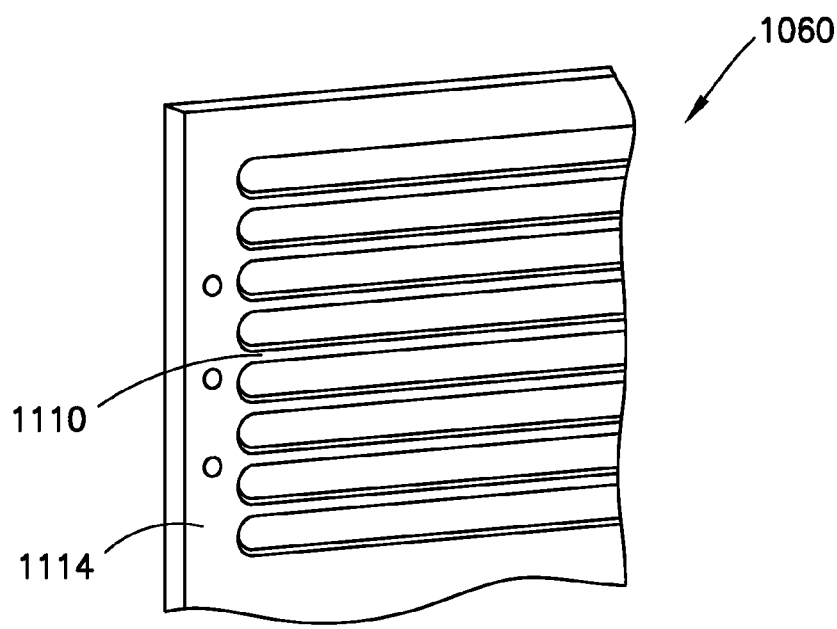
FIG. 42B shows an isometric view of a shear plate agitation member.
Figure 43A:
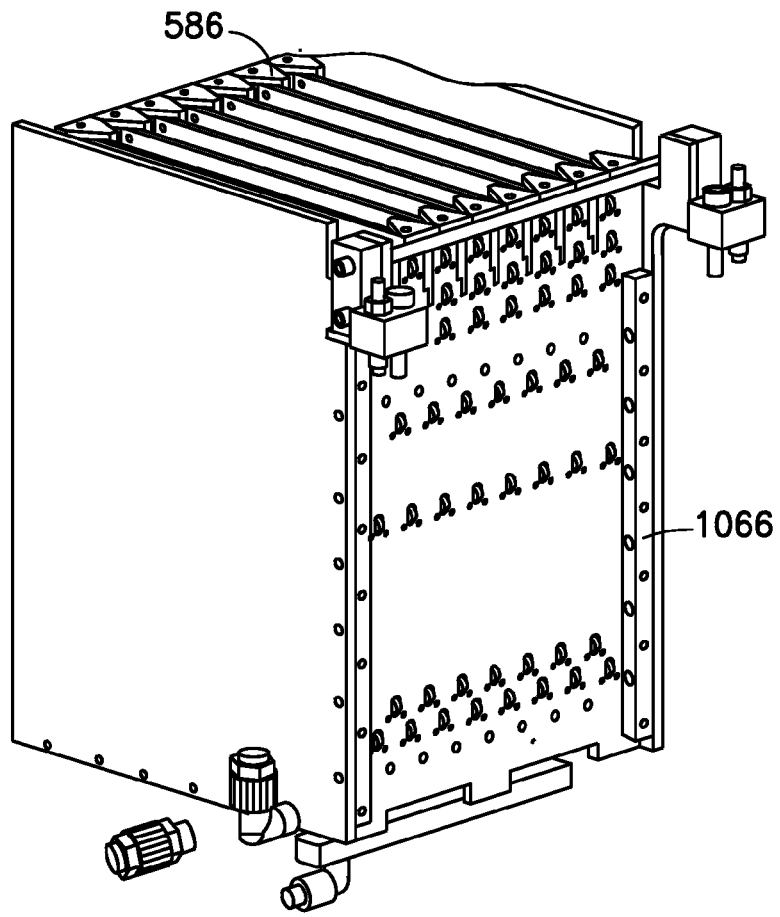
FIG. 43A shows an isometric view of a shear plate agitation module.
Figure 43B:
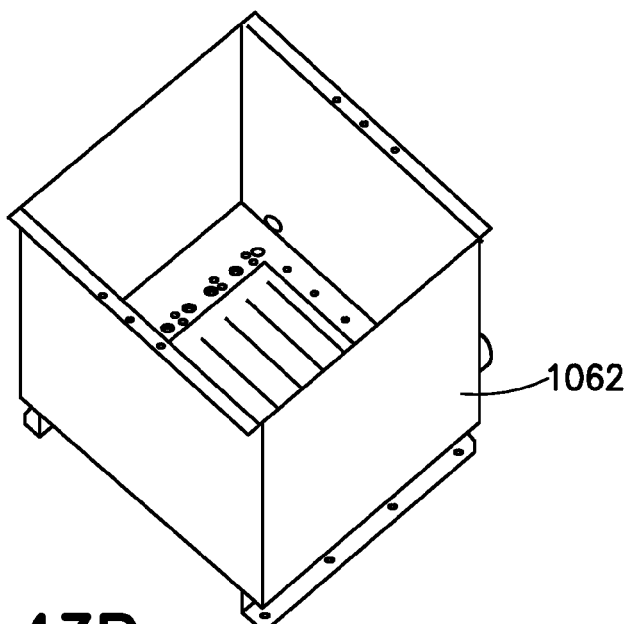
FIG. 43B shows an isometric view of a shear plate agitation module.
Figure 43C:
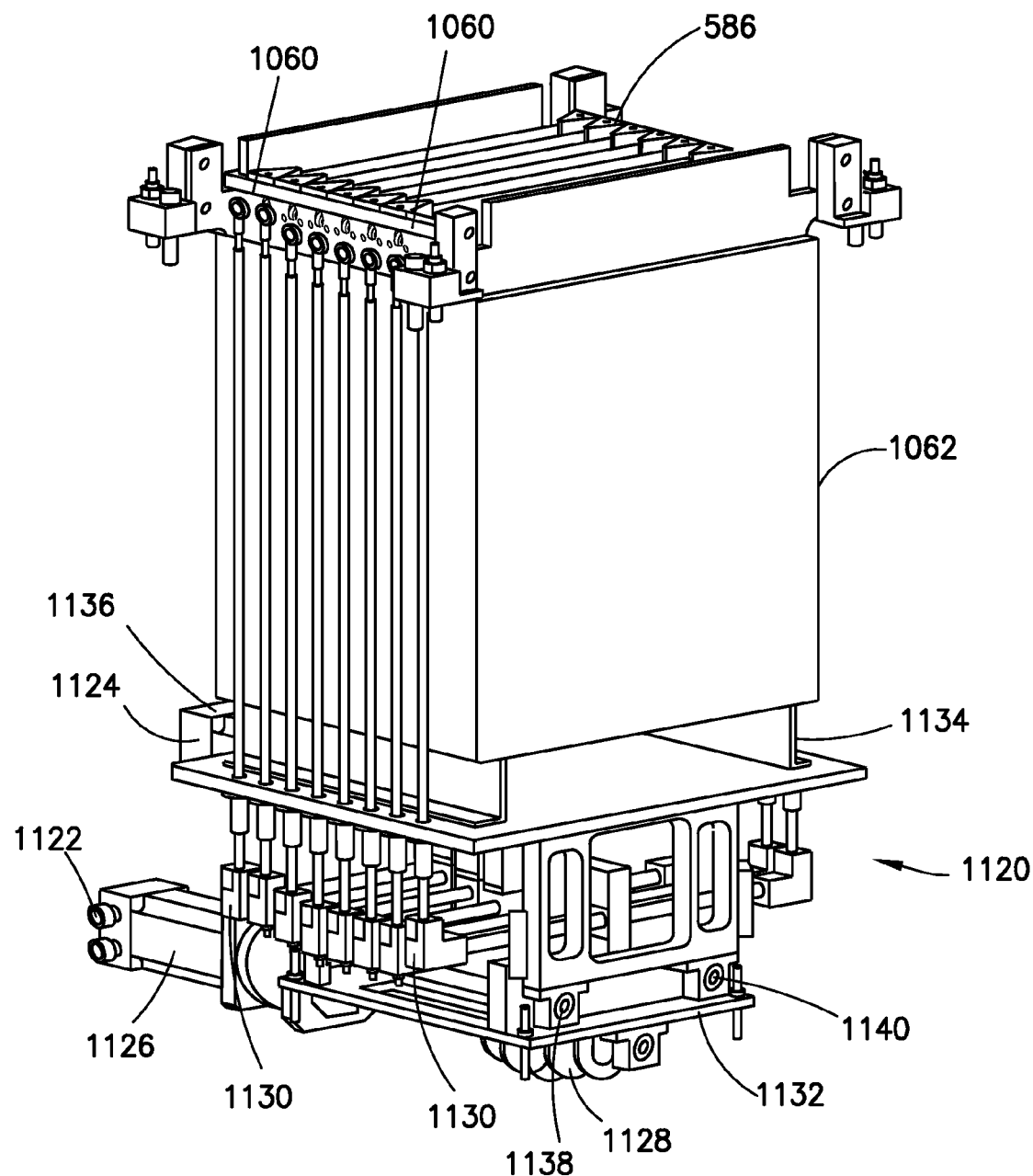
FIG. 43C shows an isometric view of a shear plate agitation module.

Referring now to FIG. 42A, there is shown a shear plate 1060. Referring also to FIG. 42B, there is shown a portion of a shear plate 1060. Shear plate fabrication may include blade 1110 pitch of 10 mm or otherwise and a thickness of 1 mm or otherwise and opening span of blade 1110 being 340 mm or otherwise with the geometry also further defining also the height and width of plate 1060. For example, based on motion of 20 mm primary cycle with 10 mm secondary cycle, for a total plus or minus 15 mm motion from center, there may be 17 blades in each top and bottom half. In alternate aspects of the disclosed embodiment, blade stroke, number of blades, may be optimized, for example to provide additional agitation and leaving enough space between blades to ensure resist "skins" aren't trapped within the shear plate structure. The plate 1060 may be made from stainless steel 316, for example, where each blade may weighs 1.63 lbs. Light weighting holes may be provided in the bottom and top edges, and for example, may have 0.15 mm minimum distance from each other and from edges of the bar. Side bars 1112, 1114 may be about 0.4 inches wide or otherwise. Notches may be provided in the side bar for clearance to the wafer holder frontside guide wheels where positioning of these features may be driven from the shear plate Nest/array assembly where the sideplates may define the wheel positions. In alternate aspects of the disclosed embodiment, any suitable shear plate agitation member geometry may be provided. Referring also to FIGS. 43A and 43B, frame assembly 1066 is shown with holder array 586 prepared for insertion into tank assembly 1062. Referring also to FIG. 43C, an isometric view of tank assembly 1062 on frame 1134 is shown with shear plate agitation member drive assembly 1120. In the embodiment shown, drive assembly has a primary oscillation drive 1122 and a secondary oscillation drive 1124. Here, the primary oscillation drive 1122 moves each shear plate 950 in a high frequency primary oscillation motion whereas the secondary oscillation drive 1124 moves the group of shear plates 950 in a lower frequency secondary oscillation motion. The primary and secondary oscillation motion(s) may be sinusoidal, modified sinusoidal, stepped or any suitable selective oscillatory motion. Primary motion drive 1122 is shown having servo actuator 1126 on frame 1132 coupled to cam drain 1128 where cam train 28 has 8 separate eccentrics, each linked to individual coupling features 1130 where the coupling features 1130 couple the cam train eccentrics to each shear plate agitation member 1060. In the embodiment shown, each eccentric is, for example, 45 degrees out of phase where the high frequency primary motion has each shear plate agitation member operating similarly at 45 degrees out of phase with respect to the adjacent agitation member. Alternately, any suitable phase or combination of phases may be provided. Further, if a different number of holders is configured the relative phase lag between each may be the number of holders divided by 360 degrees or otherwise. Secondary motion drive 1124 is shown having servo actuator 1136 on frame 1134 with servo actuator 1136 coupled to first and second drive shafts 1138, 1140 by a timing belt or otherwise. First and second drive shafts 1138, 1140 each have two eccentrics that couple frame 1134 to frame 1132 such that rotation of first and second drive shafts 1138, 1140 causes frame 1132 to move vertically relative to frame 1134 and hence causes primary drive 1122 with shear plates 1060 to move as a group. Here, primary drive 1122 moves the shear plate agitation members 1060 at a high frequency with members 1060 at different phase angles whereas secondary drive 1124 moves the shear plate agitation members 1060 at a lower frequency with members 1060 being moved together as a group in phase at the lower frequency. In alternate aspects of the disclosed embodiment, different drives may be provided, for example, linear motor drives or otherwise. For example, in alternate aspects of the disclosed embodiment, a linear motor drive may be provided driving one or more agitation member(s) where the primary and secondary motions may be provided by the linear motor drive. In alternate aspects of the disclosed embodiment, all of the agitation members may be driven together in phase or in any combination of relative phase(s).

In accordance with another aspect of the disclosed embodiment, a system 1050 for fluid processing one or more substrate surfaces arrayed in a fluid is provided. The system 1050 has a process module or process section with a frame and a plurality of agitation members 1060 to fluid process the substrate surfaces without contacting the substrate surfaces. A substrate holder assembly 586 having a holder frame 946 and a number of substrate holders 950, each of which is coupled to the holder frame and configured to hold a substrate so that a different substrate is held by each substrate holder of the substrate holder assembly for transport therewith as a unit to and from the process module 1050. The substrate holder assembly and each substrate holder of the substrate holder assembly is removably coupled to the process module frame and, when coupled to the process module frame, each substrate holder is independently moveable and positionable relative to the other substrate holders of the substrate holder assembly 586. Each agitation member 1060 of the plurality of agitation members may be vertically moveable independent of the other agitation members in the plurality of agitation members (See FIG. 43C). The surfaces of the substrates are in a substantially vertical orientation. The process module frame may comprise a fluid tank 1062. Each of the number of substrate holders may be removably coupled to the holder frame. The substrate holder assembly is removable from the process module frame as a unit. Each substrate holder in the substrate holder assembly is removable from the process module frame independent of the other holders in the substrate holder assembly. The substrate holder assembly 586 has a number of substrate holders 950 and configured for transporting one or more substrates as a unit between the process section and another location, the substrate holder assembly and each of the substrate holders being configured for removable coupling to the process section frame, each substrate holder in the substrate holder assembly being configured to hold at least one of the substrates. The process section frame has alignment features 1076 disposed so that, on coupling of the substrate holder assembly with the process section frame, the alignment features interface with each substrate holder of the substrate holder assembly and locate each substrate holder in repeatable alignment, at corresponding coupling of each substrate holder and the process section frame, with respect to the agitation members 1060 of the process section. The number of substrate holders are configured for batch transport of substrates as a unit. The module frame has insertion guides 1076 and each substrate holder has mating guides depending from each substrate holder and corresponding to the insertion guides. The insertion guides and mating guides being configured so that, on coupling of the substrate holder and the module frame, the insertion guides receive the corresponding mating guides of each substrate holder aligning each substrate holder of the substrate holder assembly in repeatable alignment with respect to a corresponding agitation member 1060 in the plurality of agitation members.

Figure 44:
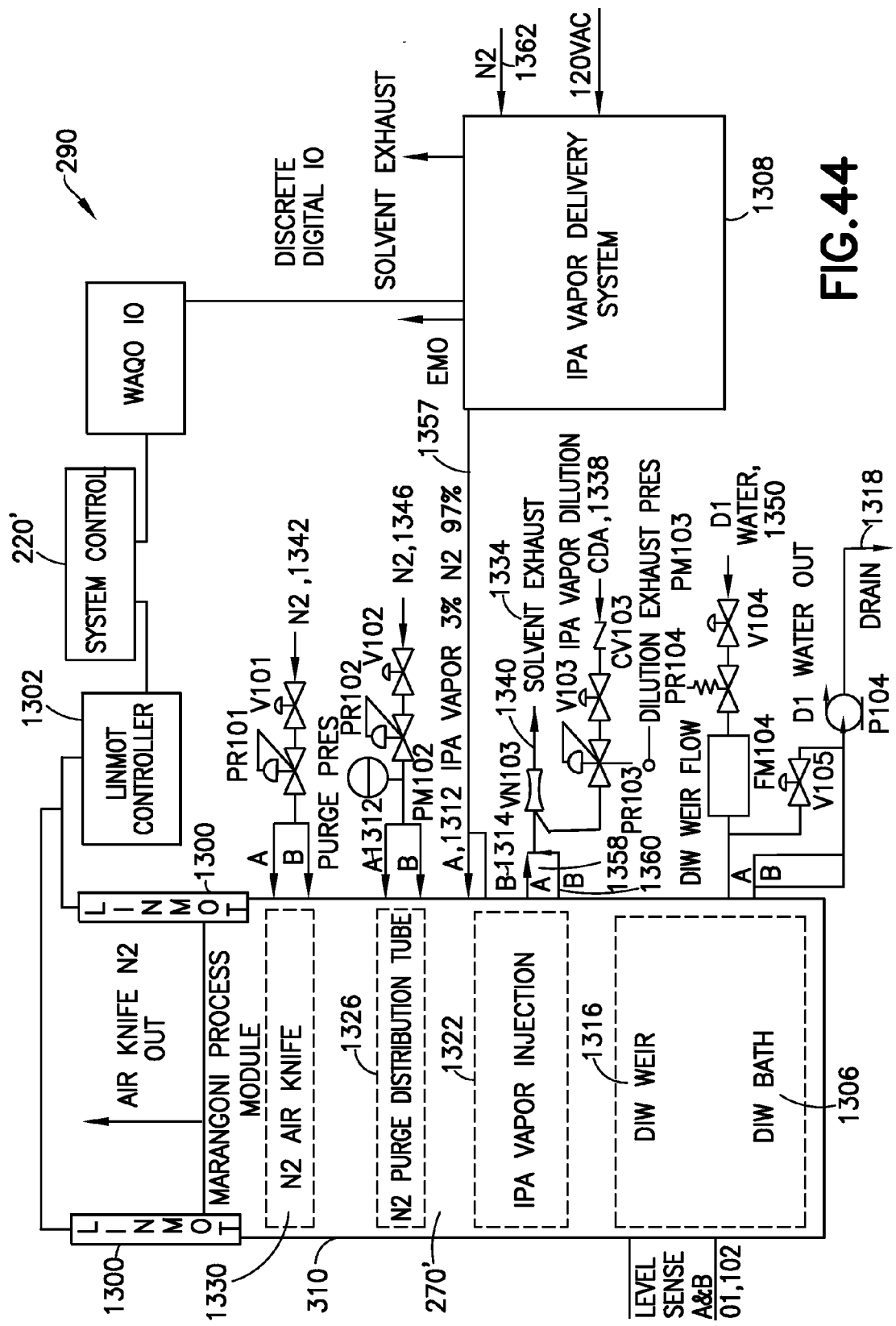
FIG. 44 is a schematic diagram of a Marangoni dryer module.

Referring now to FIG. 44 there is shown a schematic view of Marangoni dryer module 290. As will be described in greater detail, exemplary Marangoni Drying System 290 allows clean drying of wafers on Wafer Holders. Marangoni drying sprays a jet of solvent vapor, such as isopropyl alcohol (IPA) or otherwise near the water-line of a wafer as it is pulled out of a deionized water (DI) water bath. The difference in surface tension between water and the solvent thins the meniscus, and pulls the water from the wafer back into the bath. In the embodiment shown, Marangoni drying system 290 has IPA vapor delivery system and processing module 310. Module 310 has linear motors 1300 connected to motor controller 302 and module controller 220' that selectably and controllably may slowly pull wafer holder 270' up from DI water bath 1306. In alternate aspects of the disclosed embodiment, other suitable drives may be used. In alternate aspects of the disclosed embodiment, holder 270' may be stationary where the components of module 310 may be moveable. In alternate aspects of the disclosed embodiment, holder 270' and/or module 310 may be individually or separately or independently moveable relative to each other. As will be shown, with one exemplary embodiment, wafer holder 270' may hold two opposing wafers (A & B). Therefore, processing module 310 and vapor delivery system 1308 may be capable of directing IPA vapor at both the A 1312 and B 1314 side wafers. In alternate aspects of the disclosed embodiment, vapor may be directed to a single wafer or one side of a wafer or to opposing sides of a single wafer. Similarly, Marangoni module 310 may have other subsystems, each of which may have an A and B side. Further, and as will be described in greater detail below, system 290 may support drying of multiple wafers in a parallel single wafer drying configuration where multiple modules or subcomponents of modules 310 and/or 1308 may be provided to process multiple wafers in multiple wafer holders in a parallel fashion. A Deionized Water (DIW) Bath 1306 has Weir 1316 and Drain 1318. Here, the DIW flows in a smooth fashion over weir 1316. IPA Vapor Injection System 1322 directs IPA vapor just above weir 1316. Nitrogen Purge System 1326 may be used to prevent wafer oxidation while the wafer is lowered into the DIW bath 1306. Nitrogen Air-knife 1330 may be used to blow off water droplets from the portion of wafer holder 270' above the wafer, so that drops do not later fall onto the clean dry wafer surface. Wafer Holder Motion System 1300 may have linear motors used, for example, to quickly lower wafer holder 270' into the DI bath 1306 and weir 1316 and to slowly pull wafer holder 270' up. IPA Vapor Delivery System (VDS) 1308 may be a commercially available chemical or vapor delivery system, for example, as supplied by Precision Flow Technologies of Saugerties, N.Y. IPA Vapor Delivery System (VDS) 1308 may have an IPA reservoir or tank that may be manually or otherwise refillable and an IPA Bubbler that may be a vessel within a vessel. VDS 1308 holds the IPA at a constant temperature to maintain a constant 3% IPA concentration in the flowing 97% N2 stream 1354. In alternate aspects of the disclosed embodiment, different concentrations with different vapor and gas combination(s) may be used. As will be described, solvent exhaust 1334 is connected to venture pump 1340 which is supplied by CDA supply 1338 where solvent exhaust 1344 exhausts drains 1358, 1360. N2 Supply 1362 supplies Nitrogen for IPA VDS 1308 as the source for the 97% N2 concentration in 3% IPA vapor 1354. N2 supply 1342 and 1346 support N2 air knife 1330 and N2 purge distribution tube 1326 respectively. DI water supply 1350 may also be provided as a DI water source for DIW bath 1306. In alternate aspects of the disclosed embodiment, more or less features and subsystems may be provided. By way of example, N2 purge distribution and/or N2 air knife may not be provided. By way of further example, multiple IPA vapor injection manifolds may be provided in a configuration to dry one or both sides of each substrate in a parallel single wafer configuration where multiple holders with multiple wafers are dried by multiple IPA vapor injection manifolds. As such any suitable combination or configuration may be provided.

Figure 45:
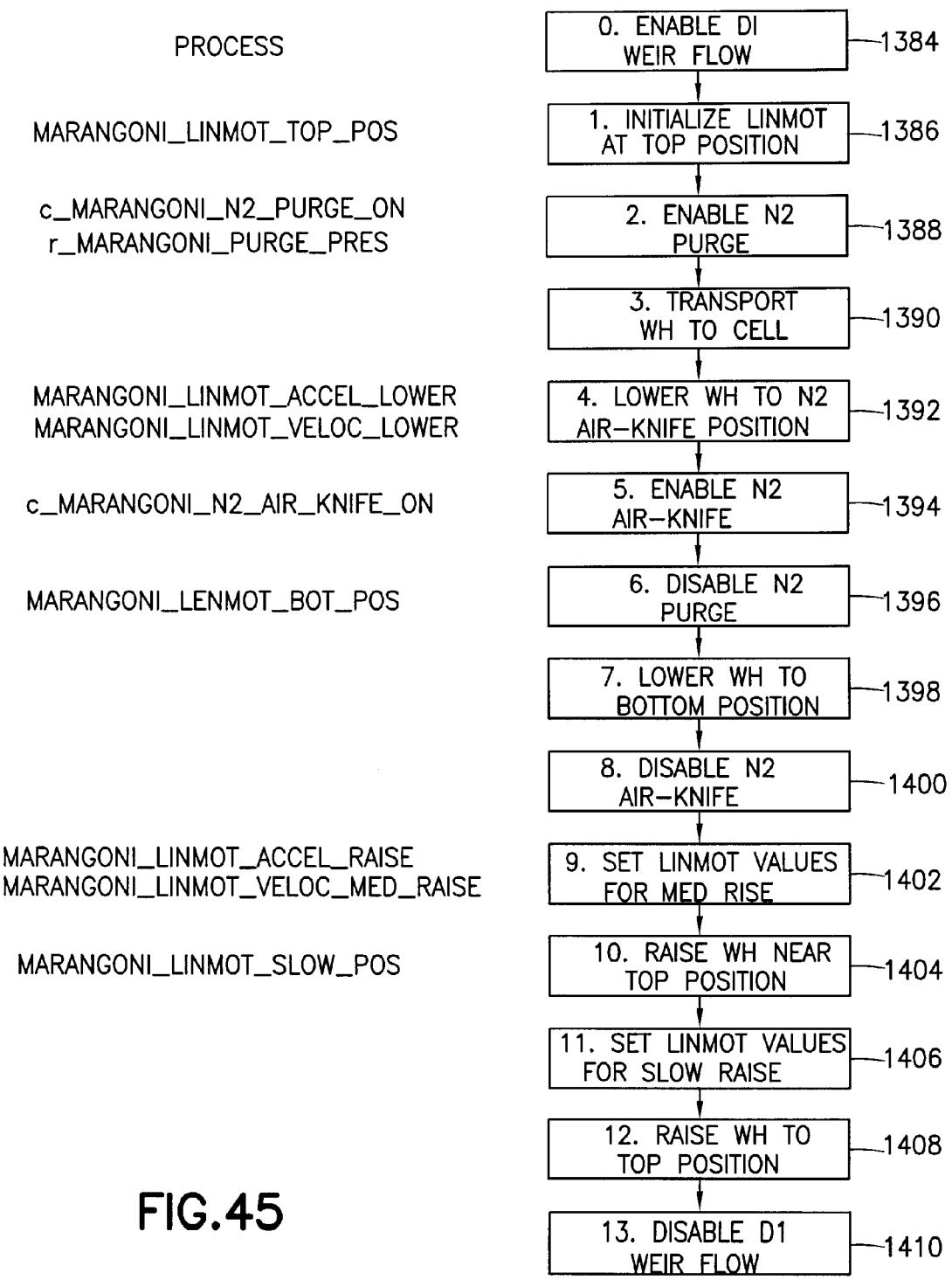
FIG. 45 is a process flow diagram.

Referring now to FIG. 45, there is shown process flow diagram 1380 for Marangoni drying suitable for use with Marangoni system 290 shown in FIG. 44 within platform 200. Prior to executing process flow 1380, system 290 may be initialized 1384 including ensuring CDA supply 1338 is on and at pressure to ensure that the IPA vapor is discharged into the solvent exhaust manifold. Further DI Weir 1316 Flow may be enabled and checked to be within range as insufficient or excessive Weir Flow can disrupt the Marangoni process. Further, the VDS system 1308 may be warmed as needed to ensure proper IPA vapor percentage. Step 1386 initializes linear motor 1300 at the top position and ensures that LinMot system 1300 is at the top position and ready to accept wafer holder 270'. Step 1388 of enable N2 purge provides enabling the purge before transporter motion and gives sufficient time to fill the process cell with N2. Here, the purpose of step 1388 is to avoid oxidation of the wafer during lowering of holder 270'. Step 1390 transports the wafer holder to the process cell, for example, via transporter automation 280, and hands off wafer holder 270' to LinMot system 1300. Step 1392 lowers the wafer holder to the N2 Air-Knife position. Here and at this position, the wafer may be partly immersed in the DI water. Holder 270' may be briefly paused at this LinMot system 300 position. Step 1394 enables N2 Air-Knife 1330. Step 1396 disables N2 Purge 1326. Step 1398 continue to lower wafer holder 270' to the bottom position. Here, Air-Knife 1330 will dry the top-most portion of the wafer holder during this process step. Step 1400 disables the N2 air knife 1330. Step 1402 sets LinMot 1300 values for a medium raise and prepares LinMot 1300 for a medium speed lifting operation. Step 1404 raises the wafer holder to a position at which the IPA vapor is slightly above the wafer bottom. Step 1406 sets LinMot 1300 values for slow raise to reduce the wafer lifting speed to slow in order to improve the drying of the base area of WH 270' near the wafer edge and the contact ring seal lip portion of wafer holder 270' at the edge of the wafer. In alternate aspects of the disclosed embodiment, wafer holder may not have a contact ring seal, for example utilizing a holder where the wafer is held at portion(s) of the edge of the wafer and where the wafer is completely immersed in DIW bath 1306. Step 1408 raises wafer holder 270' to the top position. Here, the wafer and wafer holder will be dry and the wafer drying process is complete. Step 1410 disables DI weir 1316 flow and may also disable other suitable subcomponents as required of Marangoni dryer system 290. In alternate aspects of the disclosed embodiment, more or less steps may be provided to support individual and/or multiple components and subcomponents of system 290 and in connection with the disclosed embodiment(s). In alternate aspects of the disclosed embodiment, the same, more or less steps may be provided in any suitable similar or different sequence of the steps.

Figure 46A:
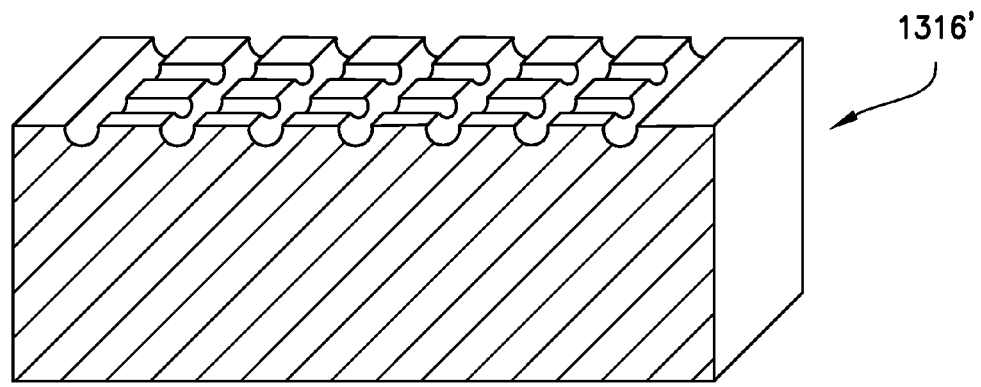
FIG. 46A is an isometric views of a portion of a weir.
Figure 46B:
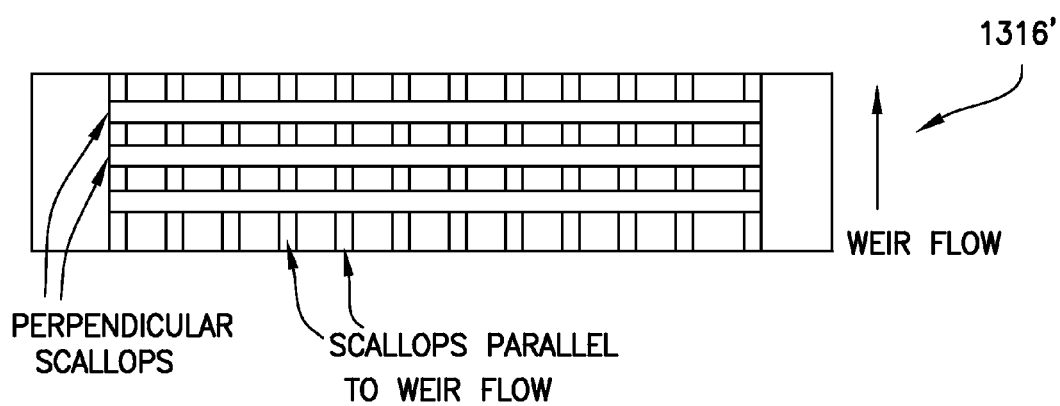
FIG. 46B is a top view of a portion of a weir.
Figure 47A:
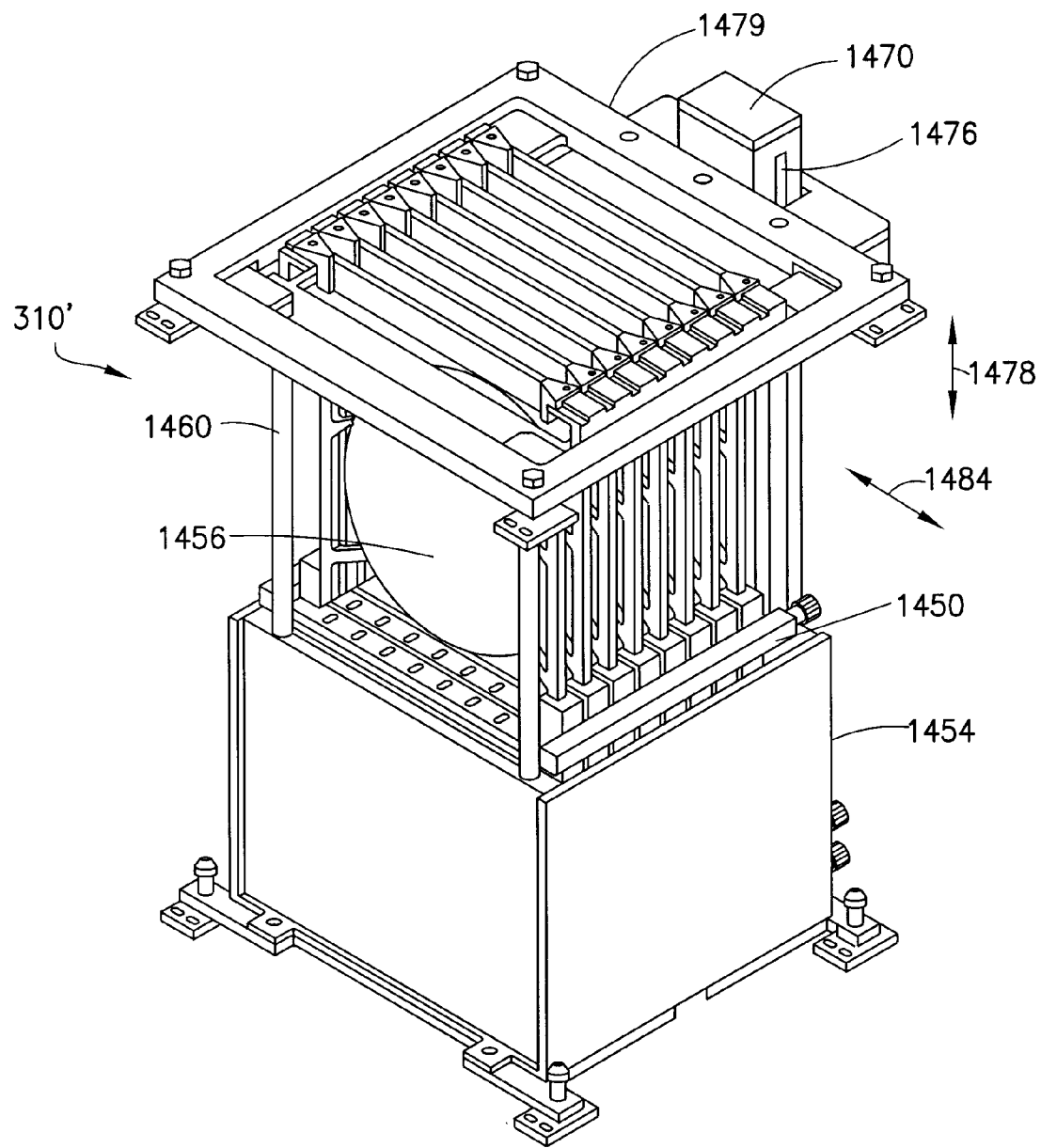
FIG. 47A is an isometric view of a parallel single wafer processing module.
Figure 47C:
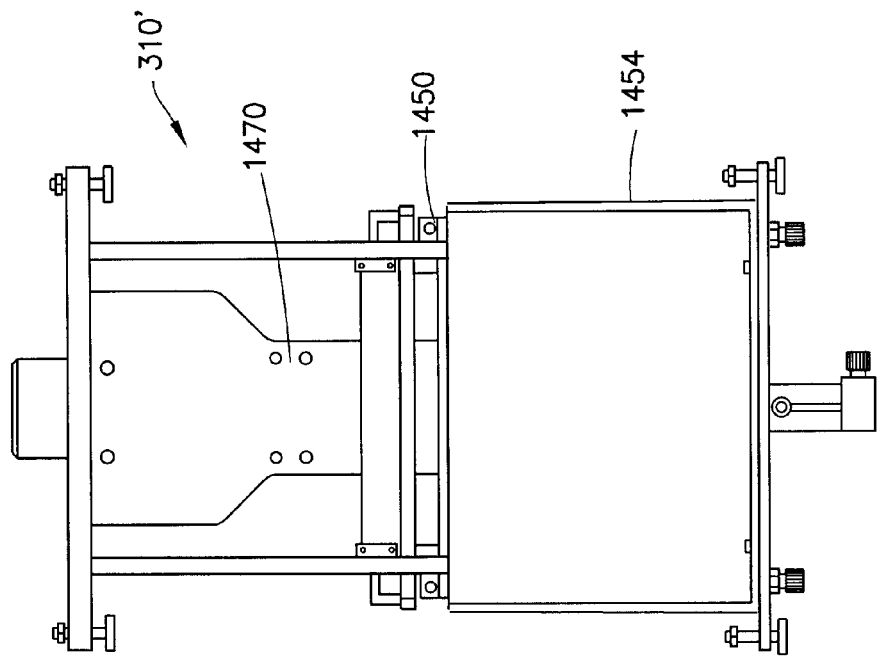
FIG. 47C is a side view of a parallel single wafer processing module.
Figure 47B:
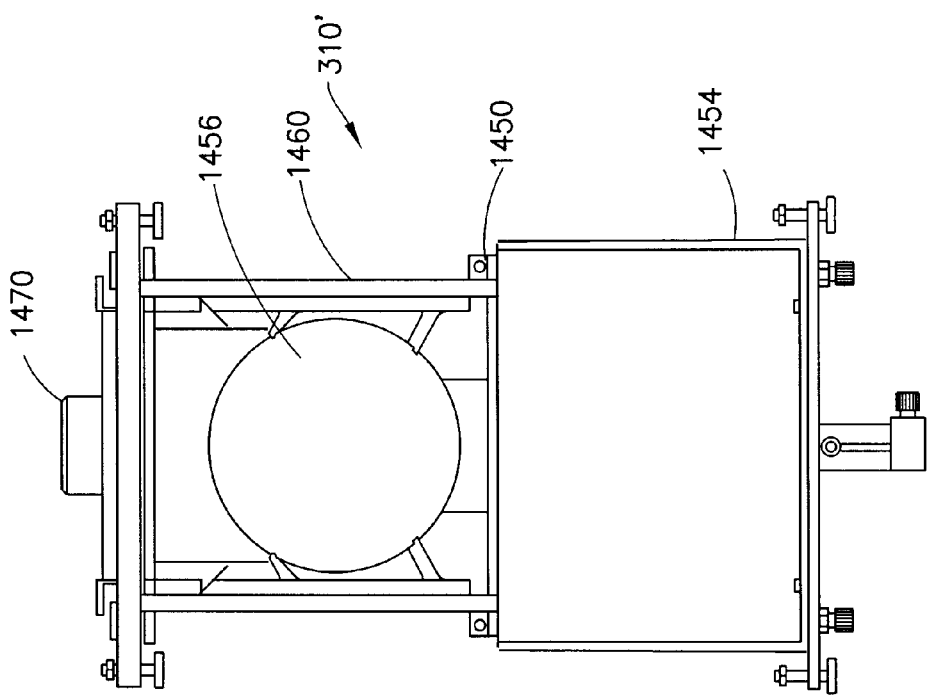
FIG. 47B is a side view of a parallel single wafer processing module.
Figure 48C:
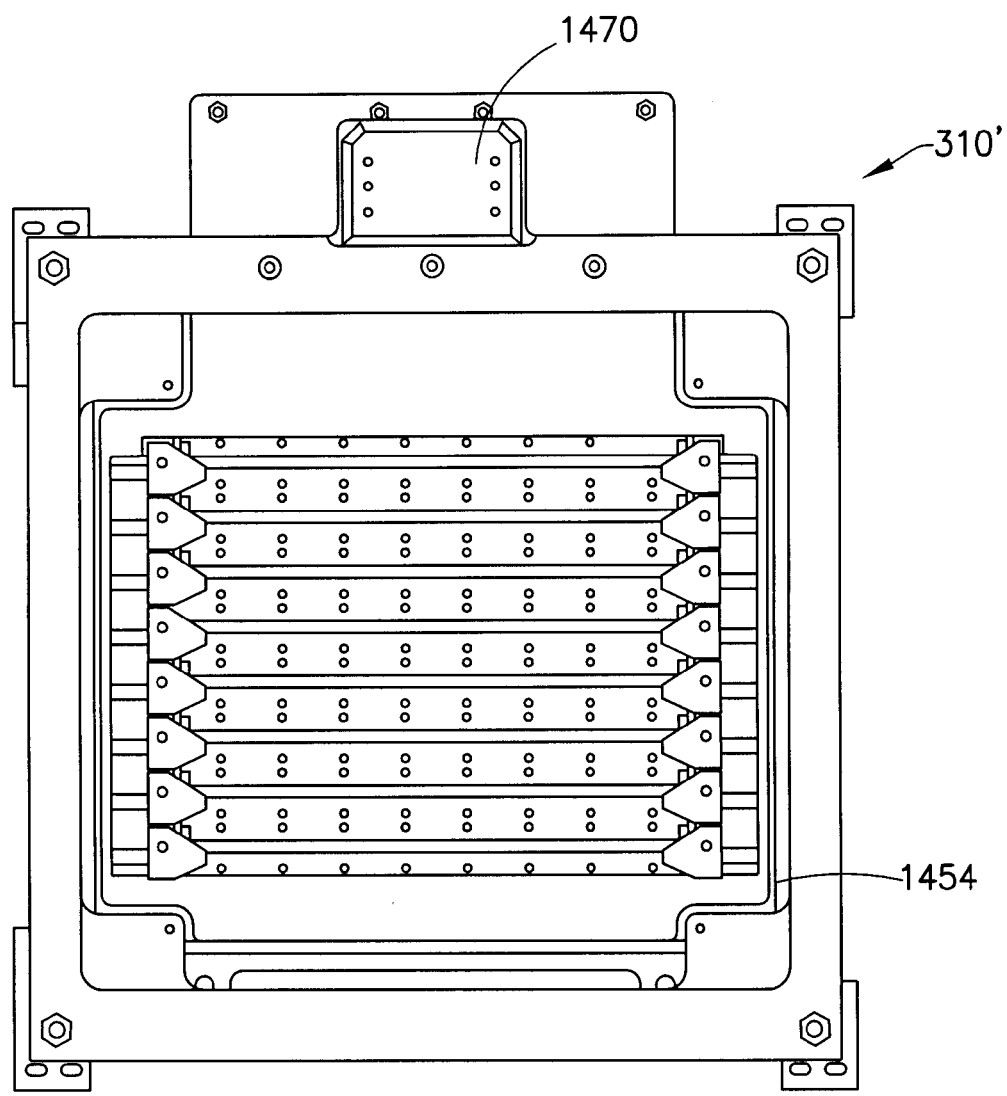
FIG. 48C is a top view of a parallel single wafer processing module.

Referring now to FIGS. 46A & 46B, there are shown isometric and top views respectively of a portion of weir 1316'. Referring also to FIGS. 47A, 47B and 47C, there are shown isometric and two side views respectively of exemplary parallel single wafer processing module 310'. Referring also to FIGS. 48A, 48B and 48C, there are shown two isometric section and top views respectively of exemplary parallel single wafer processing module 310'. Referring also to FIGS. 49A and 49B, there are shown side views of exemplary parallel single wafer processing module 310'. In the embodiment of exemplary parallel single wafer processing system 310, FIGS. 47A, 47B, 48A and 49A show multiple parallel wafer holders holding single wafers in a raised position whereas FIGS. 47C, 48B and 49B show multiple parallel wafer holders holding single wafers in a lowered position. In the embodiment parallel single wafer Marangoni drying module 310' shown, multiple N2/IPA/DIW manifolds 1450 may float in position relative to tank 1454 and may be aligned independent of tank 1454. As will be described in greater detail below, manifolds 1450 incorporate an IPA/N2 vapor injection portion that incorporates a linear nozzle in close proximity to a DIW weir and solvent exhaust portion to facilitate drying of both sides of wafers 1456. System 310' is shown using flexure based wafer holders 1460, for example, as described. Alternately, any suitable wafer holder may be used. With holders 1460, less water may be displaced by the flexure type holder than, for example, a sealed-body wafer holder of the type used for electroplating which requires electrical and fluid sealing surfaces. Sufficient weir flow at each drying or processing location of each wafer may be provided in order to ensure sufficient dilution of IPA-vapor-saturated water at the drying site(s). Sufficient flow thereby maintains the concentration gradient needed for high-throughput Marangoni drying. An exemplary design feature to promote weir flow across all processing locations may include balanced height weirs, for example, to within approximately 1 mm or otherwise. A further exemplary design feature to promote weir flow across all processing locations may include weir designs in which all or a significant fraction of the weirs are permanently wetted. By way of example, this may be accomplished with a scalloped weir in directions both parallel and perpendicular to the wafer as shown in FIGS. 46A and 46B thus promoting weir flow even for processing locations with slightly lower weir height. A further exemplary design feature to promote weir flow across all processing locations may include mechanism 1464 to produce fluid agitation in the common reservoir promoting weir flow even for drying processing locations with slightly lower weir height. Here, mechanism 1464 may be an oscillating board, a non-axisymmetric rotating system, an oscillating bellows, a piston, a pump with actuated valve or any other suitable method to create waves and fluid motion to promote localized weir flow. In the embodiment shown, an 8-wafer array of holders 1460 is shown which may be increased or decreased to any suitable number, for example, expanded to 13 or otherwise for higher throughputs. In the embodiment shown, the transporter 280 direction of travel 282 for transporting holders to and from loader 274 and modules 210 and Marangoni dryer 310', may be set by the loader such that Transporter travel 282 may be parallel to wafer. In alternate aspects of the disclosed embodiment, any suitable orientation or direction(s) of travel may be provided. As seen, Z-stage 1470 of module 310' shown in the UP or raised position accepts holders 1460 with wafers 1456 from Transporter 280. Here, Z-stage 1470 may have holder support 1472 coupled to vertical carriage that is guided by guides 1476 and driven by a suitable drive, such as a linear motor drive or any suitable drive in the vertical direction 1478. As seen with Z stage 1470 shown in a down position with wafers 1456 fully immersed in DIW 1482, from where Z stage 1470 may slowly extract wafers through the Linear IPA Nozzle Exhaust and Weir (LINEW) assembly 1450. In the embodiment shown, process piping (not shown for clarity) may come out the side of module 310' in X direction 1484, from the ends of each LINEW, and may make a turn 90 degrees toward the back of tool 200 into process support region 284. In the embodiment shown, holder support 1472 may provide for compliance and/or allow relative movement between each individual holder of the group of holders 1460 where each individual holder is not coupled to any other individual holder of holder array 1460. Alternately, holder array 1460 may be provided with compliance between each individual holder. Here and as will be described in greater detail below, each individual holder within holder array 1460 may be independently positioned within module 310' with respect to the individual holder's corresponding components of manifold(s) 1450. For example, and as will be shown, wafer holders 1460 may be engaged with alignment wheels built into the LINEW array 1450 such that each WH within array 1460 is aligned precisely with each of the LINEW elements in the array. Here, transporter 280 drop-off motion to holder support 1472 may include a compliant engagement with the alignment wheels, thereby avoiding need for a Z-stage cradle to restrain rotation about theta-X axis (i.e. rotation about an axis parallel to the wafer surface). In the embodiment shown, the XY datum for tool 200 may be the hand-off position between transporter 280 and Z drive 1470 where tank 1454 for the Dryer-module 310' may then be lower than the tanks for other process modules, for example, shear plate modules or other suitable modules. In alternate aspects of the disclosed embodiment, any suitable module may be provided, for example, air knife module(s), N2 purge distribution modules or otherwise.

Figure 50A:
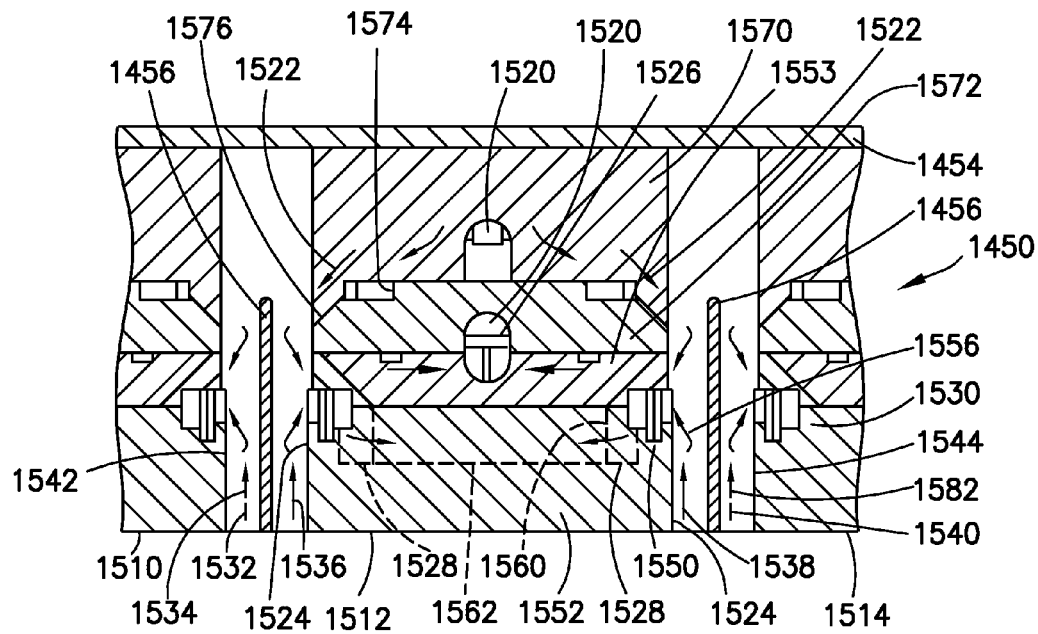
FIG. 50A is a section view of a linear IPA nozzle exhaust and weir assembly.
Figure 50B:
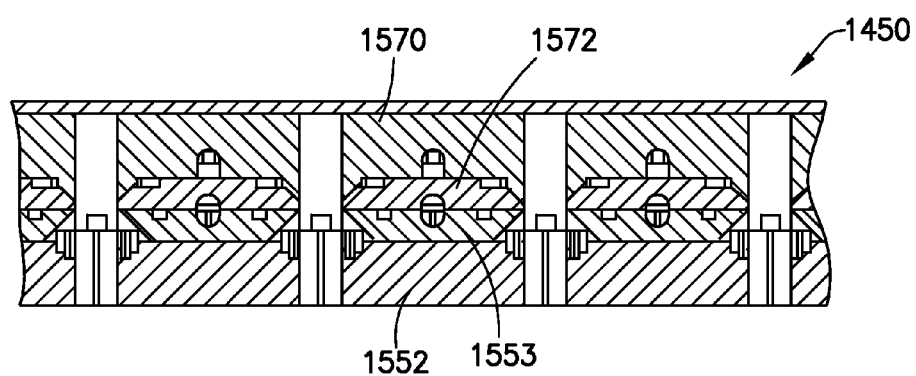
FIG. 50B is a section view of a linear IPA nozzle exhaust andweir assembly.
Figure 50C:
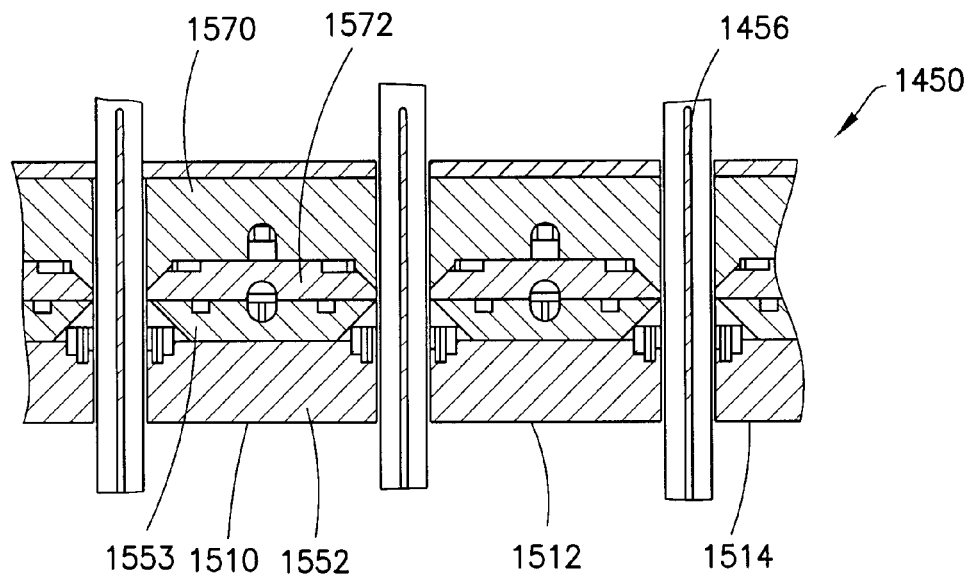
FIG. 50C is a section view of a linear IPA nozzle exhaust andweir assembly.
Figure 51A:
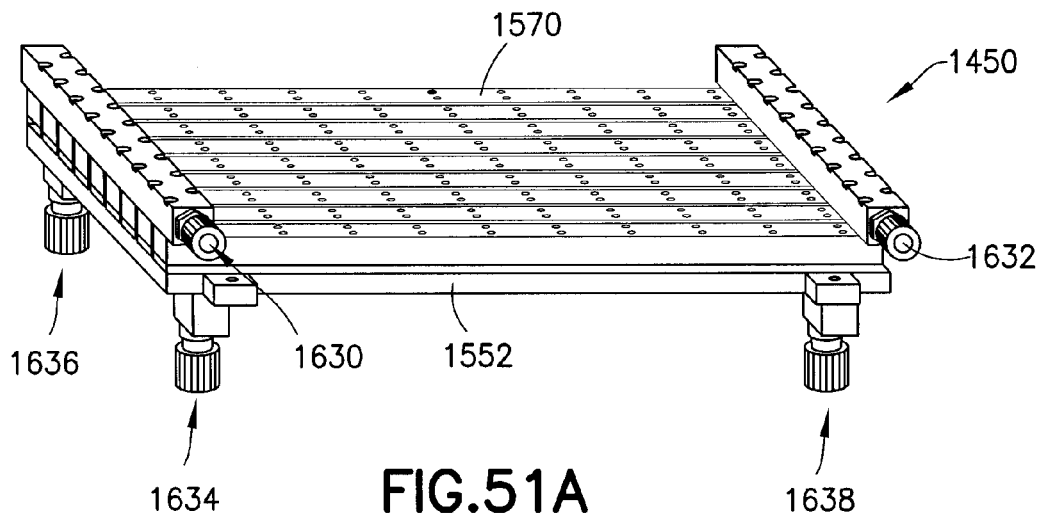
FIG. 51A is a isometric view of a linear IPA nozzle Exhaust andweir manifold assembly.
Figure 51B:
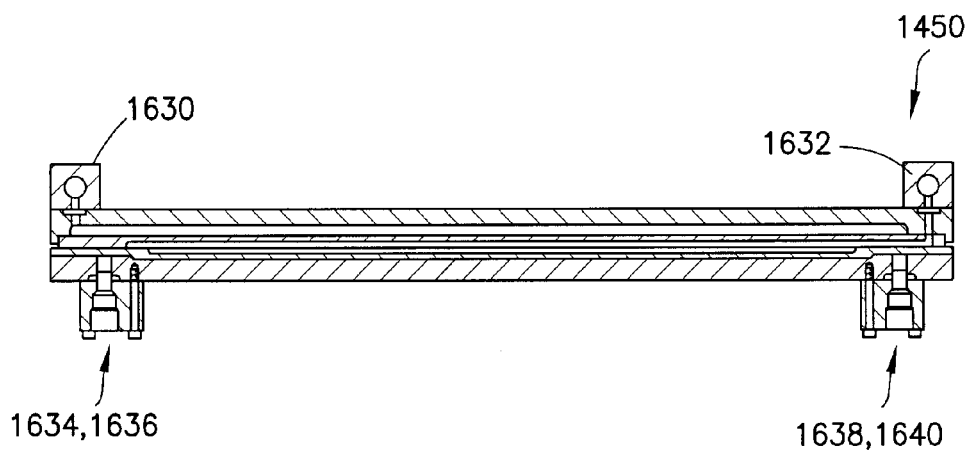
FIG. 51B is a side view of a linear IPA nozzle Exhaust andweir manifold assembly.
Figure 51C:
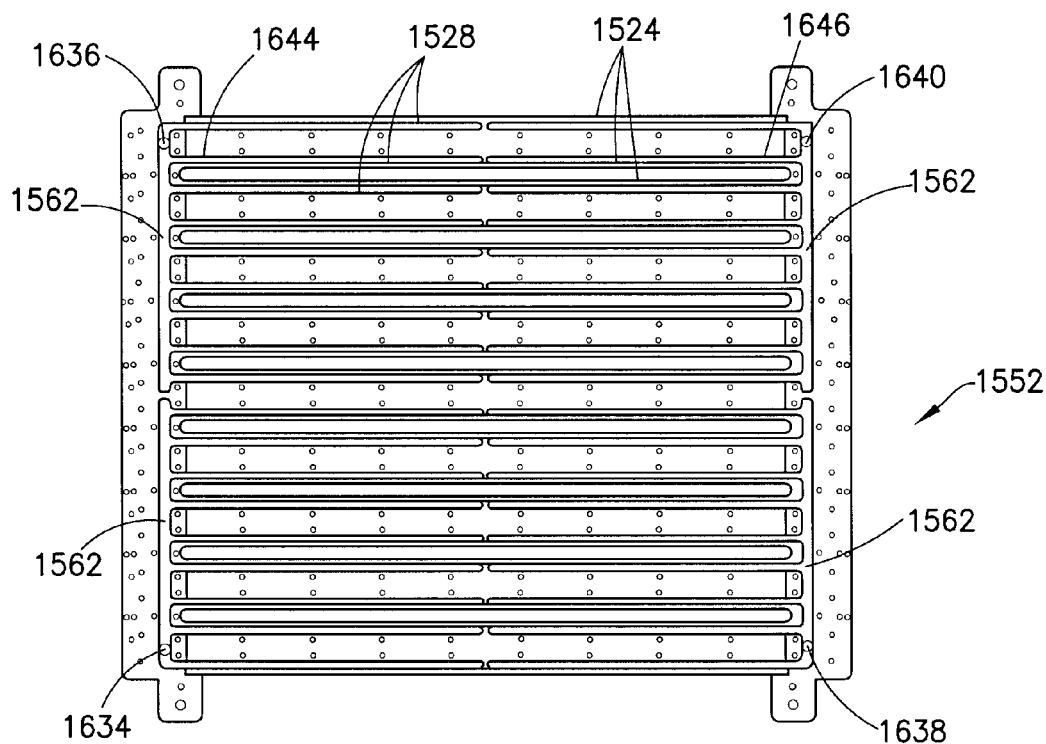
FIG. 51C is a top view of a weir drain plate.
Figure 51D:
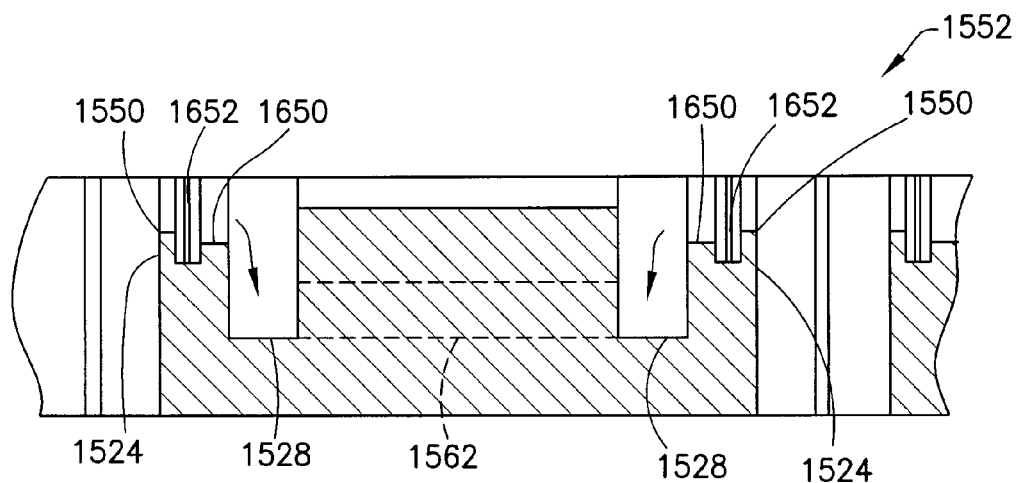
FIG. 51D is a section view of a weir drain plate.
Figure 52:
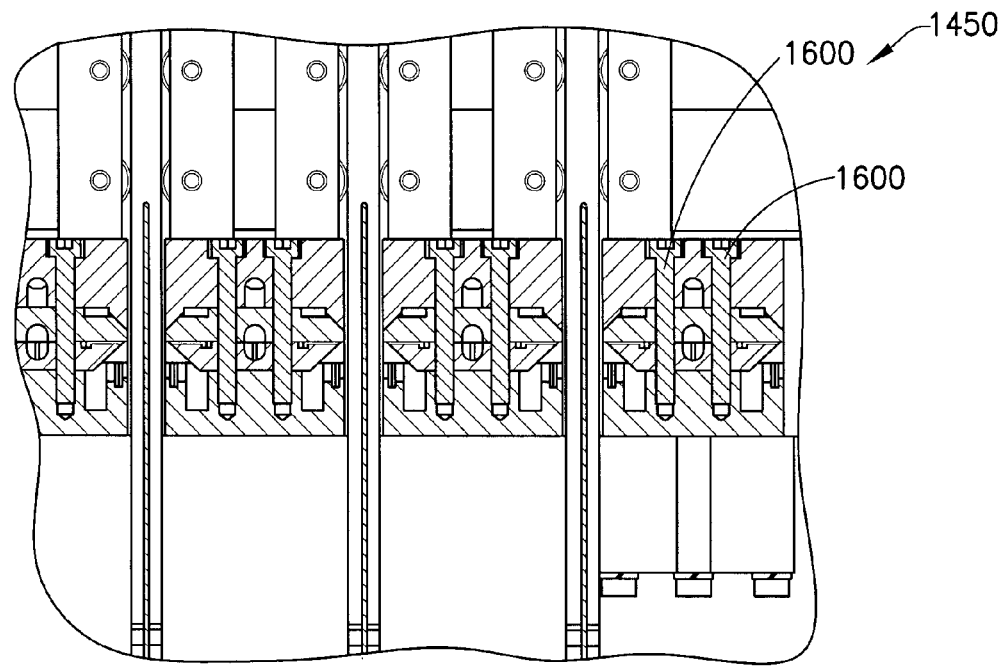
FIG. 52 is a section view of a linear IPA nozzle exhaust andweir assembly.
Figure 53A:
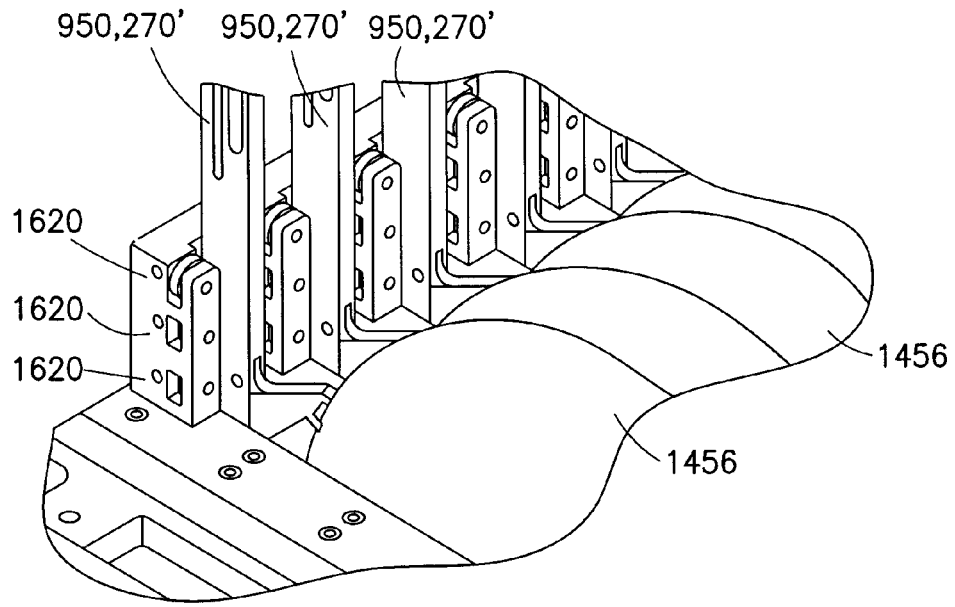
FIG. 53A is an isometric view of a holder in a linear IPA nozzle exhaust and weir assembly.
Figure 53B:
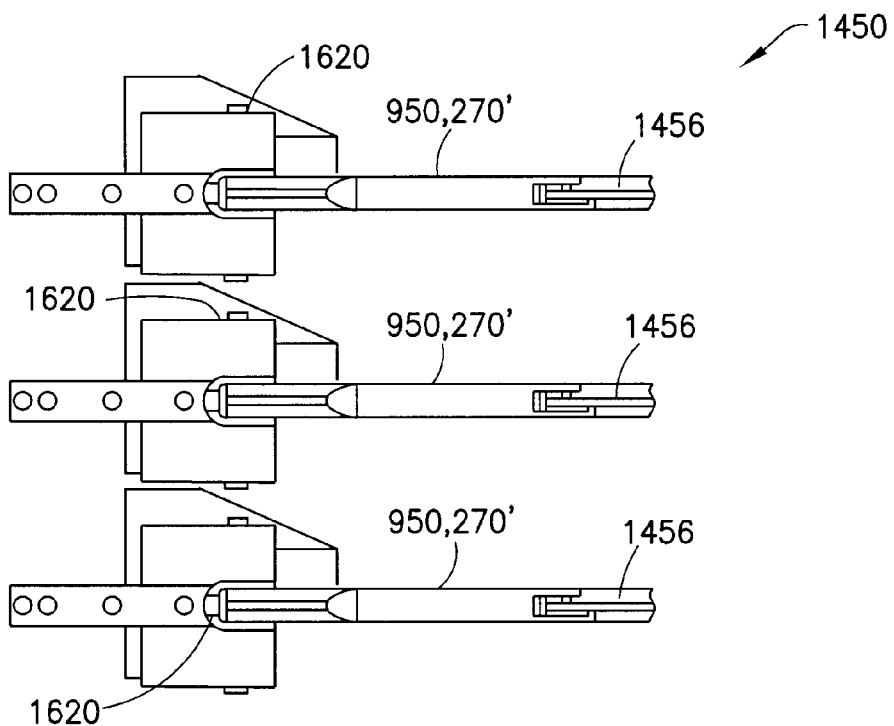
FIG. 53B is a top view of a holder in a linear IPA nozzle exhaust and weir assembly.

Referring now to FIGS. 50A-C, there is shown a section view of a Linear IPA Nozzle Exhaust and Weir (LINEW) assembly 1450. In the embodiment shown, linear IPA nozzle exhaust and weir assembly 1450 has manifolds 1510, 1512 and 1514, each having N2/IPA input portion 1520, N2/IPA vapor injection portion 1522, DIW weir 1524, N2/IPA output portion 1526 and DIW output portion 1528. In the embodiment shown, input and output portions are in communication with and shared with two opposing N2/IPA vapor injection portions and two opposing DIW weir portions on each manifold or individual LINEW of the array of manifolds. In alternate aspects of the disclosed embodiment, more or less portions may be shared or isolated. In alternate aspects of the disclosed embodiment, more or less manifolds may be provided. In the embodiment shown, DIW weir overflow at DIW level 1530 flows directly into the LINEW manifold itself, thereby avoiding need to provide a separate DIW return path downward into a secondary vessel. In FIG. 50A, liquid and N2/IPA vapor flow through LINEW manifolds 1510, 1512, 1514 are shown, for example for a one or two wafer holder array. Here, the LINEW array of manifolds is sitting in tank 1454 of DIW 1582 such that input pumping 1532 of the DIW causes it to flow upward 1534, 1536, 1538, 1540 through slots 1542, 1544 in the LINEW array of manifolds and over 1556 the individual weirs 1524 formed by weir edges 1550 of lower LINEW manifold elements 1552 such that the DIW level 1530 is only slightly above the weir edge 1550. DIW output flows through an array of slots 1560 and into a cross bore 1562 that is connected to a tube on the end of each LINEW manifold. IPA/N2 vapor enters from one end of the LINEW manifold and is distributed horizontally (i.e. in/out of page in FIG. 50B) along the nozzle by a cavity formed between the top 1570 and middle 1572 elements of the LINEW manifold. An array of cross slots 1574 serves as a distribution manifold to feed the IPA/N2 uniformly into the ejector slot 1576 which may be, for example, a 0.01" or other suitable gap between the top 1570 and middle 1572 LINEW manifold elements at their outer edge. An exhaust flow is pulled out of the LINEW manifold through a horizontal channel 1580 formed by an enclosed cavity between the upper middle 572 and lower middle 1553 LINEW manifold elements where channel may be in 1580 in communication with channel 1562. Here, exhaust flow uniformity along the LINEW manifold length is governed by the same array of slots 1560 in the lower element 1552 that transport the DIW from weir edge 1550 to fluid output channel 1562. Water mostly drops out of the exhaust flow stream into the drain tube channel 1562 while IPA/N2, along with ambient atmospheric gas (air), is pulled by exhaust negative pressure out of the LINEW manifold by the exhaust channel 1582. In alternate aspects of the disclosed embodiment, any suitable manifold configuration may be provided. Referring also to FIG. 52, there is shown a section view of manifold array 1450. In the embodiment shown, an array of bolts 1600 are shown used to clamp together the four portions 1570, 1572, 1552, 1553 of the LINEW manifold 1514 to form the input IPA/N2 channel and the exhaust channels with bolts 1600 threaded into lower element 1552. In alternate aspects of the disclosed embodiment, any suitable clamping or fabrication method having more or less portions may be used. Referring also to FIG. 51A, there is shown an isometric view of linear IPA nozzle Exhaust and weir manifold assembly 1450. Referring also to FIG. 51B, there is shown a section view of linear IPA nozzle Exhaust and weir manifold assembly 1450. Assembly 1450 has weir drain plate 1552 and top plate 1570. IPA N2 inlet 1630 is in communication with IPA inlet channel 1520 of each injector. IPA exhaust 1632 is in communication with IPA exhaust channel 1526 of each injector. Water drains 1643, 1636, 1638, 1640 are in communication with drain channels 1562 which are in communication with drain channels 1528 of each weir. Referring also to FIG. 51C, there is shown a top view of weir drain plate 1552. Referring also to FIG. 51D, there is shown a section view of weir drain plate 1552. Here, weir drain plate 1552 serves as a structural support and provides weir/DIW discharge. As seen in FIG. 51C, water drains 1643, 1636, 1638, 1640 are in communication with drain channels 1562 which are further in communication with drain channels 1528 of each weir 1524 where DIW flows over the edge 1550 of each weir 1524 and is drained through drains 1634, 1636, 1638, 1640. In an alternate aspect of the disclosed embodiment, each weir may be lowered at edges 1644 and 1646 to facilitate drainage. Here, each weir may be back cut, tapered or otherwise. With such lowered edges, the flow is directed parallel to the wafer surface where the weir may drain at the edges outside the diameter of the wafer. As seen in FIG. 51D a two level weir 1524 is show in an alternate aspect of the disclosed embodiment. Weir 1524 is shown having primary weir 1550 and secondary weir 1650. Water flows over the primary weir 1550 filling channel 1652 and then over secondary weir 1650 into drainage channel 1528 and then to drainage channel 1562. Channel 1652 serves as a reservoir of water localized between the primary and secondary weirs where the difference in height between the primary and secondary weir may be less than a capillary length or approximately 2 mm or otherwise. This allows fluid communication between the main water source and the reservoir and promotes wetting of the primary weir and increases uniformity of flow over the weir. In alternate aspects of the disclosed embodiment, any suitable weir geometry may be provided. Referring now to FIG. 53A, there is shown an isometric view of a holder in a linear IPA nozzle exhaust and weir assembly. Referring also to FIG. 53B, there is shown an isometric view of a holder in a linear IPA nozzle exhaust and weir assembly 1450. In the embodiment shown, 3 arrays of 3 rollers 1620 each are disposed to constrain each leg of holder 270' such that the surface of wafer 1456 remains at a predetermined distance from the IPA Vapor injection and the weir portions of Linear IPA Nozzle Exhaust and Weir assembly 1450. In alternate aspects of the disclosed embodiment, more or less rollers or other suitable guidance and location of holder 270' and/or wafer 1456 with respect to the IPA Vapor injection and weir portions of Linear IPA Nozzle Exhaust and Weir assembly 1450 may be provided.

In accordance with another aspect of the disclosed embodiment, a substrate drying apparatus 310' for drying a width of a surface of a substrate in a liquid is provided. The substrate drying apparatus 310' has a liquid tank 1454 containing the liquid. An injection nozzle 1576 is coupled to the liquid tank, the injection nozzle having a continuous knife edge injection surface across the width of the surface of the substrate. A drain 1524 is coupled to the injection nozzle, the drain having a continuous drain surface substantially parallel to the continuous knife edge injection surface and across the width of the surface of the substrate 1456. The liquid forms a meniscus between the continuous drain surface and the width of the surface of the substrate. The injection nozzle directs a vapor at the meniscus. The substrate is in a substantially vertical orientation. The substrate is coupled to a holder, the holder and the substrate movable relative to the injection nozzle and the drain. The continuous drain surface 1524 forms a weir that is substantially permanently wetted. The continuous drain surface forms a weir that is scalloped in directions both parallel and perpendicular to the wafer surface. The substrate drying apparatus may further have a liquid reservoir adapted to replenish the liquid, the liquid reservoir having a fluid agitation mechanism agitating the liquid. The drain may comprise a drainage manifold having a lower liquid drainage portion 1528 and an upper vapor exhaust portion 1526. System 310' may be a Marangoni dryer apparatus for drying a width of a surface of a substrate in a liquid. The injection nozzle may be coupled to a combination liquid and vapor drain. The combination liquid and vapor drain has a continuous drain surface 1524 substantially parallel to the continuous knife edge injection surface 1576. The continuous knife edge injection surface and the continuous drain surface being continuous across the width of the wafer. Vapor is injected along the length of the continuous knife edge injection surface to a meniscus formed between the surface of the substrate and the combination liquid and vapor drain, and wherein the liquid and vapor flows into the combination liquid and vapor drain. In accordance with another aspect of the disclosed embodiment, a multiple substrate drying apparatus 310' for drying opposing surfaces of multiple substrates in a liquid is provided. The multiple substrate drying apparatus has a liquid tank containing the liquid. A plurality of manifolds 1450, each manifold proximate each of the opposing surfaces of the substrates each manifold having an injection nozzle coupled to the liquid tank. Each manifold has a drain coupled to the injection nozzle, the drain having a continuous drain surface substantially parallel to the continuous knife edge injection surface and across the width of the surface of the substrate. The liquid forms a meniscus between each continuous drain surface and the width of each of the surfaces of the substrates, and wherein the injection nozzle directs a vapor at the meniscus.

Figure 54:
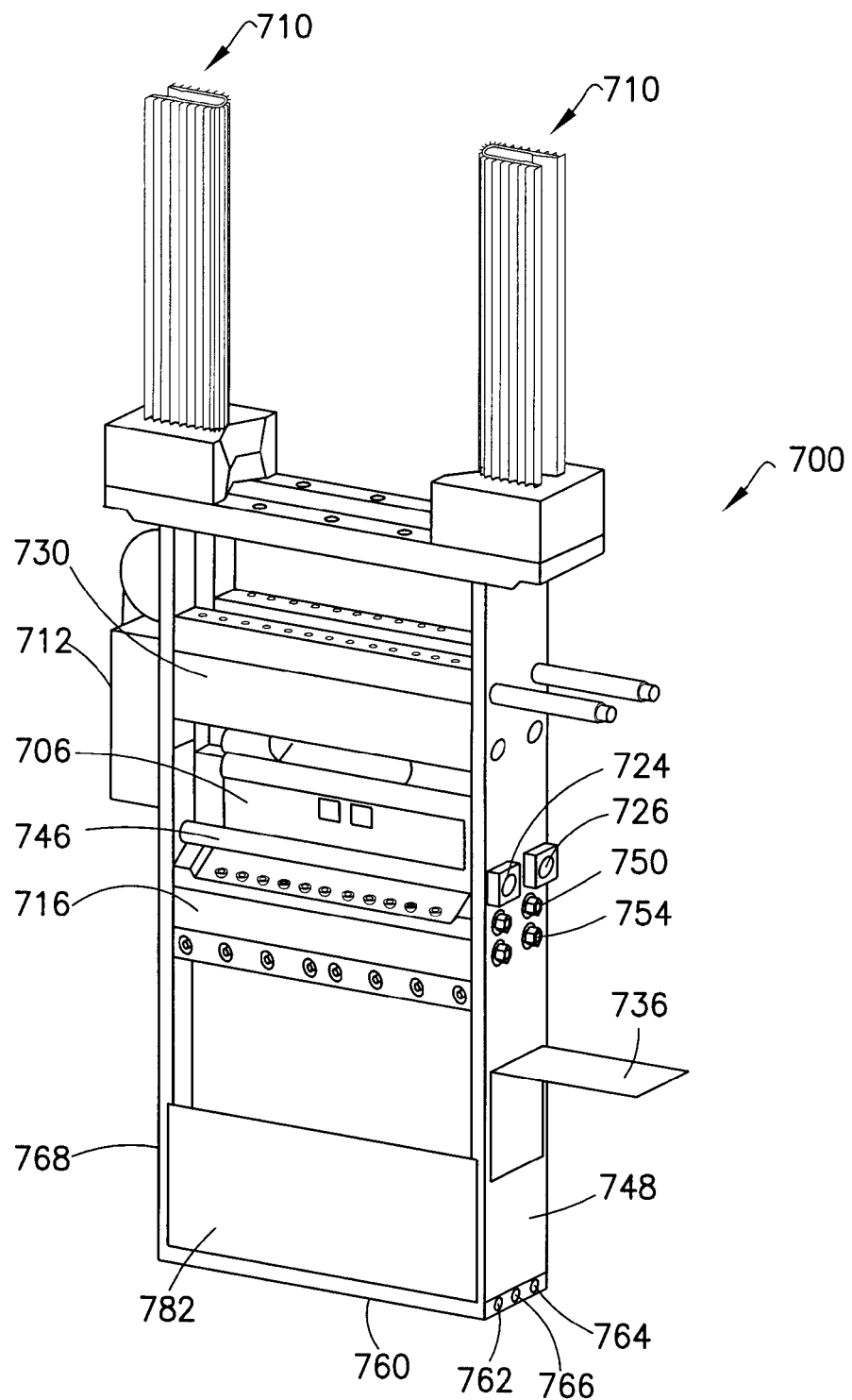
FIG. 54 is an isometric view of a Marangoni dry module.
Figure 55:
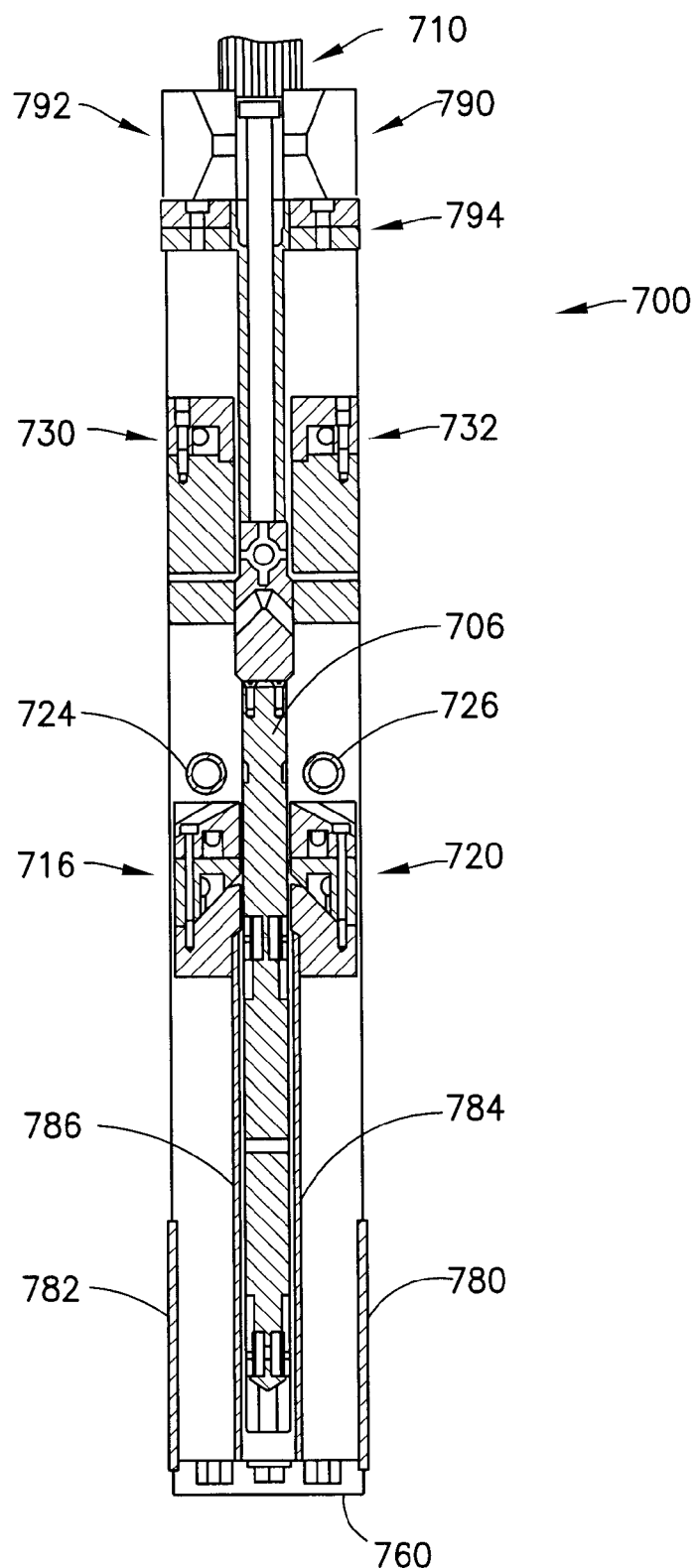
FIG. 55 is a section view of a Marangoni dry module.
Figure 56A:
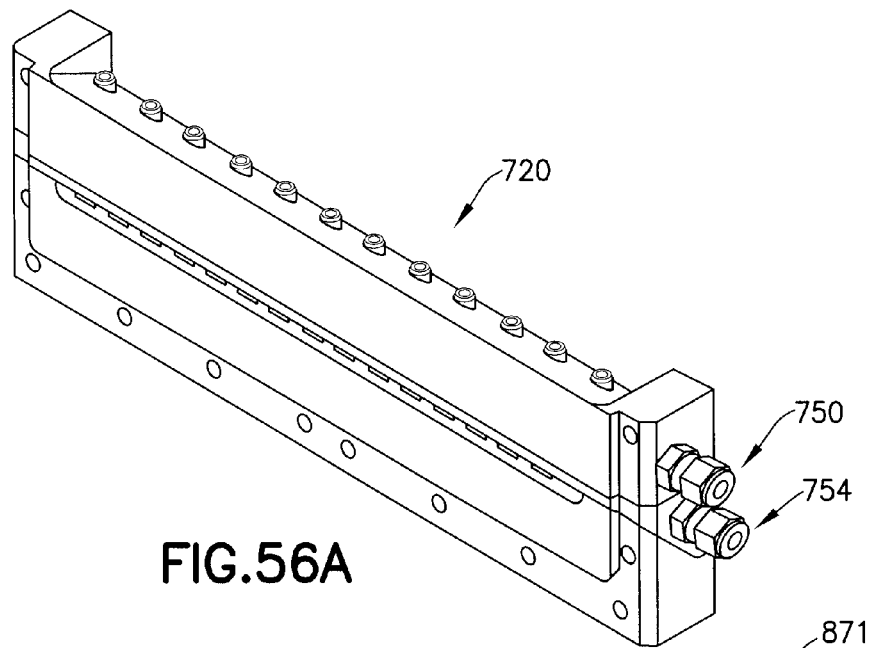
FIG. 56A is an isometric view of and IPA injector manifold.
Figures 57A, 57B:
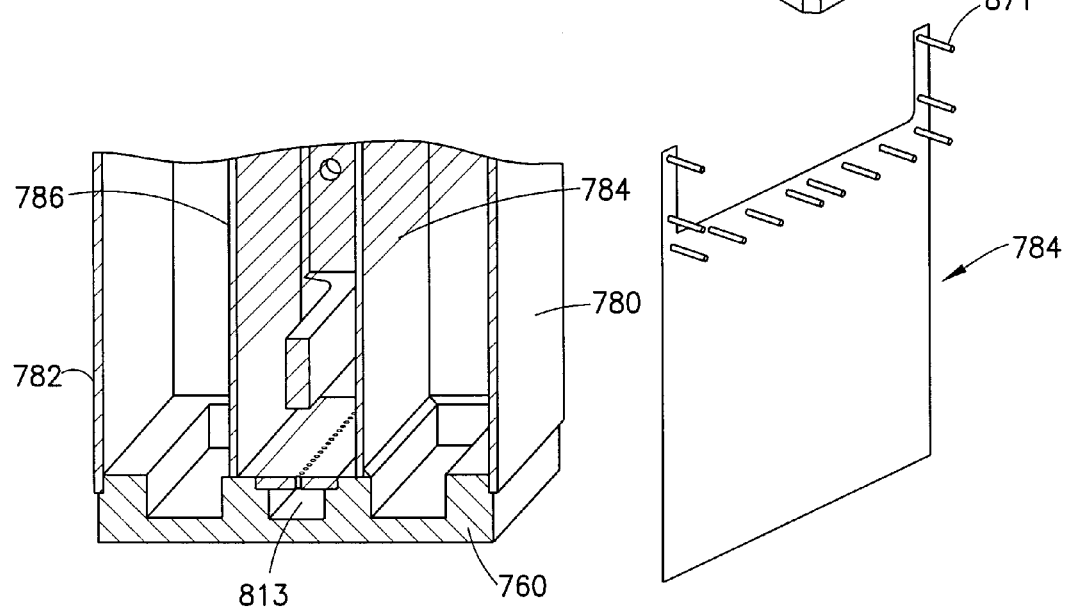
FIG. 57A is an isometric section view of a bottom plate.
FIG. 57B is an isometric view of a plate.
Figure 56B:
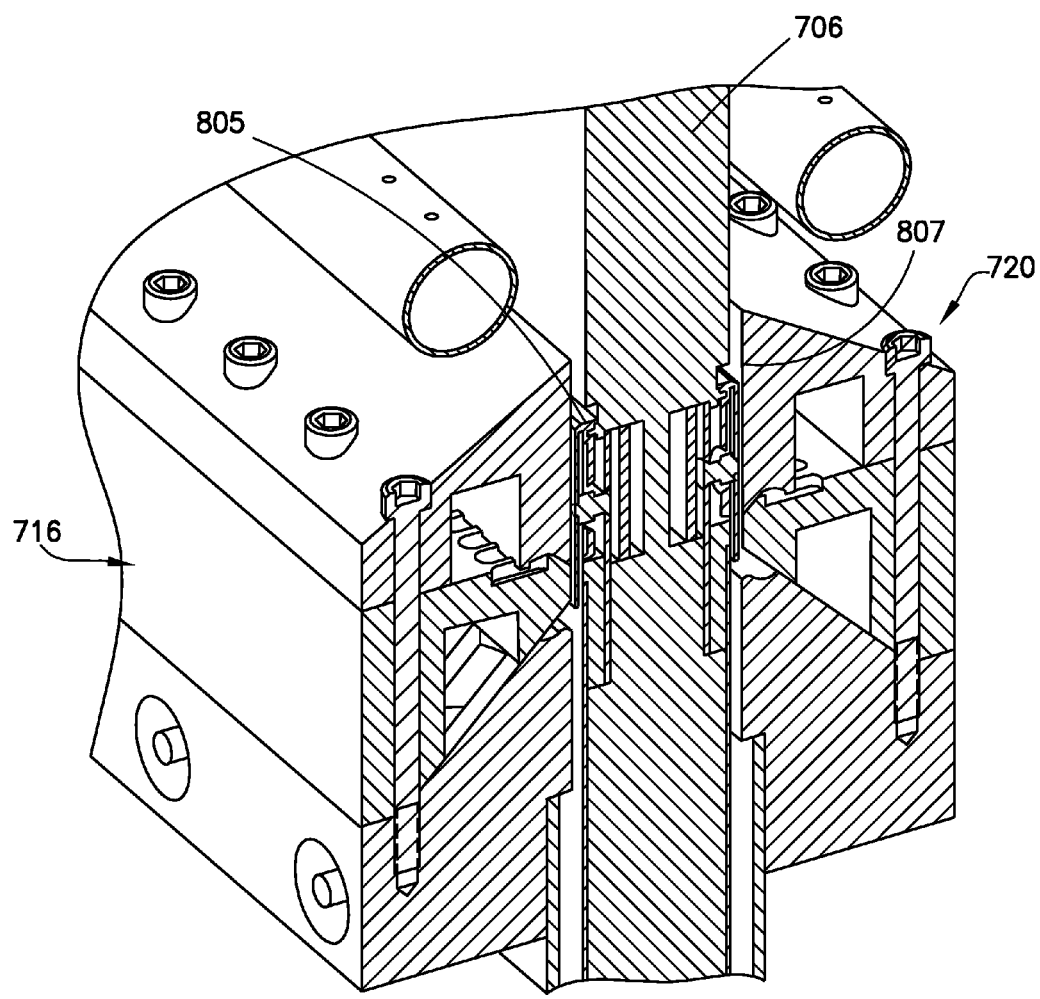
FIG. 56B is a section view of and IPA injector manifold.
Figure 56C:
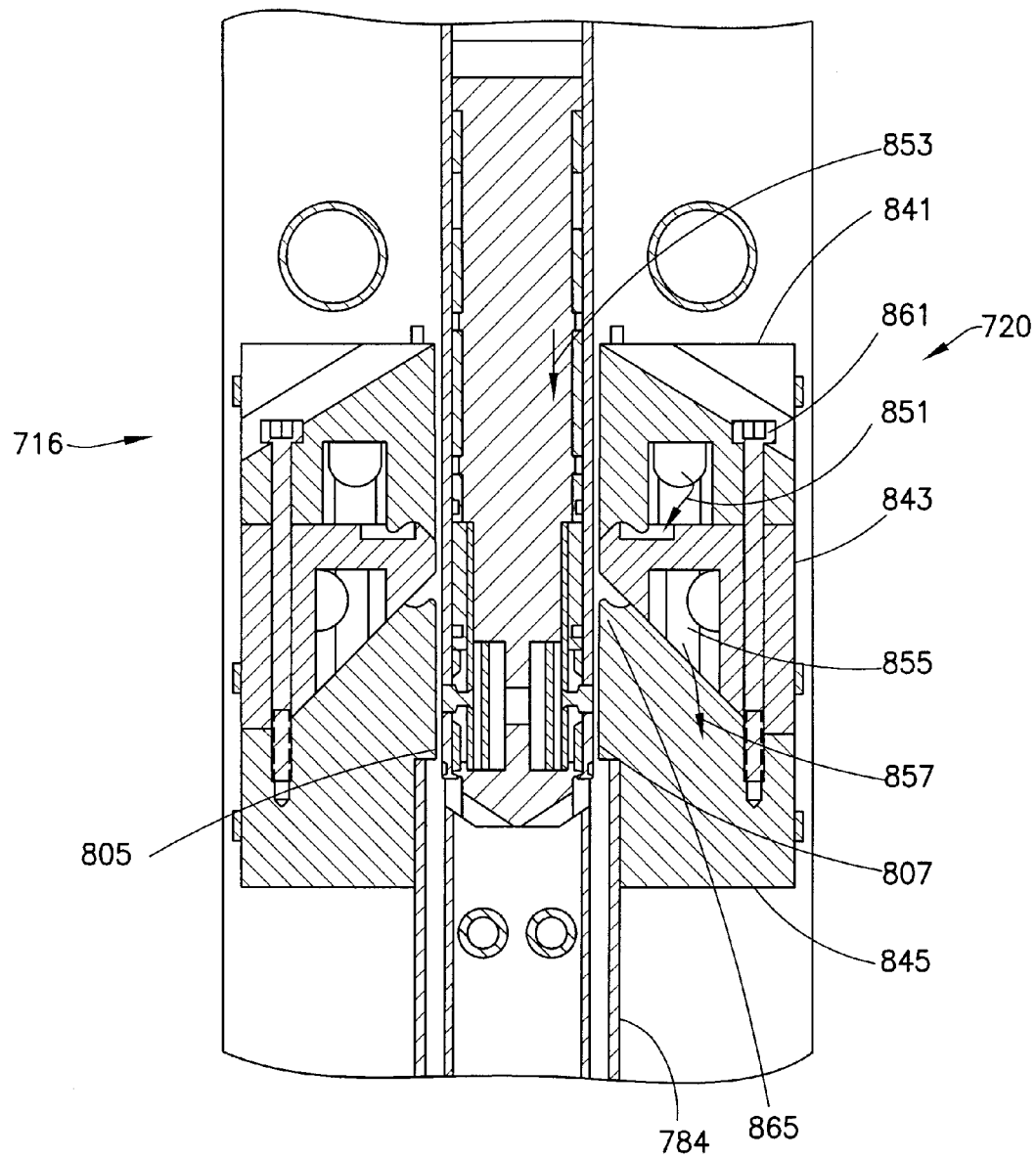
FIG. 56C is a section view of and IPA injector manifold.
Figure 58:
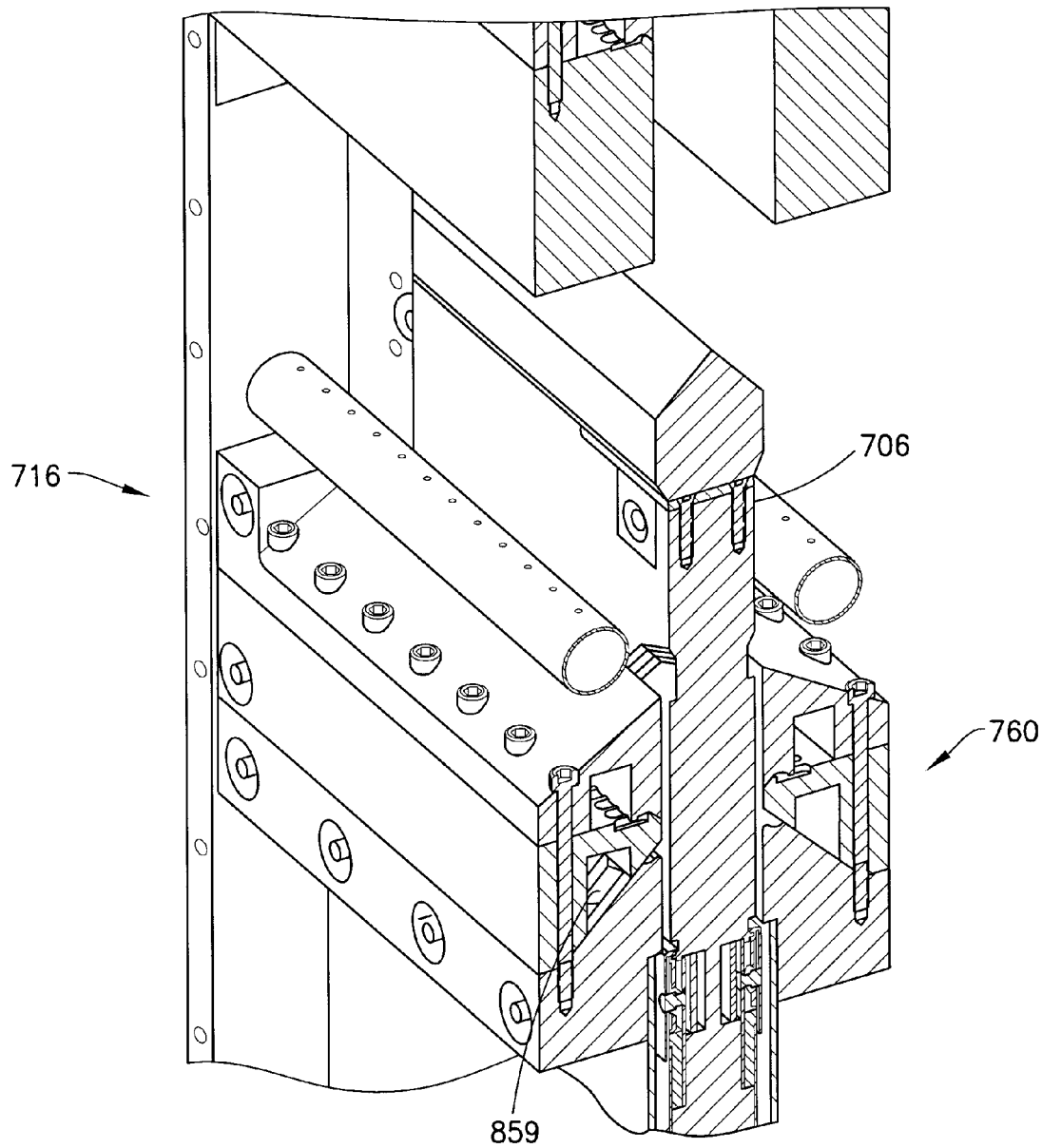
FIG. 58 is an isometric view of and IPA injector nozzle manifold and N2 purge manifold.
Figure 59:
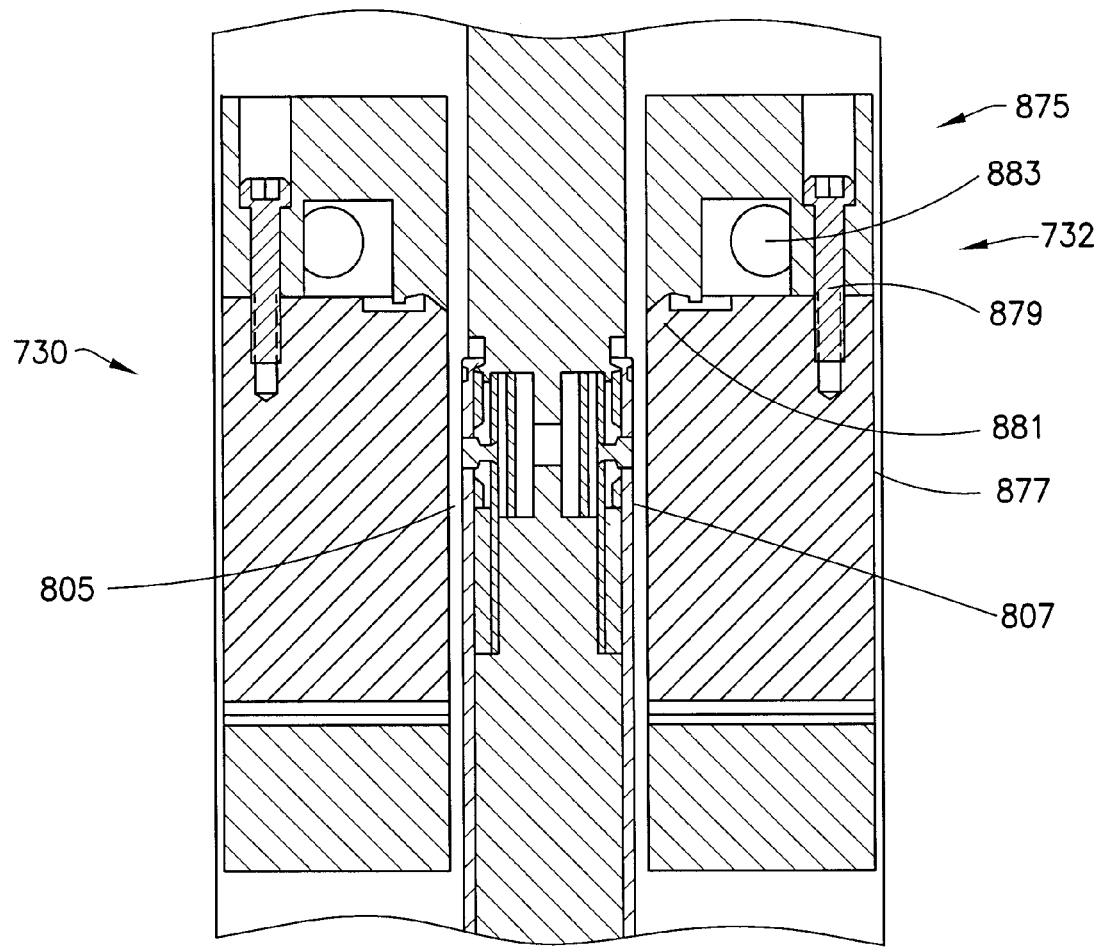
FIG. 59 is a section view of an Air Knife.
Figure 60A:
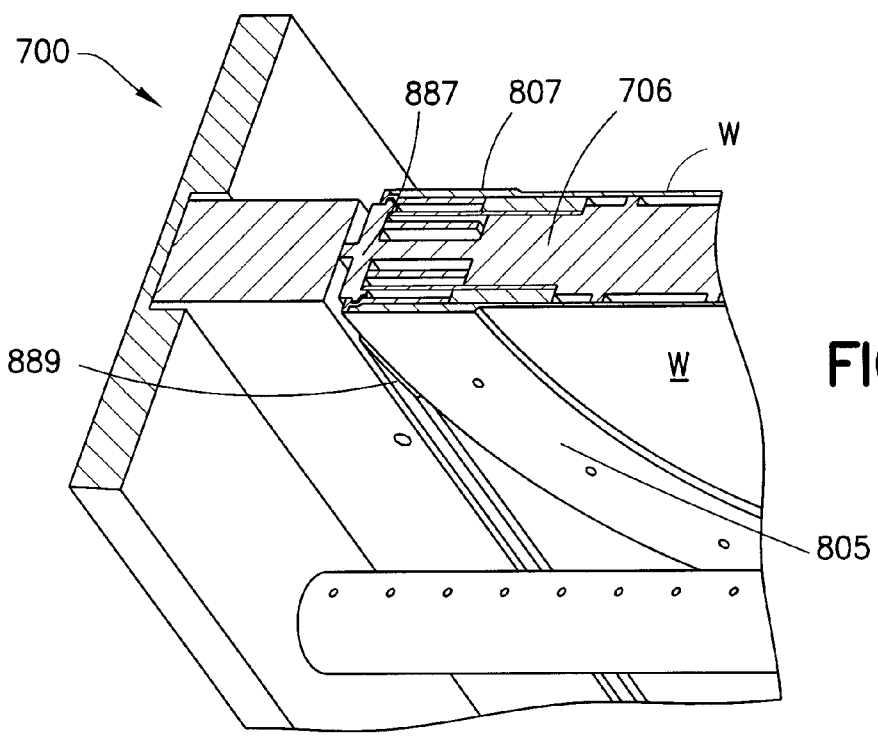
FIG. 60A is a section view of a holder and Marangoni dry module.
Figure 60B:
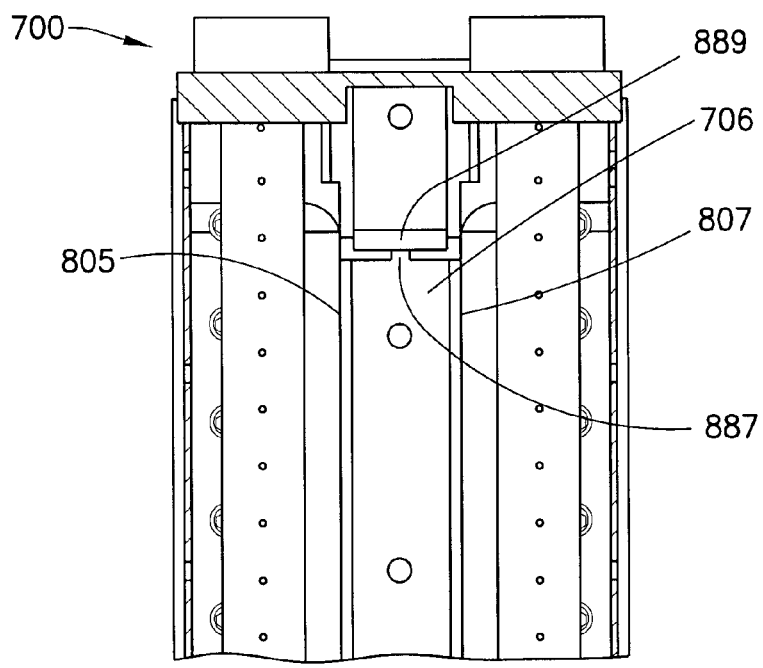
FIG. 60B is a section view of a holder and Marangoni dry module.
Figure 60C:
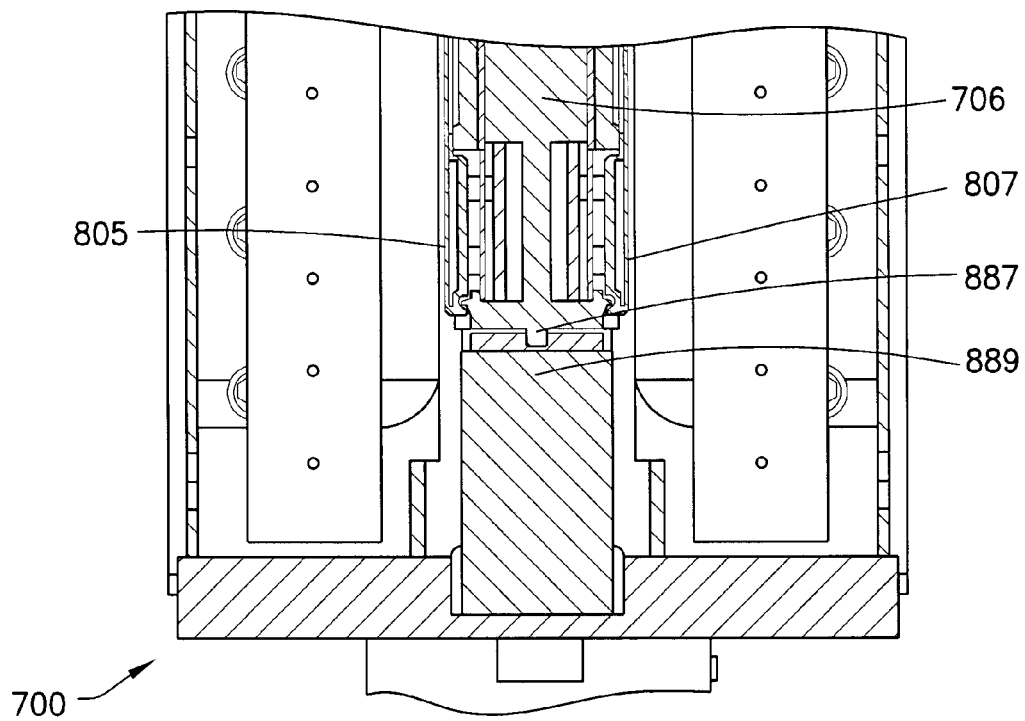
FIG. 60C is a section view of a holder and Marangoni dry module.

Referring now to FIG. 54, there is shown an isometric view of Marangoni dry module 700 suitable for use with holder 706. Referring also to FIG. 54, there is shown a cross section view of Marangoni dry module 700 suitable for use with holder 706. In the embodiment shown, holder 706 may support two wafers on opposite sides of holder 706 where the two wafers each only have a single external surface exposed to the DIW bath, for example, where two contact ring seals (CRS) are provided with holder 706 to seal against an external edge of the wafers and isolate the internal surfaces of the wafers as well as an internal portion of holder 706 from the DIW bath. Marangoni dry module 700 has LinMot vertical drive 710 with counterweight 712 that counterweights a driven cradle with holder to selectively raise and/or lower holder 706 at a desired selectable rate and motion profile. Marangoni dry module 700 has opposing IPA injector modules 716, 720; opposing N2 purge distribution modules 724, 726 and opposing air knife modules 730, 732. Bracket 736 may be provided for control valve(s). In the embodiment shown, the N2 purge manifolds are shown above the IPA injectors with Swagelok fitting on inlet and discharge of IPA injector. N2 purge manifold 724 is shown as a tube with holes 746 spaced uniformly apart. The tube is shown bolted to the side of container plate 748 via a mounting flange and is shown having a pipe threaded connection on one end. A male connector Swagelok fitting is shown for the IPA injector inlet 750 and exhaust 754. Here, the fitting may be installed after the IPA manifold is bolted to the container support plate. In alternate aspects of the disclosed embodiment, any suitable manifold geometry, fittings or connections or otherwise may be provided. N2 purge 724, 726 shown prevents oxidation during hand-off of wafers from the purged enclosed transport environment. Bottom plate 760 has (2) DIW/Solvent discharge holes 762, 764 and single hole 766 for DI water inlet for the DIW bath in Marangoni dry module 700 as will be further described. FIG. 54 shows Marangoni dry module 700 with holder 706 in a lowered position; however with lowering of counterweight 712 upon actuation of linear motors 710, holder 706 may be raised to a raised transfer position. FIG. 55 also shows dry module 700 with holder 706 in a lowered position. Bottom plate 760 is shown having inlet center tube 766 for DI water inlet, with side tubes 762, 764 for DI water drain. Outer container plates 780, 782 are sealed to bottom 760 and side plates 748, 768 for structural rigidity and to prevent drain DI water from leaking out of bottom plate 760. Inner container plates 784, 786 are sealed to bottom 760 and side plates 748, 768 and extend up to IPA injectors 716, 720 to isolate supply DIW from drain DIW. Air knifes 730, 732 are shown located above the IPA Injection manifolds 716, 720. Machine HDPE blocks 790, 792 are shown on the top plate 794 to guide wafer holder 706 in position. Referring also to FIG. 56A, there is shown an isometric view of IPA injector nozzle 720 having IPA input fitting 754 and IPA vapor exhaust fitting 754. Referring also to FIGS. 56B and 56C there are shown cross sections respectively of IPA injectors 716, 720 and air knifes 730 and 732 where both the IPA injection manifolds and air knifes clear wafer holder 706 and CRS 805, 807 respectively. Referring also to FIG. 57A, there is shown an isometric partial section view of bottom plate 760 in module 700. Here, the DI water inlet is shown as a plate 813 with a series of evenly spaced holes coupled to bottom plate 760. Referring also to FIG. 57B, there is shown an isometric view of plate 784 with studs 871 for coupling plate 784 to IPA injector nozzle 720. Referring also to FIG. 58, there is shown a section view of IPA injector nozzles 716, 720 with holder 706 in a lowered position. IPA injector nozzle 720 has top-section 841, mid-section 843 and lower-Section 844 and provides a similar concept of using a primary manifold surface and secondary slots to spread the incoming or outgoing fluid or gas flow for three flows: (1) forced incoming N2/IPA 851 and passive air flow 853; (2) outgoing N2/air 855; (3) DIW 856 overflowing the weir and into an array of holes 859 in lower section 845. The 3 sections 841, 843, 845 may be held together by screws 861 inserted from the top allowing bottom-section 845 to be bolted onto the weir-wall and leveled with full view of the fluid flow over the weir 865. Sections 841, 843 may then be bolted down to define the N2/IPA flow gap and the exhaust cavity. Top to Mid sections 841, 843 may be aligned in Y by a 0.04" wide linear boss/slot combination or otherwise with the Mid to Lower sections 843, 845 aligned by the bolt shafts and the flat or otherwise. Top to Mid alignment defines a gap, such as a 0.01+−0.02" wide air-gap. Inner fluid containment between inner weir plate 784 and IPA injector 720 is made continuous, or acceptably fluid tight, with the Injector assembly 720 using stud-welded threaded studs 871 on the Weir-Plate 784 to which Injector 720 is bolted and pulling the Injector tight against the Weir-Plate to make a reasonably leak tight fluid seal. Adjustment capability may be provided: (1) Theta-Y: (i.e. making the weir perpendicular to plumb-line so fluid flow thickness is uniform; which means parallel to the Top-Plate attach surfaces, may be accomplished by loose fit on the studs to their holes; (2) Z and X positions: (i.e. making left and right identical) same as Theta-Y; (3) Y offset from WH using shim plate or otherwise; (4) Theta-Z and Theta-X: no adjustment, these may be set by the weldment of the Weir-Plate. In alternate aspects of the disclosed embodiment, more or less adjustment may be provided. In the embodiment shown, a fluid vessel may be made by clamping the Injector-assembly 720 against the Weir-Plate 784 which may be welded into the frame. Referring now to FIG. 59, there is show a cross section of N2 air knife portion showing clearance between CRS 805, 807. Air knife 732 has upper portion 875 bolted 879 to lower portion 877 where a gap 881 between opposing surfaces of upper portion 875 and lower portion 877 forms a fluid jet across the surface of a substrate from N2 pressure source 883. Referring now to FIGS. 60A-C there are shown section views of holder 706 having two wafers W in Marangoni dryer module 700. Holder 706 has locating feature linear protrusion 887 that mates with guiding feature 889 in the module frame. Here, guiding feature may also include a lead in profile as shown in FIG. 60A. In alternate aspects of the disclosed embodiment, more or less features may be provided.

Figure 61C:
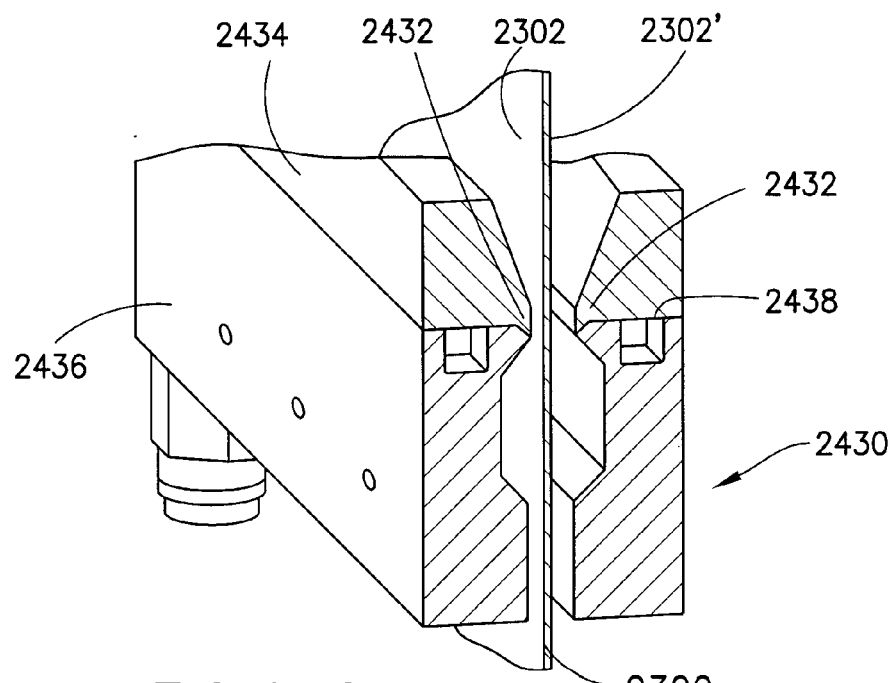
FIG. 61C is a isometric view of a linear nozzle.
Figure 61B:
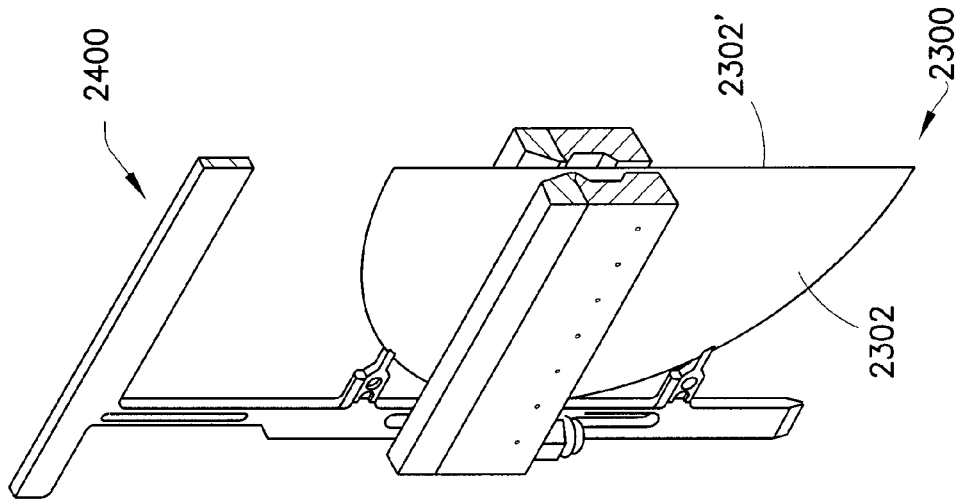
FIG. 61B is a isometric view of a linear nozzle.
Figure 61A:
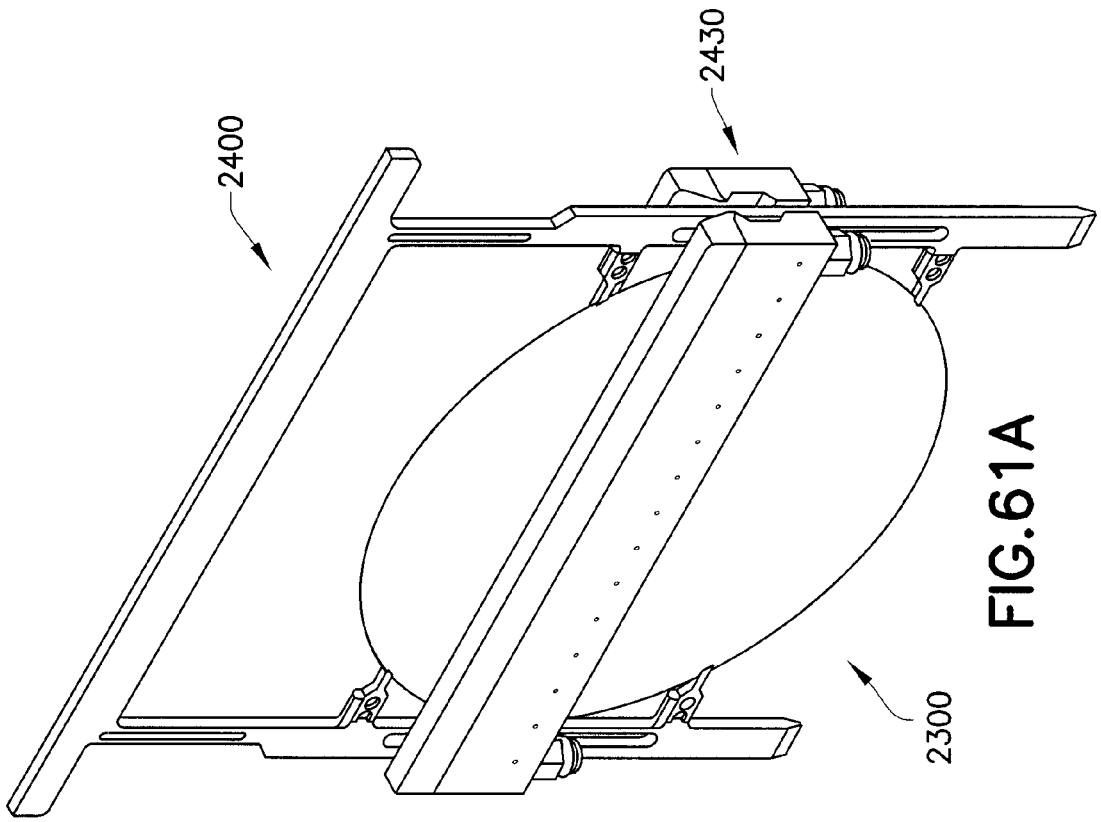
FIG. 61A is a isometric view of a linear nozzle.

Referring now to FIG. 61A, there is shown a view of wafer holder 2400 and linear nozzle 2430. Referring also to FIG. 61B, there is shown a view of wafer holder 2400 and linear nozzle 2430. Referring also to FIG. 61C, there is shown a view of wafer 2300 and linear nozzle 2430. In the embodiment shown, linear nozzle 2430 provides uniform gas flow to one or more wafer surface(s) 2302, 2302'. One embodiment may have a vertical process tool that may include a process module that provides uniform, and possibly high velocity, gas flow impingement on the wafer surface. This embodiment may be used for example with nitrogen gas flow for drying a wafer, a so called "air knife" configuration. Alternately, this embodiment may be used for applying dilute gas borne coatings to a wafer surface prior to electro deposition. The flexure wafer-holder and process module alignment elements of the disclosed embodiment provide capability to position a linear nozzle close to the wafer surface as disclosed below. In alternate aspects of the disclosed embodiment, the linear nozzle and precision alignment technique disclosed may be used with a sealed wafer holder for electroplating applications, for example, as described in U.S. Pat. No. 7,445,697, U.S. Pat. No. 7,722,747, U.S. Pat. No. 7,727,336, all of which are hereby incorporated by reference herein in their entirety. In the embodiment shown, a wafer holder 2400 is positioned relative to a linear nozzle 2430 by a process module alignment guide (not shown) that also moves the linear nozzle 2430 relative to the wafer holder 2400 (or the wafer holder relative to the nozzle) so that the gas jet emitted from nozzle 2430 is moved from bottom to top covering and past the wafer surface(s) 2302, 2302'. FIG. 61C shows a close-up cross section of the linear nozzle portion 2430 near the wafer surface. In the embodiment shown, an approximately 0.25 mm thick linear gap 2432, 2432' angled at about 30 degrees is provided relative to the wafer surface 2302, 2302' respectively, and positioned about 1 mm from the wafer frontside surface and ejects the gas at high velocity toward the wafer surface 2302, thereby impinging on the surface with sufficient energy to displace most fluid so that a thin remaining layer of fluid then quickly dries by evaporation. In alternate aspects of the disclosed embodiment, other suitable geometries may be provided. In alternate aspects of the disclosed embodiment, the uniform precision aligned linear gas jet may be used to apply gas borne material or otherwise onto the wafer surface. A second linear nozzle 2432' may be positioned about 5 mm from the wafer backside surface and also may cause drying of the backside surface and also avoids applying a significant net gas pressure that could disadvantageously deflect the wafer. In the disclosed embodiment, an exemplary linear nozzle construction is shown. Two fabricated pieces 2434, 2436 are bolted or epoxied together to form a sequence of primary and secondary manifolds that feed the narrow linear gap 2432 that defines the nozzle aperature as shown in FIGS. 61A-C. Separation blocks 2438 may be provided within the manifold to ensure uniform pressure and flow distribution.

Referring now to FIG. 62A, there is shown a wafer holder 2400 and a process module 2450. Referring also to FIG. 62B, there is shown a wafer holder 2400 and a process module 2450. Referring also to FIGS. 63A-C, there is shown a wafer holder 2400 and a process module 2450. In the embodiment shown, precision alignment of wafer 2300 with respect to fluid process element 2430 is provided where module 2450 uses guide wheels 2452 attached to the process module frame 2454, with the guide wheels 2452 engaging the lower sections of the wafer holder leg elements prior to the wafer approaching the fluid process element 2430. In the exemplary embodiment, FIG. 62 shows wafer holder 2400 with wafer 2300 prior to engaging the linear nozzle process element 2430 where FIG. 62B shows wafer holder 2400 that has been passed through the linear nozzle 2430. Further, FIGS. 63A-C show progressively where wafer holder 2400 is moved into position and guided on opposing sides by the arrays of guide wheels 2452 and vertically during the process, by system automation components which by way of example may be linear motor modules, transporter 280 or other suitable apparatus (not shown). In the embodiment shown, wafer holder 2400 is engaged by guide wheels 2452 prior to the wafer 2300 coming into proximity with the linear nozzle 2430, thereby avoiding risk of touching the wafer 2300 to the linear nozzle 2430 and causing damage to the wafer surface while attaining the feature of close spacing of the linear nozzle 2430 to the wafer 2300 during the processing phase of the vertical motion. Here, wheels 2452 attached to the process frame 2454 guide the wafer holder 2400 into final position before the wafer 2300 enters the tight gap 2456 of the linear nozzle 2430. Alternately or in conjunction with the disclosed embodiment, process frame guidance elements may be used in other embodiments, such as in SHEAR PLATE fluid immersion and agitation, Marangoni-Dry, and scanning nozzle array, where this guidance aspect may also be applicable to a batch of wafer holder's, such as the six wafer holder batch previously described, for example, in a photoresist strip system or otherwise. With respect to a batch application, single guidance elements may be provided for the individual holders within the batch or alternately less guidance elements may be provided.

Figure 65C:
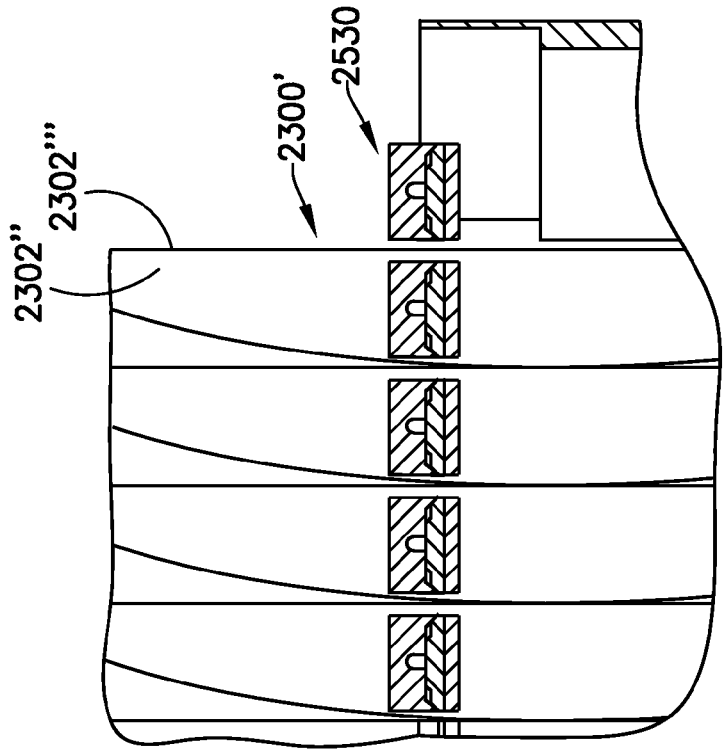
FIG. 65C is a section view of an array of wafer holders and a process module.
Figure 65B:
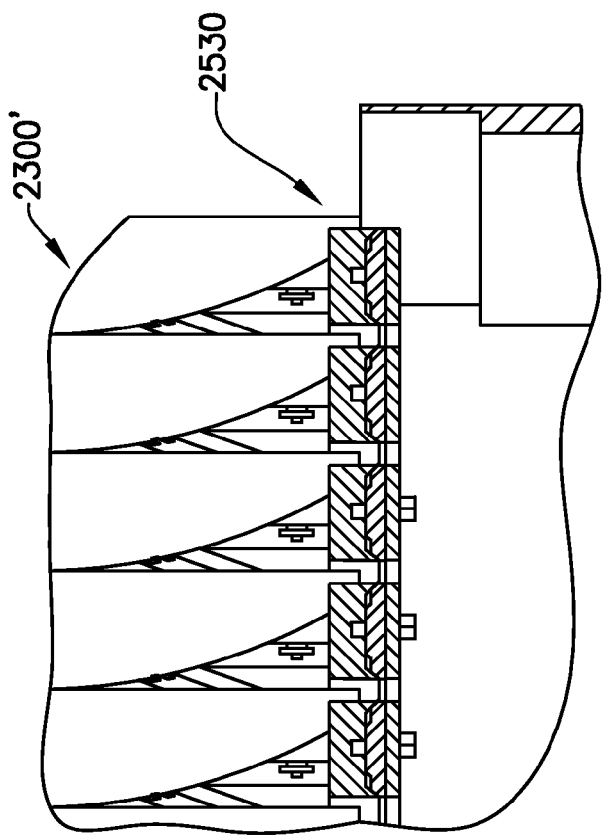
FIG. 65B is a section view of an array of wafer holders and a process module.
Figure 65D:
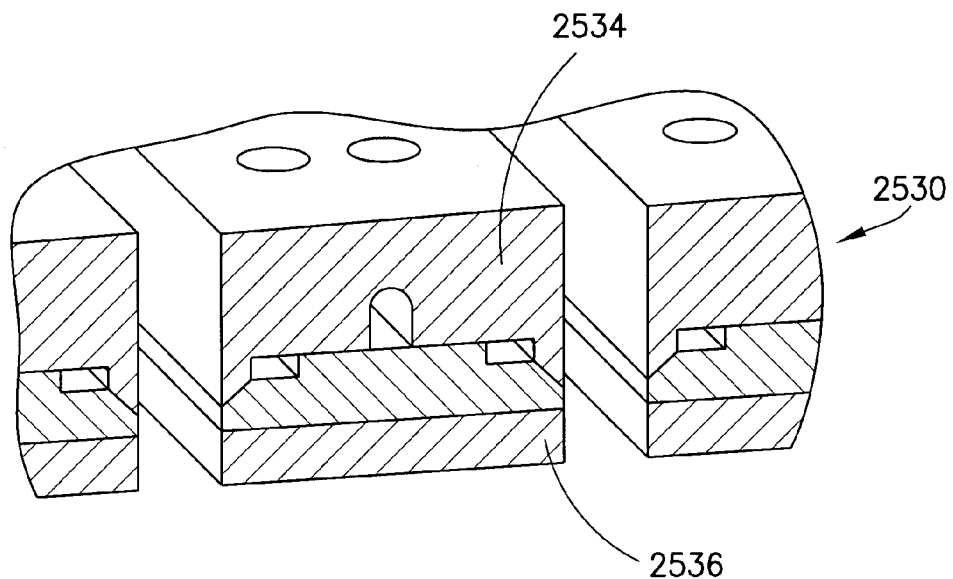
FIG. 65D is a section view of a nozzle manifold.
Figure 65E:
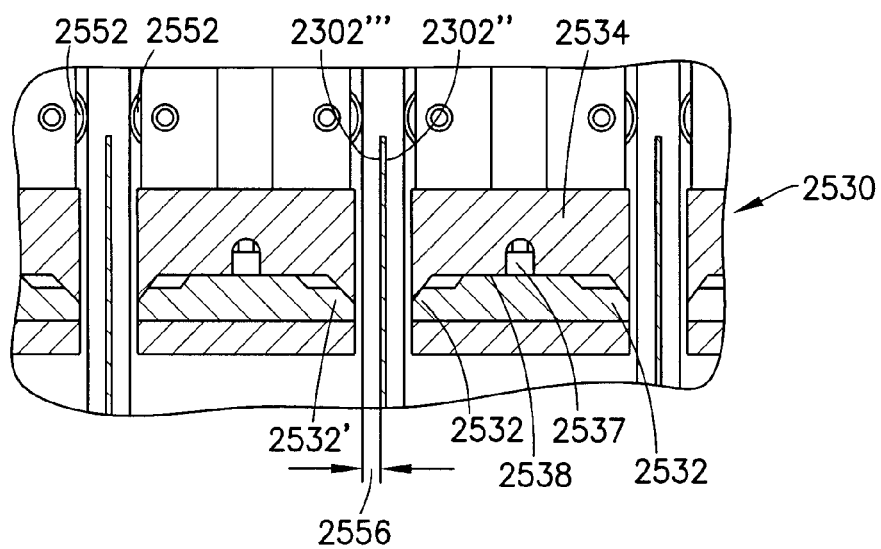
FIG. 65E is a section view of an array of wafer holders and a process module.

Referring now to FIG. 64, there is shown a view of wafer holder array 2500 and linear nozzle array 2530 in process module 2545. Referring also to FIG. 65A, there is shown a view of wafer holder array 2500 and linear nozzle array 2530. Referring also to FIG. 65B, there is shown a view of wafer array 2300' being extracted or inserted into linear nozzle array 2530. Referring also to FIG. 65C, there is shown a view of wafer array 2300' being passed by linear nozzle array 2530. In the embodiment shown, linear nozzle 2530 provides uniform gas flow to one or more wafer surface(s) 2302", 2302'". One embodiment may have a vertical process tool that may include a process module that provides uniform, and possibly high velocity, gas flow impingement on the wafer surface. This embodiment may be used for example with nitrogen gas flow for drying a wafer, a so called "air knife" configuration. Alternately, this embodiment may be used for applying dilute gas borne coatings to a wafer surface prior to electro deposition. The flexure wafer-holder and process module alignment elements of the disclosed embodiment provides capability to position a linear nozzle close to the wafer surface. In alternate aspects of the disclosed embodiment, the linear nozzle and precision alignment technique disclosed may be used with a sealed wafer holder for electroplating applications, for example, as described in U.S. Pat. No. 7,445,697, U.S. Pat. No. 7,722,747, U.S. Pat. No. 7,727,336, all of which are hereby incorporated by reference herein in their entirety. In the embodiment shown, each holder in a wafer holder array 2500 is positioned relative to each linear nozzle in a linear nozzle 2530 by a process module alignment guide (not shown) that also moves the linear nozzle 2530 relative to the wafer holder 2400 (or the wafer holder array relative to the nozzle array) so that the gas jet emitted from nozzle 2530 is moved from bottom to top covering and past the wafer surface(s) 2302", 2302"'. FIGS. 65D and 65E show a close-up cross section of the linear nozzle portion 2530 near the wafer surface. In the embodiment shown, an approximately 0.25 mm thick linear gap 2532, 2532' angled at about 45 degrees is provided relative to the wafer surface 2302", 2302"' respectively, and positioned about 1-4 mm from the wafer surfaces and ejects the gas at high velocity toward the wafer surfaces, thereby impinging on the surface with sufficient energy to displace most fluid so that a thin remaining layer of fluid then quickly dries by evaporation. In alternate aspects of the disclosed embodiment, other suitable geometries may be provided. In alternate aspects of the disclosed embodiment, the uniform precision aligned linear gas jet may be used to apply gas borne material or otherwise onto the wafer surface. A second linear nozzle 2532' may be positioned about 5 mm from the wafer backside surface and also may cause drying of the backside surface and also avoids applying a significant net gas pressure that could disadvantageously deflect the wafer. In the disclosed embodiment, an exemplary linear nozzle construction is shown. Two fabricated pieces 2534, 2536 are bolted or epoxied together to form a sequence of primary and secondary manifolds 2537 that feed the narrow linear gap 2532 that defines the nozzle aperature. Separation blocks 2538 may be provided within the manifold to ensure uniform pressure and flow distribution. In the embodiment shown, precision alignment of the array of wafers 2300' with respect to fluid process element 2530 is provided where module 2545 uses guide wheels 2552 attached to the process module frame 2554, with the guide wheels 2552 engaging the lower sections of the wafer holder leg elements prior to the wafer approaching the fluid process element 2530. In the embodiment shown, wafer holder 2500 is engaged by guide wheels 2552 prior to the wafer 2300' coming into proximity with the linear nozzle array 2530, thereby avoiding risk of touching the wafer 2300 to the linear nozzle 2530 and causing damage to the wafer surface while attaining the feature of close spacing of the linear nozzle array 2530 to the wafer array 2300' during the processing phase of the vertical motion. Here, wheels 2552 attached to the process frame 2554 guide each of the holders in the wafer holder array 2500 into final position before each wafer in the wafer array 2300' enters the tight gap 2556 of the linear nozzle array 2530. Alternately or in conjunction with the disclosed embodiment, process frame guidance elements may be used in other embodiments, such as in SHEAR PLATE fluid immersion and agitation, Marangoni-Dry, and scanning nozzle array, where this guidance aspect may also be applicable to a batch of wafer holder's, such as the six wafer holder batch previously described, for example, in a photoresist strip system or otherwise. With respect to a batch application, single guidance elements may be provided for the individual holders within the batch or alternately less guidance elements may be provided.

Figure 66:
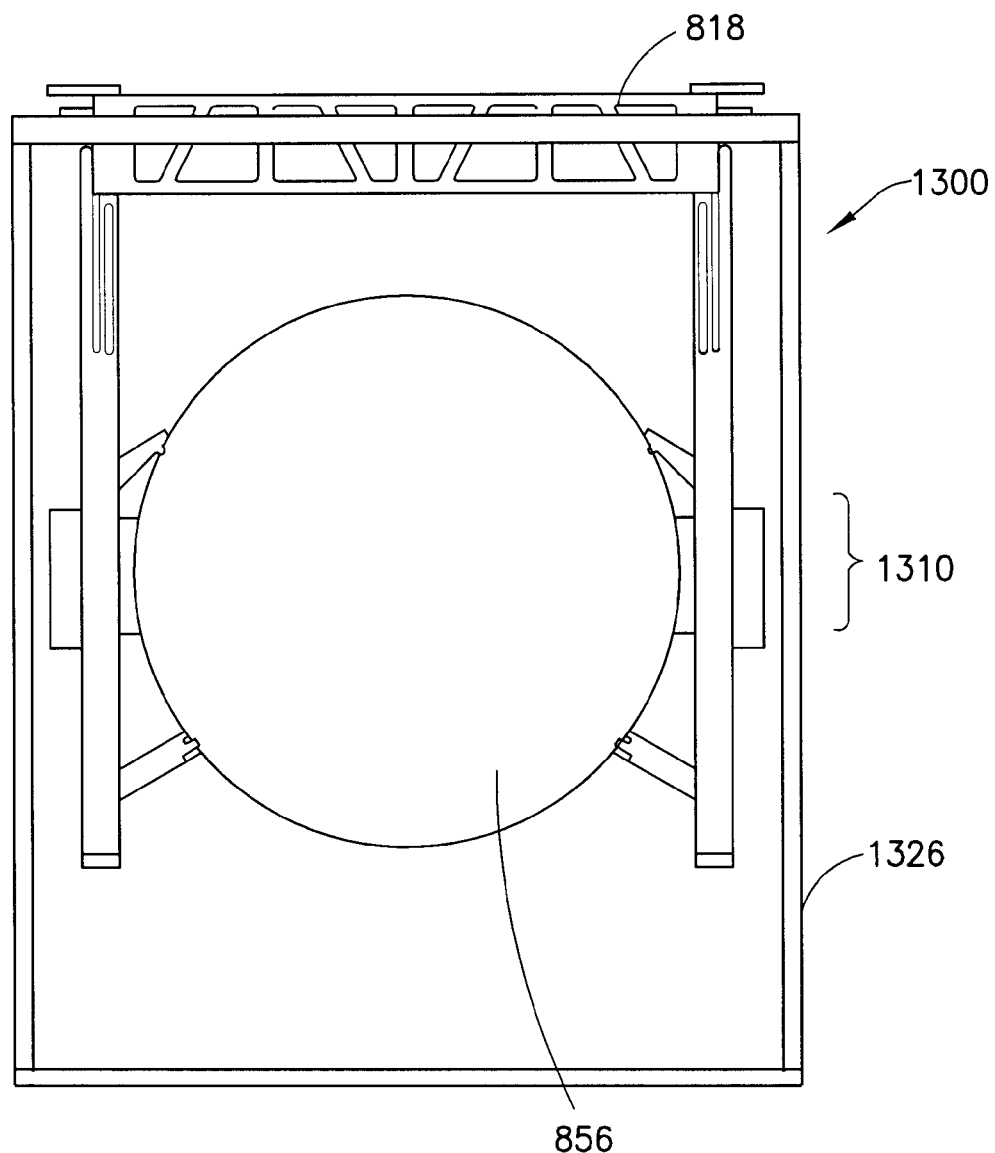
FIG. 66 shows a side view of a fluid jet parallel single wafer process module.
Figure 67:
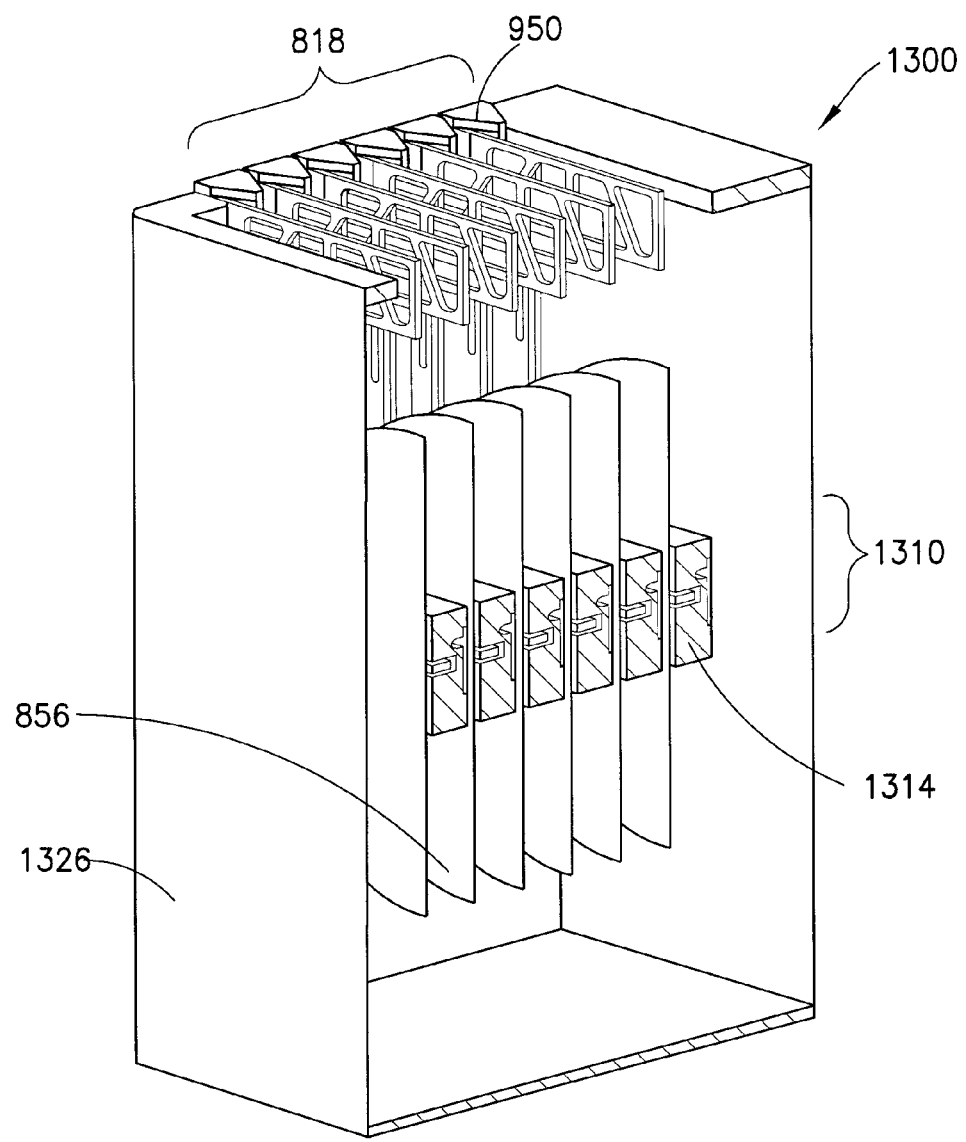
FIG. 67 shows an isometric partial section view of a fluid jet parallel single wafer process module.
Figure 68C:
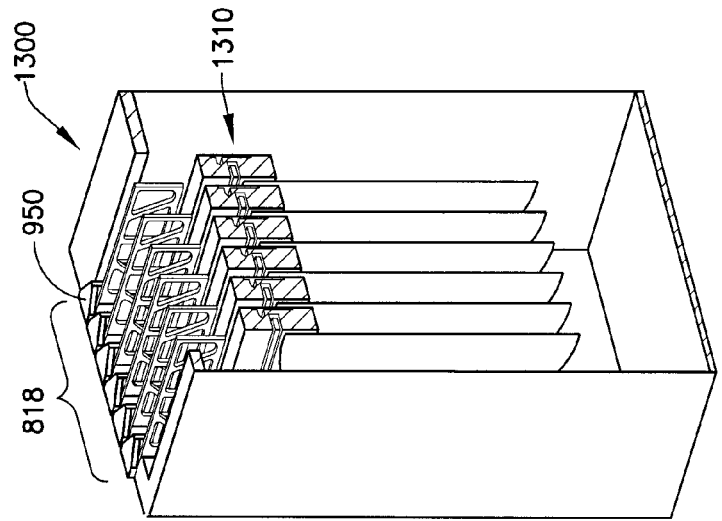
FIG. 68C shows an isometric partial section view of a fluid jet parallel single wafer process module.
Figure 68B:
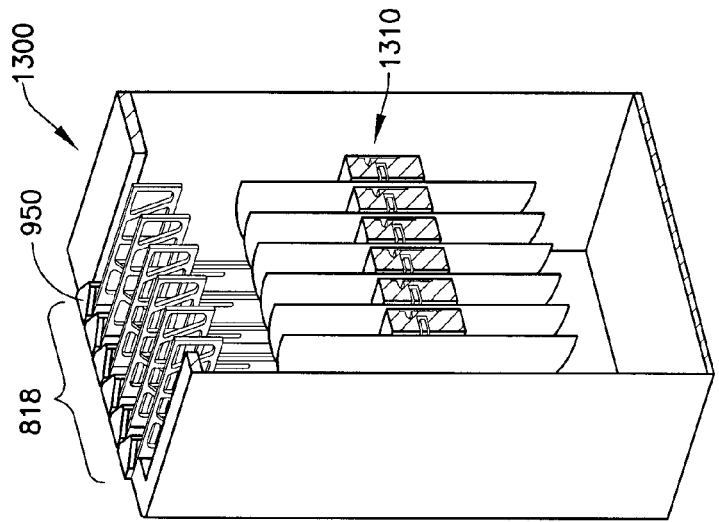
FIG. 68B shows an isometric partial section view of a fluid jet parallel single wafer process module.
Figure 68A:
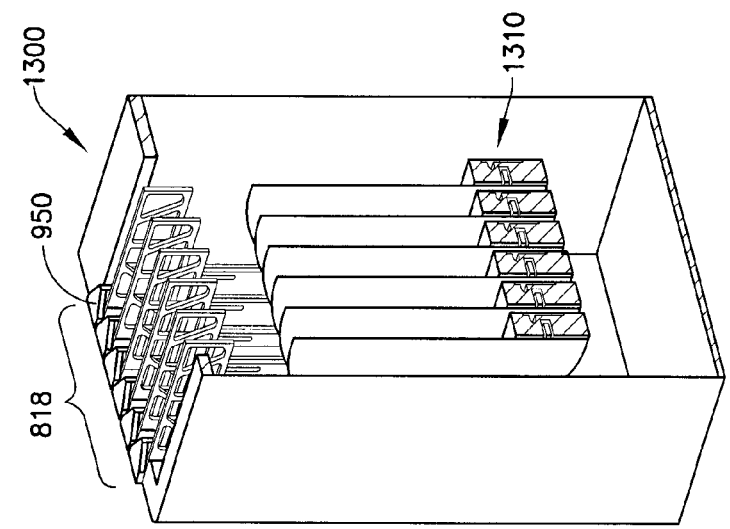
FIG. 68A shows an isometric partial section view of a fluid jet parallel single wafer process module.
Figure 70:
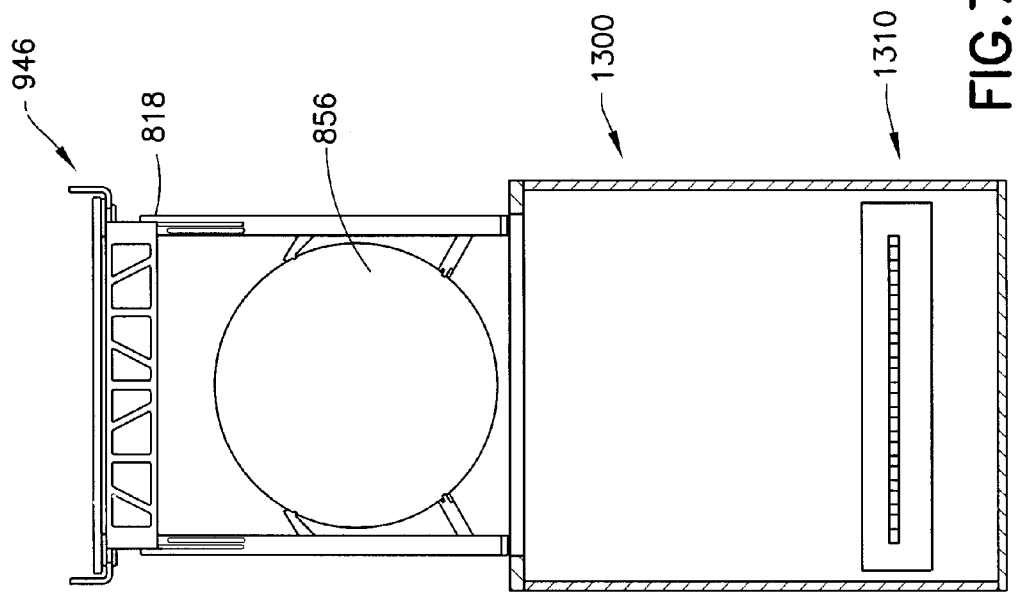
FIG. 70 shows a side view of a fluid jet parallel single wafer process module.
Figure 69:
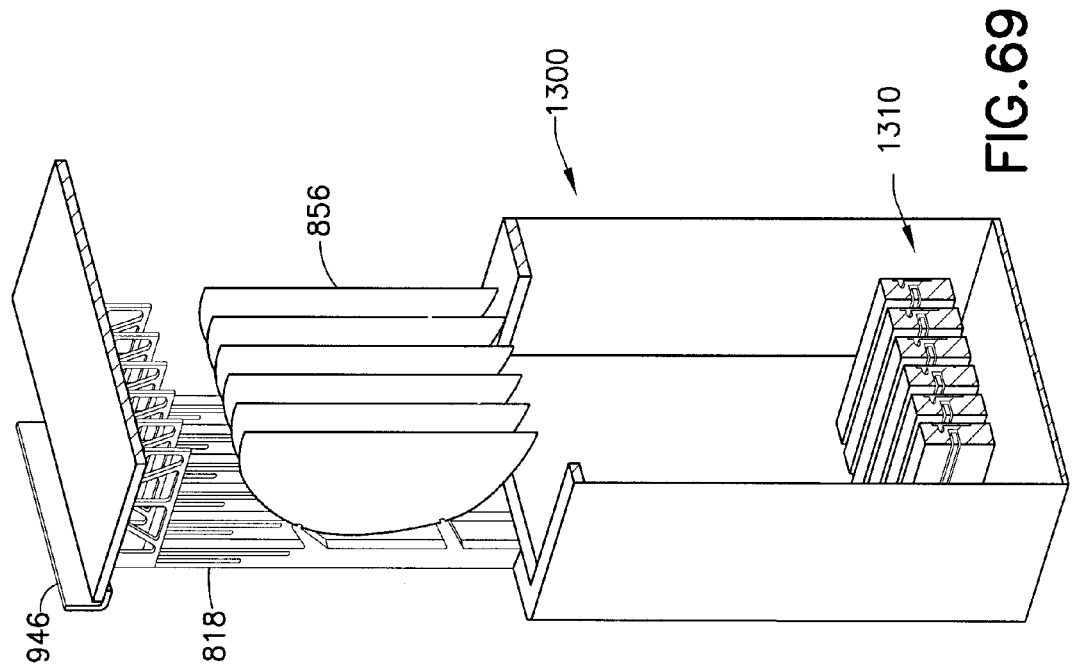
FIG. 69 shows an isometric partial section view of a fluid jet parallel single wafer process module.
Figure 71:
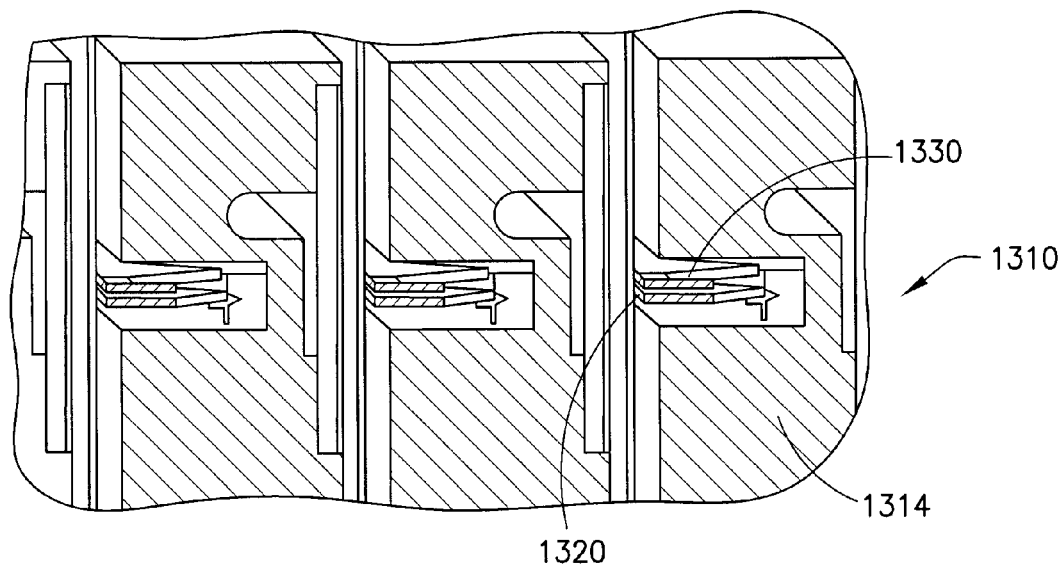
FIG. 71 shows an isometric partial section view of a fluid jet nozzle array.
Figure 72:
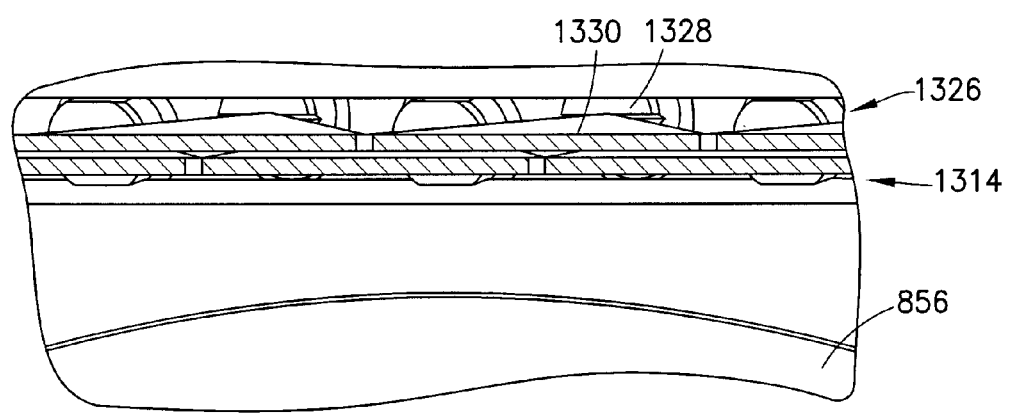
FIG. 72 shows an isometric view of a fluid jet nozzle array.
Figures 73A, 73B, 73C:
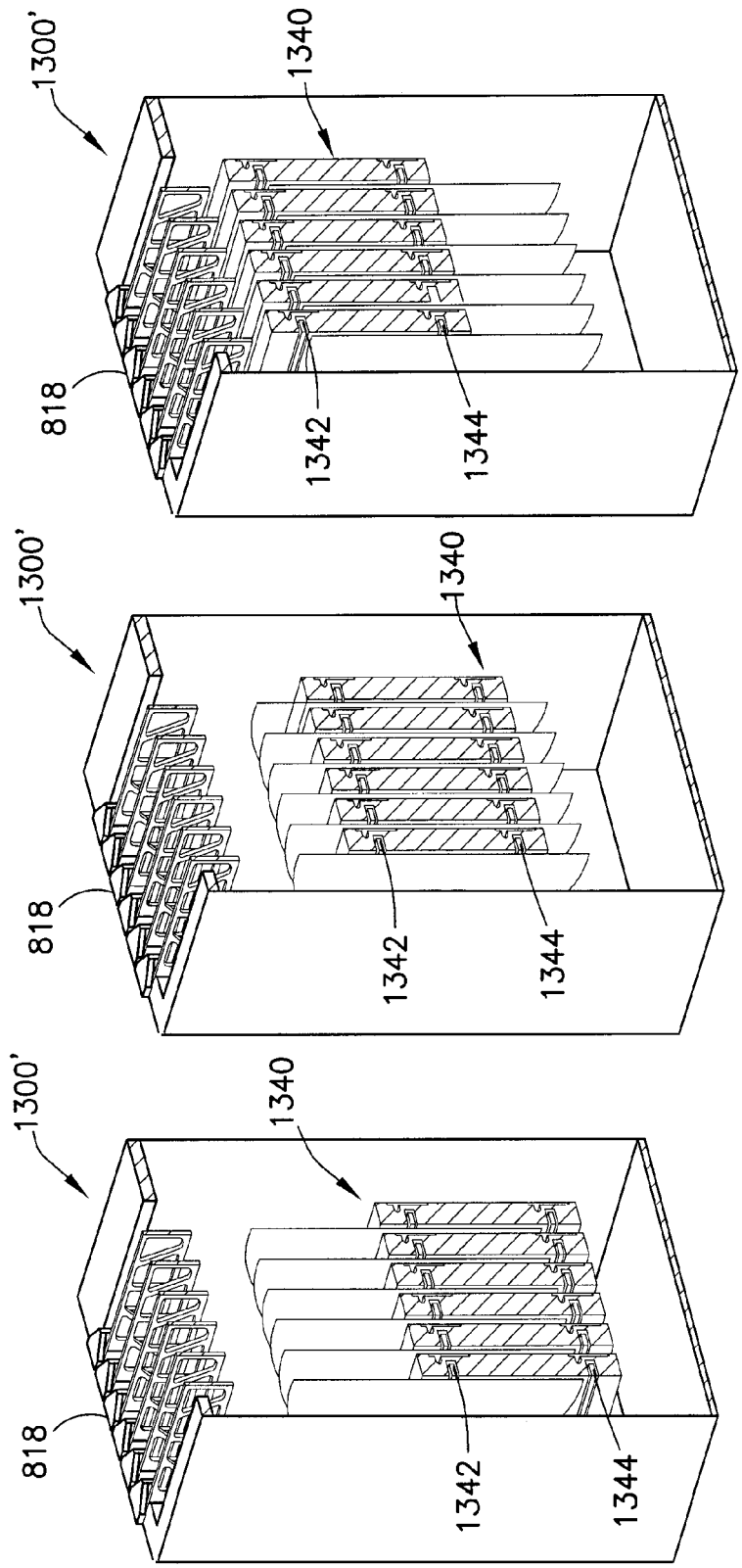
FIG. 73A shows an isometric partial section view of a fluid jet parallel single wafer process module.
FIG. 73B shows an isometric partial section view of a fluid jet parallel single wafer process module.
FIG. 73C shows an isometric partial section view of a fluid jet parallel single wafer process module.

Referring now to FIG. 66 there is shown a side view of fluid jet parallel single wafer process module 1300. Here, fluid process module 1300 may process a plurality of substrate holders in parallel where module 1300 has a plurality of linear jet nozzles corresponding to the plurality of substrate holders in a fluid processing tank and with each of the plurality of substrate holders aligned and positioned with respect to the corresponding one of the each of the plurality of linear jet nozzles independent of the other substrate holders. Fluid jets may impart fluid at high velocity to a wafer surface. Fluid-jets, i.e. fluid sprayed at high velocity through a confined gap or nozzle, causes fluid to impinge on the wafer surface with considerable velocity which may be used to overcome surface tension and wet the wafer surface or to dislodge and carry away unwanted particles or debris from microscale features on the wafer surface. Where the wafer to fluid-jet interface is surrounded by a gas such as air or nitrogen, the energy in the fluid stream is available to overcome surface tension and wetting forces. A fluid-jet assembly that is immersed in the ambient fluid may also be used to improve mixing at the wafer surface but most of its energy may be absorbed by the surrounding ambient fluid. While Shear-Plate fluid agitation is useful for thinning the fluid boundary layer in front of a wafer surface that is immersed in fluid, thereby increasing the transport rate through the boundary layer of reactants to the wafer surface and reaction by products away from the wafer surface, it does not substantially use fluid energy to overcome wetting resistance or advantageously dislodge particles on a wafer surface. Parallel Single Wafer (PSW) fluid-jet processing utilizing module 1300 has an array 1310 of fluid-jets 1314 that are closely spaced and precisely aligned to the wafer 856 surface thereby providing efficient fluid energy transfer for process effectiveness and repeatability. An array 1310, or several arrays, of fluid jets may be provided to simultaneously processing each wafer surface within holder array 818 providing for high productivity. In module 1300, vertical orientation causes fluid to drain away from the jet to wafer line of impingement 1320, thereby ensuring that fluid energy is not wasted by impinging on a layer of fluid, for example, as would occur in a substantially horizontal orientation. In module 1300, an array of wafers may be processed simultaneously in a single process module, thereby providing economic benefit of shared fluid pumping, fluid containment and other fluid processing system elements as well as the economic benefit of using a single motion of automation sub-system for transporting multiple wafers into and out of the process module. Referring also to FIG. 67, there is shown an isometric partial section view of a fluid jet parallel single wafer process module 1300. FIG. 66 shows a front view with the front wall of the fluid containment vessel 1326 removed whereas FIG. 67 shows a cross section through the fluid-jet process module 1300. Wafers 856 are held by Wafer-Holders 950 that have been delivered to the fluid-jet process unit 1300 as an array 818. An array of fluid jet nozzle arrays 1310 is positioned precisely with respect to the WH-Array and is scanned vertically up and down as will be shown in greater detail below. Tank element 1326 may contain the fluid as it drips downward off the wafer surfaces and returns the fluid to a pumping and filtration system which pumps the fluid back into the nozzle array. Referring also to FIGS. 68A-C, there is shown isometric partial section views of fluid jet parallel single wafer process module 1300. FIGS. 68A-C show fluid-jet module 1300 cross sections that depict the Nozzle-Array 1310 scanning from the bottom (FIG. 68A) to the top (FIG. 68C) of the wafers 856. On each end of the scan the array typically moves to an "over-scan" position that is slightly beyond the edge of the wafer, thereby ensuring full coverage of fluid-jet processing to the wafer surface. Conventional scanning of the Nozzle-Array in the vertical direction may be used, for example a set of four linear motors operating in synchrony, each disposed on one of the four corners of the rectangular array; a suitable manufacturer is LinMot from Elkhorn Wis. Suitable guidance, for example by guide wheels or otherwise may be used to accurately position each independent holder 950 with respect to its respective nozzle 1314. Referring also to FIG. 69, there is shown an isometric partial section view of a fluid jet parallel single wafer process module 1300 with WH-Array 818 being inserted into the Fluid-Jet-Module 1300. Referring also to FIG. 70, there is shown a side view of a fluid jet parallel single wafer process module 1300 with WH-Array 818 being inserted into the Fluid-Jet-Module 1300. In the embodiment shown, WH-Array 818 is held by an element 946 of the system automation where the Transporter, which supports the weight of the WH-Array 818 and aligns it relative to features on the Fluid-Jet-Module 1300 that serve to guide the WH's into precise position with respect to the Nozzle-Array 1310. As the Transporter releases the WH's 950 each of the WH elements 950 is free to come into alignment with their respective Nozzle-Manifold 1314 in the Nozzle-Array 1320 and be independently positioned with respect to each corresponding nozzle 1314. Referring also to FIG. 71, there is shown an isometric partial section view of a fluid jet nozzle array 1310. Referring also to FIG. 72, there is shown an isometric view of a fluid jet nozzle array 1326 within nozzle 1314. FIGS. 71 and 72 show a close-up cross section view of the region in which the fluid-jets impinge upon the wafer. Here, Wafer 856 is held by the WH 950 which is precisely aligned to the nozzle manifolds 1314. Individual nozzles 1328 may be commercially available, for example from Lechler Inc., or may be custom made. Processing fluid 1330, for example de-ionized water, solvent, or etchant, is pumped into the nozzle manifold 1314 and distributes along the manifold cavity and enters each individual nozzle 1328 to emerge as a high velocity fluid jet 1330. Depicted in the figures is a commercial nozzle which emits a jet in a V-shaped fan pattern. Alternately, any suitable pattern may be used. FIG. 72 shows the horizontal array of nozzles 1326 in one nozzle-manifold 1314 positioned above the top edge of a wafer 856, i.e. in the "over-scan" position. As shown, two parallel arrays of nozzles 1328, positioned apart vertically by several millimeters, and alternating laterally, so that the fluid-jet streams emanating from each nozzle do not interfere and substantially impinge on the wafer surface prior to intercepting streams from other nozzles may be provided. Referring also to FIGS. 73A-C, there are shown isometric partial section views of an alternate embodiment fluid jet parallel single wafer process module 1300'. Module 1300' use a plurality 1340 of horizontal nozzle arrays 1342, 1344 vertically separated so that a smaller vertical scan distance is required to fully cover the wafer surface, shown in FIGS. 73A-C the bottom, middle, and top scanning positions respectively for a configuration with two nozzle arrays for each wafer. In alternate aspects of the disclosed embodiment, any suitable combination may be provided.

In accordance with another aspect of the disclosed embodiment, a system 2545 for fluid processing one or more substrate surfaces arrayed in a fluid is provided. The system has a process module or section with a frame and a plurality of fluid jet elements 2530 to inject a fluid at the substrate surfaces without contacting the substrate surfaces. A substrate holder assembly 2500 has a holder frame 946 and a number of substrate holders, each of which is coupled to the holder frame and configured to hold a substrate so that a different substrate is held by each substrate holder of the substrate holder assembly for transport therewith as a unit to and from the process module. The substrate holder assembly 2500 and each substrate holder of the substrate holder assembly is removably coupled to the process module frame and, when coupled to the process module frame, each substrate holder is independently moveable and positionable relative to the other substrate holders of the substrate holder assembly. The plurality of fluid jet elements 2530 are moveable as a group relative to the substrate holder assembly. The surfaces of the substrates are in a substantially vertical orientation. The process module frame may be a fluid tank. Each of the number of substrate holders is removably coupled to the holder frame. The substrate holder assembly 2500 is removable from the process module frame as a unit. Each substrate holder in the substrate holder assembly is removable from the process module frame independent of the other holders in the substrate holder assembly. Substrate holder assembly has a number of substrate holders and is configured for transporting one or more substrates as a unit between the process section and another location, the substrate holder assembly and each of the substrate holders being configured for removable coupling to the process section frame, each substrate holder in the substrate holder assembly being configured to hold at least one of the substrates. The process section frame has alignment features 2552 disposed so that, on coupling of the substrate holder assembly with the process section frame, the alignment features interface with each substrate holder of the substrate holder assembly and locate each substrate holder in repeatable alignment, at corresponding coupling of each substrate holder and the process section frame, with respect to the fluid jet elements of the process section. The substrate holder assembly has a number of substrate holders and configured for batch transport of substrates as a unit, the substrate holder assembly and each of the substrate holders being configured for removable coupling to the module frame, each substrate holder in the substrate holder assembly being configured to hold a substrate. The module frame has insertion guides 2552 and each substrate holder has mating guides depending from each substrate holder and corresponding to the insertion guides. The insertion guides and mating guides being configured so that, on coupling of the substrate holder and the module frame, the insertion guides receive the corresponding mating guides of each substrate holder aligning each substrate holder of the substrate holder assembly in repeatable alignment with respect to a corresponding fluid jet element in the plurality of fluid jet elements 2530.

In accordance with one aspect of the disclosed embodiment, a system for fluid processing one or more substrate surfaces arrayed in a fluid is provided, the system has a process section with a frame having a plurality of process elements to process the substrate surfaces without contacting the substrate surfaces; and a substrate holder assembly having a number of substrate holders and configured for transporting one or more substrates as a unit between the process section and another location, the substrate holder assembly and each of the substrate holders being configured for removable coupling to the process section frame, each substrate holder in the substrate holder assembly being configured to hold at least one of the substrates; the process section frame having alignment features disposed so that, on coupling of the substrate holder assembly with the process section frame, the alignment features interface with each substrate holder of the substrate holder assembly and locate each substrate holder in repeatable alignment, at corresponding coupling of each substrate holder and the process section frame, with respect to a predetermined feature of the process section.

In accordance with another aspect of the disclosed embodiment, the predetermined features comprises each of the process elements with each of the process elements in the plurality of process elements being located between the substrates.

In accordance with another aspect of the disclosed embodiment, the alignment feature comprises vertical guides aligning each of the substrate holders in the substrate holder assembly in repeatable alignment with respect to a corresponding process element in the plurality of process elements, wherein each of the substrate holders in the substrate holder assembly has integral positioning features that cooperate with mating features of each of the vertical guides.

In accordance with another aspect of the disclosed embodiment, the holder assembly comprises the number of substrate holders coupled to a frame, wherein the frame comprises an end effector coupled to a transporter and wherein the transporter is configured to move the substrate holder assembly to and from the process module, and wherein the transporter is configured to move a different substrate holder assembly with the holder frame to and from the process module.

In accordance with another aspect of the disclosed embodiment, each of the substrate holders in the substrate holder assembly is independently moveable and positionable relative to the other substrate holders in the substrate holder assembly.

In accordance with another aspect of the disclosed embodiment, each of the substrate holders in the substrate holder assembly is in repeatable alignment with respect to the predetermined feature of the process section independent of the other substrate holders in the substrate holder assembly.

In accordance with another aspect of the disclosed embodiment, each of the substrate holders in the substrate holder assembly is in repeatable alignment with respect to a corresponding process element in the plurality of process elements and independent of the other process elements in the plurality of process elements.

In accordance with another aspect of the disclosed embodiment, a system for fluid processing one or more substrate surfaces arrayed in a fluid is provided, the system having a process apparatus having a module with a frame and a plurality of process elements to fluid process the substrate surfaces without contacting the substrate surfaces; and a substrate holder assembly having a number of substrate holders and configured for batch transport of substrates as a unit, the substrate holder assembly and each of the substrate holders being configured for removable coupling to the module frame, each substrate holder in the substrate holder assembly being configured to hold a substrate; wherein, the module frame has insertion guides and each substrate holder has mating guides depending from each substrate holder and corresponding to the insertion guides, the insertion guides and mating guides being configured so that, on coupling of the substrate holder and the module frame, the insertion guides receive the corresponding mating guides of each substrate holder aligning each substrate holder of the substrate holder assembly in repeatable alignment with respect to a corresponding process element in the plurality of process elements.

In accordance with another aspect of the disclosed embodiment, the insertion guides comprises vertical guides aligning each of the substrate holders in the substrate holder assembly in repeatable alignment with respect to the corresponding process element in the plurality of process elements.

In accordance with another aspect of the disclosed embodiment, the holder assembly comprises the number of substrate holders coupled to a frame, wherein the frame comprises an end effector coupled to a transporter and wherein the transporter is configured to move the substrate holder assembly to and from the process apparatus, and wherein the transporter is configured to move a different substrate holder assembly with the holder frame to and from the process apparatus.

In accordance with another aspect of the disclosed embodiment, each of the substrate holders in the substrate holder assembly is in repeatable alignment with respect to the corresponding process element in the plurality of process elements independent of the other substrate holders in the substrate holder assembly.

In accordance with another aspect of the disclosed embodiment, a system for fluid processing one or more substrate surfaces arrayed in a fluid is provided, the system has a fluid process section with a frame having a plurality of process elements to process the substrate surfaces without contacting the substrate surfaces; and a substrate holder assembly having a number of substrate holders and configured for transporting one or more substrates in a vertical orientation and as a unit between the process section and another location, the substrate holder assembly and each of the substrate holders being configured for removable coupling to the process section frame, each substrate holder in the substrate holder assembly being configured to hold at least one of the substrates; the process section frame having vertical alignment features disposed so that, on coupling of the substrate holder assembly with the process section frame, the alignment features interface with each substrate holder of the substrate holder assembly and locate each substrate holder in repeatable alignment, at corresponding coupling of each substrate holder and the process section frame, with respect to a predetermined feature of the process section with each of the predetermined features being located between the substrates.

In accordance with another aspect of the disclosed embodiment, a system for fluid processing one or more substrate surfaces arrayed in a fluid is provided, the system having a process section with a frame having a plurality of process elements to process the substrate surfaces without contacting the substrate surfaces; a substrate holder assembly having a holder frame and a number of substrate holders, each of which is coupled to the holder frame and is configured for holding a substrate so that each substrate holder of the holder assembly holds a different substrate in the substrate holder assembly for transport as a unit with the substrate holder assembly to and from the process section; and the substrate holder assembly and each substrate holder thereof are removably coupled to the process section frame, and at least one of the substrate holders of the substrate holder assembly is movable relative to the holder frame and positionable in repeatable alignment with respect to a predetermined feature of the process section and independent of positioning of the holder frame with respect to the process section.

In accordance with another aspect of the disclosed embodiment, the holder frame comprises an end effector coupled to a transporter and wherein the transporter is configured to move the substrate holder assembly to and from the process section, and wherein the transporter is configured to move a different substrate holder assembly with the holder frame to and from the process section.

In accordance with another aspect of the disclosed embodiment, each of the number of substrate holders is removably coupled to the holder frame.

In accordance with another aspect of the disclosed embodiment, each of the substrate holders in the substrate holder assembly is independently moveable and positionable relative to the process elements.

In accordance with another aspect of the disclosed embodiment, each of the substrate holders in the substrate holder assembly is in repeatable alignment with respect to the predetermined feature of the process section independent of the other substrate holders in the substrate holder assembly.

In accordance with another aspect of the disclosed embodiment, each of the process elements in the plurality of process elements are located between the substrates.

In accordance with another aspect of the disclosed embodiment, each of the substrate holders in the substrate holder assembly is in repeatable alignment with respect to a corresponding process element in the plurality of process elements and independent of the other process elements in the plurality of process elements with each of the process elements in the plurality of process elements being located between the substrates.

In accordance with another aspect of the disclosed embodiment, a system for fluid processing one or more substrate surfaces arrayed in a fluid is provided, the system has a process module with a frame and a plurality of process elements to fluid process the substrate surfaces without contacting the substrate surfaces; and a substrate holder assembly having holder frame and a number of substrate holders, each of which is coupled to the holder frame and configured to hold a substrate so that a different substrate is held by each substrate holder of the substrate holder assembly for transport therewith as a unit to and from the process module; the substrate holder assembly and each substrate holder of the substrate holder assembly are removably coupled to the process module frame and, when coupled to the process module frame, each substrate holder is independently moveable and positionable relative to the other substrate holders of the substrate holder assembly.

In accordance with another aspect of the disclosed embodiment, the holder frame comprises an end effector coupled to a transporter and wherein the transporter is configured to move the substrate holder assembly to and from the process module, and wherein the transporter is configured to move a different substrate holder assembly with the holder frame to and from the process module.

In accordance with another aspect of the disclosed embodiment, each of the substrate holders in the substrate holder assembly is in repeatable alignment with respect to the predetermined feature of the process module independent of the other substrate holders in the substrate holder assembly.

In accordance with another aspect of the disclosed embodiment, a system for fluid processing one or more substrate surfaces arrayed in a fluid is provided, the system having a process module with a frame and a plurality of process elements to fluid process the substrate surfaces without contacting the substrate surfaces; and a substrate holder assembly having holder frame and a number of substrate holders, each of which is removably coupled to the holder frame and configured to hold a substrate in a vertical orientation so that a different substrate is held by each substrate holder of the substrate holder assembly for transport therewith as a unit to and from the process module; wherein, the substrate holder assembly and each substrate holder of the substrate holder assembly are removably coupled to the process module frame and, when coupled to the process module frame, each substrate holder is independently moveable and positionable relative to the other substrate holders of the substrate holder assembly.

In accordance with another aspect of the disclosed embodiment, a substrate holder adapted to hold and retain a substrate during vertical fluid processing of a surface of the substrate is provided, the wafer holder having a frame; a first leg coupled to the frame by a first compliant flexure, the first leg having a first contact member configured to engage a first edge of the substrate; and a second leg coupled to the frame by a second compliant flexure, the second leg having a second contact member configured to engage a second edge of the substrate; wherein, upon deflection of the first and second compliant flexures, the first and second legs are moveable in substantially opposite directions disengaging the first and second contact fingers from the first and second edges of the substrate respectively.

In accordance with another aspect of the disclosed embodiment, the first contact member comprises first and second contact fingers engaging different portions of the first edge of the substrate.

In accordance with another aspect of the disclosed embodiment, the first contact member comprises first, second and third contact points, the first contact point engaging the first edge of the substrate, the second contact point engaging the surface of the substrate, the third contact point engaging another surface of the substrate on an opposite side of the substrate.

In accordance with another aspect of the disclosed embodiment, the first and second legs are moveable in the same plane.

In accordance with another aspect of the disclosed embodiment, the first and second legs further comprise first and second integral positioning features configured to cooperate with a mating locating feature.

In accordance with another aspect of the disclosed embodiment, the first and second legs further comprise first and second leading tapered edges configured to engage with a mating locating feature.

In accordance with another aspect of the disclosed embodiment, the first compliant flexure comprises first and second flexure elements, the first flexure element substantially parallel to the second flexure element.

In accordance with another aspect of the disclosed embodiment, a substrate holder adapted to hold and retain a substrate during vertical fluid processing of a surface of the substrate is provided, the wafer holder having: a frame; a first leg coupled to the frame by a first compliant flexure, the first leg having a first contact member configured to engage a first edge of the substrate; a second leg coupled to the frame by a second compliant flexure, the second leg having a second contact member configured to engage a second edge of the substrate; and a handling feature coupled to the frame, the handling feature having a holder transporter interface surface substantially perpendicular to the first and second legs; wherein, upon deflection of the first and second compliant flexures, the first and second legs are moveable in substantially opposite directions disengaging the first and second contact fingers from the first and second edges of the substrate respectively.

In accordance with another aspect of the disclosed embodiment, a substrate holder adapted to hold and retain a substrate during vertical fluid processing of a surface of the substrate is provided, the wafer holder having a frame; a first leg coupled to the frame by a first compliant flexure, the first leg having a first contact member having first and second contact fingers configured to engage different portions of a first edge of the substrate; and a second leg coupled to the frame by a second compliant flexure, the second leg having a second contact member having third and fourth contact fingers configured to engage different portions of a second edge of the substrate; wherein, upon deflection of the first and second compliant flexures, the first and second legs are moveable in substantially opposite directions disengaging the first and second contact fingers from the first and second edges of the substrate respectively.

In accordance with another aspect of the disclosed embodiment, a substrate unload and load apparatus adapted to unload a plurality of processed substrates from a plurality of arrayed substrate holders and load a plurality of unprocessed substrates to the plurality of arrayed substrate holders is provided, the substrate unload and load apparatus having a frame; a plurality of processed substrate supports coupled to the frame and configured to support the plurality of processed substrates; a plurality of unprocessed substrate supports coupled to the frame and configured to support the plurality of un processed substrates, each of the plurality of unprocessed substrate supports alternating and interleaved with respect to each of the plurality of processed substrate supports; and a holder release coupled to the frame and configured to engage the plurality of arrayed substrate holders, the holder release having a first state where the plurality of arrayed substrate holders releases the plurality of processed substrates from the plurality of arrayed substrate holders, the holder release having a second state where the plurality of arrayed substrate holders captures the plurality of un processed substrates with the plurality of arrayed substrate holders; wherein, the plurality of processed substrates are unloaded from the plurality of arrayed substrate holders to the plurality of processed substrate supports in the first state, and wherein and the plurality of unprocessed substrates are loaded from the plurality of unprocessed substrate supports to the plurality of arrayed substrate holders in the second state.

In accordance with another aspect of the disclosed embodiment, the plurality of processed substrates are unloaded from the plurality of arrayed substrate holders while in a vertical orientation, and wherein the plurality of unprocessed substrates are loaded to the plurality of arrayed substrate holders while in a vertical orientation.

In accordance with another aspect of the disclosed embodiment, the plurality of processed substrate supports and the plurality of unprocessed substrate supports are coupled to the frame with an indexer, wherein the indexer simultaneously moves the plurality of processed substrate supports and the plurality of unprocessed substrate supports from a first position where the plurality of processed substrates are unloaded from the plurality of arrayed substrate holders to a second position where the plurality of unprocessed substrates are loaded to the plurality of arrayed substrate holders.

In accordance with another aspect of the disclosed embodiment, the holder release disengages substrate edge support members of the plurality of arrayed substrate holders from edges of the plurality of processed substrates when in the first state, and wherein the holder release engages the substrate edge support members to edges of the plurality of unprocessed substrates when in the second state.

In accordance with another aspect of the disclosed embodiment, each of the plurality of unprocessed substrates supported by the plurality of unprocessed substrate supports are alternating and interleaved with respect to each of the plurality of processed substrates supported by the plurality of processed substrate supports.

In accordance with another aspect of the disclosed embodiment, each of the plurality of unprocessed substrates supported by the plurality of unprocessed substrate supports are axially aligned with respect to each of the plurality of processed substrates supported by the plurality of processed substrate supports.

In accordance with another aspect of the disclosed embodiment, edges of the plurality of unprocessed substrates are supported by the plurality of unprocessed substrate supports, and wherein edges of the plurality of processed substrates are supported by the plurality of processed substrate supports.

In accordance with another aspect of the disclosed embodiment, a substrate unload and load apparatus adapted to unload a plurality of processed substrates from a plurality of arrayed substrate holders and load a plurality of unprocessed substrates to the plurality of arrayed substrate holders is provided, the substrate unload and load apparatus having a frame; a plurality of processed substrate supports coupled to the frame and configured to support the plurality of processed substrates; a plurality of unprocessed substrate supports coupled to the frame and configured to support the plurality of un processed substrates, each of the plurality of unprocessed substrate supports alternating and interleaved with respect to each of the plurality of processed substrate supports; and a holder release coupled to the frame and configured to engage the plurality of arrayed substrate holders, the holder release having a first state where the plurality of arrayed substrate holders releases the plurality of processed substrates from the plurality of arrayed substrate holders, the holder release having a second state where the plurality of arrayed substrate holders captures the plurality of un processed substrates with the plurality of arrayed substrate holders; wherein, the plurality of processed substrates are simultaneously unloaded as a processed substrate group from the plurality of arrayed substrate holders to the plurality of processed substrate supports in the first state, and wherein and the plurality of unprocessed substrates are simultaneously loaded as a unprocessed substrate group from the plurality of unprocessed substrate supports to the plurality of arrayed substrate holders in the second state.

In accordance with another aspect of the disclosed embodiment, a substrate unload and load apparatus adapted to unload a plurality of processed substrates from a plurality of arrayed substrate holders and load a plurality of unprocessed substrates to the plurality of arrayed substrate holders is provided, the substrate unload and load apparatus having a frame; a plurality of processed substrate supports coupled to the frame and configured to support the plurality of processed substrates; a plurality of unprocessed substrate supports coupled to the frame and configured to support the plurality of un processed substrates, each of the plurality of unprocessed substrate supports alternating and interleaved with respect to each of the plurality of processed substrate supports; a plurality of holder supports coupled to the frame and configured to support and align each holder of the plurality of arrayed substrate holders independent of the other holders in the plurality of arrayed substrate holders; and a holder release coupled to the frame and configured to engage the plurality of arrayed substrate holders, the holder release having a first state where the plurality of arrayed substrate holders releases the plurality of processed substrates from the plurality of arrayed substrate holders, the holder release having a second state where the plurality of arrayed substrate holders captures the plurality of un processed substrates with the plurality of arrayed substrate holders; wherein, the plurality of processed substrates are unloaded from the plurality of arrayed substrate holders to the plurality of processed substrate supports in the first state, and wherein and the plurality of unprocessed substrates are loaded from the plurality of unprocessed substrate supports to the plurality of arrayed substrate holders in the second state.

In accordance with another aspect of the disclosed embodiment, a system for processing surfaces of a plurality of substrates is provided, the system having a process module having a process module frame and having a plurality of process elements to process the substrate surfaces without contacting the substrate surfaces; a plurality of substrate holder assemblies, each having a number of substrate holders, each of which is removably coupled to the process module frame, each substrate holder in the substrate holder assembly configured to hold a substrate; the process module frame having alignment features aligning each of the substrate holders in the substrate holder assembly in repeatable alignment with respect to each of the process elements in the plurality of process elements with each of the process elements in the plurality of process elements being located between the substrates; a loader module configured to unload a plurality of processed substrates from each of the substrate holder assemblies and load a plurality of unprocessed substrates to each of the substrate holder assemblies; and a transporter configured to transport each of the substrate holder assemblies to and from the process module and the loader module.

In accordance with another aspect of the disclosed embodiment, the system further has a second process module, wherein the transporter is configured to transport each of the substrate holder assemblies to and from the process module, the second process module and the loader module.

In accordance with another aspect of the disclosed embodiment, the system further has a substrate transport front end configured to transport the unprocessed substrates from substrate carriers to the loader module and further configured to transport processed substrates from the loader module to the substrate carriers.

In accordance with another aspect of the disclosed embodiment, the surfaces of the substrates are in a substantially vertical orientation.

In accordance with another aspect of the disclosed embodiment, the plurality of process elements comprises an array of agitation members that agitate a fluid proximate the substrate surfaces without contacting the substrate surfaces.

In accordance with another aspect of the disclosed embodiment, the substrate holder assembly is removable from the process module frame as a unit.

In accordance with another aspect of the disclosed embodiment, each substrate holder in the substrate holder assembly is removable from the process module frame independent of the other holders in the substrate holder assembly.

In accordance with another aspect of the disclosed embodiment, a system for processing surfaces of a plurality of substrates is provided, the system having a process module frame having a plurality of process elements to process the substrate surfaces without contacting the substrate surfaces; a substrate holder assembly having a number of substrate holders, each of which is removably coupled to the process module frame, each substrate holder in the substrate holder assembly configured to hold a substrate, each substrate holder in the substrate holder assembly independently moveable and positionable relative to the other substrate holders in the substrate holder assembly; each of the substrate holders in the substrate holder assembly in repeatable alignment with respect to each of the process elements in the plurality of process elements with each of the process elements in the plurality of process elements being located between the substrates; a loader module configured to unload a plurality of processed substrates from each of the substrate holder assemblies and load a plurality of unprocessed substrates to each of the substrate holder assemblies; and a transporter configured to transport each of the substrate holder assemblies to and from the process module and the loader module.

In accordance with another aspect of the disclosed embodiment, a system for fluid processing one or more substrate surfaces arrayed in a fluid is provided, the system having a process module frame having a plurality of process elements to fluid process the substrate surfaces without contacting the substrate surfaces; a substrate holder assembly having a number of substrate holders, each of which is removably coupled to the process module frame, each substrate holder in the substrate holder assembly configured to hold a substrate, each substrate holder in the substrate holder assembly independently moveable and positionable relative to the other substrate holders in the substrate holder assembly; each of the substrate holders in the substrate holder assembly in repeatable alignment with respect to a corresponding process element in the plurality of process elements and independent of the other process elements in the plurality of process elements with each of the process elements in the plurality of process elements being located between the substrates, and wherein the substrate surfaces are maintained in parallel alignment and in a vertical orientation; a loader module configured to unload a plurality of processed substrates from each of the substrate holder assemblies and load a plurality of unprocessed substrates to each of the substrate holder assemblies; and a transporter configured to transport each of the substrate holder assemblies to and from the process module and the loader module.

In accordance with another aspect of the disclosed embodiment, a system for fluid processing one or more substrate surfaces arrayed in a fluid is provided, the system having a process module with a frame and a plurality of agitation members to fluid process the substrate surfaces without contacting the substrate surfaces; and a substrate holder assembly having holder frame and a number of substrate holders, each of which is coupled to the holder frame and configured to hold a substrate so that a different substrate is held by each substrate holder of the substrate holder assembly for transport therewith as a unit to and from the process module; wherein, the substrate holder assembly and each substrate holder of the substrate holder assembly are removably coupled to the process module frame and, when coupled to the process module frame, each substrate holder is independently moveable and positionable relative to the other substrate holders of the substrate holder assembly.

In accordance with another aspect of the disclosed embodiment, each agitation member of the plurality of agitation members are vertically moveable independent of the other agitation members in the plurality of agitation members.

In accordance with another aspect of the disclosed embodiment, the surfaces of the substrates are in a substantially vertical orientation.

In accordance with another aspect of the disclosed embodiment, the process module frame comprises a fluid tank.

In accordance with another aspect of the disclosed embodiment, each of the number of substrate holders is removably coupled to the holder frame.

In accordance with another aspect of the disclosed embodiment, the substrate holder assembly is removable from the process module frame as a unit.

In accordance with another aspect of the disclosed embodiment, each substrate holder in the substrate holder assembly is removable from the process module frame independent of the other holders in the substrate holder assembly.

In accordance with another aspect of the disclosed embodiment, a system for fluid processing one or more substrate surfaces arrayed in a fluid is provided, the system having a process section with a frame having a plurality of agitation members to process the substrate surfaces without contacting the substrate surfaces; and a substrate holder assembly having a number of substrate holders and configured for transporting one or more substrates as a unit between the process section and another location, the substrate holder assembly and each of the substrate holders being configured for removable coupling to the process section frame, each substrate holder in the substrate holder assembly being configured to hold at least one of the substrates; the process section frame having alignment features disposed so that, on coupling of the substrate holder assembly with the process section frame, the alignment features interface with each substrate holder of the substrate holder assembly and locate each substrate holder in repeatable alignment, at corresponding coupling of each substrate holder and the process section frame, with respect to the agitation members of the process section.

In accordance with another aspect of the disclosed embodiment, a system for fluid processing one or more substrate surfaces arrayed in a fluid is provided, the system having a process apparatus having a module with a frame and a plurality of agitation members to fluid process the substrate surfaces without contacting the substrate surfaces; and a substrate holder assembly having a number of substrate holders and configured for batch transport of substrates as a unit, the substrate holder assembly and each of the substrate holders being configured for removable coupling to the module frame, each substrate holder in the substrate holder assembly being configured to hold a substrate; wherein, the module frame has insertion guides and each substrate holder has mating guides depending from each substrate holder and corresponding to the insertion guides, the insertion guides and mating guides being configured so that, on coupling of the substrate holder and the module frame, the insertion guides receive the corresponding mating guides of each substrate holder aligning each substrate holder of the substrate holder assembly in repeatable alignment with respect to a corresponding agitation member in the plurality of agitation members.

In accordance with another aspect of the disclosed embodiment, a substrate drying apparatus for drying a width of a surface of a substrate in a liquid is provided, the substrate drying apparatus having a liquid tank containing the liquid; an injection nozzle coupled to the liquid tank, the injection nozzle having a continuous knife edge injection surface across the width of the surface of the substrate; and a drain coupled to the injection nozzle, the drain having a continuous drain surface substantially parallel to the continuous knife edge injection surface and across the width of the surface of the substrate; wherein, the liquid forms a meniscus between the continuous drain surface and the width of the surface of the substrate, and wherein the injection nozzle directs a vapor at the meniscus.

In accordance with another aspect of the disclosed embodiment, the substrate is in a substantially vertical orientation.

In accordance with another aspect of the disclosed embodiment, the substrate is coupled to a holder, the holder and the substrate movable relative to the injection nozzle and the drain.

In accordance with another aspect of the disclosed embodiment, the continuous drain surface forms a weir that is substantially permanently wetted.

In accordance with another aspect of the disclosed embodiment, the continuous drain surface forms a weir that is scalloped in directions both parallel and perpendicular to the wafer surface.

In accordance with another aspect of the disclosed embodiment, the substrate drying apparatus further has a liquid reservoir adapted to replenish the liquid, the liquid reservoir having a fluid agitation mechanism agitating the liquid.

In accordance with another aspect of the disclosed embodiment, the drain comprises a drainage manifold having a lower liquid drainage portion and an upper vapor exhaust portion.

In accordance with another aspect of the disclosed embodiment, a Marangoni dryer apparatus for drying a width of a surface of a substrate in a liquid is provided, the Marangoni dryer apparatus having an injection nozzle coupled to a combination liquid and vapor drain; the injection nozzle having a continuous knife edge injection surface; the combination liquid and vapor drain having a continuous drain surface substantially parallel to the continuous knife edge injection surface; the continuous knife edge injection surface and the continuous drain surface being continuous across the width of the wafer; wherein, vapor is injected along the length of the continuous knife edge injection surface to a meniscus formed between the surface of the substrate and the combination liquid and vapor drain, and wherein the liquid and vapor flows into the combination liquid and vapor drain.

In accordance with another aspect of the disclosed embodiment, a multiple substrate drying apparatus for drying opposing surfaces of multiple substrates in a liquid is provided, the multiple substrate drying apparatus having a liquid tank containing the liquid; a plurality of manifolds, each manifold proximate each of the opposing surfaces of the substrates; each manifold having an injection nozzle coupled to the liquid tank, the injection nozzle having a continuous knife edge injection surface across the width of the surface of the substrate; and each manifold having a drain coupled to the injection nozzle, the drain having a continuous drain surface substantially parallel to the continuous knife edge injection surface and across the width of the surface of the substrate; wherein, the liquid forms a meniscus between each continuous drain surface and the width of each of the surfaces of the substrates, and wherein the injection nozzle directs a vapor at the meniscus.

In accordance with another aspect of the disclosed embodiment, a system for fluid processing one or more substrate surfaces arrayed in a fluid is provided, the system having a process module with a frame and a plurality of fluid jet elements to inject a fluid at the substrate surfaces without contacting the substrate surfaces; and a substrate holder assembly having holder frame and a number of substrate holders, each of which is coupled to the holder frame and configured to hold a substrate so that a different substrate is held by each substrate holder of the substrate holder assembly for transport therewith as a unit to and from the process module; wherein, the substrate holder assembly and each substrate holder of the substrate holder assembly are removably coupled to the process module frame and, when coupled to the process module frame, each substrate holder is independently moveable and positionable relative to the other substrate holders of the substrate holder assembly.

In accordance with another aspect of the disclosed embodiment, the plurality of fluid jet elements are moveable as a group relative to the substrate holder assembly.

In accordance with another aspect of the disclosed embodiment, the surfaces of the substrates are in a substantially vertical orientation.

In accordance with another aspect of the disclosed embodiment, the process module frame comprises a fluid tank.

In accordance with another aspect of the disclosed embodiment, each of the number of substrate holders is removably coupled to the holder frame.

In accordance with another aspect of the disclosed embodiment, the substrate holder assembly is removable from the process module frame as a unit.

In accordance with another aspect of the disclosed embodiment, each substrate holder in the substrate holder assembly is removable from the process module frame independent of the other holders in the substrate holder assembly.

In accordance with another aspect of the disclosed embodiment, a system for fluid processing one or more substrate surfaces arrayed in a fluid is provided, the system having a process section with a frame having a plurality of fluid jet elements to inject a fluid at the substrate surfaces without contacting the substrate surfaces; and a substrate holder assembly having a number of substrate holders and configured for transporting one or more substrates as a unit between the process section and another location, the substrate holder assembly and each of the substrate holders being configured for removable coupling to the process section frame, each substrate holder in the substrate holder assembly being configured to hold at least one of the substrates; the process section frame having alignment features disposed so that, on coupling of the substrate holder assembly with the process section frame, the alignment features interface with each substrate holder of the substrate holder assembly and locate each substrate holder in repeatable alignment, at corresponding coupling of each substrate holder and the process section frame, with respect to the fluid jet elements of the process section.

In accordance with another aspect of the disclosed embodiment, a system for fluid processing one or more substrate surfaces arrayed in a fluid is provided, the system having a process apparatus having a module with a frame and a plurality of fluid jet elements to inject a fluid at the substrate surfaces without contacting the substrate surfaces; and a substrate holder assembly having a number of substrate holders and configured for batch transport of substrates as a unit, the substrate holder assembly and each of the substrate holders being configured for removable coupling to the module frame, each substrate holder in the substrate holder assembly being configured to hold a substrate; wherein, the module frame has insertion guides and each substrate holder has mating guides depending from each substrate holder and corresponding to the insertion guides, the insertion guides and mating guides being configured so that, on coupling of the substrate holder and the module frame, the insertion guides receive the corresponding mating guides of each substrate holder aligning each substrate holder of the substrate holder assembly in repeatable alignment with respect to a corresponding fluid jet element in the plurality of fluid jet elements.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A system for fluid processing one or more substrate surfaces arrayed in a fluid, the system comprising:
   a process section including a frame and a plurality of process elements to process the substrate surfaces without contacting the substrate surfaces;
   a substrate holder assembly having a plurality of substrate holders and configured for transporting a plurality of substrates as a unit between the process section and another location,
   the substrate holder assembly and each of the substrate holders being configured for removable coupling to the process section frame, each substrate holder in the substrate holder assembly being configured to hold at least one of the substrates, the plurality of substrate holders assembled as an array in the substrate holder assembly with each substrate holder spaced apart from each other in the substrate holder assembly; and
   a transporter configured to move the substrate holder assembly to and from the process section,
   the process section frame having alignment features disposed so that, on coupling of the substrate holder assembly with the process section frame, the alignment features interface with and directly contact each substrate holder assembled as the array in the substrate holder assembly and locate each substrate holder in repeatable alignment, at corresponding coupling of each substrate holder and the process section frame, with respect to a predetermined feature of the process section.

2. The system of claim 1, wherein the predetermined features comprises each of the process elements with each of the process elements in the plurality of process elements being located between the substrates.

3. The system of claim 1, wherein the alignment feature comprises vertical guides aligning each of the substrate holders in the substrate holder assembly in repeatable alignment with respect to a corresponding process element in the plurality of process elements, wherein each of the substrate holders in the substrate holder assembly has integral positioning features that cooperate with mating features of each of the vertical guides.

4. The system of claim 1, wherein the holder assembly comprises the plurality of substrate holders coupled to a frame, wherein the frame comprises an end effector coupled to the transporter, and wherein the transporter is configured to move a different substrate holder assembly with the holder frame to and from the process section.

5. The system of claim 1, wherein each of the substrate holders in the substrate holder assembly is independently moveable and positionable relative to the other substrate holders in the substrate holder assembly.

6. The system of claim 1, wherein each of the substrate holders in the substrate holder assembly is in repeatable alignment with respect to the predetermined feature of the process section independent of the other substrate holders in the substrate holder assembly.

7. The system of claim 1, wherein each of the substrate holders in the substrate holder assembly is in repeatable alignment with respect to a corresponding process element in the plurality of process elements and independent of the other process elements in the plurality of process elements.

8. A system for fluid processing one or more substrate surfaces arrayed in a fluid, the system comprising:
   a process apparatus having a module with a frame and a plurality of process elements to fluid process the substrate surfaces without contacting the substrate surfaces;
   a substrate holder assembly having a plurality of substrate holders and configured for batch transport of a plurality of substrates as a unit, the substrate holder assembly and each of the substrate holders being configured for removable coupling to the module frame, each substrate holder in the substrate holder assembly being configured to hold a substrate, the plurality of substrate holders assembled as an array in the substrate holder assembly with each substrate holder spaced apart from each other in the substrate holder assembly; and
   a transporter configured to move the plurality substrate holders as a unit to and from the process apparatus,
   wherein, the module frame has insertion guides and each substrate holder has mating guides depending from each substrate holder and corresponding to the insertion guides, the insertion guides and mating guides being configured so that, on coupling of the substrate holder and the module frame, the insertion guides receive and directly contact the corresponding mating guides of each substrate holder aligning each substrate holder assembled as the array in the substrate holder assembly in repeatable alignment with respect to a corresponding process element in the plurality of process elements.

9. The system of claim 8, wherein each of the process elements in the plurality of process elements are located between the substrates.

10. The system of claim 8, wherein the insertion guides comprises vertical guides aligning each of the substrate holders in the substrate holder assembly in repeatable alignment with respect to the corresponding process element in the plurality of process elements.

11. The system of claim 8, wherein the holder assembly comprises the plurality of substrate holders coupled to a frame, wherein the frame comprises an end effector coupled to the transporter, and wherein the transporter is configured to move a different substrate holder assembly with the holder frame to and from the process apparatus.

12. The system of claim 8, wherein each of the substrate holders in the substrate holder assembly is independently moveable and positionable relative to the other substrate holders in the substrate holder assembly.

13. The system of claim 8, wherein each of the substrate holders in the substrate holder assembly is in repeatable alignment with respect to the corresponding process element in the plurality of process elements independent of the other substrate holders in the substrate holder assembly.

14. The system of claim 8, wherein each of the substrate holders in the substrate holder assembly is in repeatable alignment with respect to the corresponding process element in the plurality of process elements and independent of the other process elements in the plurality of process elements.

15. A system for fluid processing one or more substrate surfaces arrayed in a fluid, the system comprising:
- a fluid process section including a frame and a plurality of process elements to process the substrate surfaces without contacting the substrate surfaces;
- a substrate holder assembly having a plurality of substrate holders and configured for transporting a plurality of substrates in a vertical orientation and as a unit between the process section and another location, the substrate holder assembly and each of the substrate holders being configured for removable coupling to the process section frame, each substrate holder in the substrate holder assembly being configured to hold at least one of the substrates, the plurality of substrate holders assembled as an array in the substrate holder assembly with each substrate holder spaced apart from each other in the substrate holder assembly; and
- a transporter configured to move the plurality of substrate holders as a unit to and from the process apparatus,
- the process section frame having vertical alignment features disposed so that, on coupling of the substrate holder assembly with the process section frame, the alignment features interface with and directly contact each substrate holder assembled as the array in the substrate holder assembly and locate each substrate holder in repeatable alignment, at corresponding coupling of each substrate holder and the process section frame, with respect to a predetermined feature of the process section with each of the predetermined features being located between the substrates.

16. The system of claim 15, wherein each of the predetermined features comprises each process element with each of the process elements in the plurality of process elements being located between the substrates.

17. The system of claim 15, wherein the alignment feature comprises vertical guides aligning each of the substrate holders in the substrate holder assembly in repeatable alignment with respect to a corresponding process element in the plurality of process elements, wherein each of the substrate holders in the substrate holder assembly has integral positioning features that cooperate with mating features of each of the vertical guides.

18. The system of claim 15, wherein the holder assembly comprises the plurality of substrate holders coupled to a frame, wherein the frame comprises an end effector coupled to the transporter, and wherein the transporter is configured to move a different substrate holder assembly with the holder frame to and from the process section.

19. The system of claim 15, wherein each of the substrate holders in the substrate holder assembly is independently moveable and positionable relative to the other substrate holders in the substrate holder assembly.

20. The system of claim 15, wherein each of the substrate holders in the substrate holder assembly is in repeatable alignment with respect to the predetermined feature of the process section independent of the other substrate holders in the substrate holder assembly and independent of the other process elements in the plurality of process elements.

* * * * *